United States Patent [19]
Trovato et al.

[11] Patent Number: 5,696,674
[45] Date of Patent: Dec. 9, 1997

[54] COMPUTER ANIMATION OF PLANNED PATH IN CHANGING SPACE

[75] Inventors: Karen Irene Trovato, Putnam Valley; Leendert Dorst, Yorktown Heights, both of N.Y.

[73] Assignee: Philips Electronics North America Corp., New York, N.Y.

[21] Appl. No.: 487,619

[22] Filed: Jun. 7, 1995

Related U.S. Application Data

[63] Continuation of Ser. No. 508,024, Apr. 11, 1990, which is a continuation of Ser. No. 166,599, Mar. 9, 1988, Pat. No. 4,949,277.

[51] Int. Cl.$^6$ .................................................. G06F 19/00
[52] U.S. Cl. .......................... 364/167.01; 364/424.031; 364/424.033; 364/444.2; 364/461
[58] Field of Search ........................ 364/167.01, 148, 364/461, 436, 437, 438, 444, 474.2, 424.02, 578, 424.029, 424.031, 424.032, 424.033, 444.1, 444.2, 449.3, 449.4, 449.5; 395/80, 85, 88, 90, 919, 89, 905, 152, 174, 958

[56] References Cited

U.S. PATENT DOCUMENTS

| | | | |
|---|---|---|---|
| 4,481,568 | 11/1984 | Inaba et al. | 364/513 X |
| 4,482,968 | 11/1984 | Inaba et al. | 364/474.2 X |
| 4,674,048 | 6/1987 | Okumura | 364/424.02 |
| 4,752,836 | 6/1988 | Blanton et al. | 358/342 |
| 4,764,873 | 8/1988 | Libby | 364/461 |

OTHER PUBLICATIONS

Ichikawa et al "A Heuristic Planner and an Executive for Mobile Robot Control"–IEEE Trans. on Systems, Man & Cybernetics, vol. SMC–15, No. 4, Jul./Aug. 1985–pp.558–563.

T. Boult "Updating Distance Maps when Objects Move", (Columbia University 1987).

V. Lumelsky "Algorithmic and Complexity Issues of Robot Motion in an Uncertain Environment", Journal of Complexity 3, 146–182, (1987).

V. Lumelsky, "Dynamic Path Planning for a Planar Articulated Robot Arm Moving Amidst Unknown Obstacles", Automatica, vol. 23, No. 5, pp. 551–570 (1987).

*Primary Examiner*—Joseph Ruggiero
*Attorney, Agent, or Firm*—Anne E. Barschall

[57] ABSTRACT

A method is presented for path planning after changes in task space. In one embodiment, the method is applied to planning a path for a robot arm. The method identifies areas in the configuration space which are affected by the changes in task space. Cost waves can then be repropagated in these affected areas to allow for planning in N dimensions and using space variant metrics. The method is also adapted to use in the presence of phantom obstacles.

32 Claims, 56 Drawing Sheets

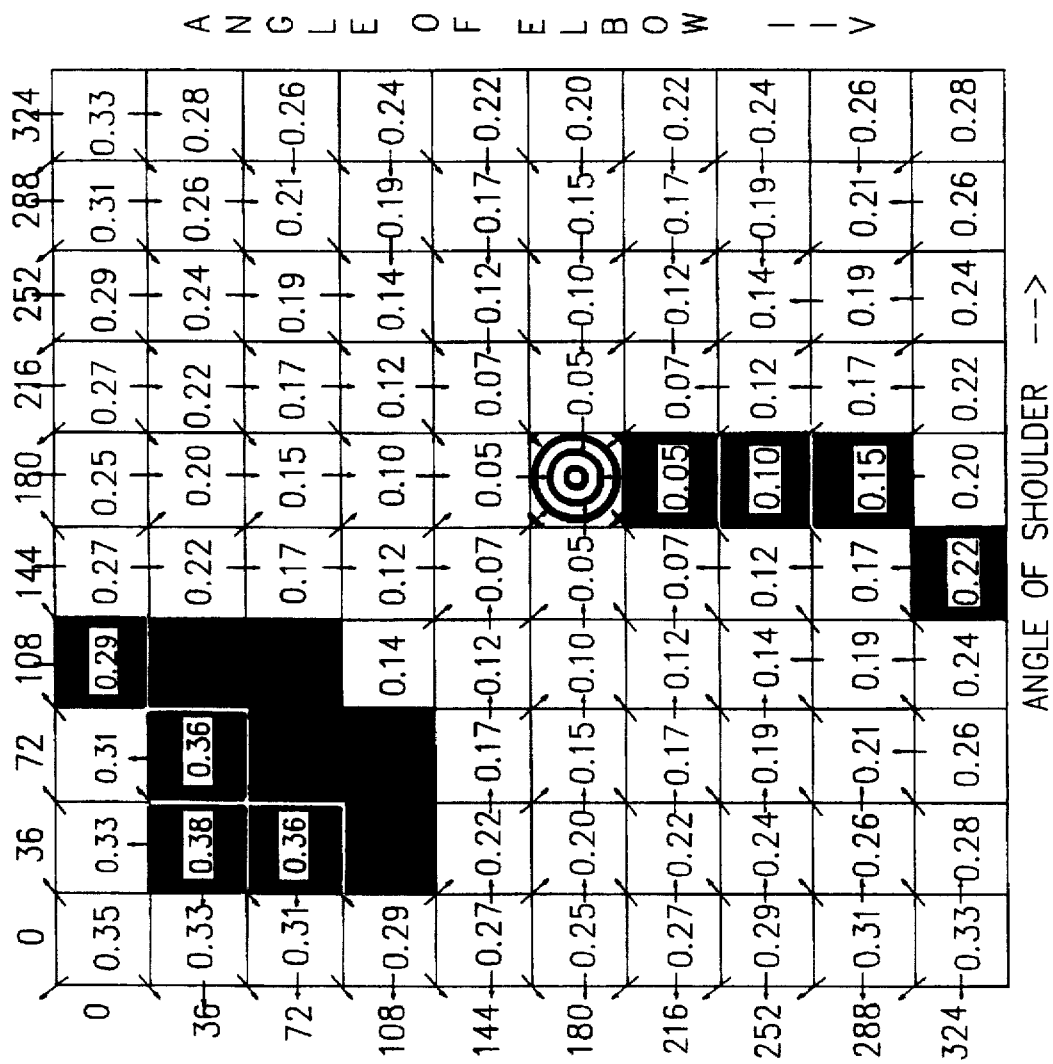

COMPUTER ANIMATION OF PLANNED PATH IN CHANGING SPACE

This is a continuation of application Ser. No. 07/508,024, filed on Apr. 11, 1990, which is continuation of application Ser. No. 07/166,599, filed on Mar. 9, 1988 now U.S. Pat. No. 4,949,277.

A portion of the disclosure of this patent document contains material which is subject to copyright protection. The copyright owner has no objection to the facsimile reproduction by anyone of the patent document of the patent disclosure, as it appears in the patent and Trademark Office patent file or records, but otherwise reserves all copyright rights whatsoever.

I. BACKGROUND OF THE INVENTION

1. Field of the Invention

The invention relates to path planning and in particular to repropagating cost waves in a configuration space after some aspect of that space has been changed.

The invention also relates to path planning in a configuration space in which the location of obstacles is not known.

2. Prior Art

The field of path planning is one with many applications. The most common application is to controlling robots, for instance robot arms such as are used in the space shuttle. Other applications include electronic maps, traffic control, emergency vehicle control, and emergency exit systems.

The path planning problem, as applied to robots, typically involves getting a robot from a start point to a goal point while avoiding obstacles. Automating multi-dimensional path planning for robots is one of the great historical problems of robotics.

The present invention is an improvement on the invention disclosed U.S. patent application Ser. No. 123,502, which is incorporated herein by reference as background material. That application disclosed, amongst other things, propagating cost waves through a configuration space by budding, using a space-variant metric.

After budding, some aspect of the configuration space may change, for instance, if an obstacle is removed or a goal added. In such a case, it may be inefficient to bud the entire configuration space again because only a small part of the configuration space may be affected.

Another problem which arises after a change in configuration space is that the precise location of the changes, particularly in obstacle location, may not be known. An approach to this problem is set forth in V. Lumelsky, "Algorithmic and Complexity Issues of Robot Motion in an Uncertain Environment", Journal of Complexity 3, 146–182 (1987); and V. Lumelsky, "Dynamic Path Planning for a Planar Articulated Robot Arm Moving Amidst Unknown Obstacles", Automatica, Vol. 23., No. 5, pp. 551–570 (1987). This approach suffers from certain shortcomings. For instance, the method disclosed is only able to deal with two dimensions. The method also does not have a memory for previously encountered obstacles.

II. SUMMARY OF THE INVENTION

It is therefore an object of the invention to deal with changes in a configuration space.

It is a second object to deal with changes in configuration space in the context of a space-variant metric.

It is a further object of the invention to deal with changes in a configuration space using budding.

It is still a further object of the invention to deal with changes in condition in multiple dimensions.

It is another object of the invention to deal with unsensed or partially sensed changes in conditions in the context of a space-variant metric.

It is yet another object of the invention to deal with unsensed or partially sensed changes in conditions using budding.

It is yet a further object of the invention to deal with unsensed or partially sensed changes in conditions with improved abilities to incorporate new data into the memory of the path planes.

These and other objects of the invention are achieved herein using a method referred to herein as differential budding.

The method involves identifying a region in configuration space which is affected by a change of conditions in task space. Precisely selected states referred to as a perimeter and which define this region are then placed on a "sifting heap" from which they are budded.

In the case of an added obstacle, the perimeter includes the front edge of the obstacle as well as surrounding a group of states which are connected via direction arrows to the back edge of the added obstacle.

In the case of removed obstacles, the perimeter states are neighbors of the removed obstacle states.

In the case of added goals, the perimeter states are the added goals themselves.

In the case of partially sensed changes in conditions, the changes in conditions are detected while following a pre-calculated path. Most changes in conditions can then be dealt with as an added obstacle, a removed obstacle, an added goal, or a removed goal. In one embodiment of the invention, the object first encounters a portion of the change in conditions iteratively follows a newly calculated path until the change in conditions is taken into account.

Further objects and advantages will become apparent in what follows.

III. BRIEF DESCRIPTION OF THE DRAWING

The invention will now be described using several examples with reference to the following figures.

Figure 6:
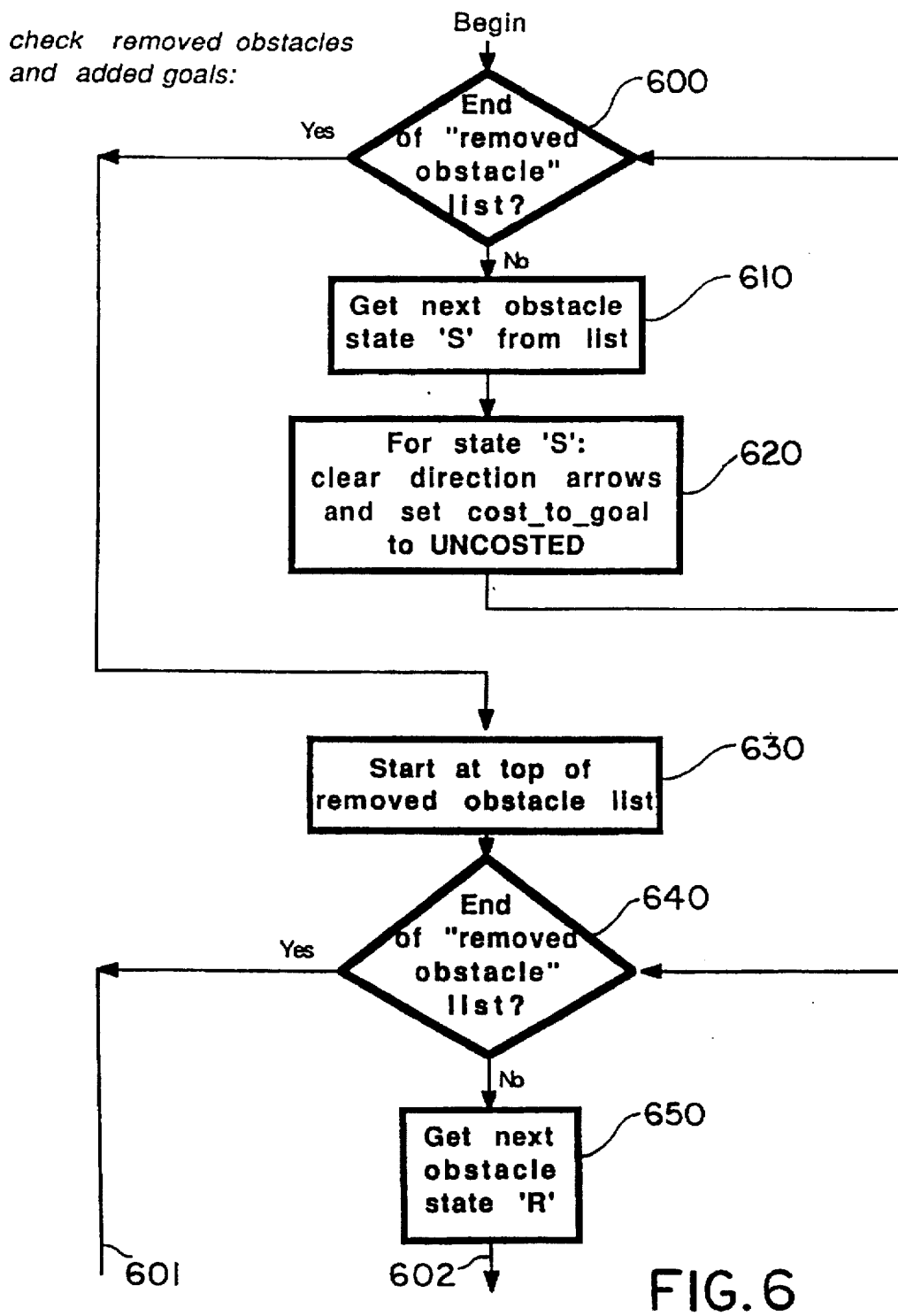
FIGS. 6 and 7 are flow charts giving more details of box 130 of FIG. 1.
Figure 7:
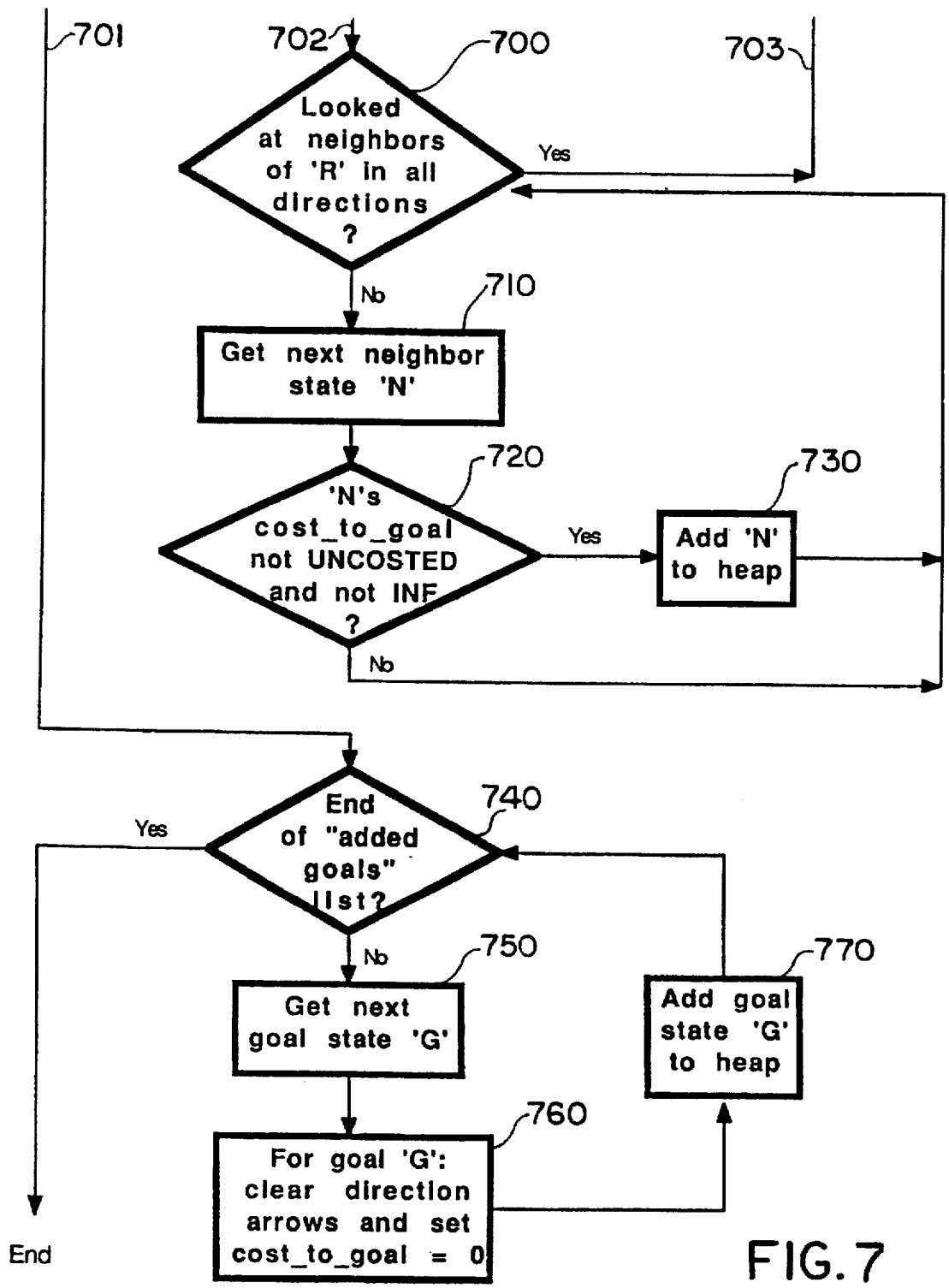
Figure 8A:
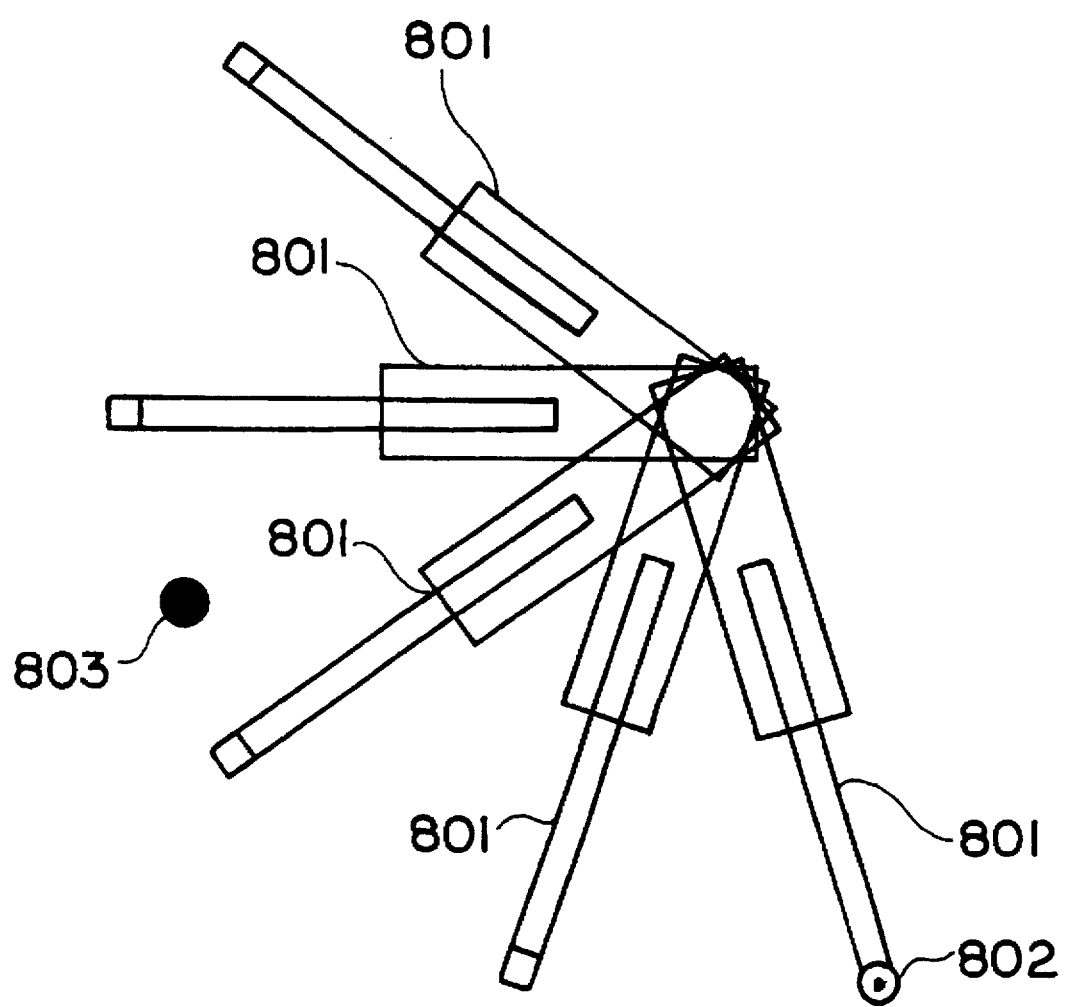
FIG. 8a shows a task space with a two link robot following a minimum joint motion path.
Figure 8B:
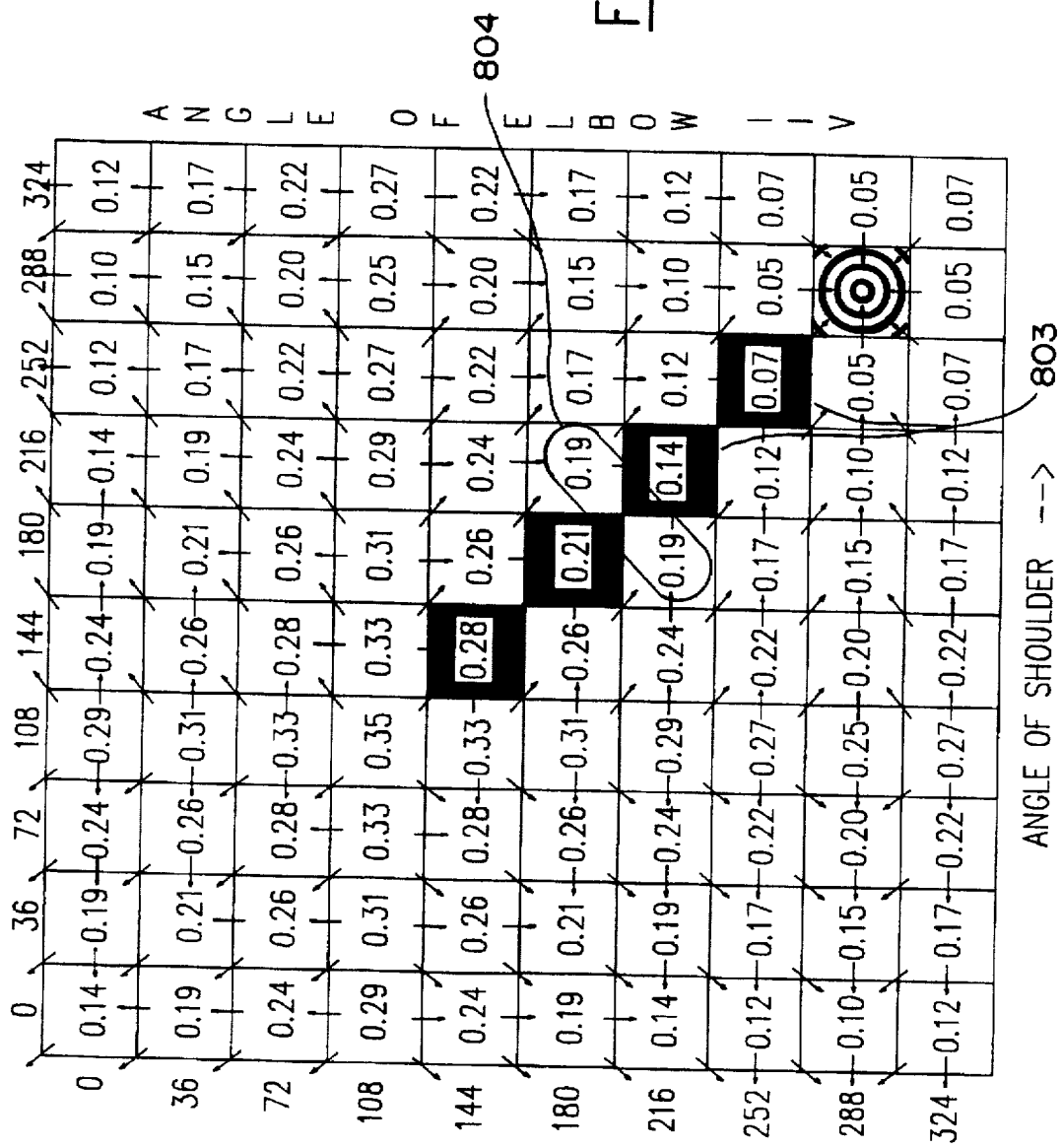
Figure 9:
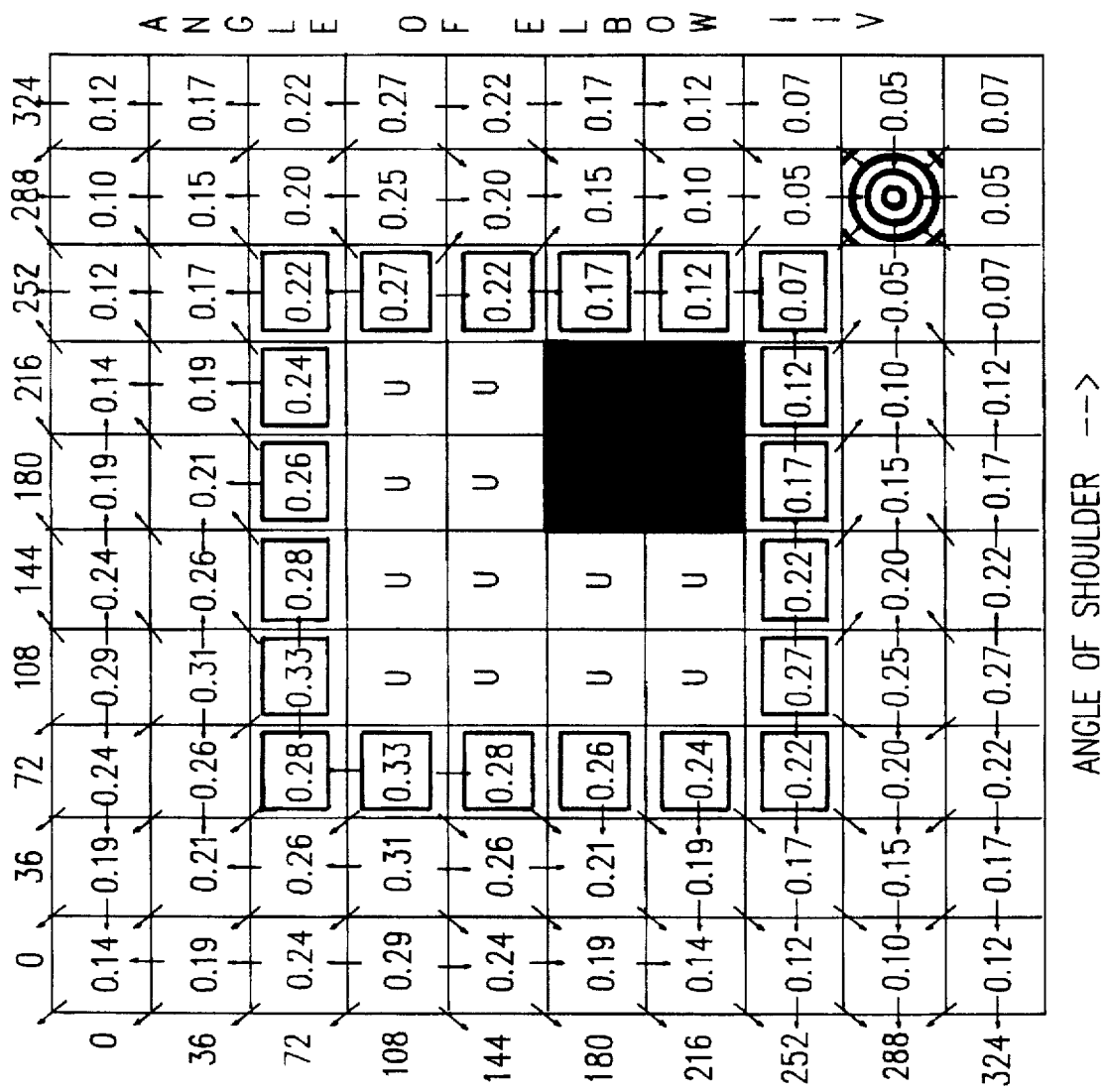
Figure 10:
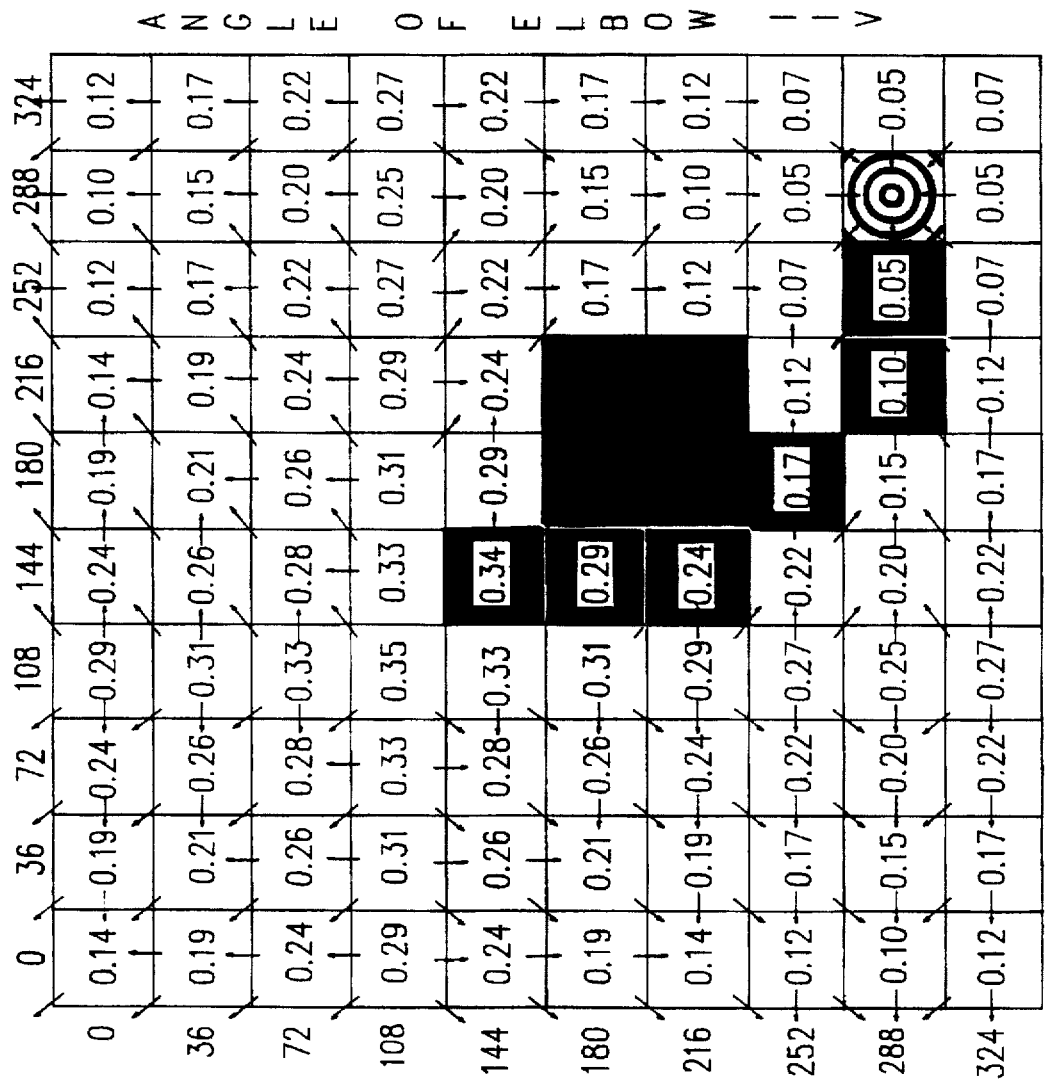

FIGS. 8b, 9, and 10 show the effects of the method of FIGS. 1–7 on the configuration space corresponding to the task space of FIG. 8a.

Figure 11A:
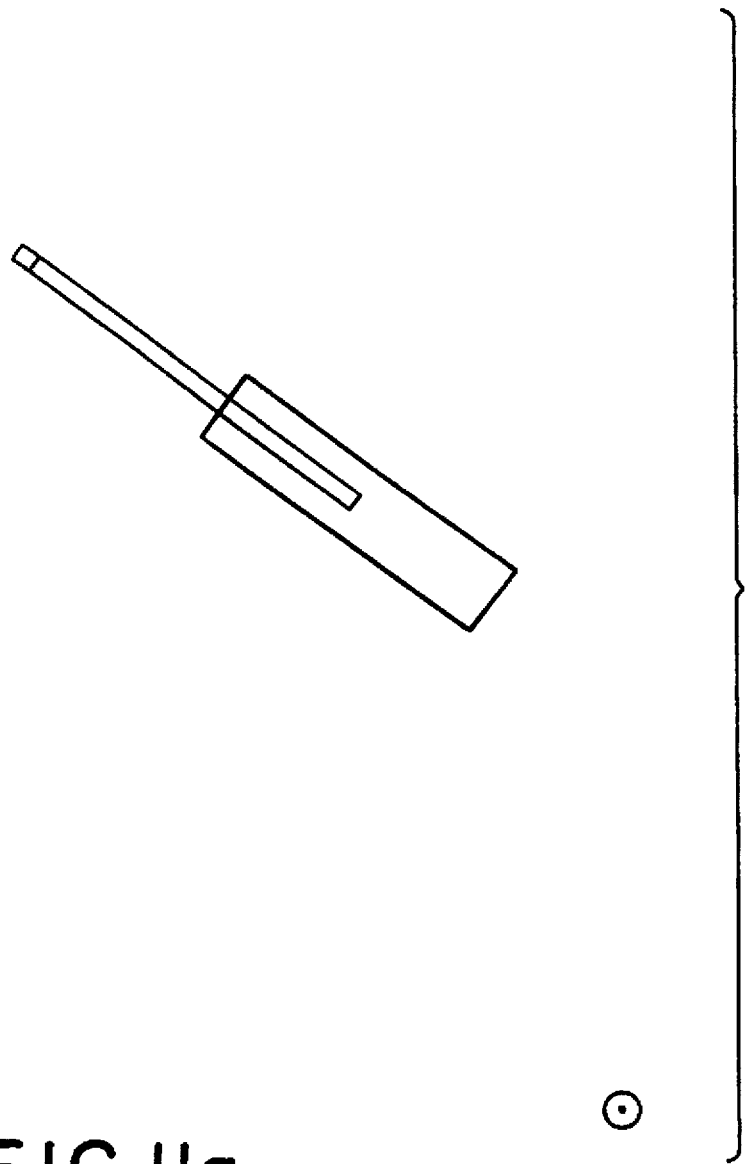

FIG. 11a shows the task space of FIG. 8a with the obstacle removed.

Figure 11B:
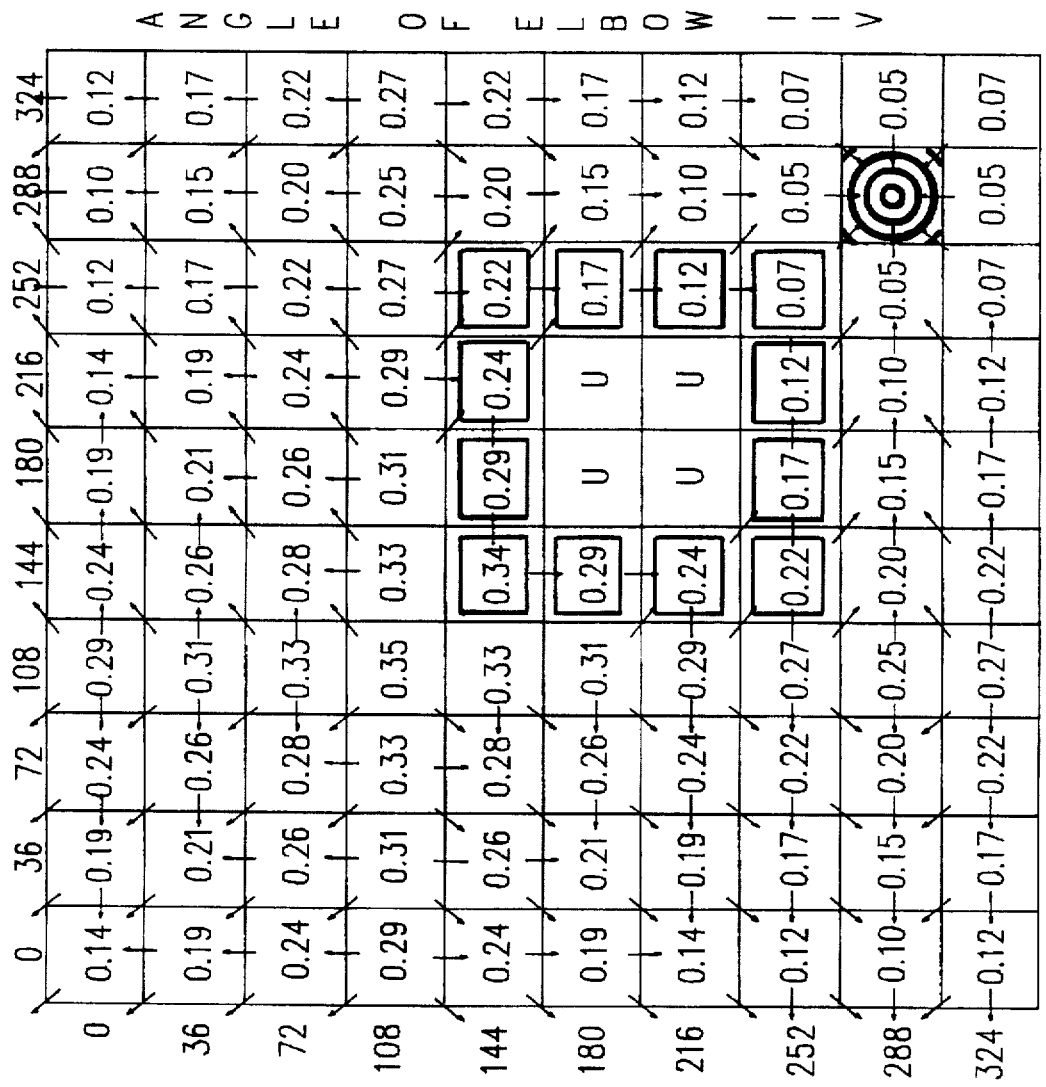

FIG. 11b shows a configuration space which has been altered by removing an obstacle and to which the method of FIGS. 1–7 has been applied.

Figure 12:
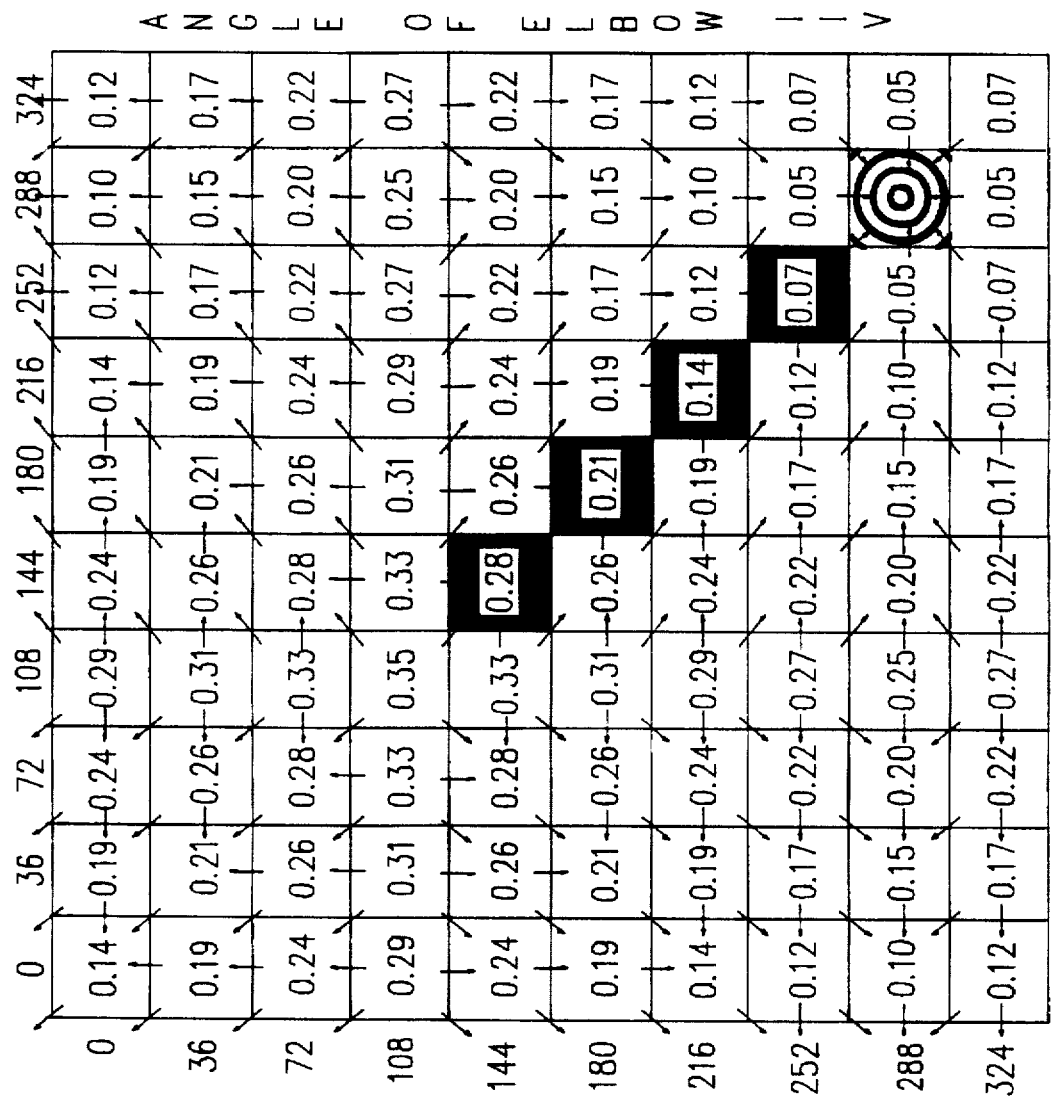

FIG. 12 shows the configuration space of FIG. 11b after budding and with a new path.

Figure 13A:
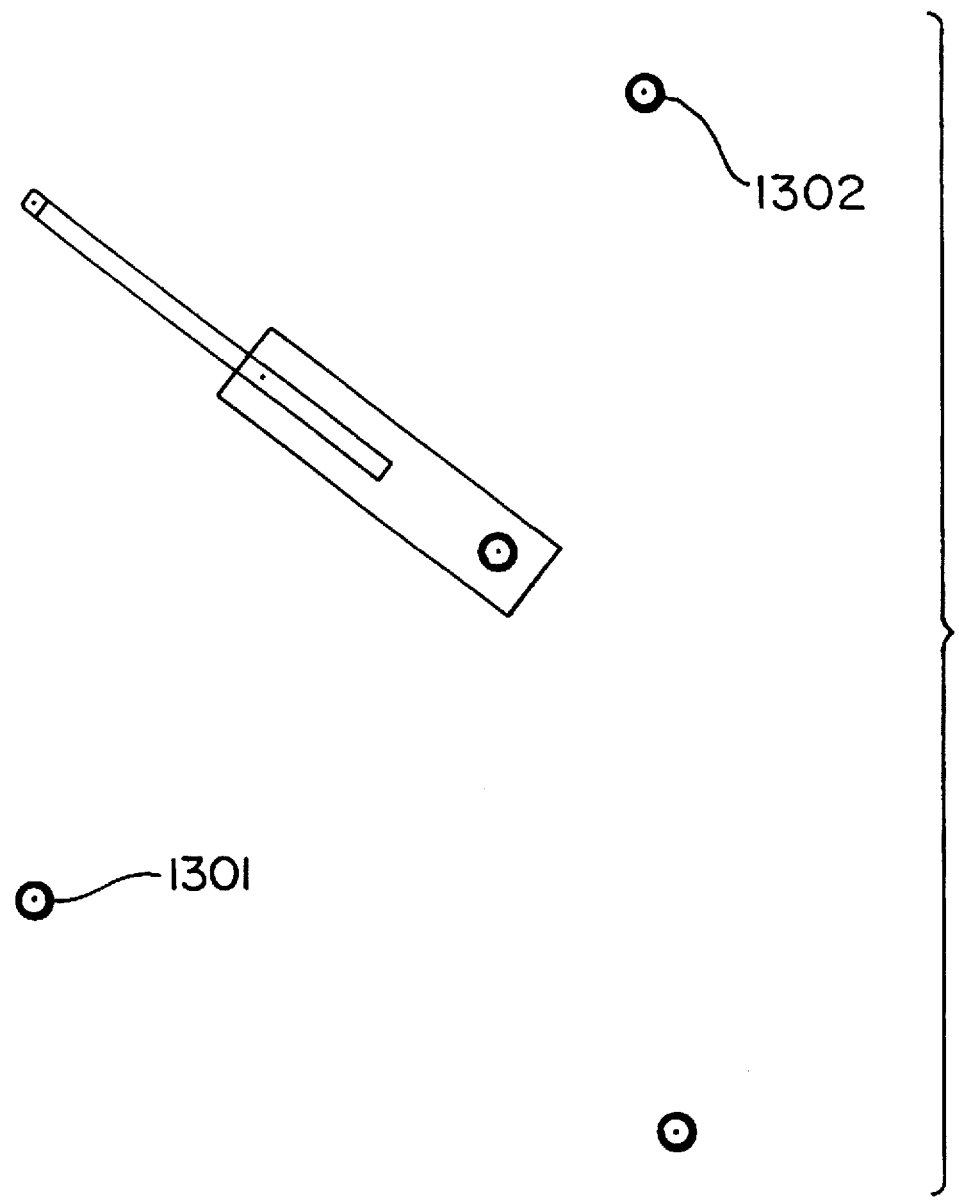

FIG. 13a shows the task space of FIG. 11a with newly added goals.

Figure 13B:
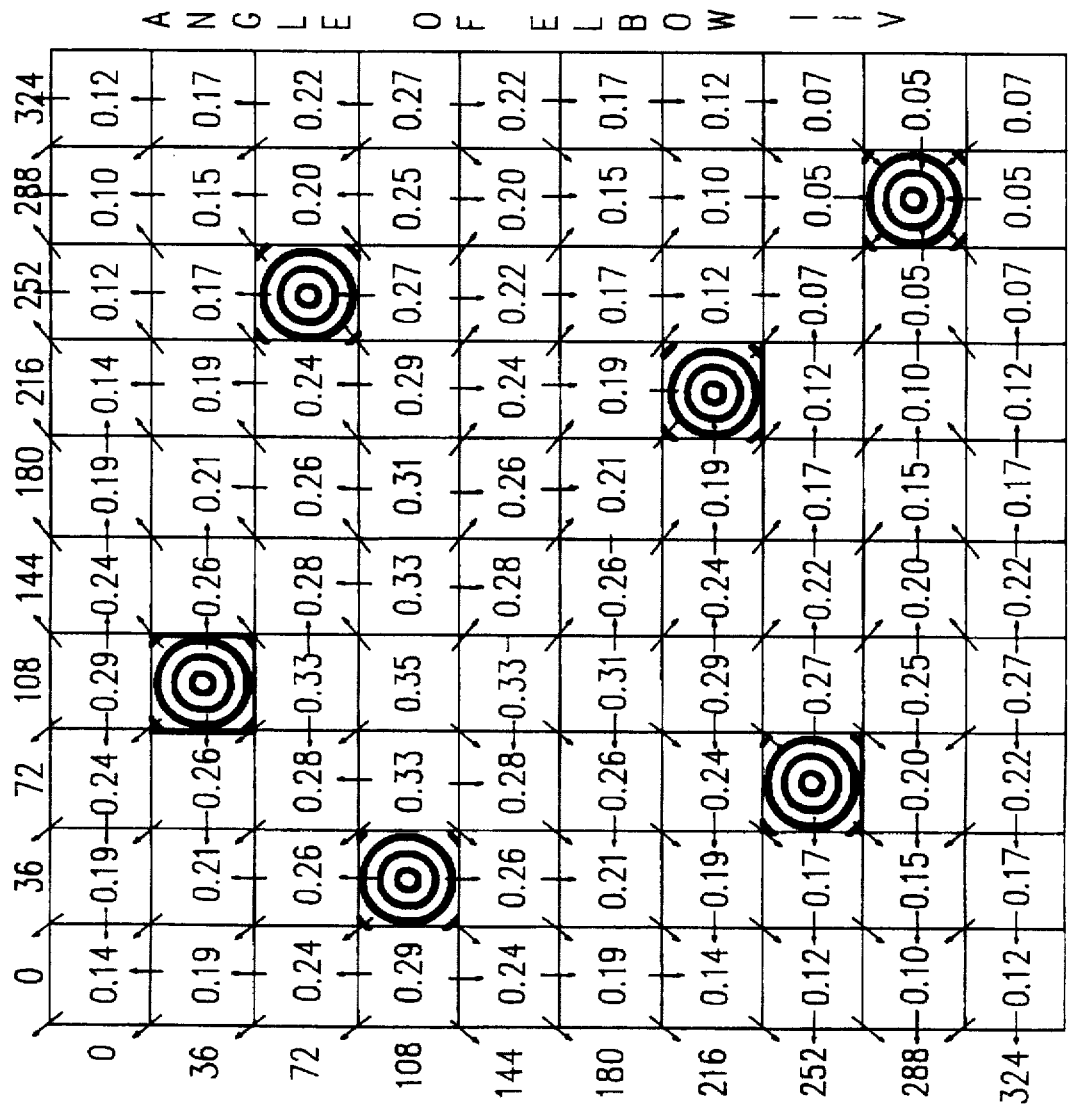

FIG. 13b shows a configuration space at an intermediate status resulting from the newly added goals of FIG. 13a.

Figure 14:
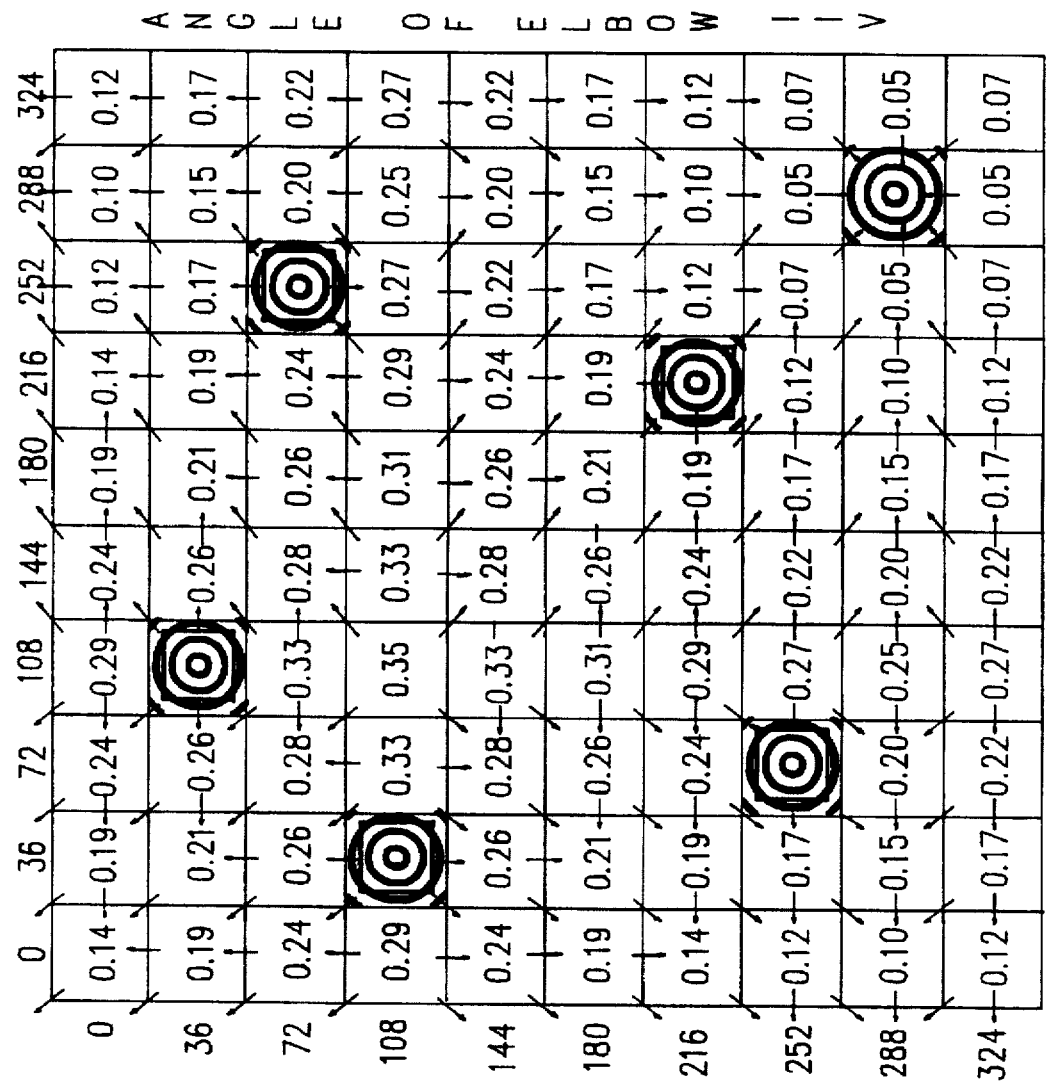

FIG. 14 shows the configuration space of FIG. 13b at a second intermediate status.

Figure 15:
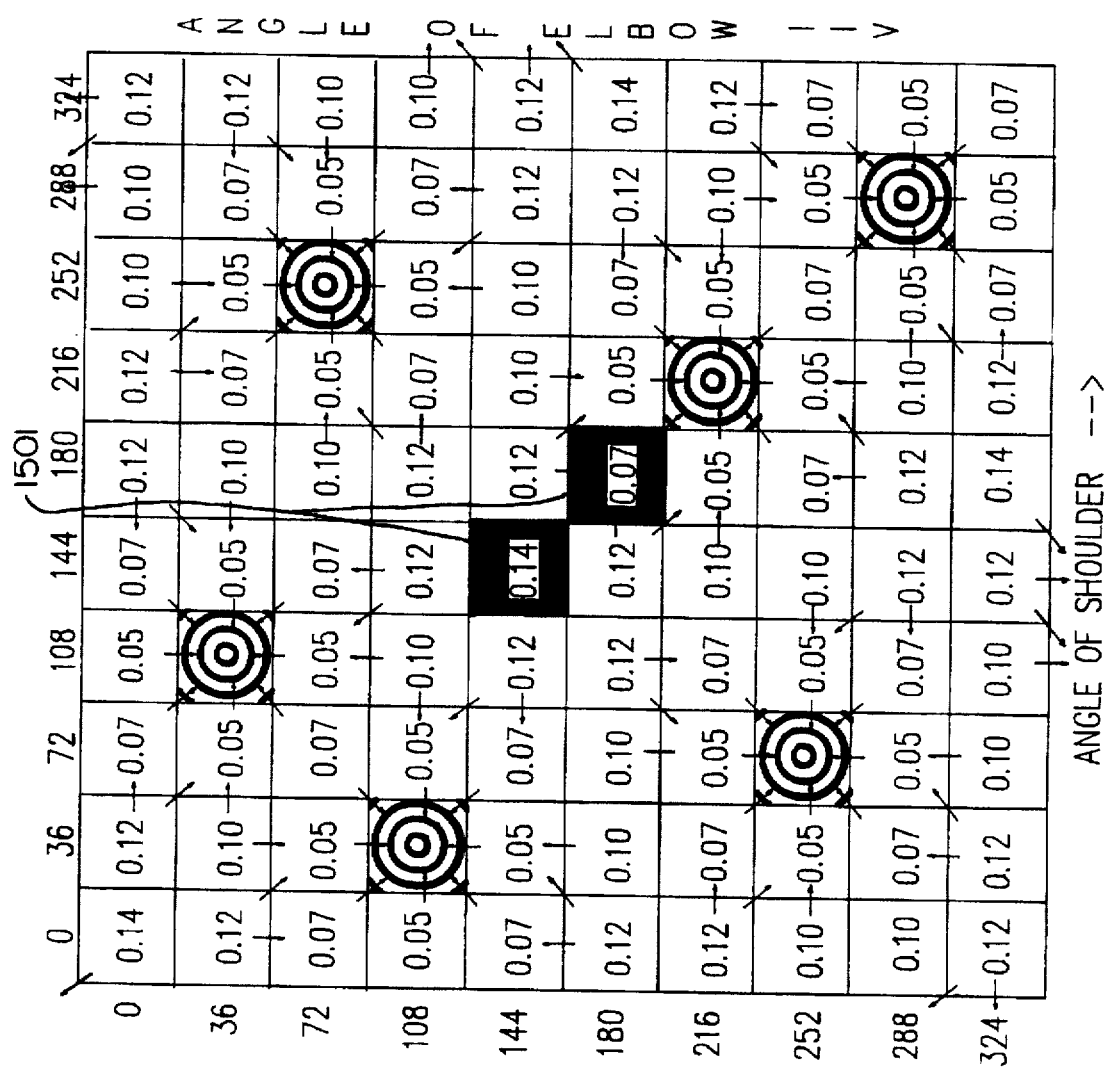

FIG. 15 shows the configuration space of FIG. 14 after budding and with a new path.

Figure 16:
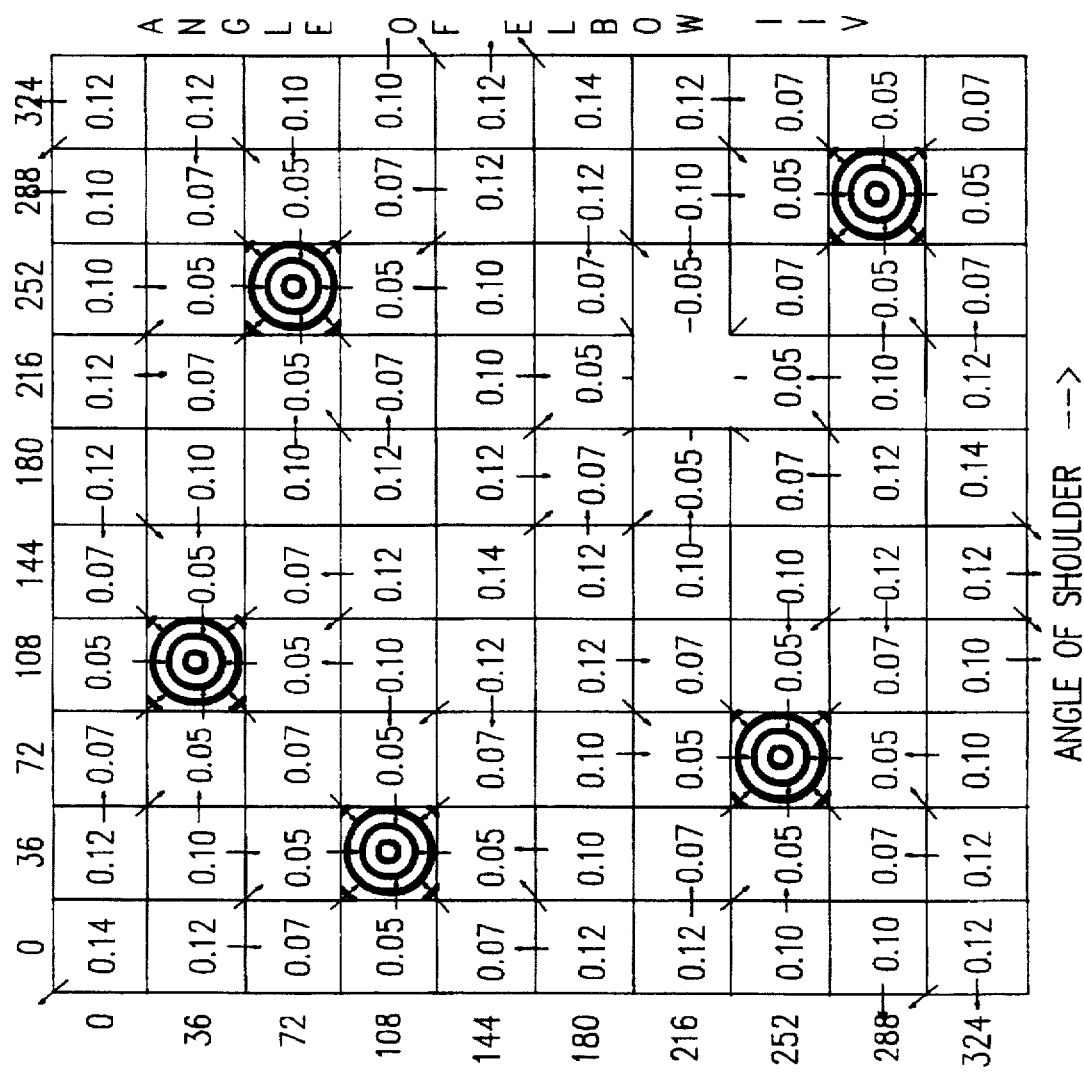

FIG. 16 shows the configuration space of FIG. 15 with a goal state removed.

Figure 17:
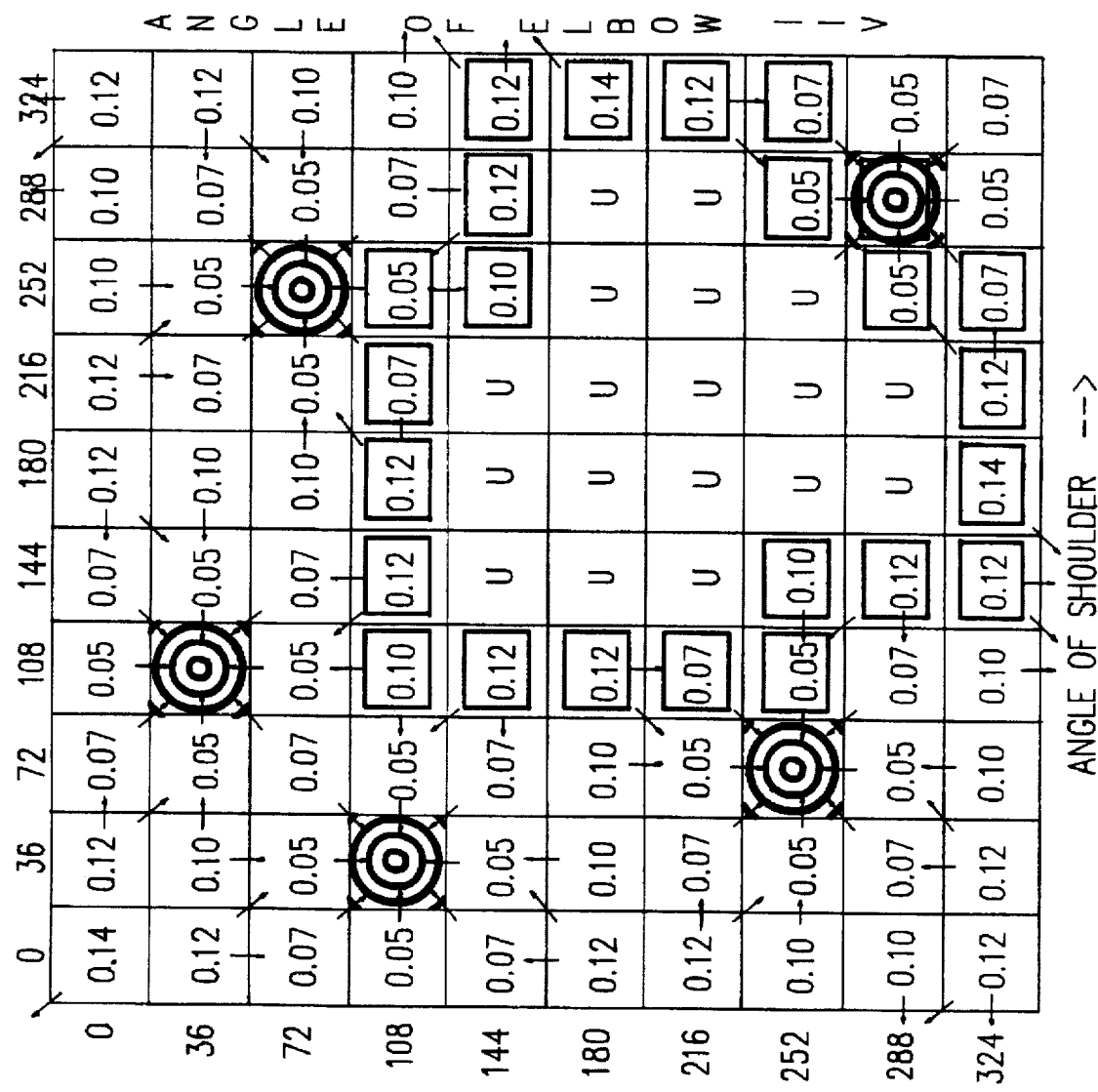

FIG. 17 shows the configuration space of FIG. 16 at an intermediate status resulting from the application of the method of FIGS. 2–7.

Figure 18:
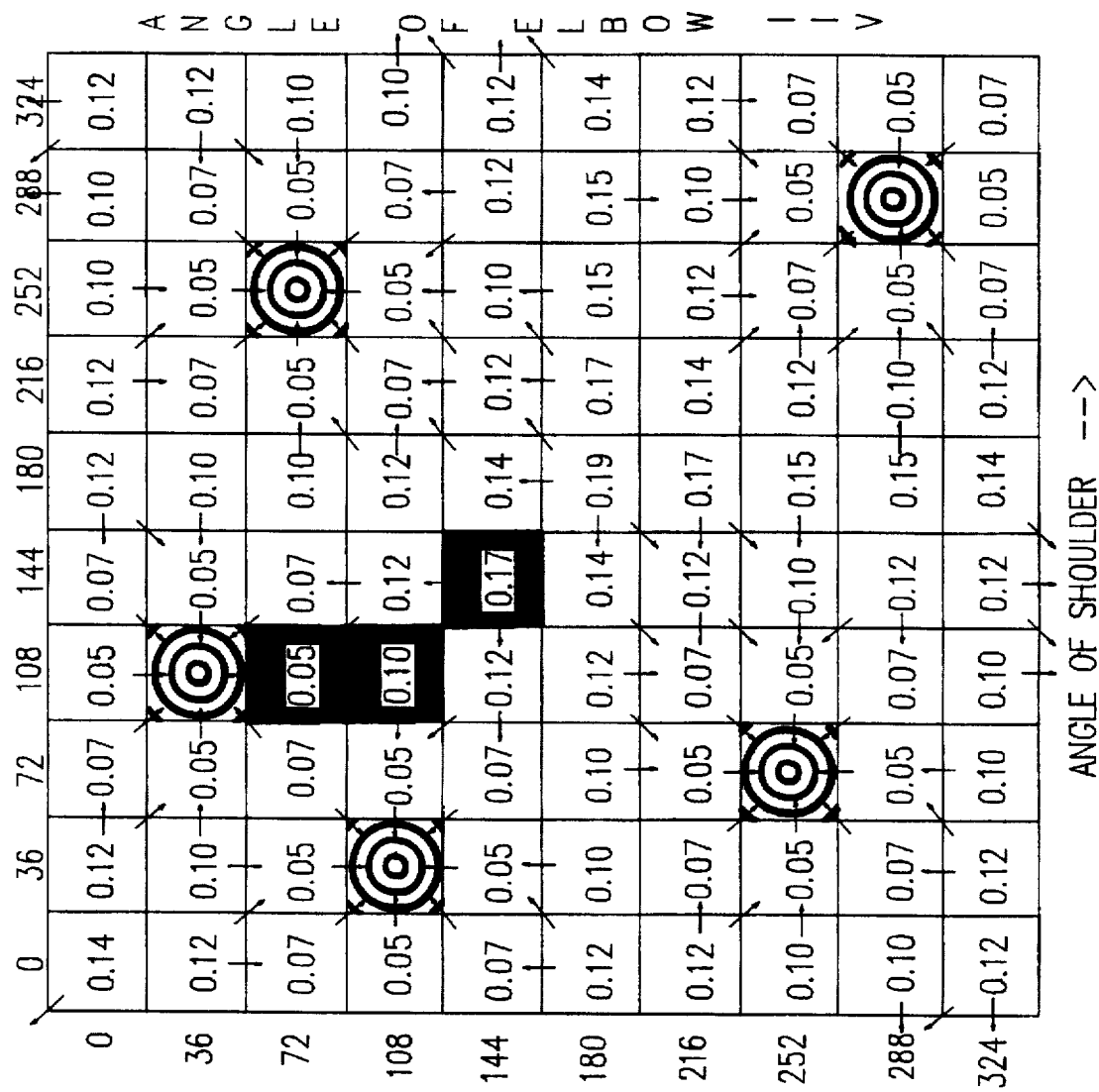

FIG. 18 shows the configuration space of FIG. 17 after budding and with a new path.

Figure 19A:
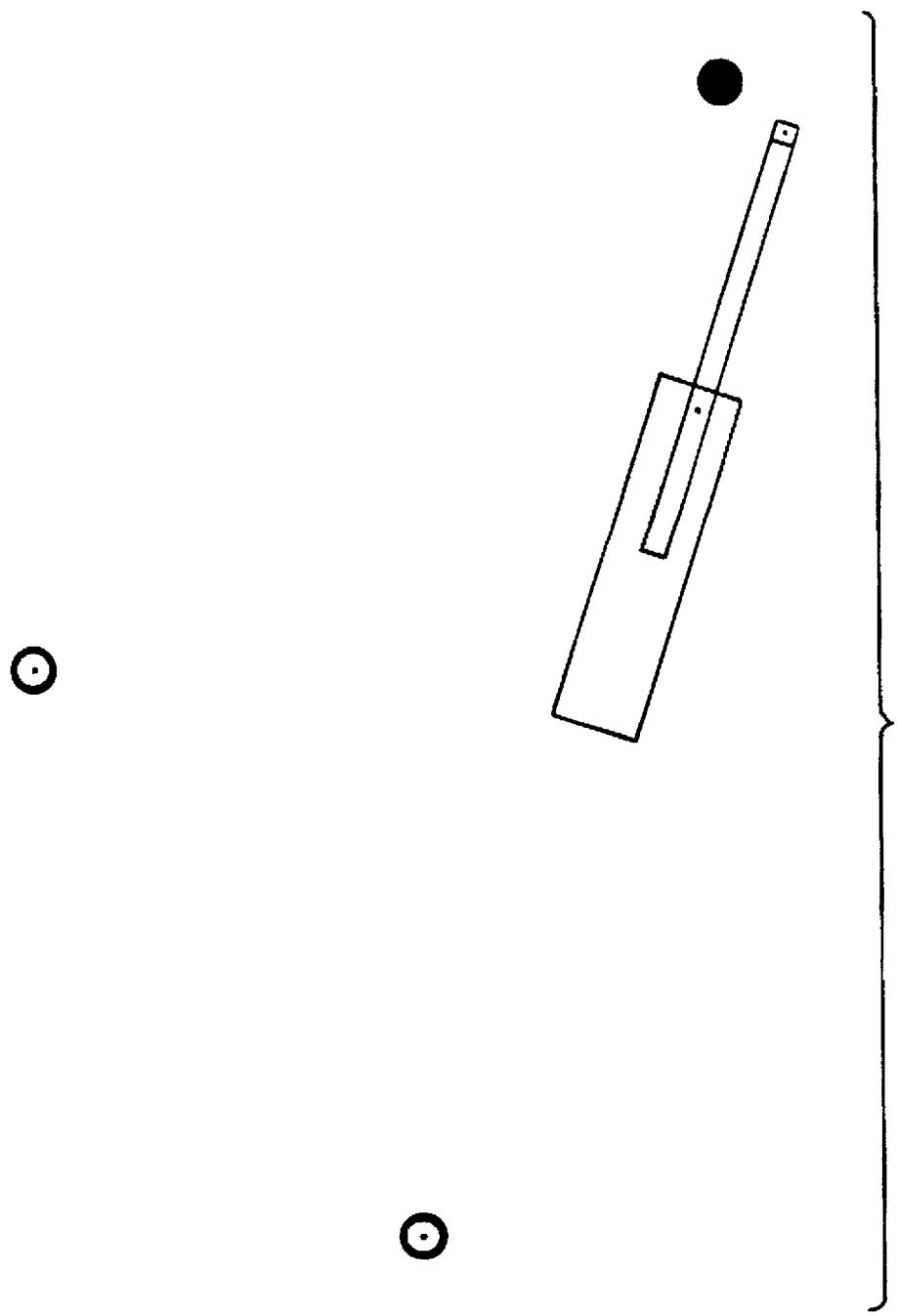
Figure 19B:
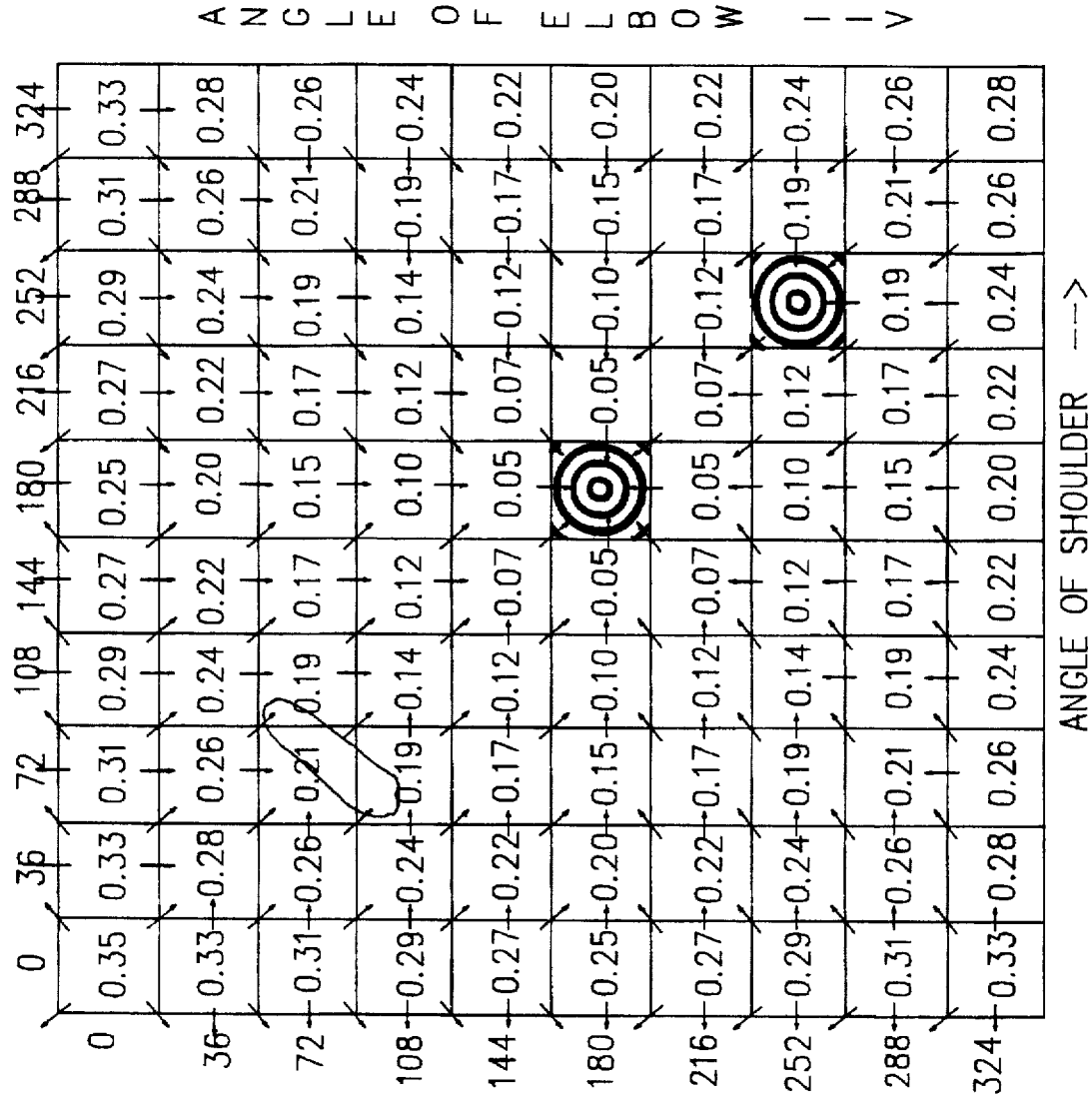

FIG. 19a shows the task space resulting in FIG. 19b.

FIG. 19b shows the configuration space of FIG. 18 with a newly added goal state and a new obstacle.

Figure 20:
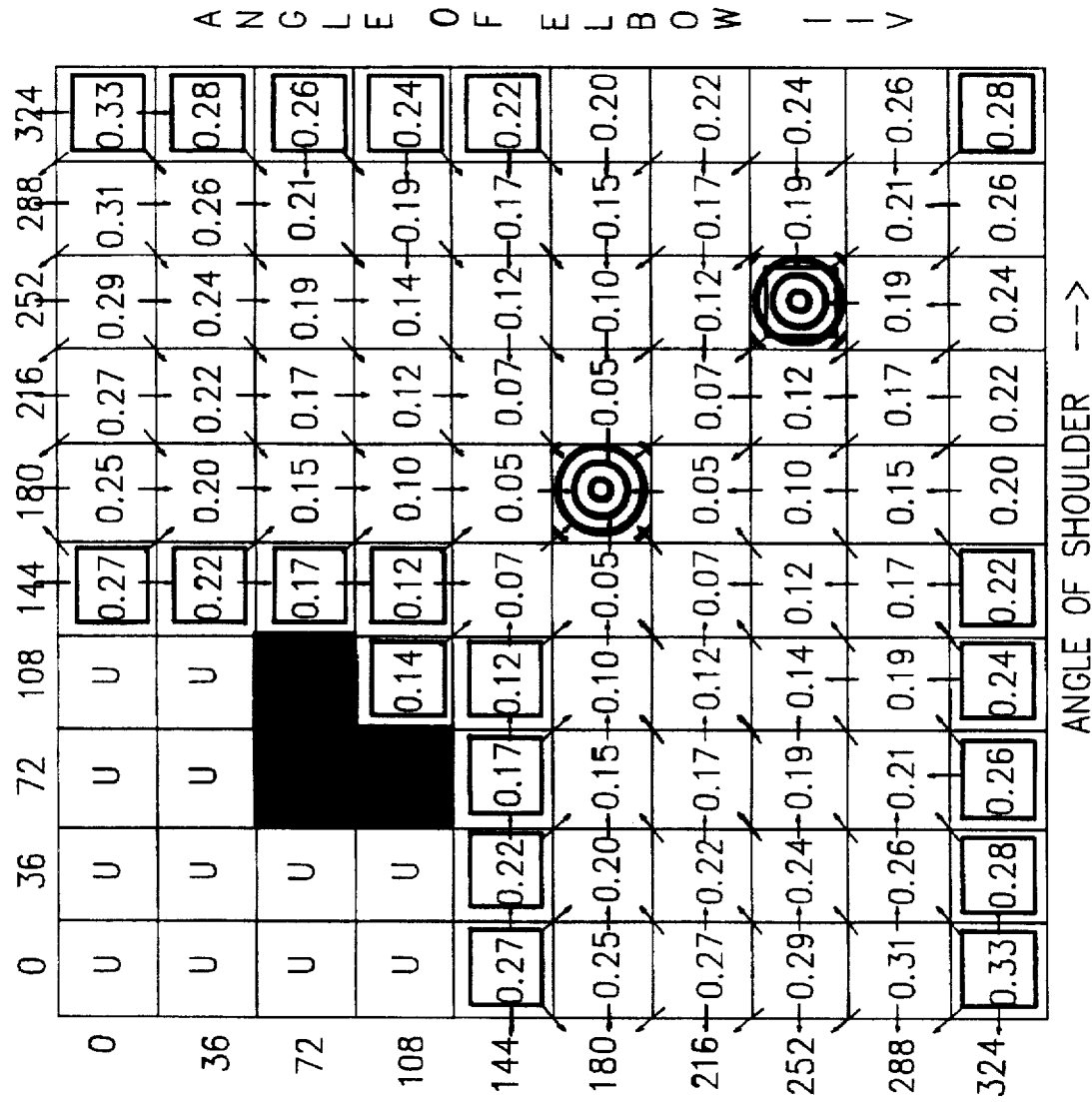

FIG. 20 shows a configuration space of FIG. 19b at an intermediate status resulting from the application of the method of FIGS. 2–7.

Figure 21:
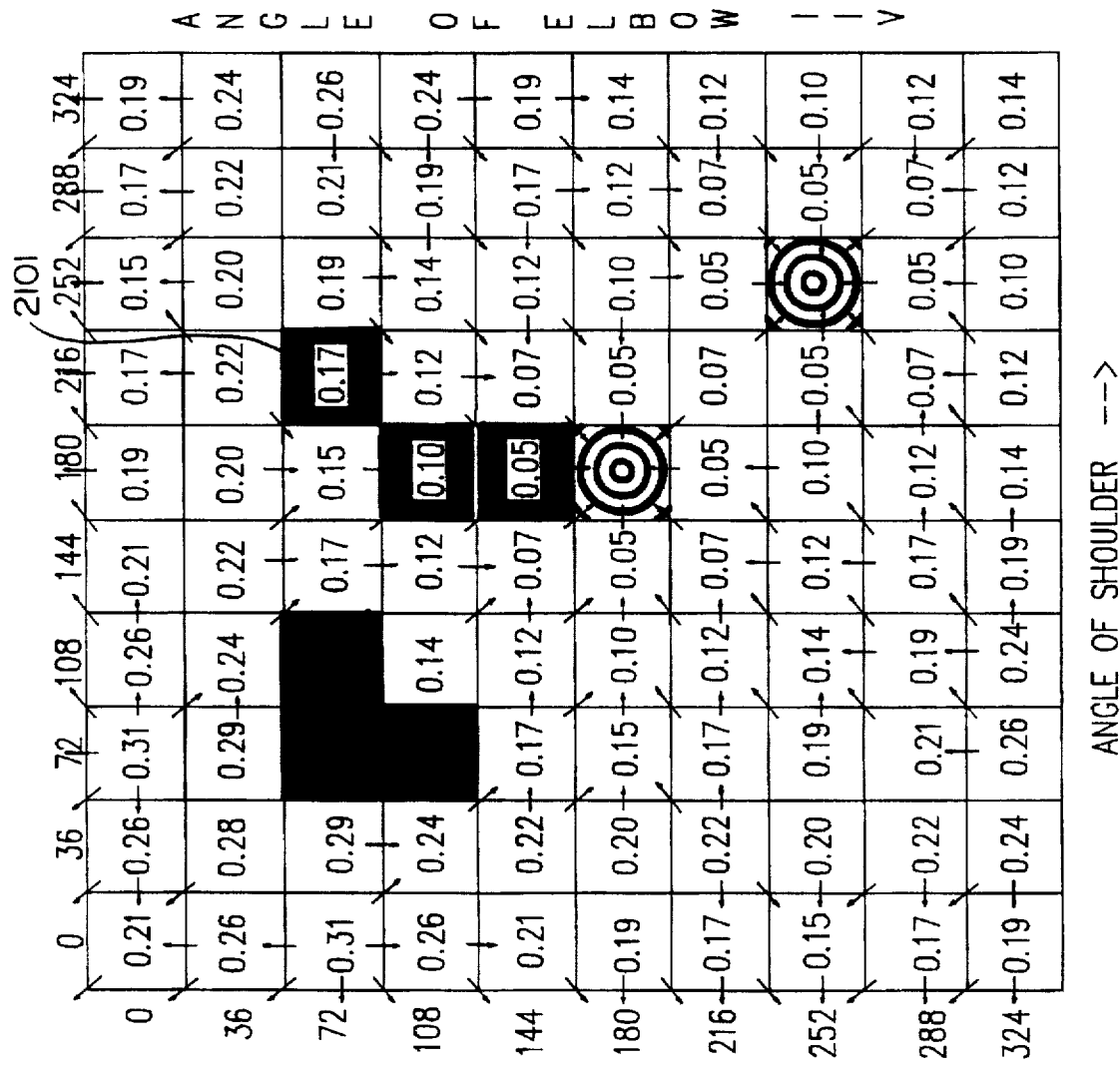

FIG. 21 shows the configuration space of FIG. 20 after budding and with a new path.

Figure 22:
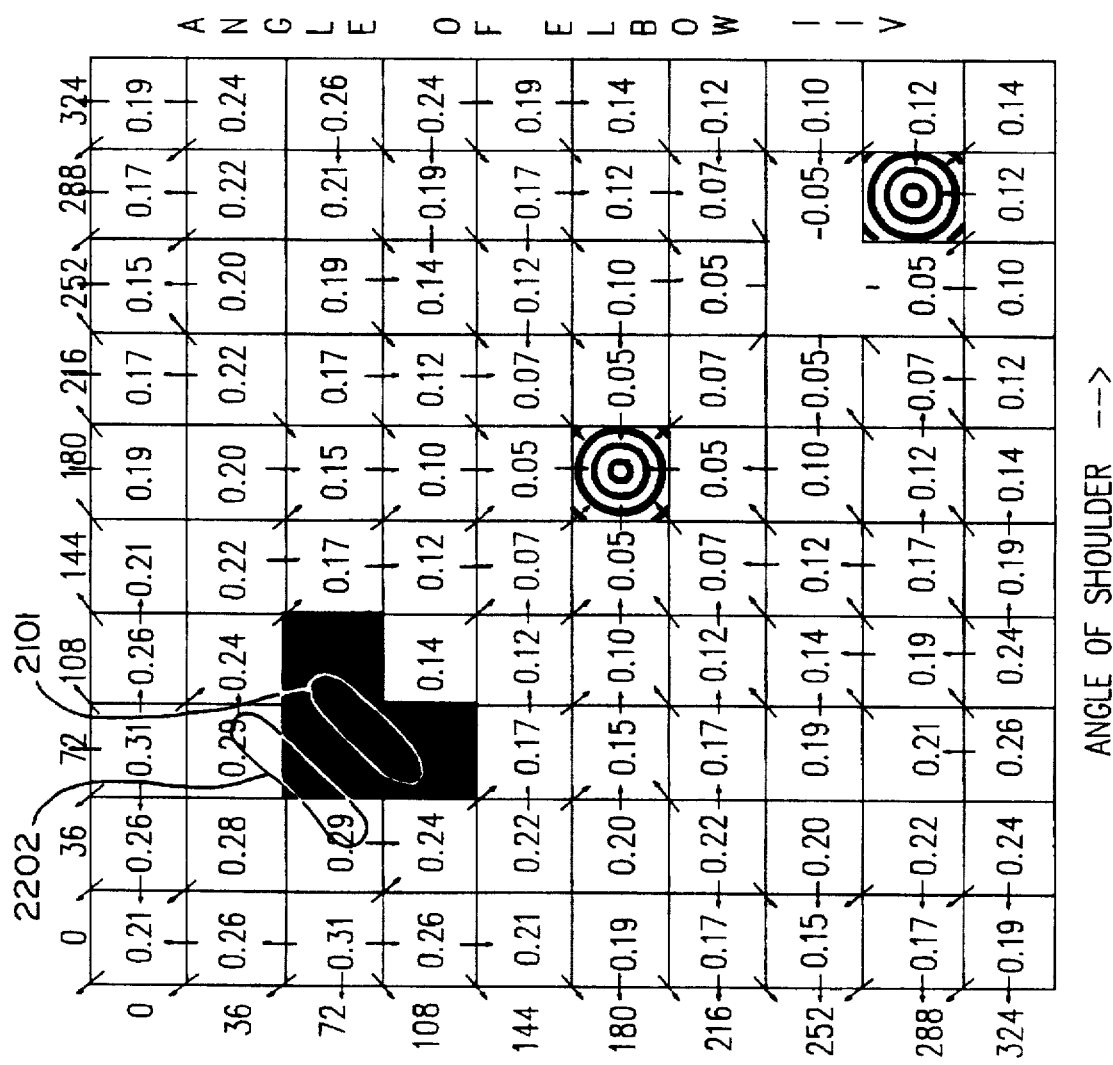

FIG. 22 shows the configuration space of FIG. 21 with the obstacle and the goal both moved slightly.

Figure 23:
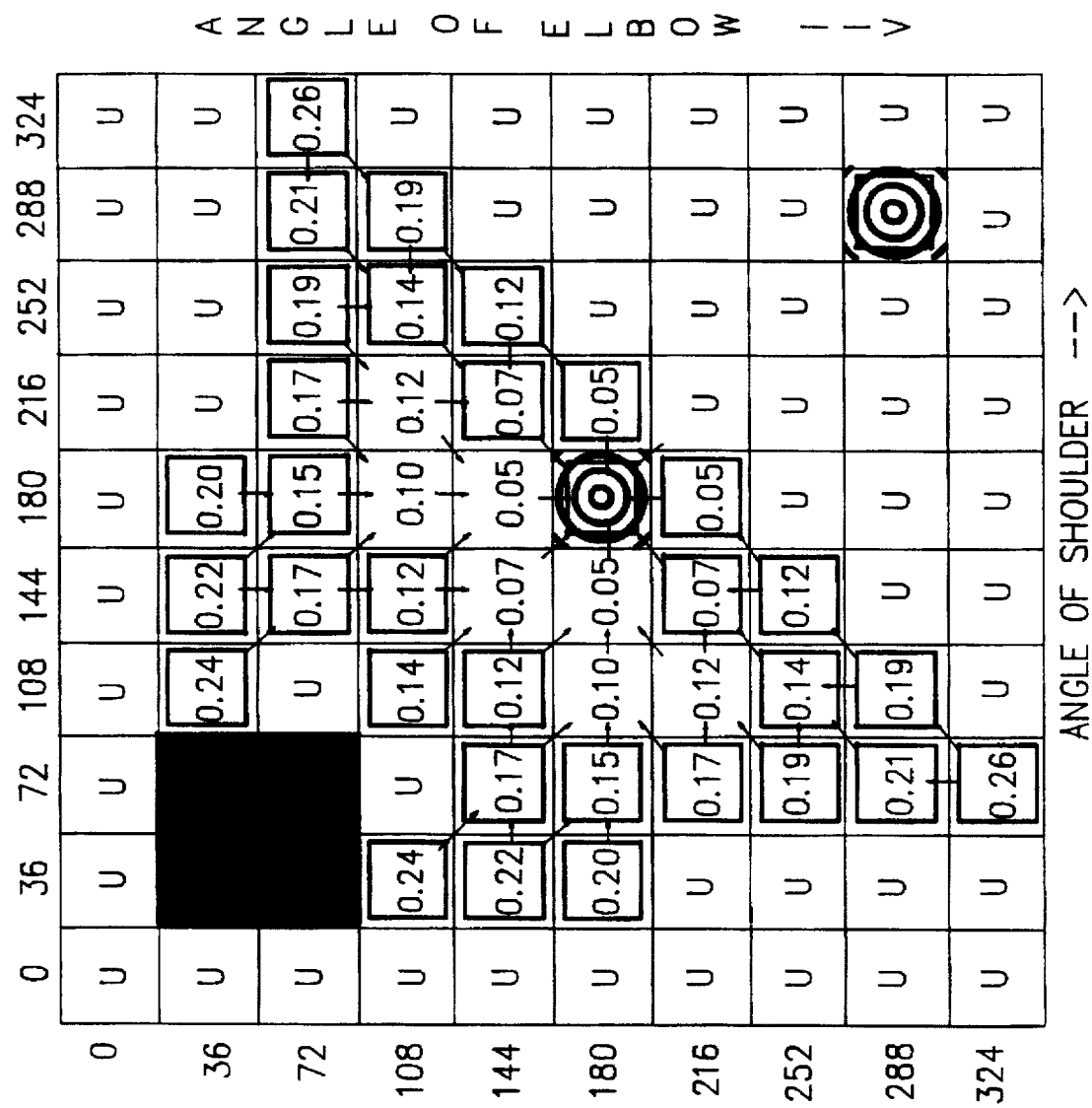

FIG. 23 shows the configuration space of FIG. 22 at an intermediate status resulting from the application of the method of FIGS. 2–7.

Figure 24:
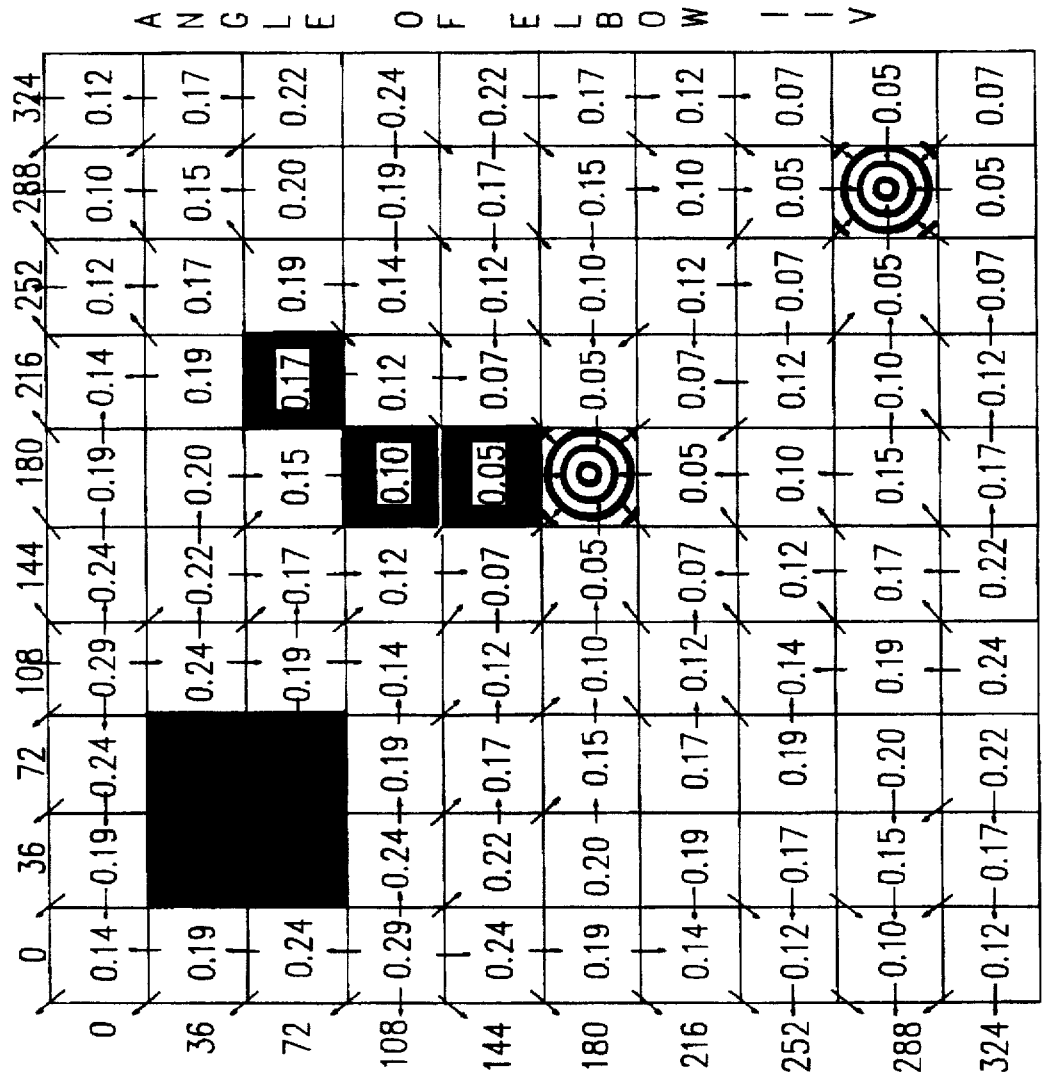

FIG. 24 shows the configuration space of FIG. 23 after budding and with a new path.

Figure 25A:
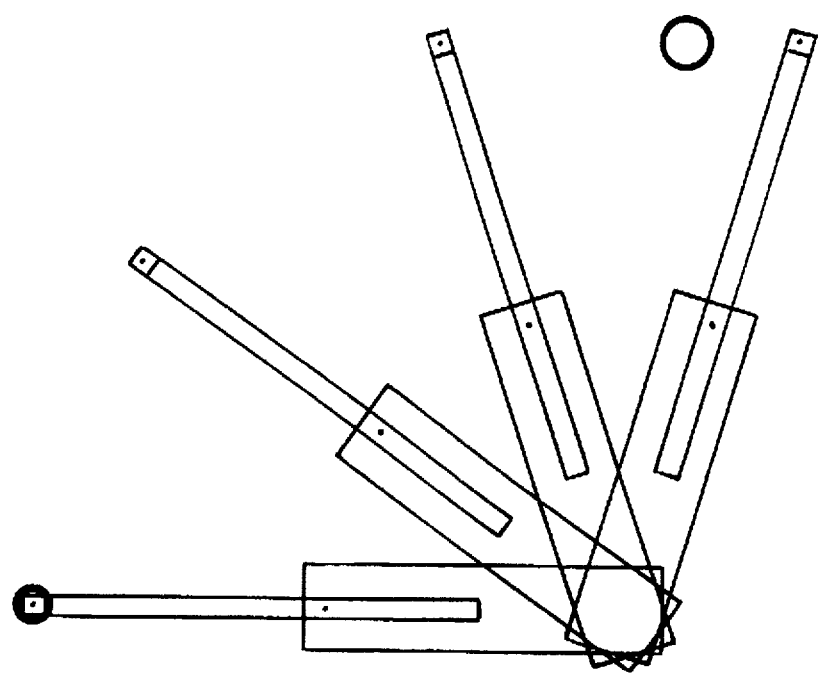

FIG. 25a shows a task space with a goal and a phantom obstacle.

Figure 25B:
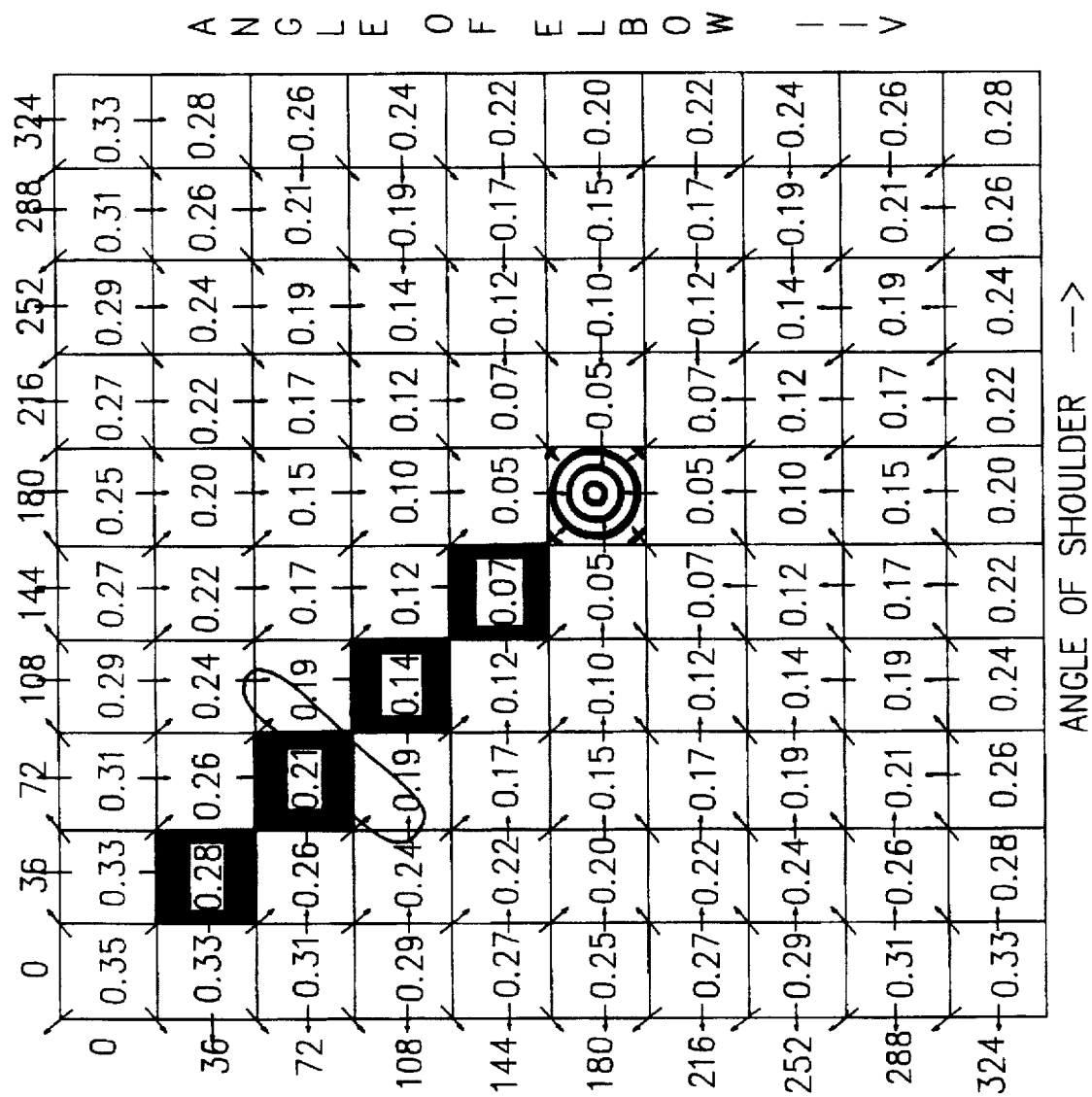

FIG. 25b shows a configuration space corresponding to the task space of FIG. 25a before the phantom obstacle is sensed.

Figure 26:
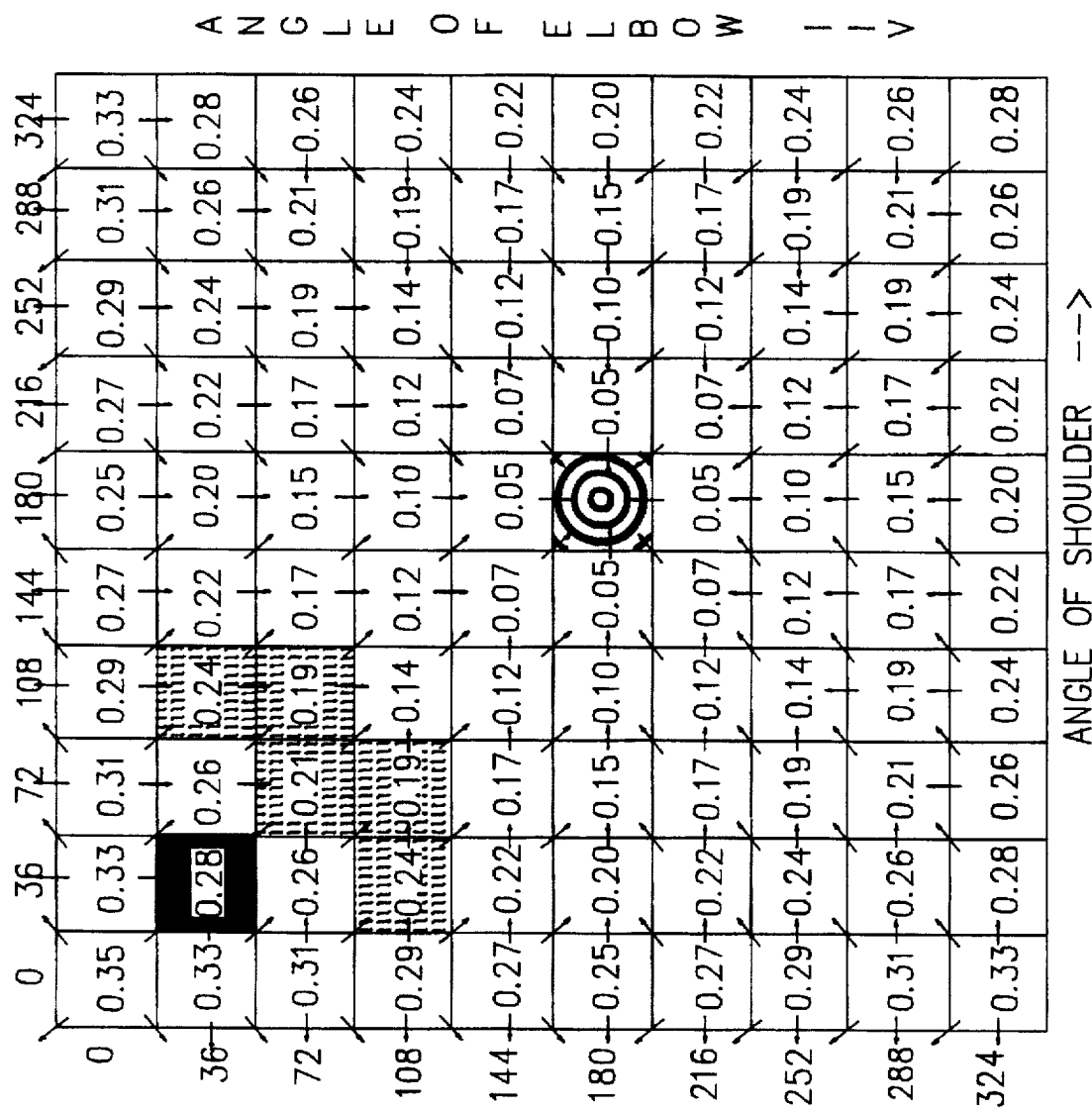

FIG. 26 shows the configuration space of FIG. 25b with the phantom obstacle discretized.

Figure 27:
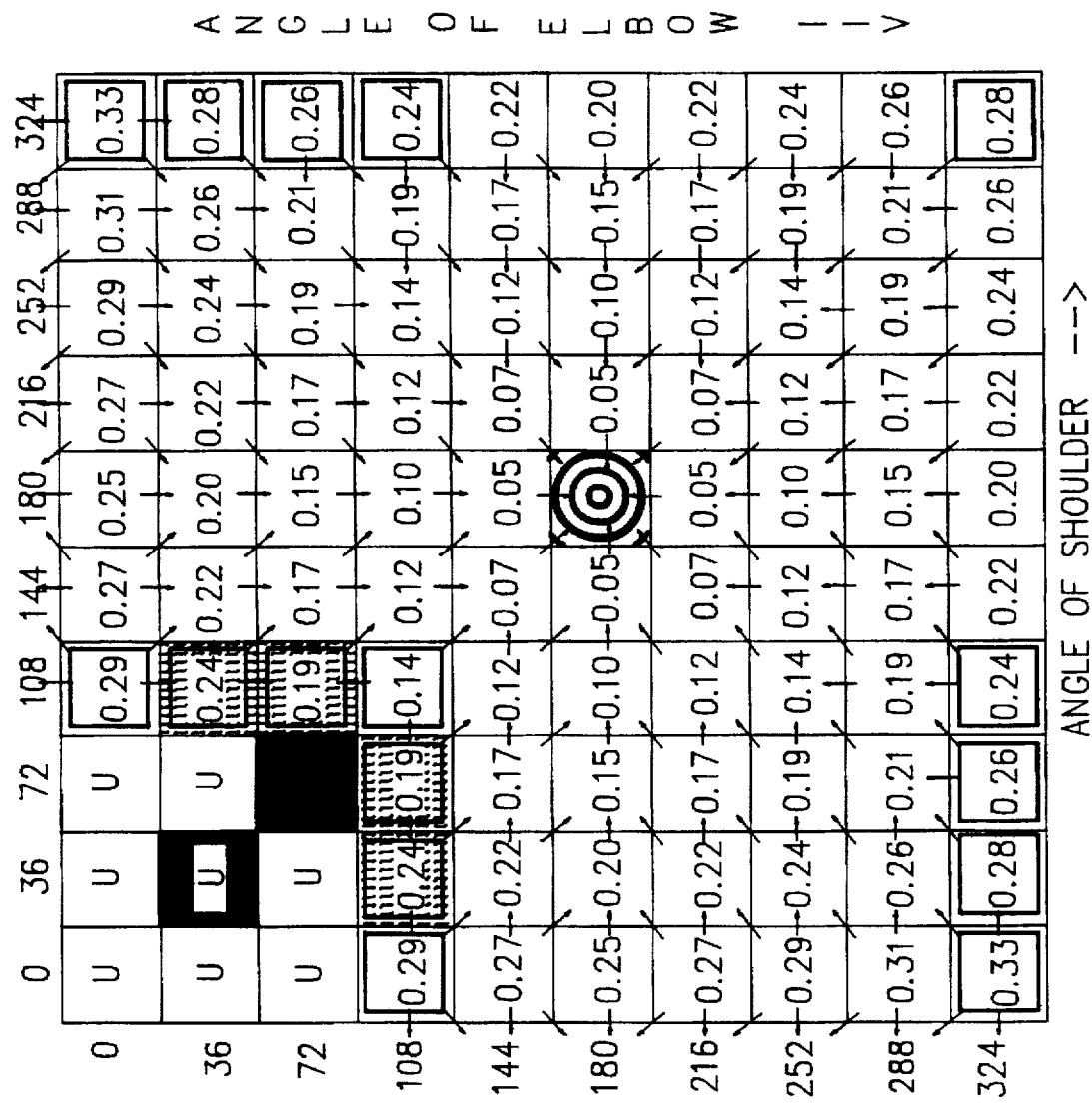

FIG. 27 shows the configuration space of FIG. 26 in an intermediate status after the robot first encounters the phantom obstacle and after the application of the method of FIGS. 2–7.

Figure 28:
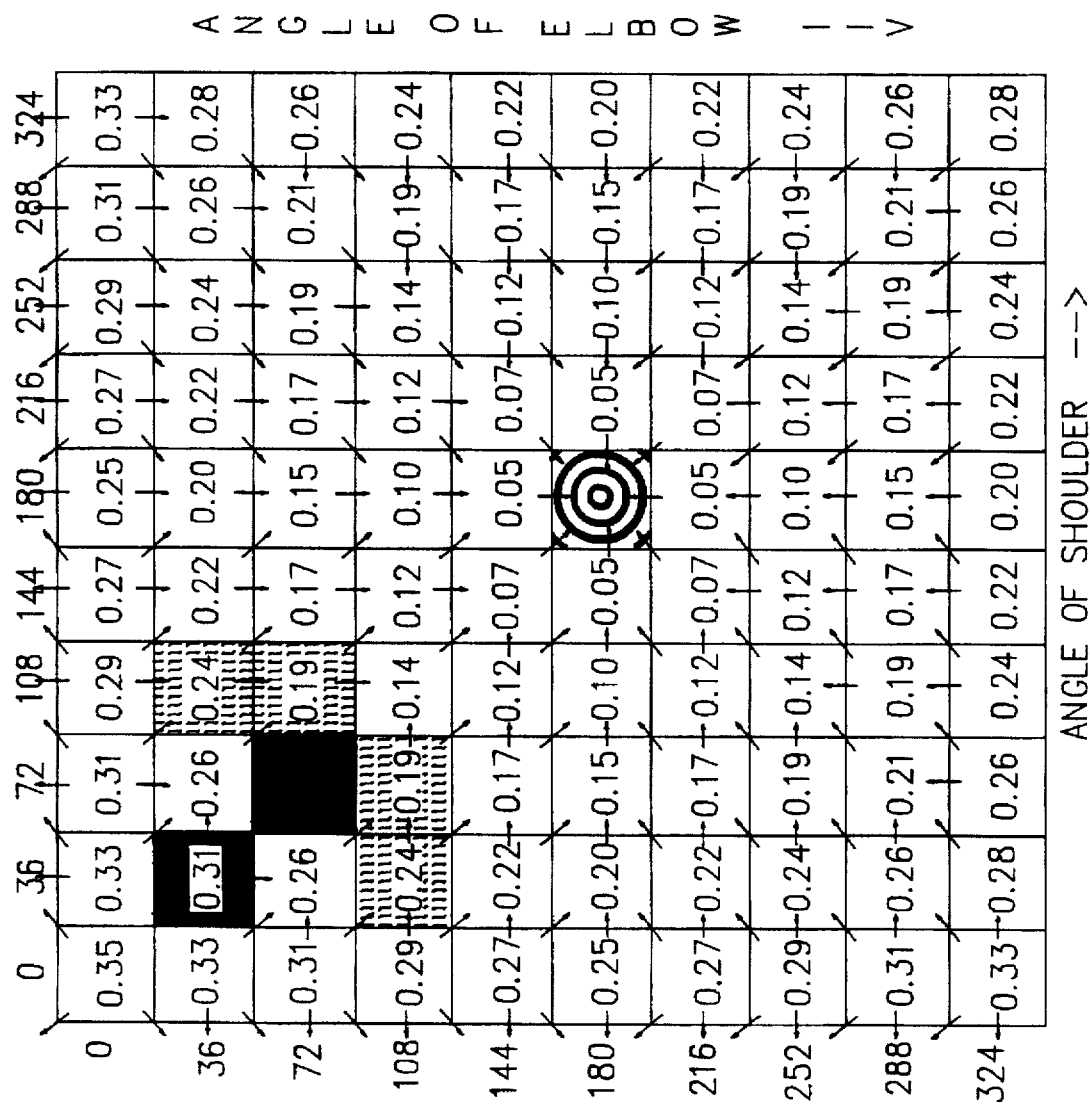

FIG. 28 shows the configuration space of FIG. 27 after budding.

Figure 29:
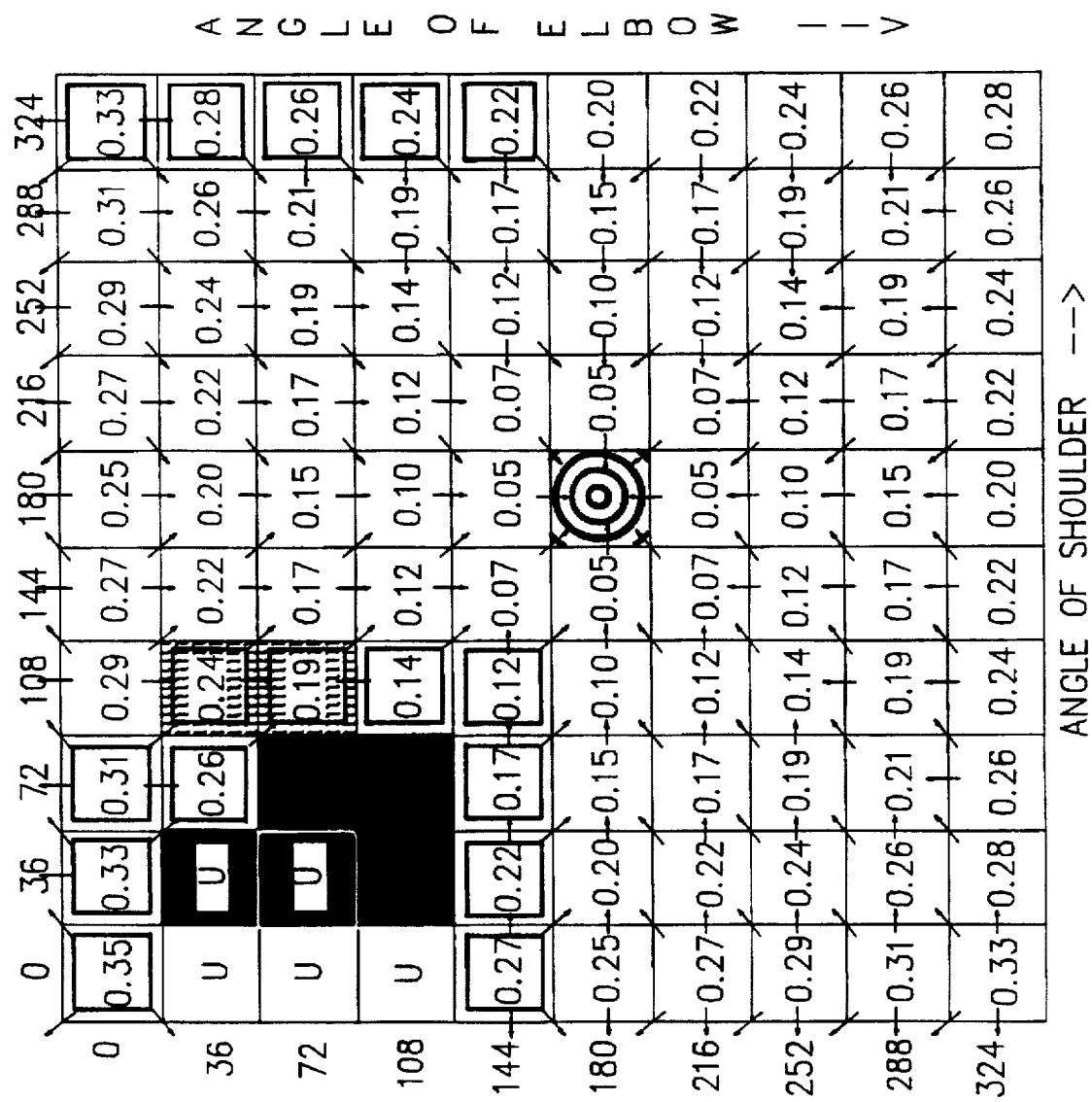

FIG. 29 shows the configuration space of FIG. 28 in an intermediate status after the robot encounters the phantom obstacle for the second time and after the application of the method of FIGS. 2–7.

Figure 30:
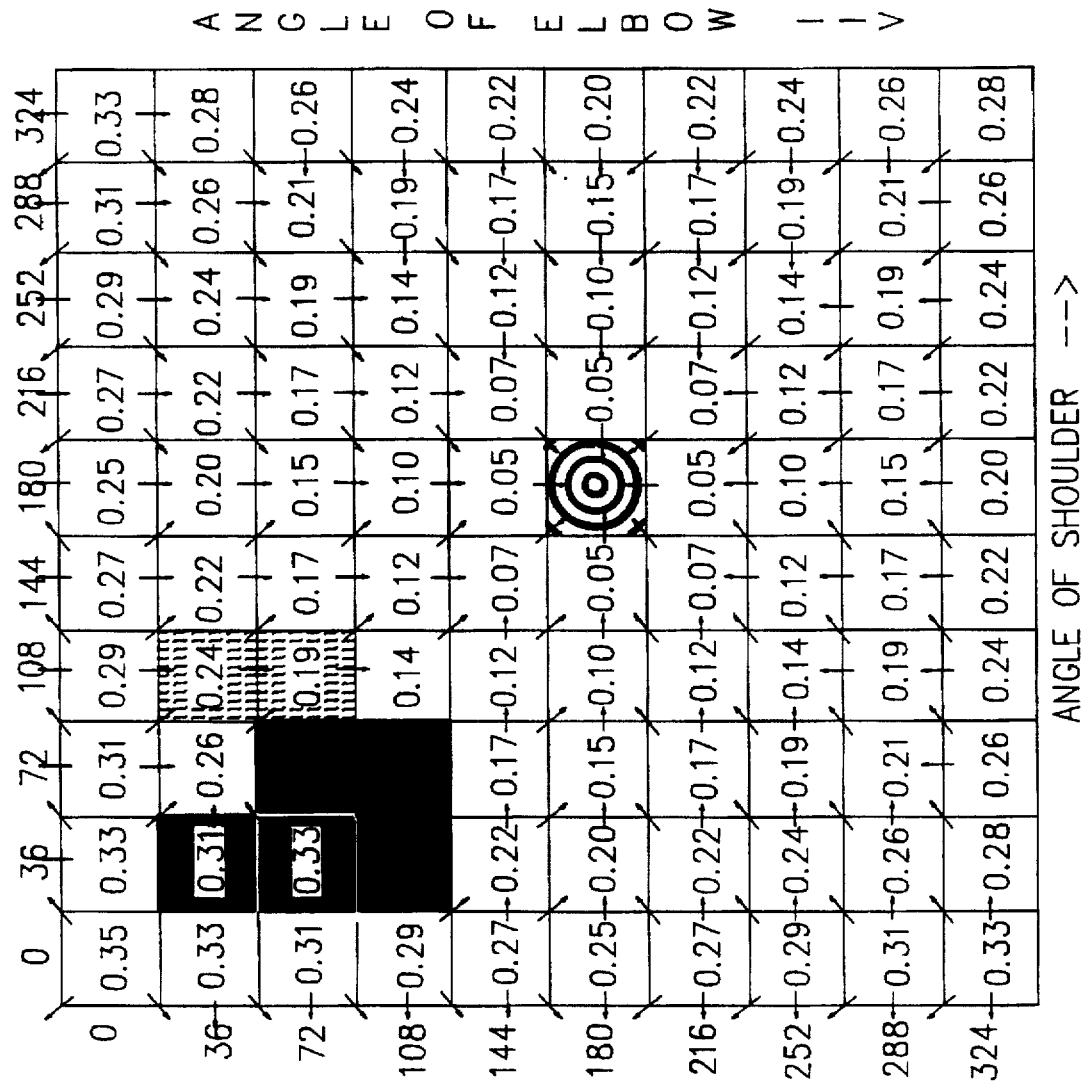

FIG. 30 shows the configuration space of FIG. 29 after budding.

Figure 31:
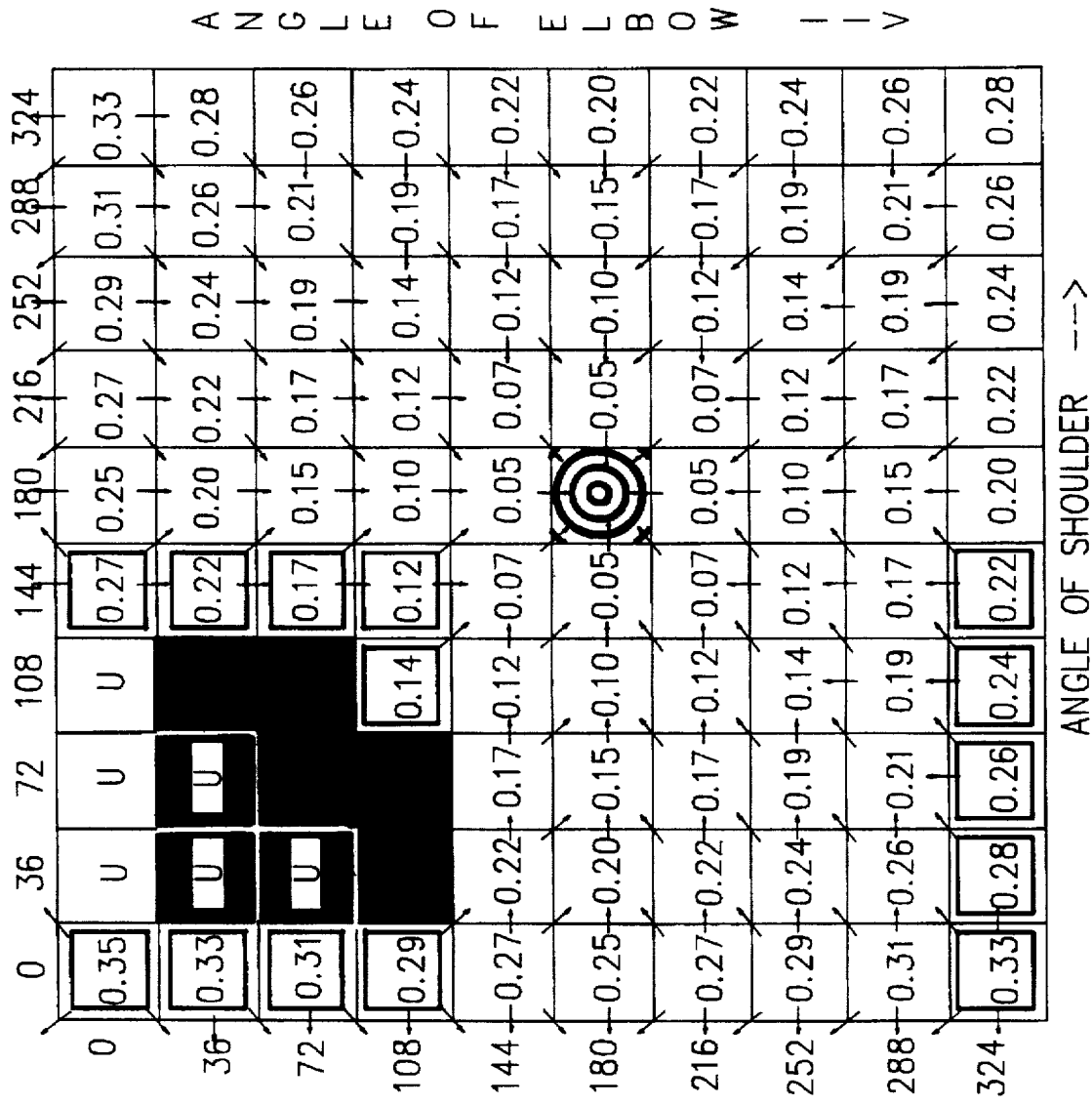

FIG. 31 shows the configuration space of FIG. 30 in an intermediate status after the robot encounters the phantom obstacle for the third time and after the application of the method of FIGS. 2–7.

Figure 32:
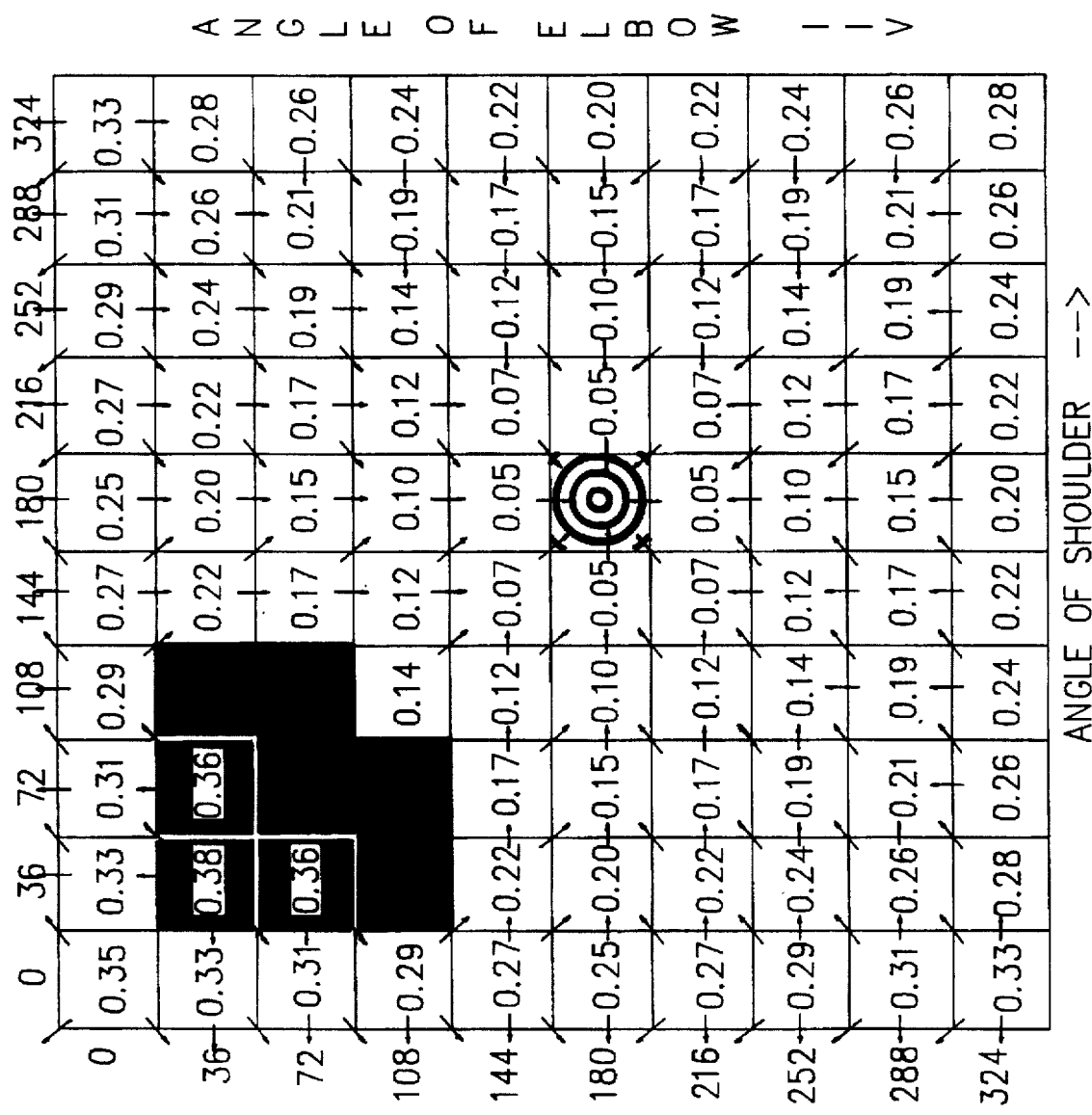

FIG. 32 shows the configuration space of FIG. 31 after budding.

FIG. 33 shows the configuration space of FIG. 32 with the newly calculated path.

Figure 34A:
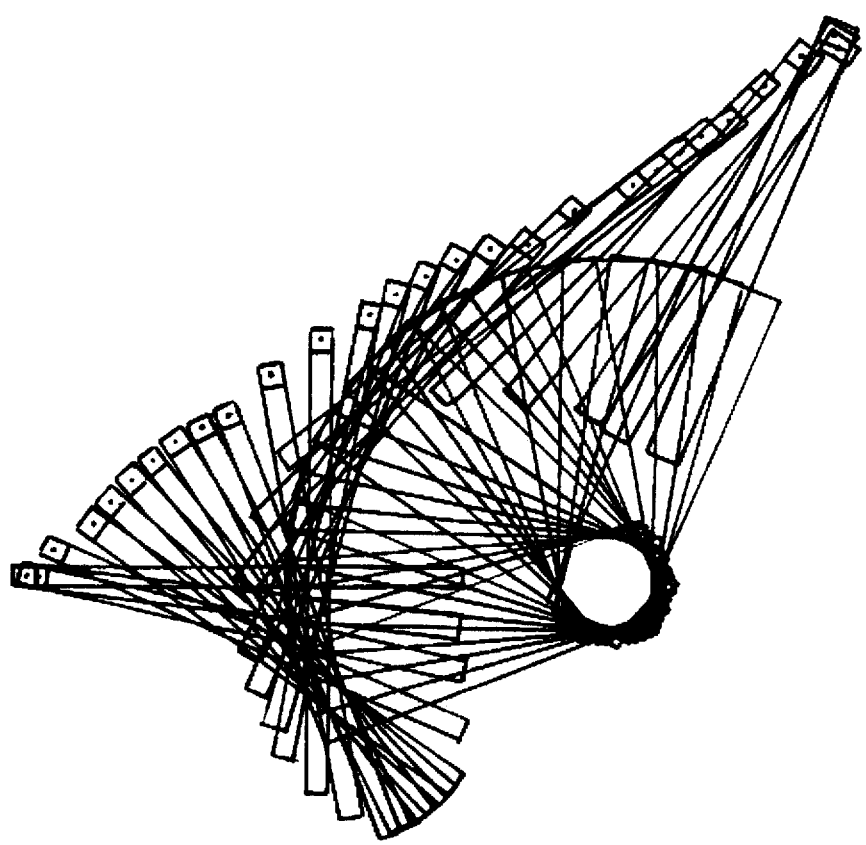

FIG. 34a shows a task space with one goal and a two-link robot following a path which minimizes the distance of travel of the end-effector.

Figure 34B:
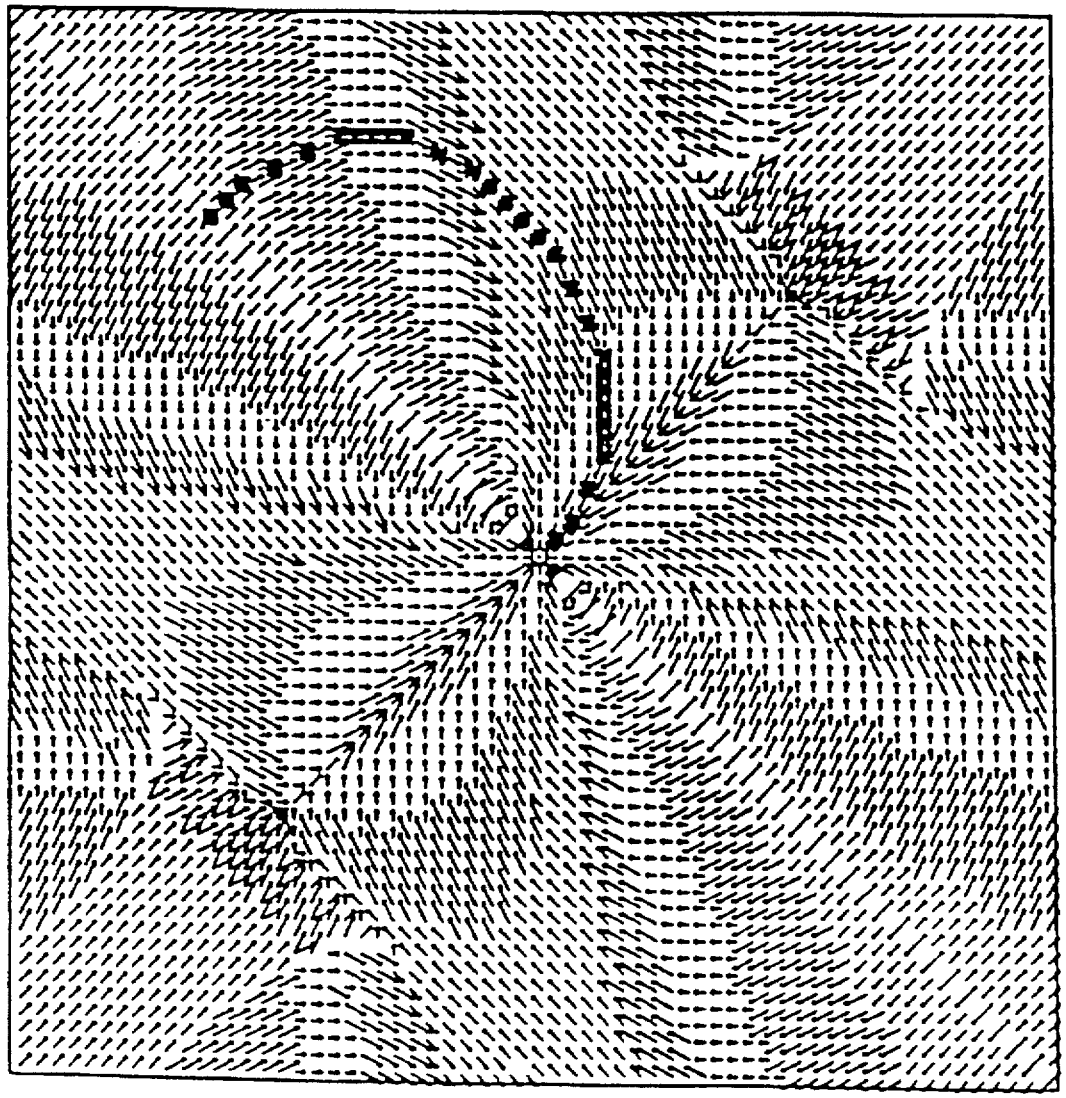

FIG. 34b shows the configuration space corresponding to FIG. 34a.

Figure 35A:
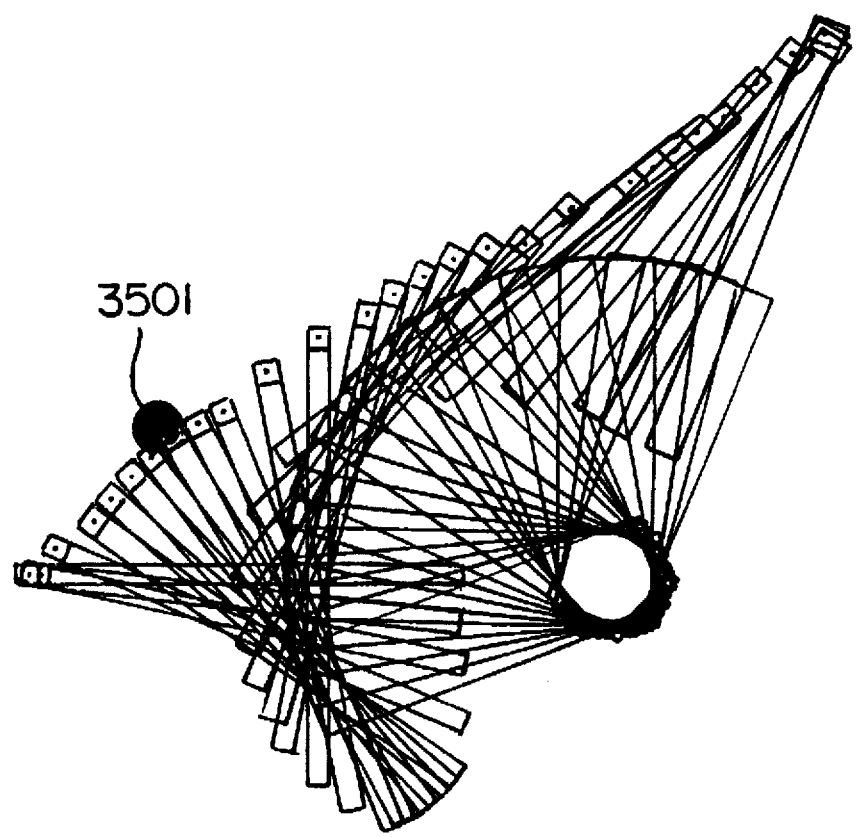

FIG. 35a shows the task space of FIG. 34a with a newly added obstacle.

Figure 35B:
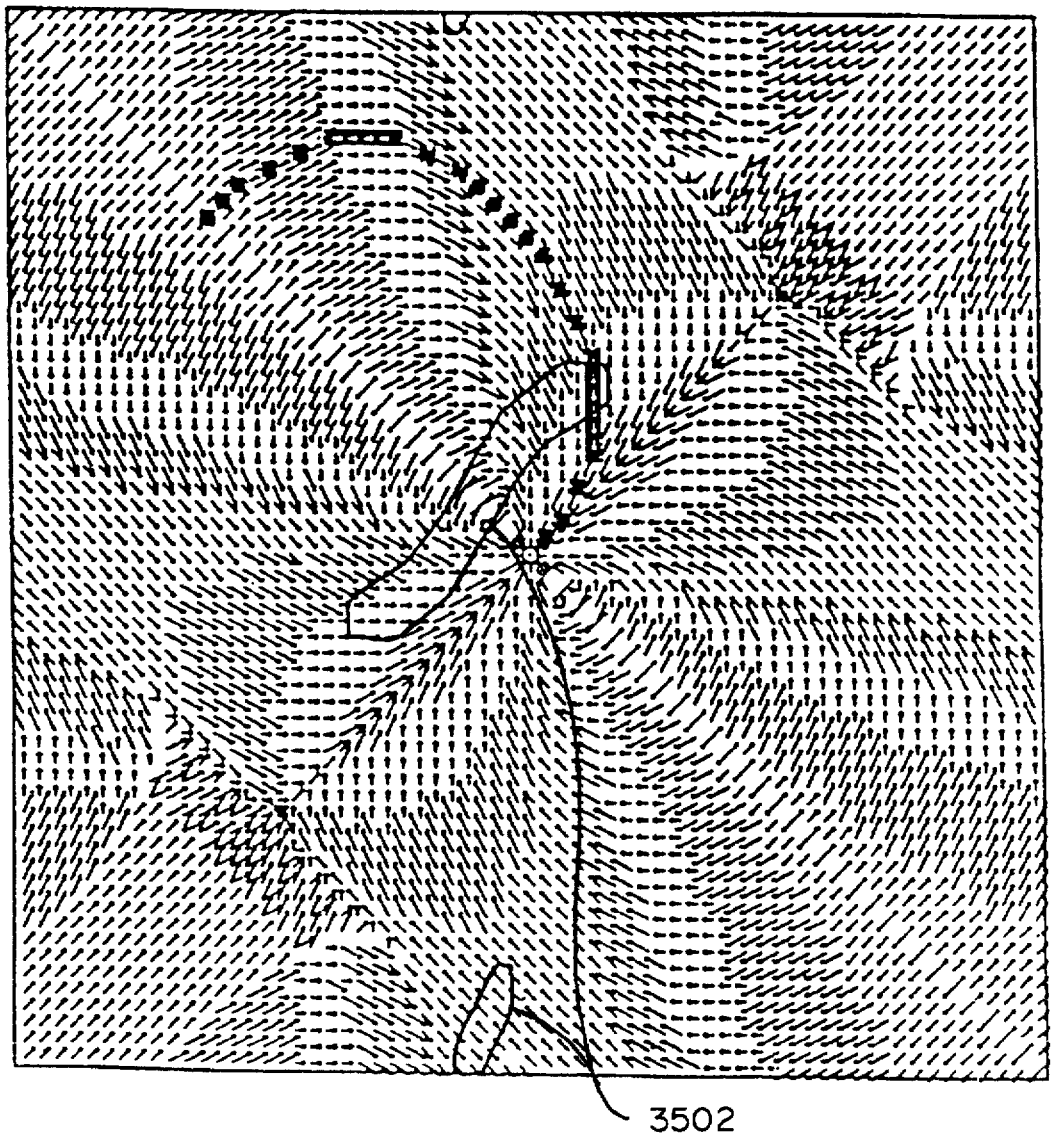

FIG. 35b shows the configuration space of FIG. 34b with an outline of the newly added obstacle.

Figure 36:
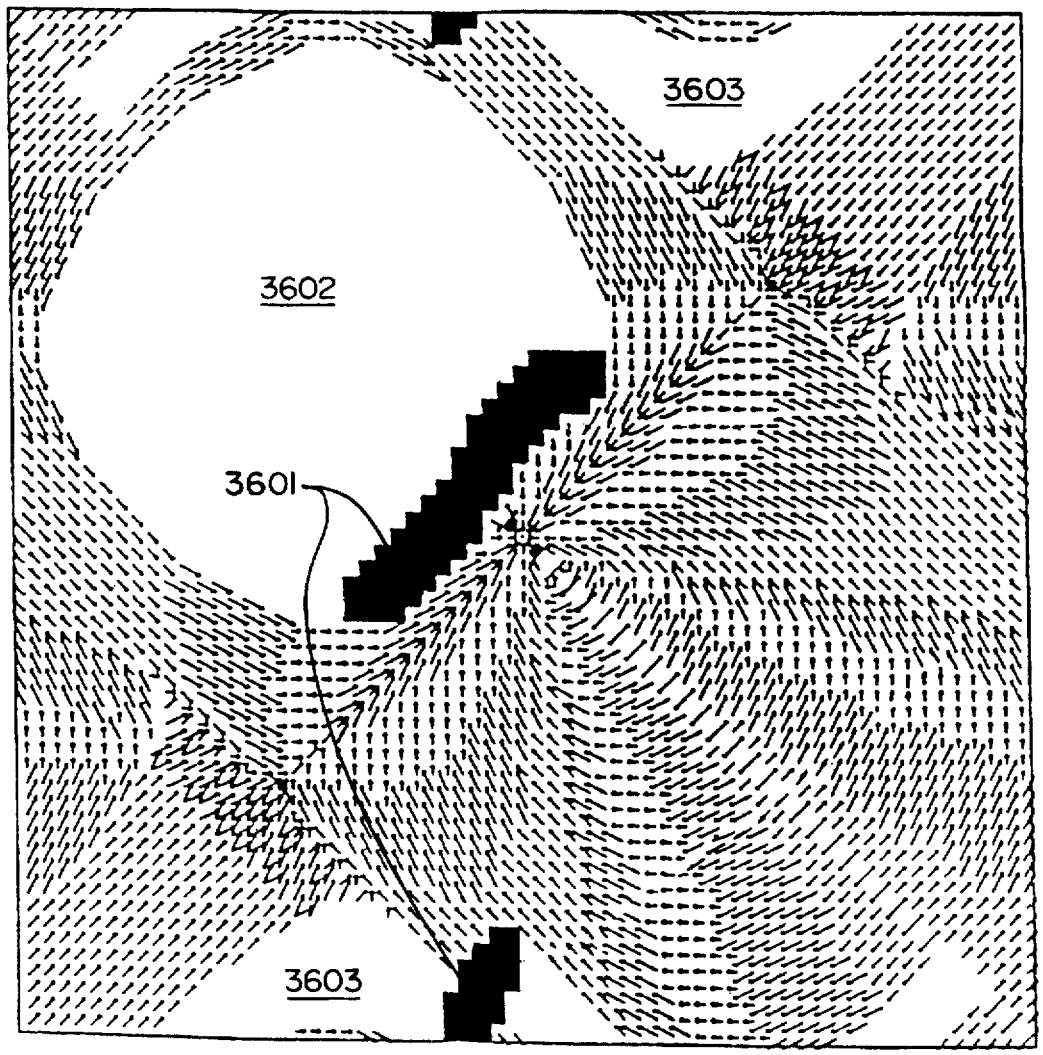

FIG. 36 shows the configuration space of FIG. 35 at an intermediate status after adding the obstacle and after applying the method of FIGS. 2–7.

Figure 37:
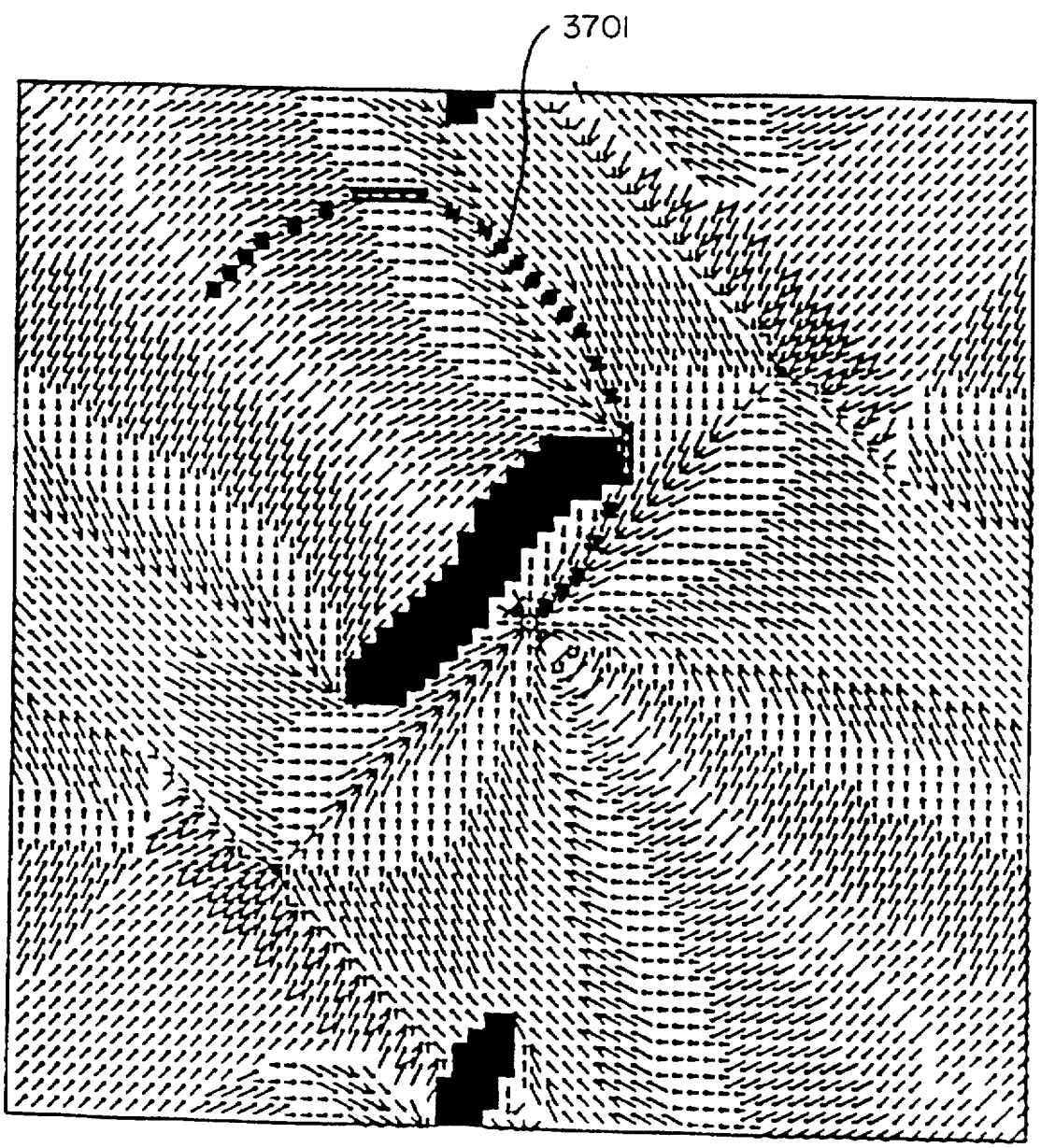

FIG. 37 shows the configuration space of FIG. 36 after budding.

Figure 38:
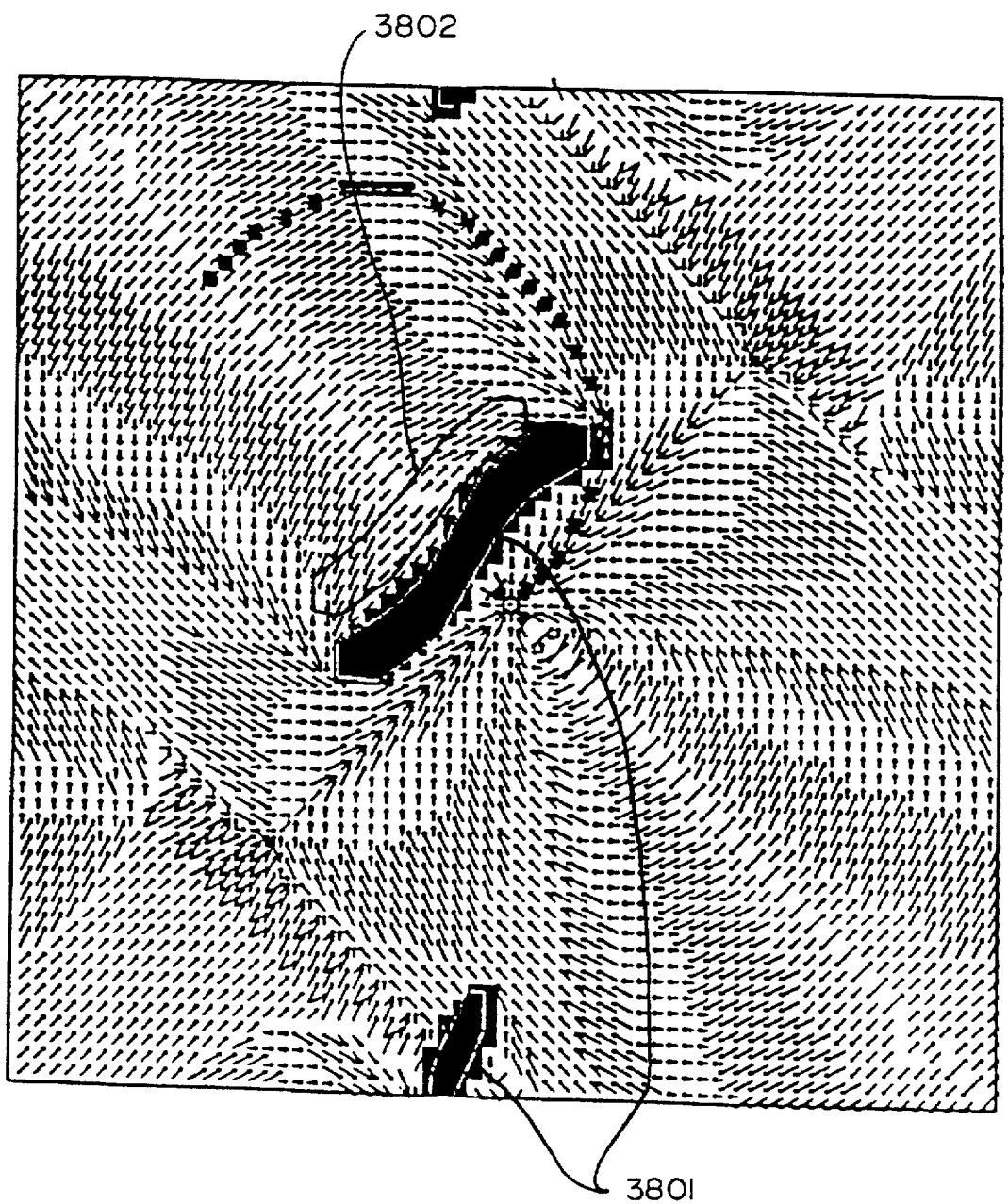

FIG. 38 shows the configuration space of FIG. 37 with a new position for the obstacle indicated in outline.

Figure 39:
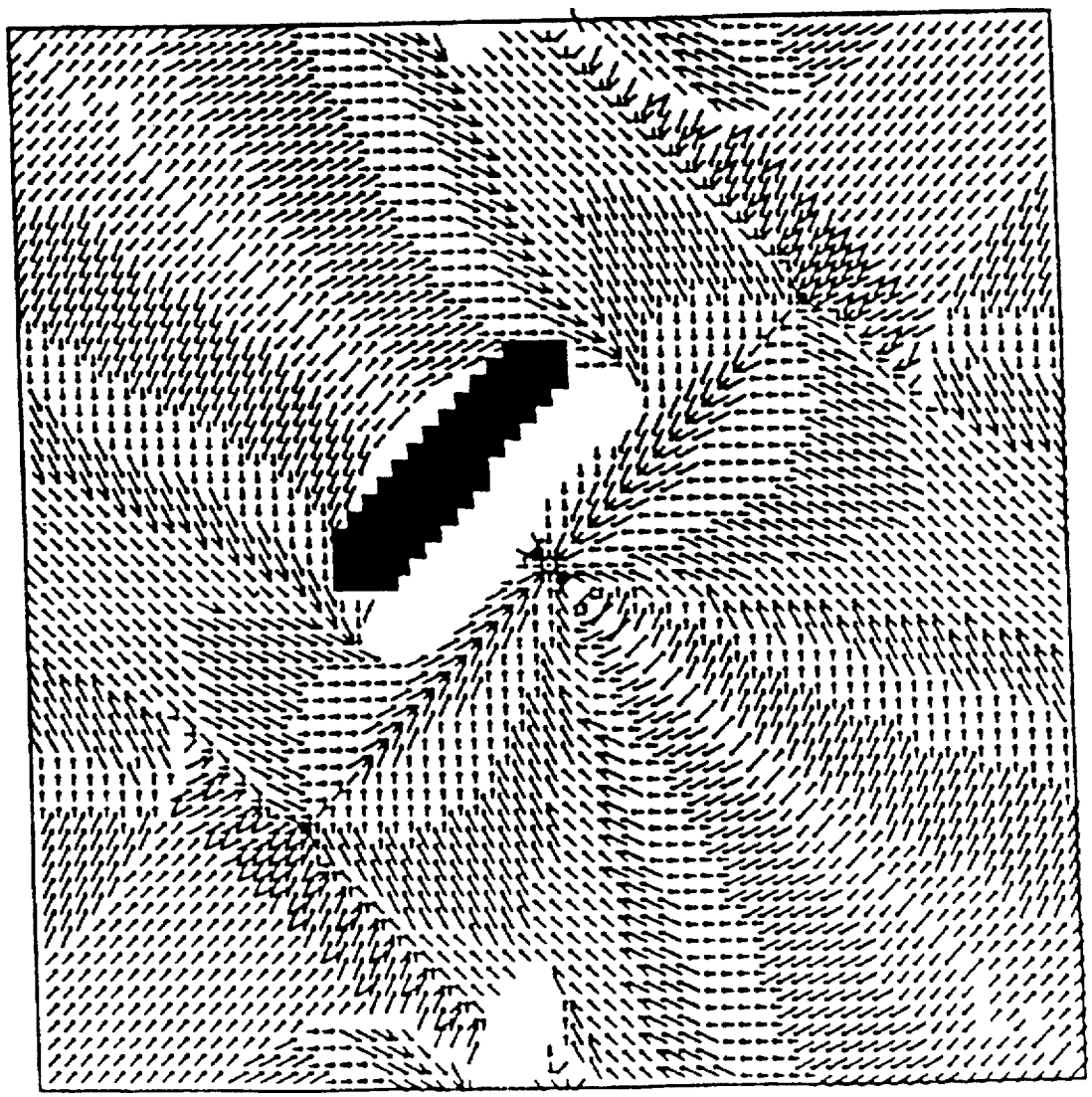

FIG. 39 shows the configuration space of FIG. 38 at an intermediate status after moving the obstacle and after applying the method of FIGS. 2–7.

Figure 40A:
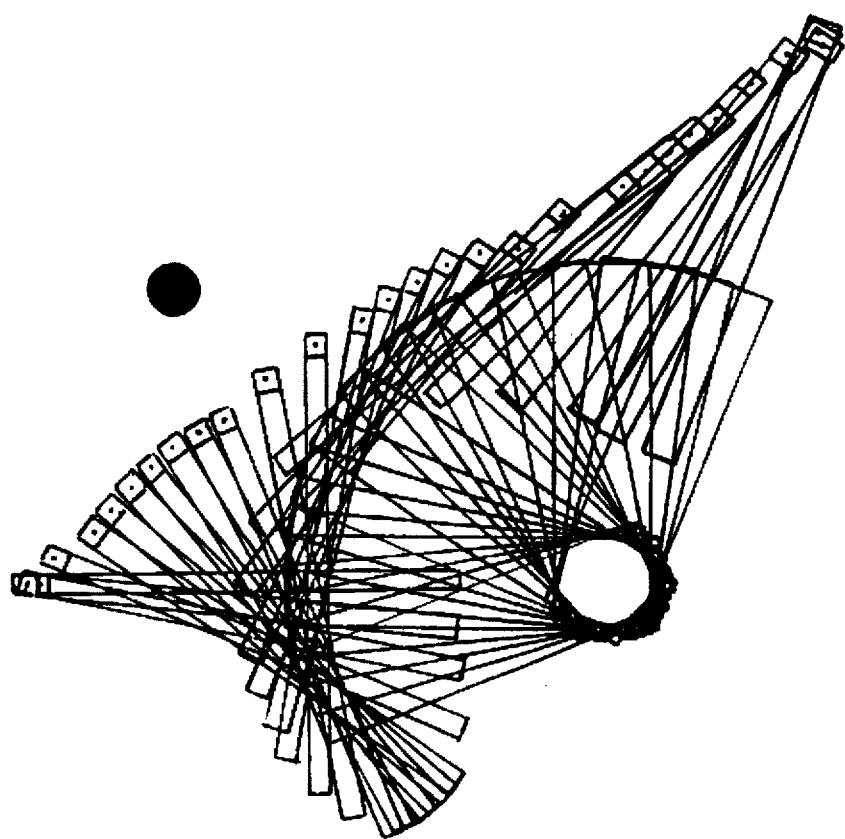
Figure 40B:
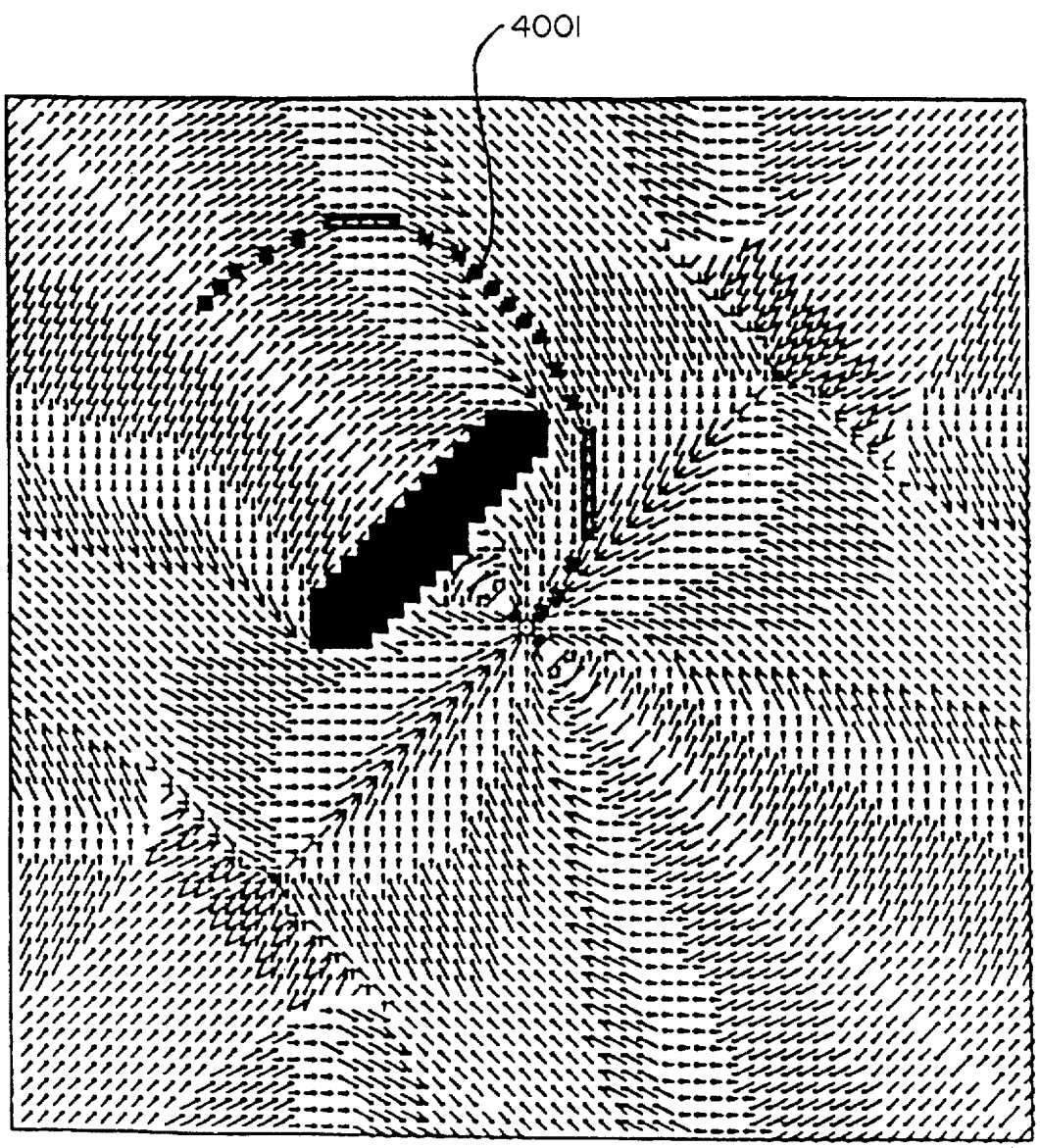

FIG. 40a shows the task space corresponding to FIG. 40b.

FIG. 40b shows the configuration space of FIG. 39 after budding and with a new path.

Figure 41A:
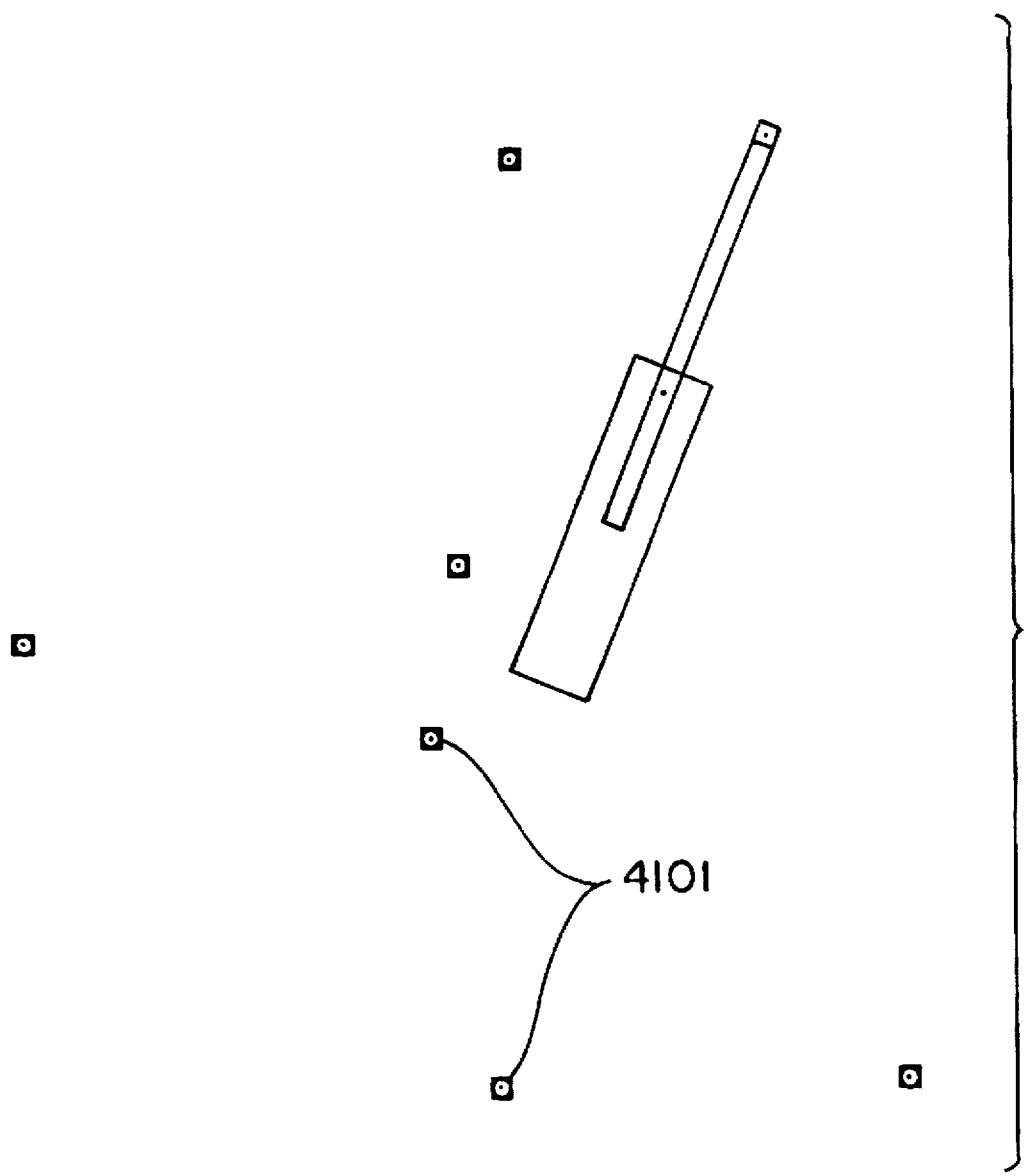

FIG. 41a shows a task space with a two-link robot and a number of goals.

Figure 41B:
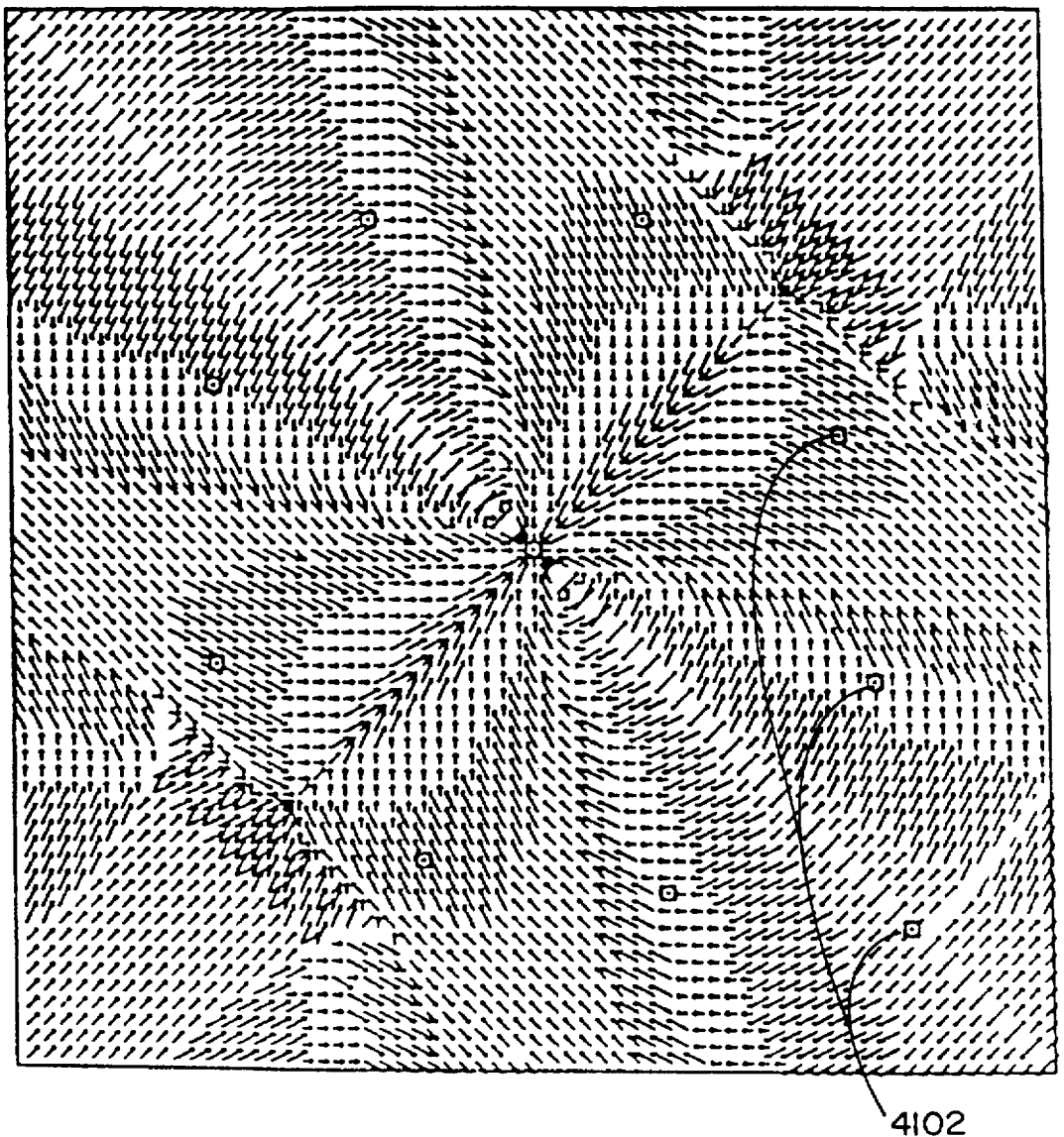

FIG. 41b shows a configuration space corresponding to the task space of FIG. 41a with cost waves propagated using a metric which minimizes joint motion.

Figure 42A:
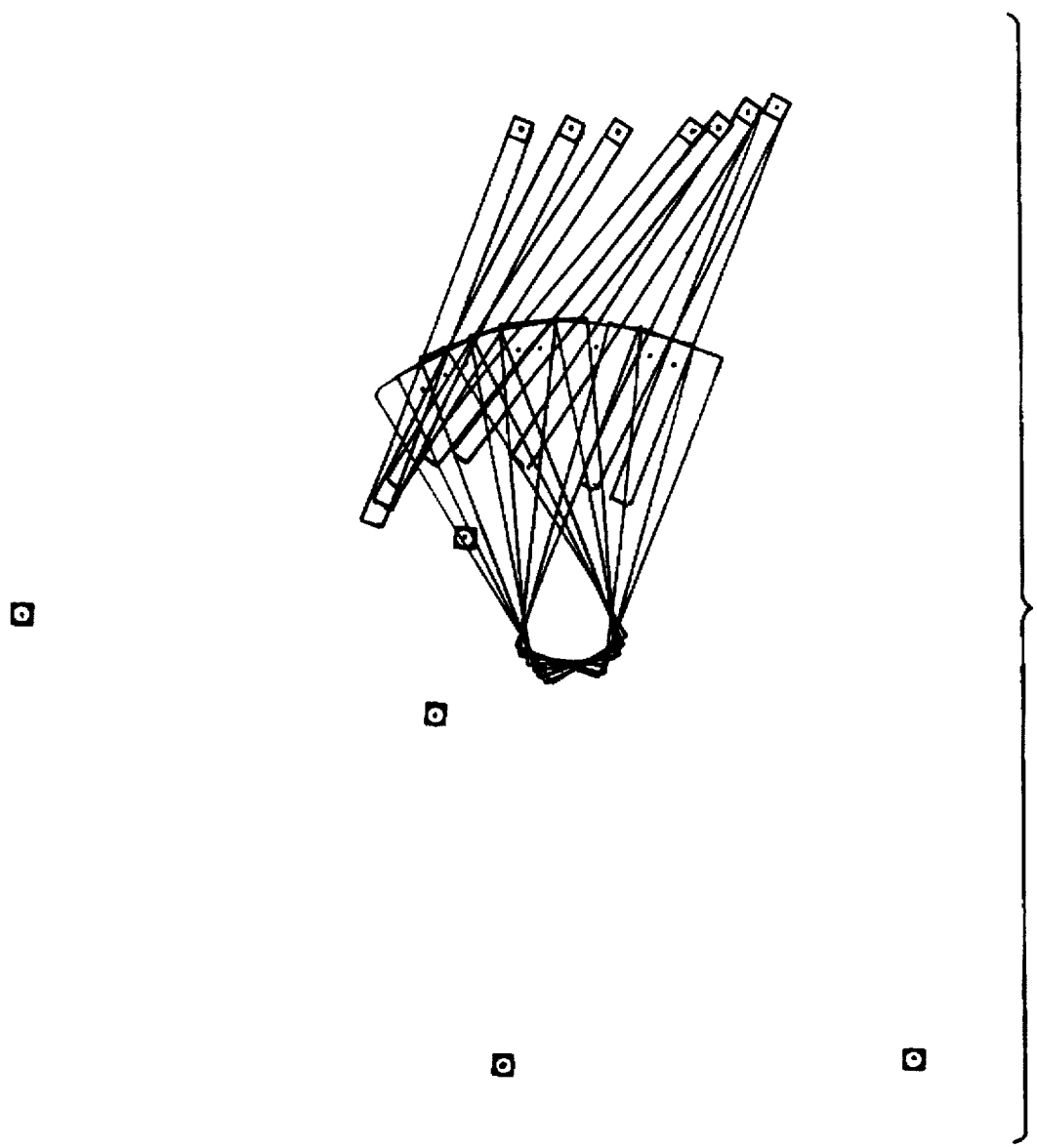

FIG. 42a shows the task space of FIG. 41a with the robot following a newly calculated path.

Figure 42B:
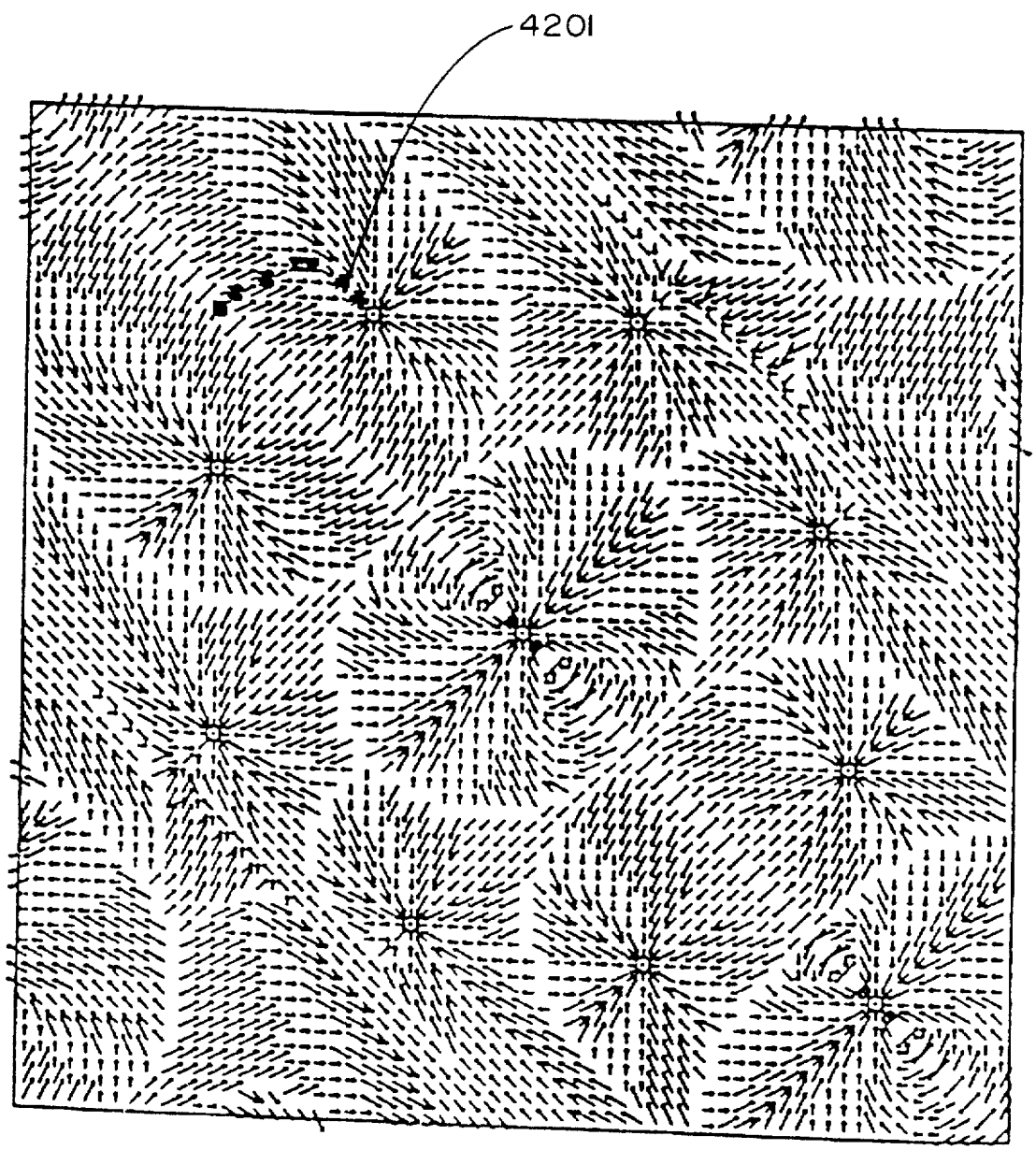

FIG. 42b shows the configuration space of FIG. 41b after application of the method of FIGS. 1–7.

Figure 43:
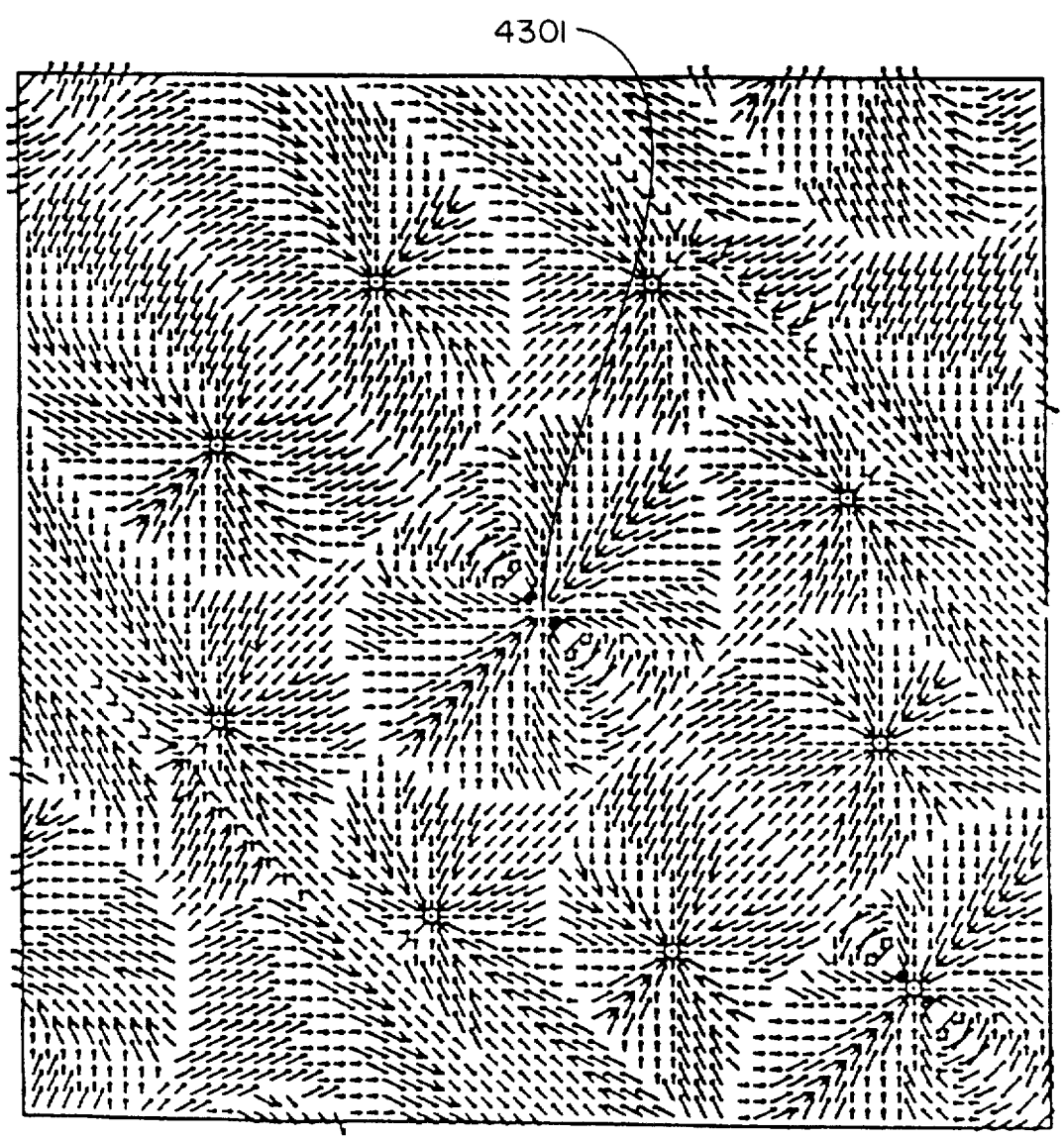

FIG. 43 shows the configuration space of FIG. 42 with a goal state removed.

Figure 44:
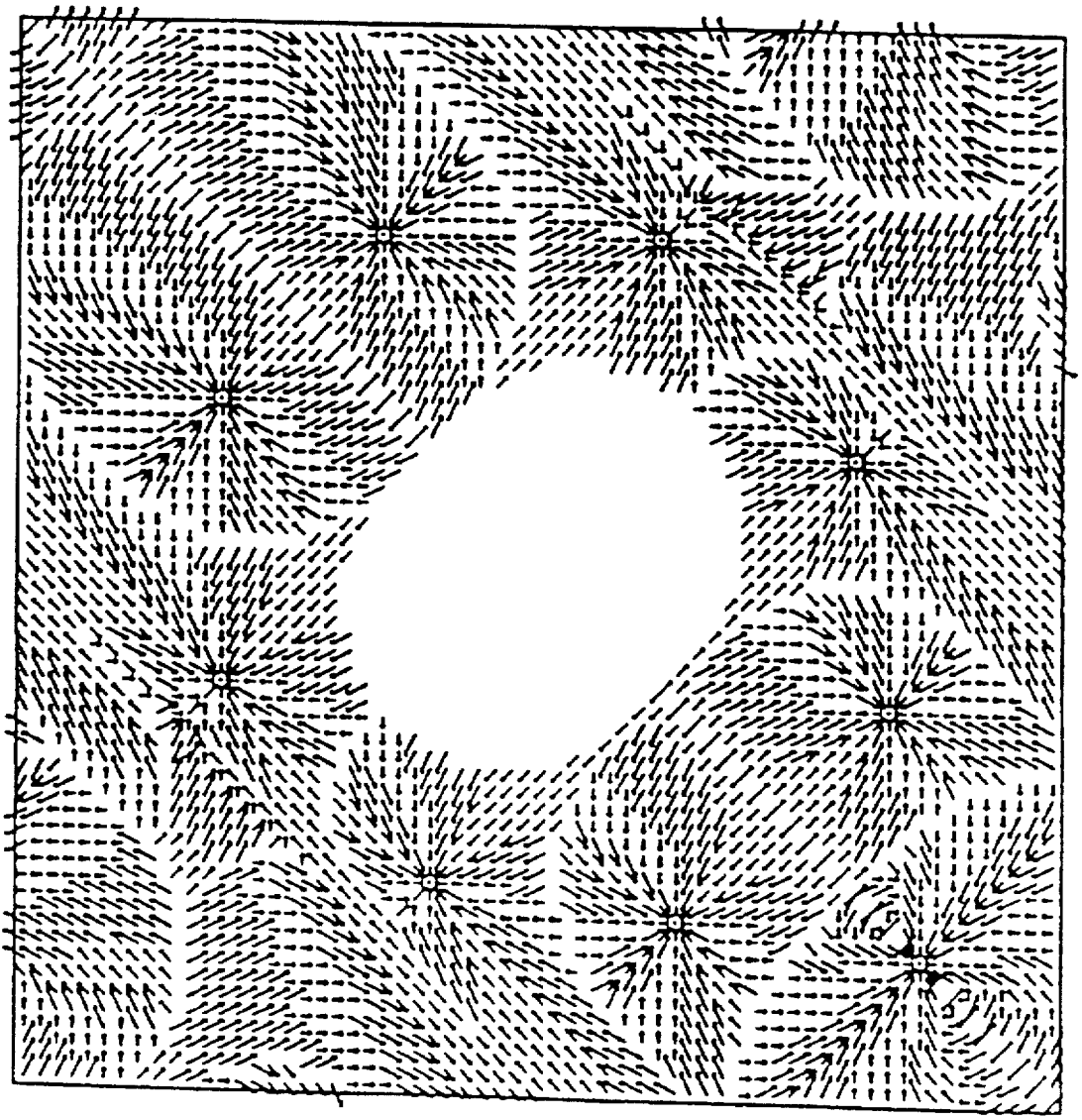

FIG. 44 shows the configuration space of FIG. 43 at an intermediate status after removing the goal and after applying the method of FIGS. 2–7.

Figure 45:
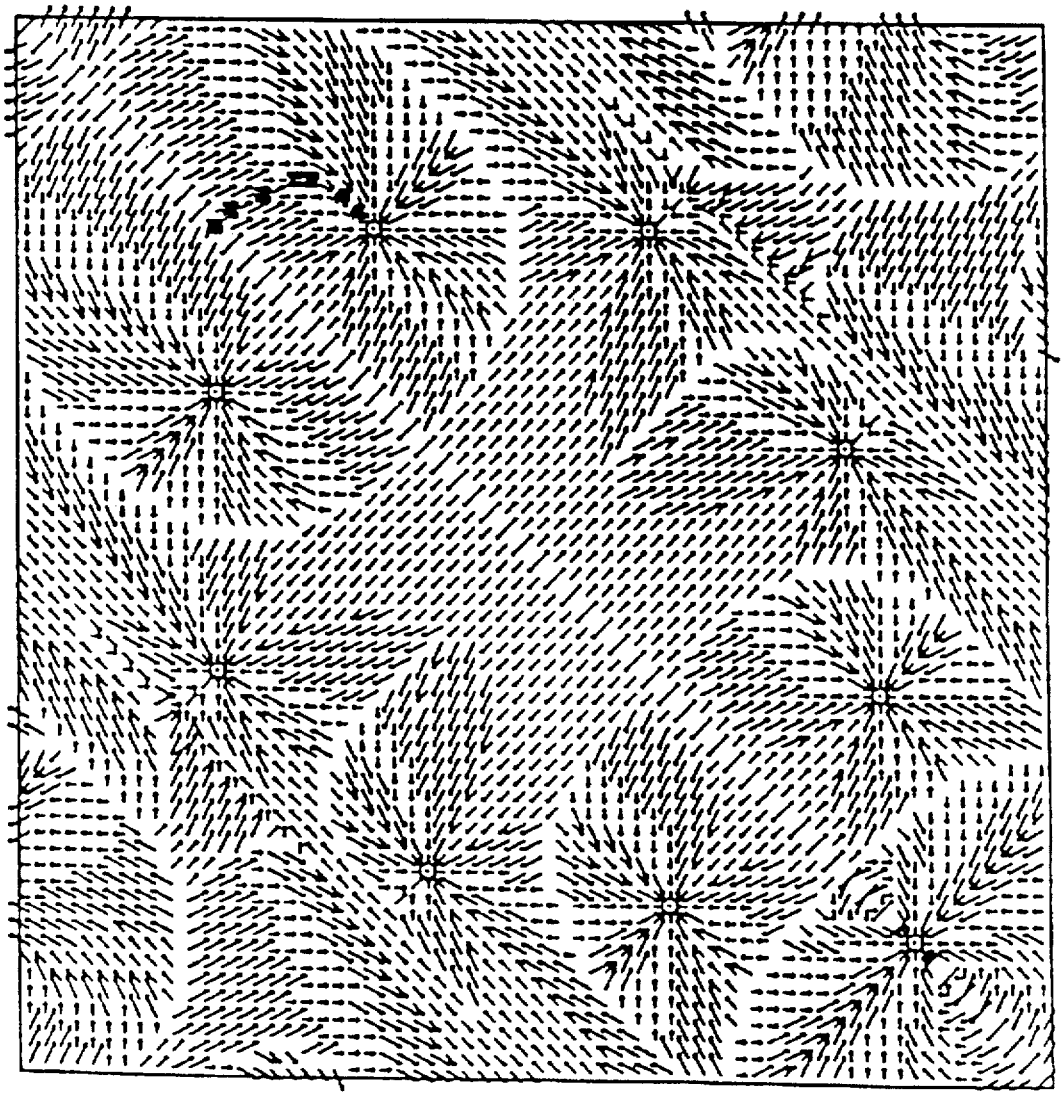

FIG. 45 shows the configuration space of FIG. 44 after budding.

Figure 46:
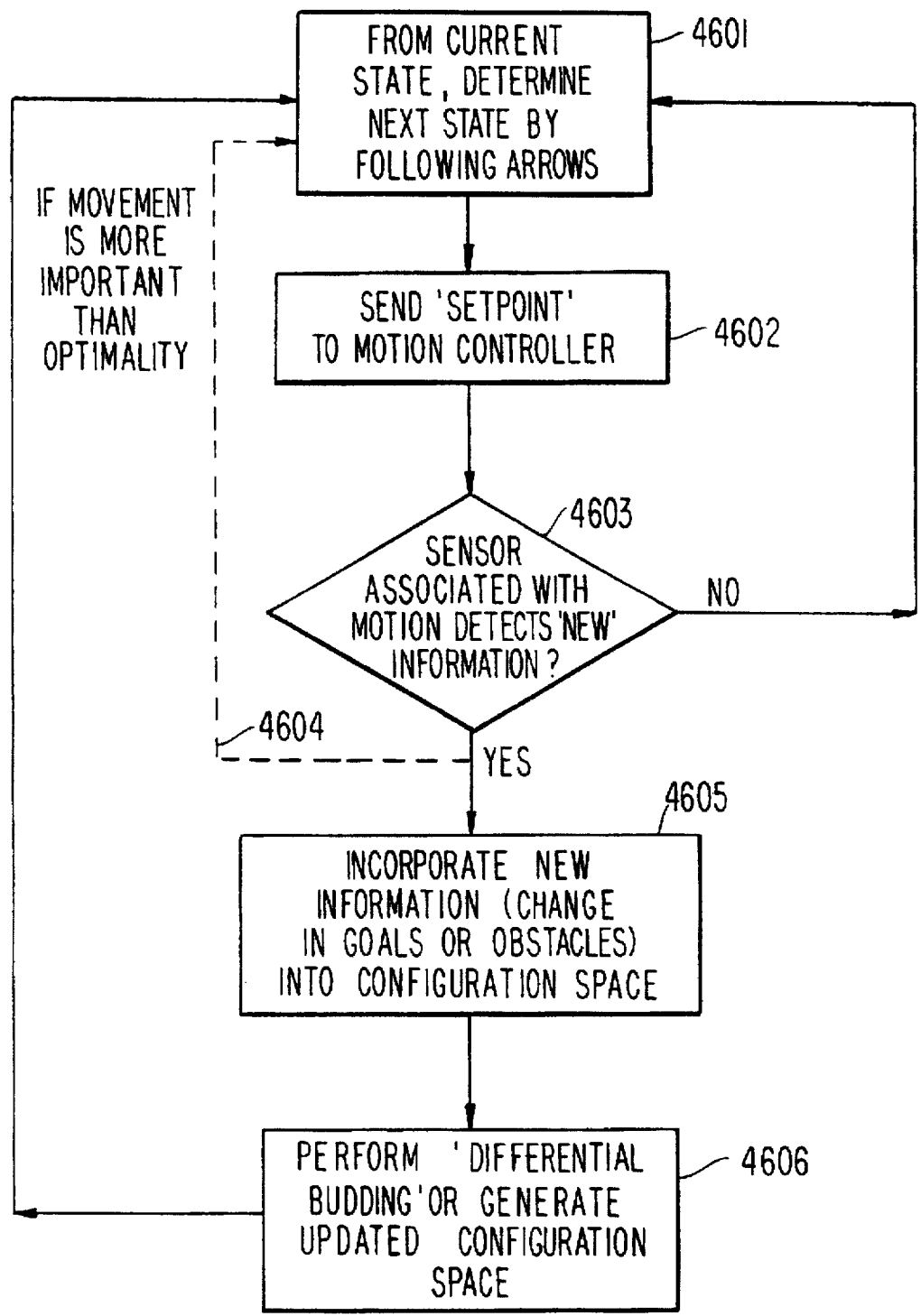

FIG. 46 shows a flow chart for dealing with phantom changes in conditions.

IV. DETAILED DESCRIPTION OF THE PREFERRED EMBODIMENT

1. Overview of the Method

Figure 1:
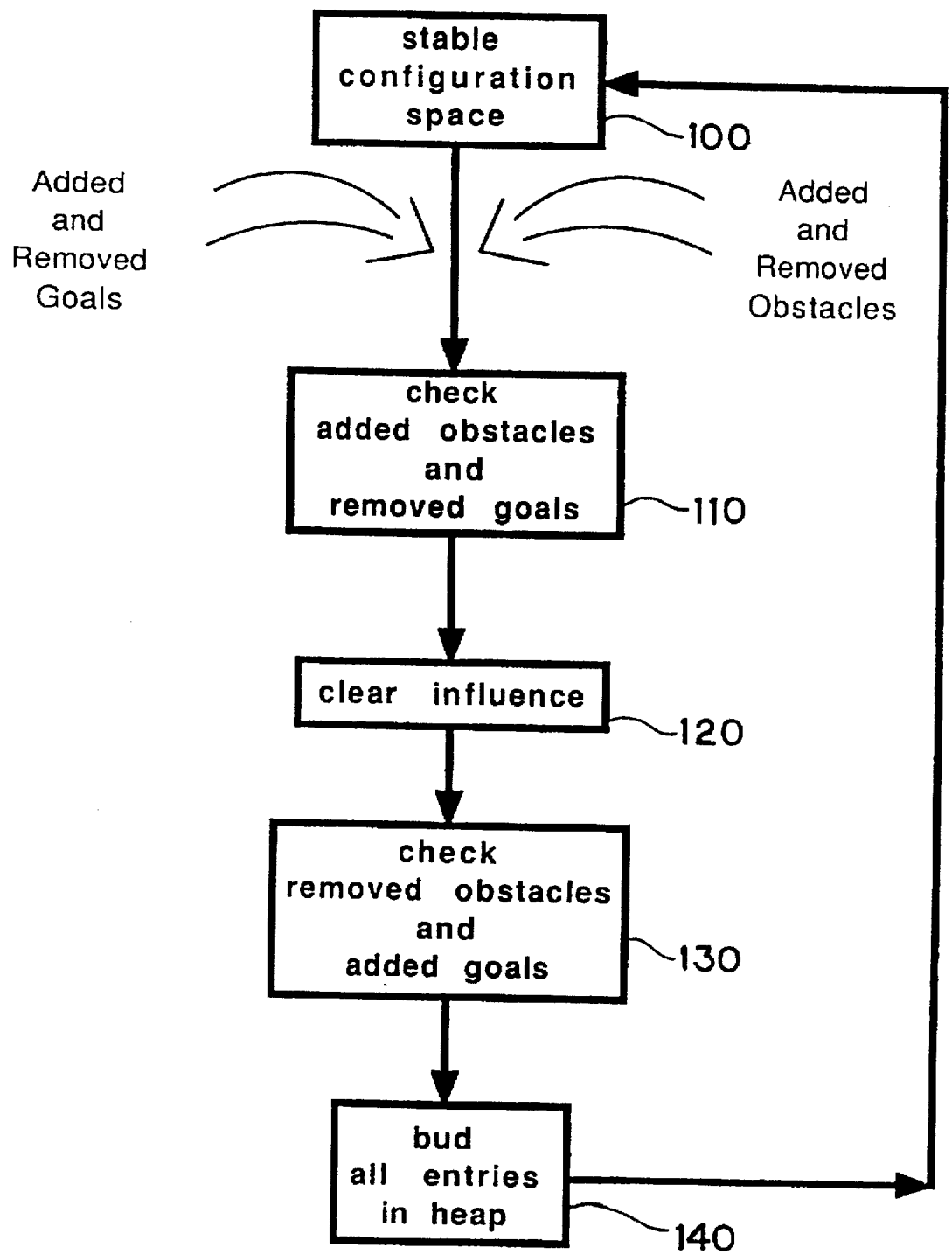
FIG. 1 is a summary flow chart of the differential budding method.

FIG. 1 gives a general overview of steps used in "differential budding", a method for regenerating a configuration space with changes in obstacles and goals. The resulting configuration space provides information necessary to generate a series of set points to be followed for an optimal path.

In box 100, a configuration space filled with direction arrows and costs$_{13}$ to_goal is assumed. Information about changed goal and obstacle states is also assumed to be provided. These states are already transformed from task space to configuration space. It should be noted that the method will work if the configuration space is merely initialized, with UNCOSTED in each cost-to-goal, and no direction arrows.

In box 110, information about newly added obstacle states and newly removed goal states is used to initialize the corresponding states in configuration space.

In box 120, all states 'influenced' by the added obstacle and removed goal states are initialized to have UNCOSTED values and no direction arrows. 'Influenced' neighbors are those that are on paths that point to or through these added obstacle or removed goal states. The 'perimeter' of states around this region is obtained and added to the heap for later 'budding'.

In box 130, information about newly removed obstacle states and newly added goal states is used to initialize the corresponding states in configuration space. The heap is set up so that 'budding' can take place.

In box 140, the states on the heap accumulated as a result of boxes 110, 120, and 130 are 'budded' resulting in a stable (valid) configuration space. Given a starting state, an optimal path of set points can be read out by following the direction arrows in configuration space to the goal state.

Two special structures are used for efficiency: a sifting heap, and a sifting array. The 'sifting heap' is a regular heap except that it keeps at most one copy of a tuple (state) in the heap even though many requests to add extra copies may be made. Whenever the word "heap" is used herein, a "sifting heap" is intended. The 'sifting array' (used to store unique states of the perimeter) is similarly a regular array except that it keeps at most one copy of a tuple (state). Some of the arrays referred to herein are sifting and some are not. In both cases, sifting is achieved by maintaining flags in each state of the configuration space that report if a state is in the heap or in the perimeter array. Then all that is needed when adding or removing states from the heap or perimeter is to modify these flags correctly.

A. Check added obstacles and removed goals

Figure 2:
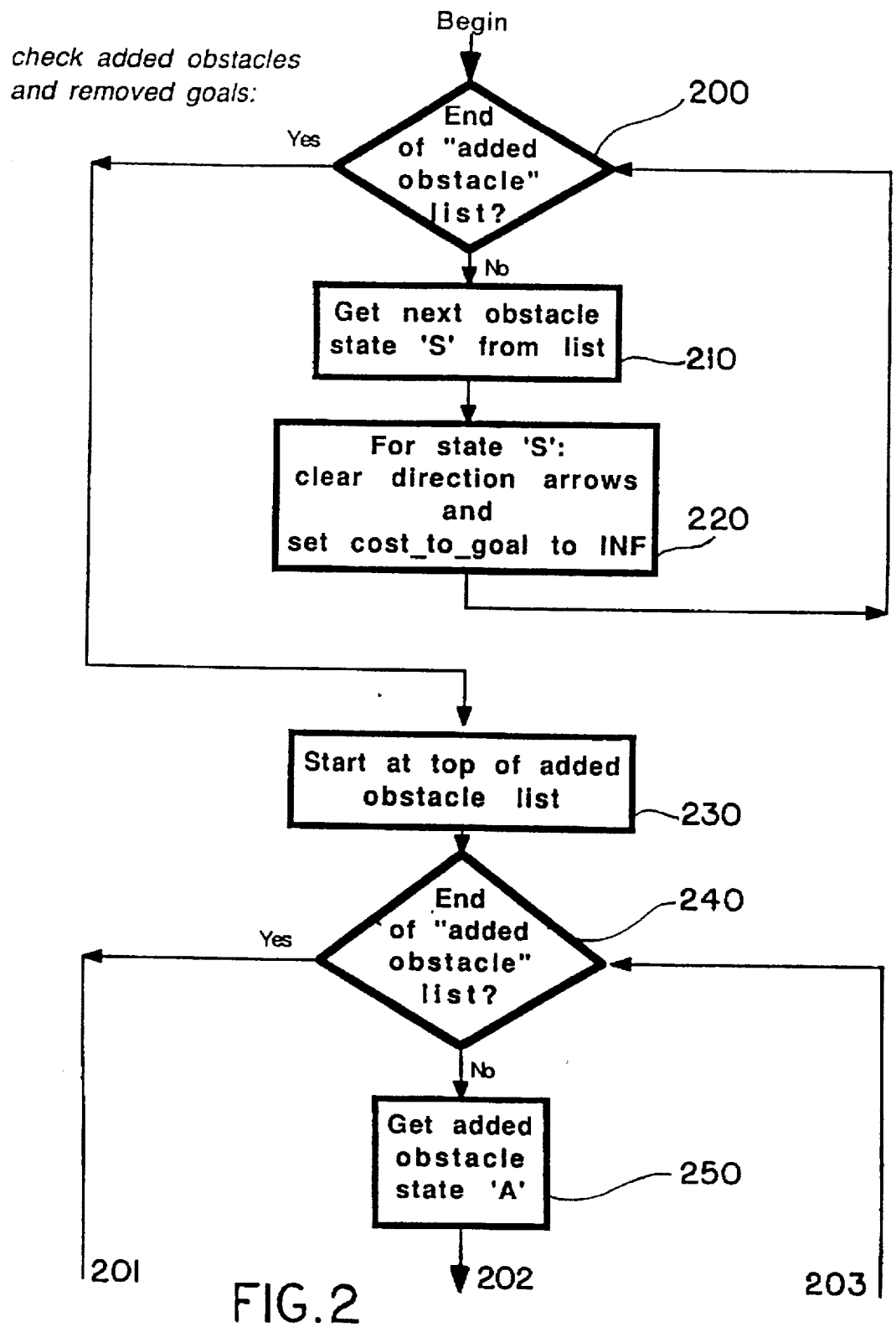
FIGS. 2 and 3 are flow charts giving more details of box 110 of FIG. 1.
Figure 3:
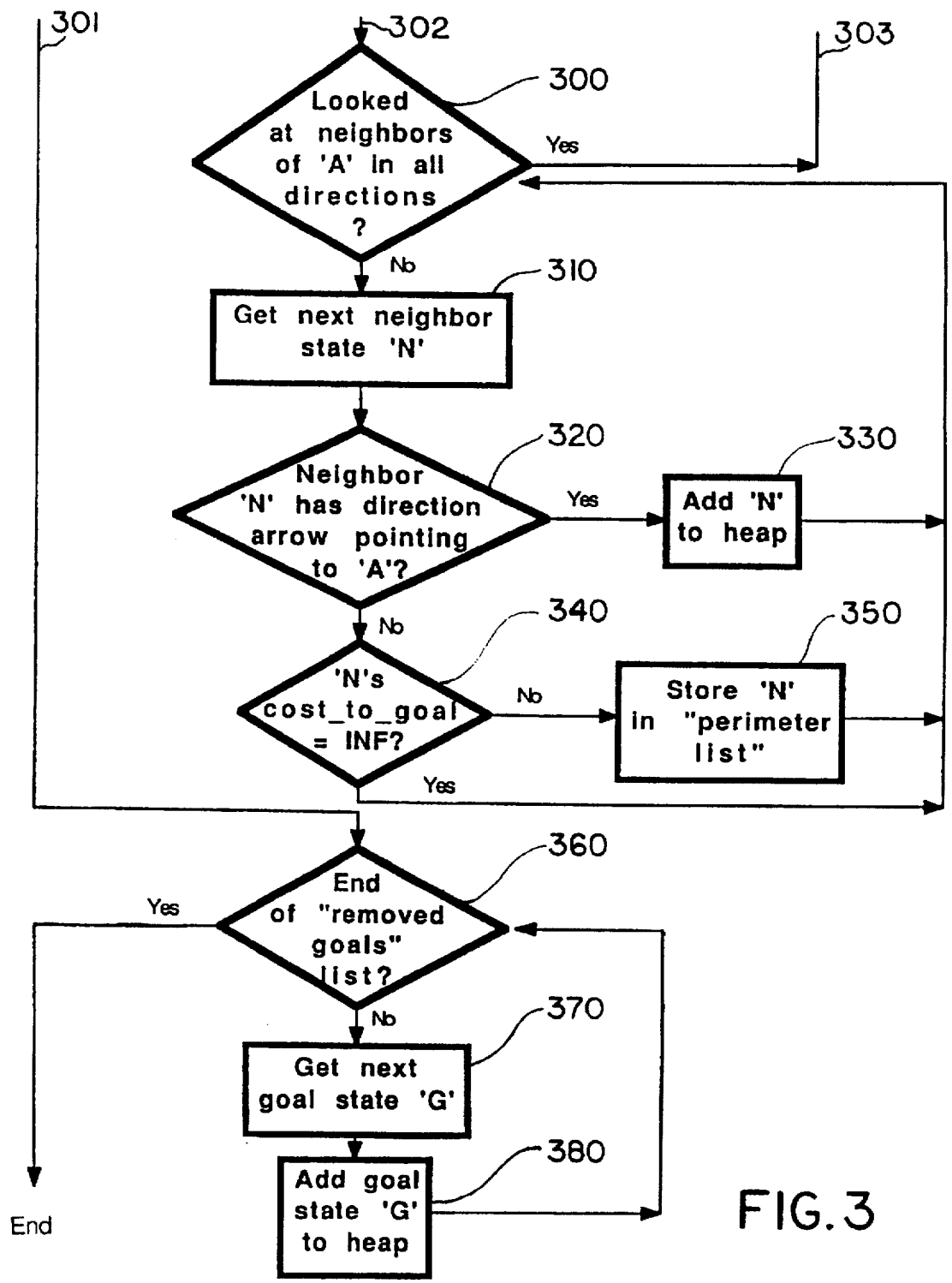

The method in box 110 is detailed by the flowchart of FIG. 2 and FIG. 3. The method of box 120 is detailed by the flowchart in FIG. 4 and FIG. 5. The method of box 130 is detailed by the flowchart of FIG. 6 and FIG. 7.

The 'check added obstacles and removed goals' method of box 110 includes three main parts.

The first part is shown in boxes 200, 210, and 220. Box 200 tests whether the end of the "added obstacle" list has been reached. If the result of the test in box 200 is "Yes", control passes to box 230. If the result of the test in box 200 is "No", control passes to box 210. Box 210 gets the next obstacle state 'S' from the added obstacle list. Box 220 then clears the direction __arrows field and sets the cost__to__goal field to INF in the state "S". After box 220, control is returned to box 200.

Boxes 200, 210, and 220 thus constitute a loop which initializes each 'added obstacle' state ('S') in configuration space to have no direction arrows and an INF (INFINITE) cost__to__goal.

The second part of the "check added obstacles and removed goals" method of box 110 is shown in boxes 230, 240 and 250 of FIG. 2, and boxes 300, 310, 320, 330, 340, and 350 of FIG. 3. It should also be noted that line 201 of FIG. 2 connects to line 301 of FIG. 3; line 202 of FIG. 2 connects to line 302 of FIG. 3; and line 203 of FIG. 2 connects to line 303 of FIG. 3.

In this second part of box 110, the 'front edge' of the obstacle and the 'back edge' of the added obstacle are obtained. The 'front edge' contains those neighbor states that are on the 'goal side' of the added obstacle. These states are neighbors of the obstacle region, have cost values other than INFINITY or UNCOSTED, and are not pointing toward any of the obstacle states. The 'back edge' contains those neighbor states that are not on the front edge. These states have direction arrows that point into the added obstacle.

Box 240 signifies a test for the end of the "added obstacle" list. If the end has been reached, control passes via line 201/301 to box 360. If the end has not been reached, control passes to box 250, where an added obstacle 'A' is retrieved.

Then at box 300, it is determined whether all of the neighbor states 'N' of the obstacle state 'A' have been considered. If all of the neighbor states 'N' have been considered, control returns via line 303/203 to box 240. If a neighbor state 'N' has not been considered, control passes to box 310, where that state 'N' is retrieved.

Box 320 indicates a test of whether the state 'N' contains a direction arrow that points to "A". If state 'N' does not contain such a direction arrow, control passes to box 340. If state 'N' does contain such a direction arrow, the state 'N' is added to the heap at box 330. If the state 'N' is added to the heap at box 330, 'N' is considered to be part of the 'back edge' of the added obstacle. After box 330, control returns to box 300.

In box 340, 'N' is tested for whether its cost__to__goal field contains INF. If 'N' does have a cost__to__goal of INF, control is returned to box 300. If 'N' has a cost__to__goal other than INF, it is added to the 'perimeter list' at box 350, and is considered part of the 'font edge' of the obstacle The third part of the "check added obstacles and removed goals" method of box 110 is shown in boxes 360, 370 and 80 of FIG. 3. These three boxes form a loop. In box 360, it is determined whether the end of the "removed goals" list has been reached. If the end has been reached, the "check added obstacles and removed goals" method is complete. If the end has not been reached, the next goal state 'G' is retrieved at box 370. This goal state 'G' is then added to the heap at box 380 and control is returned to box 360. Thus, in this loop, each of the removed goal states in the 'removed goal list' is added to the heap.

B. Clear influence

The 'clear influence' method of box 120 includes two main parts. The first part determines the 'perimeter of influence' due to the newly added obstacle and removed goal states, and the second part takes the perimeter and puts it into the heap.

Figure 4:
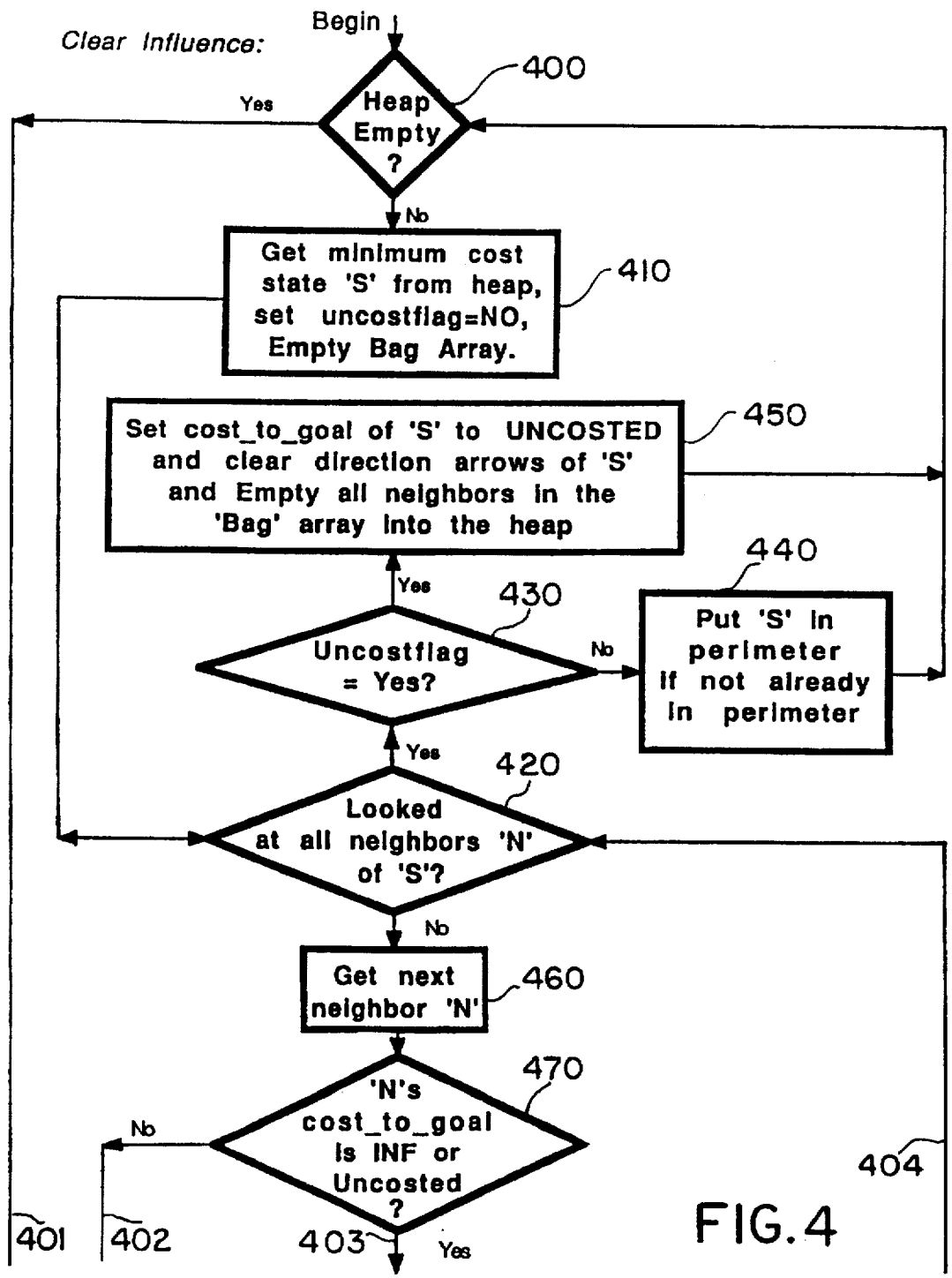
FIGS. 4 and 5 are flow charts giving more details of box 120 of FIG. 1.
Figure 5:
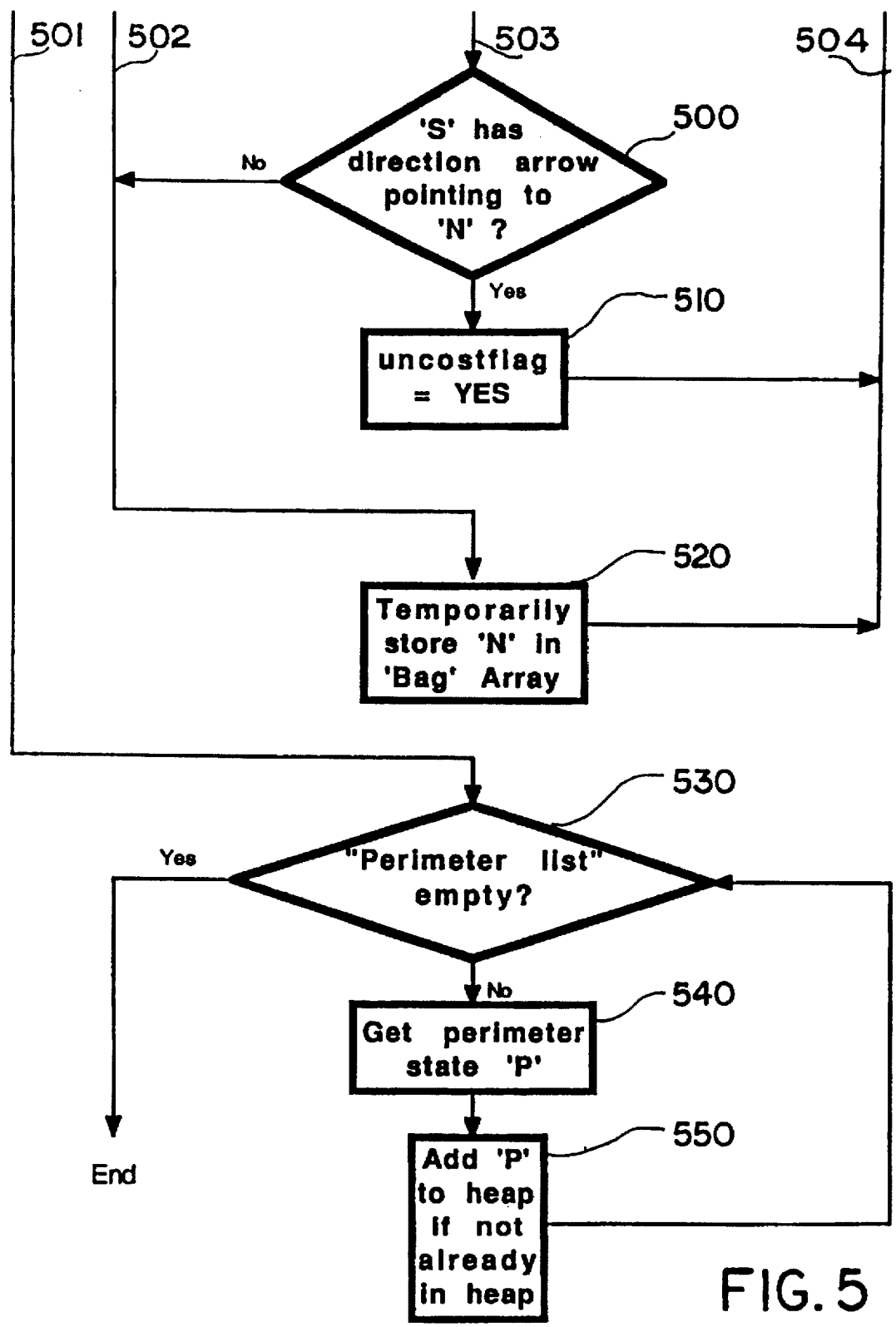

The first part of the 'clear influence' method of box 120 is shown in boxes 400, 410 420, 430, 440, 450, 460 and 470 of FIG. 4, and boxes 500, 510 and 520 of FIG. 5. It should be noted that line 401 of FIG. 4 connects to line 501 of FIG. 5, line 402 of FIG. 4 connects to line 502 of FIG. 5, line 403 of FIG. 4 connects to line 503 of FIG. 5, and line 404 of FIG. 4 connects to line 504 of FIG. 5.

At the beginning of the 'clear influence' method, the heap consists of neighbor states at the back edge of any added obstacles and any removed goal states. At box 400, the heap is tested to see if it is empty. If the heap is empty control passes via line 401/501 to box 530.

If the heap is not empty, then, at box 410, a minimum cost state 'S' is retrieved from the heap and and a variable, uncostflag, corresponding to 'S' is set to "NO" At box 420, it is then determined whether all neighbors 'N' of 'S' have been considered. If all the neighbors have been considered, control passes to box 460.

If all of the neighbors have not been considered, the variable uncostflag is tested at box 430. If uncostflag has a value "No" then, at box 440, 'S' is added to the perimeter, if 'S' has not already been added to the perimeter. If uncostflag has a value "yes", then, at box 450, the cost__ to__goal field of 'S' is set to UNCOSTED; the direction__ arrows field of 'S' is cleared; and all neighbor from the 'Bag' array are emptied into the heap which sifts them, i.e. it does not store any duplicate states.

At box 460 a next neighbor 'N' is retrieved. At box 470 the cost__to__goal field of 'N' is tested to see if it is either INF or UNCOSTED. If it is neither, control passes via line 402/502 to box 520. If it is either INF or uncosted, control passes via line 403/503 to box 500.

At box 500, 'S' is checked to see if it has a direction arrow pointing to 'N'. If not, control passes to box 520. If so, the uncostflag associated with 'S' is set to "YES".

In box 520 the neighbor 'N' is temporarily stored in the Bag array. Control then returns via line 504/404 to box 420.

Thus, during the first part of the "clear influence" method of box 120, each state 'S' in the heap, that points to any neighbor 'N' that has a cost_to_goal that is either INFINITE or UNCOSTED is identified. Such a state 'S' must therefore have been 'connected' via direction arrows to the back of a new obstacle state or to a removed goal state. Any neighbor that is not INFINITE or UNCOSTED is a candidate for expanding the search and is temporarily stored in the 'Bag'. The 'Bag' is a standard array containing states. After all neighbors of 'S' are examined, if 'S' is connected, then all neighbors of 'S' that are in the 'Bag' are added ("emptied") to the heap, which sifts them, and 'S' is reinitialized to have cost_to_goal of UNCOSTED and no direction arrows. If 'S' is not connected, 'No' branch from box 430, then 'S' must be a member of the 'perimeter' and the neighbors that are in the 'Bag' are NOT added to the heap.

The second part of the "clear influence" method of box 120 is shown in boxes 530, 540, and 550 of FIG. 5. At box 530, the perimeter list, stored in a sifting array, is checked to see if it is empty. If so, the clear influence method ends. If not, a perimeter state 'P' is retrieved 540 and added 550 to the heap, if not,already in the heap. After box 550, control is returned to box 530. This second part of box 120 thus reads the states in the "perimeter list" and stores them in the heap.

Thus the perimeter list can be said to surround an influenced or "affected region" of the configuration space, and this terminology has been used herein. The term "influenced" is used herein particularly to refer to the "clear influence" step 120 and is distinguished from the term affected, which is used more broadly as explained below. However, this terminology is not meant to imply that the surrounded region is contains the only states which may be changed as a result of differential budding. States on or outside the perimeter may have their cost_to_goal or direction_arrows values changed as a result of budding the heap in box 140 of FIG. 1.

C. Check removed obstacles and added goals

The 'check removed obstacles and added goals' method of box 130 has three main parts.

The first part is shown in boxes 600, 610 and 620. At box 600 it is determined whether the end of the 'removed obstacle' list has been reached. If the end has been reached, control passes to box 630. If the end has not been reached, a next obstacle state, 'S', is retrieved from the list at box 610. In this state, 'S', the direction arrows field is cleared and the cost_to_goal field is set to UNCOSTED. This first part is, then, a loop which initializes each 'removed obstacle' state in configuration space to have no direction arrows and an UNCOSTED cost_to_goal. These are appropriate values, since these now unoccupied (removed) obstacle states have no presumed costs or arrows. These removed obstacle states can be said to be the region affected by the obstacle removal, and this terminology is used herein. However, it should be noted that states outside this "affected region" may still have their cost_to_goal and direction_arrows values changed as a result of budding in box 140. The states surrounding the removed obstacle can be said to be the perimeter, but they require a less sophisticated treatment than the perimeter of the removed goals and added obstacles.

The second part of box 130 is shown in boxes 630, 640 and 650 of FIG. 6 and boxes 700, 710, 720, and 730 of FIG. 7. It should also be noted that line 601 of FIG. 6 connects to line 701 of FIG. 7, line 602 of FIG. 6 connects to line 702 of FIG. 7, and line 603 of FIG. 6 connects to line 703 of FIG. 7.

This second part of box 130 starts at the top of the removed obstacle list, at 630. A test is performed at 640, as in box 600, to determine whether the end of the "removed obstacle" list has been reached. If the end has been reached, control passes via line 601/701 to box 740. If the end has not been reached, a next obstacle state 'R' is retrieved at 650. Then, in box 700, it is determined whether all neighbors of 'R' have been considered. If so, control is passed via lie 703/603 to box 640. If not, a next neighbor state 'N' of 'R' is retrieved at 710. If 'N' has a cost_to_goal field which has a value of UNCOSTED or INF, then control is returned to box 700. If 'N' has a cost_to_goal field which is not UNCOSTED and not INF, then 'N' is added to the heap at 730.

Thus, in this second part of box 130, all neighbors of a removed obstacle state that have a cost_to_goal other than 'INFINITY' or 'UNCOSTED' are added to the heap, which sifts them. These states together form an edge that is adjacent to the removed obstacle. These neighboring states will help (via the 'budding' mechanism of box 140) to fill in the vacated area where the 'removed obstacle' states reside.

The third part of box 130 is shown in boxes 740, 750, 760, and 770 of FIG. 7. At box 740, a test is performed to determine if the end of the "added goals" list has been reached. If the end has been reached, the 'check removed obstacles and added goals' method terminates. If the the end has not been reached, a next goal state 'G' is retrieved at 750. At 760, for the goal 'G', the direction_arrows field is cleared and the cost_to_goal field is set to zero. Then, at 770, the goal 'G' is added to the heap and control is returned to box 740.

Thus, this third part of box 130 is a loop which takes each newly added goal state from the "added goals" list, clears the direction arrows, sets the cost_to_goal to zero, and adds each goal state to the heap. Thus the added goal states are both the "affected region" and the perimeter as that terminology is used herein. However, it should be noted that states outside this "affected region" may still have their cost_to_goal and direction_arrows values changed as a result of budding in box 140.

In summary, then, the "affected region" as that term is used herein means states that have been cleared as part of the clear influence step 120, and states corresponding to removed obstacles and added goal states which are "influenced" are the ones cleared during the clear influence step 120.

Appendix A contains source code performing the method of FIGS. 1–7. In addition to code for executing the method, Appendix A has code for producing a graphic simulation. The source code is in the 'C' language. In printing this source code, the printer has changed the character sequence "\n" in the "printf" statements to "0" (zero). Therefore, in order to use this code, the programmer will have to change these zeroes back to "\n".

This concludes the differential budding aspect of this algorithm. At this point, the states that reside in the heap are 'budded' box 140 according to the 'budding method' found in patent application Ser. No. 123,502 abandoned. This produces the final updated configuration space from which an optimal path can be produced.

2. Simplified Examples

The method of FIGS. 1–7 will now be illustrated with reference to some simplified examples. In these examples, a coarse configuration space is used, so that values of the direction_arrows and cost_to_goal fields will be clearly visible. In addition, the various steps used in the method are more clearly visible on the coarse configuration space.

A. Adding an obstacle

FIG. 8a illustrates a task space with a two-link robot 801 following a minimum joint motion path to a goal 802. An obstacle 803 has been added to the task space, after the minimum joint motion path was calculated.

FIG. 8b shows a coarse configuration space corresponding to the task space of FIG. 8a. In the coarse configuration space, states appear as squares in the table. The locations of the states are identified by shoulder and elbow angle. States have cost to goal values marked as numbers in the squares. Direction arrows are shown leading from one state to another. For instance, the state corresponding to a shoulder angle of 72° and an elbow angle of 36° is indicated as [72,36]. State [72,36] has a cost to goal of 0.26 and two direction arrows pointing respectively to states [36,36] and [36,0]. It should be noted that each illustrated direction arrow is associated with the state where it starts. Each direction arrow points to the state where its arrowhead appears. The goal is indicated with a target symbol at state [288,288]. The path to the goal is indicated by blackened states, e.g. at 805.

In the configuration space of FIG. 8b, the newly added obstacle first appears as a line polygon 804, which blocks the path 805. The line polygon 804 has a finer resolution than the configuration space, and will be discretized in later figures.

In the configuration space of FIG. 9, the obstacle has been transformed into states [180,180], [180,216], [216,180], and; [216,216]. FIG. 9 shows the configuration space after the 'clear influence' phase of box 120. The heap now contains all configuration states that are 'boxed' such as [72,72], [72,180] etc. These coordinates are read [shoulder angle, elbow angle]. The states that have actually been cleared during the 'clear influence' stage 120 show a 'U' (meaning UNCOSTED) as their state cost_to_goal. All of these states were traceable (via direction arrows in FIG. 8) to the back of the added obstacle.

In FIG. 10, a stable configuration space has been calculated and is shown after 'budding' the states that were in the heap after FIG. 9.

B. Removing an obstacle

In the task space of FIG. 11a, the obstacle 803, previously added to the task space, has been removed again.

FIG. 11b illustrates the effect of removing the obstacle 803 on the configuration space. Boxes 600, 610, and 620 yield the UNCOSTED values that are at states [180,180], [180,216], [216,180], and [216,216]. Boxes 630, 640, and 650 of FIG. 6 along with 700, 710, 720, and 730 of FIG. 7 result in the 'boxed states' that are on the perimeter of the influenced or affected region and therefore reside on the heap as of FIG. 11. The cost_to_goal fields of states [180,180], [180,216], [216,180] and [216,216] are set to UNCOSTED, and the 'boxed states', e.g. 144,144], [144, 180], [144,216], etc. shown are in the heap.

The result of budding the 'boxed states' from FIG. 11 is the stable configuration space shown in FIG. 12.

C. Adding goals

FIG. 13a shows the task space with newly added goals 1301 and 1302.

In FIG. 13b, the newly added goals are shown at goal states: [108,36], [36,108], [252,72], [72,252] and [216,216]. The goal states are cost-initialized to zero and their direction arrows are cleared. The pre-existing goal is shown at state [288,288].

In FIG. 14, these new goals are shown in the heap. The 'boxed states' that are also goal states show boxes through the goal (target) symbol.

In FIG. 15. the final (stable) configuration space is shown after budding the heap, with accommodations for the new goals. A new path is also shown at 1501.

D. Removing goals

FIG. 16 shows the removal of goal 1301, which corresponds to state [216,216].

In FIG. 17, the area influenced by the removed goal of FIG. 16, formerly at [216,216], is shown by the area of 'UNCOSTED' states, e.g. [144,144], [180,144], [216,144], etc. The perimeter of these UNCOSTED states, along with the front edge of the obstacle, are shown as 'boxed states'. The 'boxed states' are in the heap and will be budded next. The states that are actually cleared during the 'clear influence' step 120, show a 'U' (meaning UNCOSTED) as their state cost_to_goal. Prior to the 'clear influence' step of box 120, all of these states were traceable (via direction arrows as shown in FIG. 8b) to the back of the removed goal, formerly at [216,216].

In FIG. 18, the result of Budding the configuration space starting with the 'boxed states' that were in the heap is shown. A new path appears in FIG. 18. The new path leads through states [144,144], [108,108], and [108,72] to the goal state at [108,32].

E. Adding goal and obstacle

In FIGS. 19a and b, a new goal located at state [252,252] and a new obstacle in the [72,72] vicinity are added at the same time.

In FIG. 20, the states of the perimeter of the influence of the discretized obstacle, and the new goal state, are stored on the heap after 'clearing the influence' 120 of the new obstacle, and are shown as 'boxed states'

FIG. 21 shows the resulting configuration space and the new path 2101 that the robot would follow.

F. Moved obstacle and moved goal

In FIG. 22, the obstacle has moved slightly, from 2201 to 2202, and a goal is also moved from [252,252] to [288,288]. In this situation, all four main procedures are performed simultaneously: adding and removing goal states, and adding and removing obstacle states. By moving the obstacle, some new obstacle states may be added, in this case [72,36], [36,72]; and some obstacle states may be removed, in this case [108,72] and [72,108]. State [72,72] is unaffected. The goal at [252,252] can be 'moved' by adding a goal at the new location, [288,288] in this case, and removing the goal at the old location, [252,252] in this case.

FIG. 23 shows the configuration space of FIG. 22 as it appears after the operations described in FIGS. 2–7 but before budding.

In FIG. 23, the cost_to_goal of states [108,72] and [72,108] which were formerly part of the obstacle are set to UNCOSTED. The goal at [180,180] is included on the heap because it is at the perimeter of the influence of the removed goal state [252,252]. The goal state at [288,288] is in the heap because it is going to be budded. In addition to added goals, other states on the heap are shown in "boxed states" at the perimeters of affected areas. The cost_to_goal fields of states in the affected areas have been set to uncosted.

FIG. 24 shows the stable configuration space which results from budding the states which are on the heap as of the time of FIG. 23.

3. Treatment of Unknown or Unforeseen New Information

In all of the previous examples, perfect knowledge of the environment, that is, of all of the obstacles in the environment, was assumed. The invention can also handle the situation where some new information is discovered while the robot is already moving on a prescribed path. This arises when a robot does not have a vision sensor, or has a faulty one, but does have a proximity or tactile sensor of some kind. This can also arise where stored information becomes out of date. In many cases a robot may be able to learn about an environment simply by moving around, acquiring information about new obstacles or goals or removed obstacles or goals as it encounters them, and incorporating this knowledge into its configuration space. The robot can also adapt to a changing environment even if the vision sensors are not perfect. This next example shows how the method of FIGS. 1–7 can solve this problem. It should be noted that although the following description relates to added obstacles, it is equally applicable to removed obstacles, and removed and added goals.

A. Coarse configuration space

In FIG. 25b, there is a goal state at [180,180] and the starting state is [36,36]. An unsensed (also called a phantom) obstacle is located in the area of [108,72], [72,108], [72,72], [108,36] and [36,108]. According to the sensed, but factually incomplete information, the robot should be able to move from state [36,36] to [180,180] without obstruction. As the robot actually performs the move, the tactile or proximity sensors will report that an obstacle has been encountered at location [72,72]. FIG. 25a shows a task space corresponding to FIG. 25b.

In FIG. 26, the 'phantom' obstacle is shown discretized and in half tone. Note that the direction arrows point through the phantom, because the planner is not aware that this obstacle actually exists.

In FIG. 27, the robot takes its first step along the prescribed path, but at its next step senses an obstacle state at [72,72]. The newly discovered obstacle state is treated the same as a newly added obstacle. The perimeter of configuration space that this new obstacle state affects is shown in FIG. 27 as 'boxed states' and is added to the heap. States affected by the newly discovered obstacle at [72,72] have their cost_to_goal fields set to UNCOSTED. Thus FIG. 27 shows a configuration space in which the portion of the phantom obstacle corresponding to state [72,72] has been sensed and in which the method of FIGS. 1–7 has been performed, inasfar as it relates to newly added obstacles.

In FIG. 28, the stable configuration space corresponding to FIG. 27 is shown. FIG. 28 is generated by budding the states which are on the heap at the time of FIG. 27. FIG. 28 thus takes into account the newly discovered information about the phantom obstacle.

In FIG. 29, the robot has followed the newly calculated path, shown in FIG. 28. The robot thus moved from the position of FIG. 28 (state [36,36]) to state [36,72]. The robot then tried to move to state [72,108]. At [72,108], however, the robot sensed another obstacle, which is therefore indicated in black meaning that it has been recognized as an obstacle.

At this point, it should be noted that many techniques can be used for following the path with sensing capabilities enabled. The method shown is simple. If an obstacle is sensed, then the immediate neighbor states are also checked for obstacle existence. Therefore, in this case, the path follower has also sensed the obstacle state [36,108]. State [36,108] is therefore also indicated in black, meaning that it has been recognized as an obstacle.

In practice, if the motion controller of a robot has a proximity and/or tactile sensors and could pinpoint the point at which contact with an obstacle occurred, then the entire set of obstacle states in the configuration space corresponding to that point could be directly determined. If many obstacle states can be obtained en masse, only one differential budding "session" will be necessary to compensate for one obstacle point in task space. In the above example, only a few states at a time are discovered requiring several differential budding sessions. It can be seen, then, that, although the path following mechanism does not actually impact the method as it applies to phantom obstacles, it does affect the number of times the method is applied. It should be noted that if the object is a car, the path following mechanism is a driver, who can make fairly sophisticated observation about changes in the environment which can be reported back.

The edge of the 'cleared influence' area is once again added to the heap and is shown by the 'boxed states'

In FIG. 30, the stable configuration space shown is the result of 'budding' the states on the heap as of the time of FIG. 29. In the configuration space of FIG. 30, the portions of the phantom obstacle at [108,36] and [108,72] remain unsensed. Therefore direction arrows continue to point at those portions.

In FIG. 31, the robot has followed the newly planned path to state [72,86], because the sensed information did not show an obstacle at this state. It then attempted to move to [108,72] which is a phantom obstacle state. According to the present path following mechanism, [108,36] was therefore also sensed as a phantom obstacle state. At this point, the entire 'phantom obstacle' has been sensed. Therefore the entire phantom obstacle, consisting of states [36,108], [72, 72], [72,108], [108,36], and [108, 72], is now indicated in black. 'Boxed states' are on the heap, indicating the perimeter of the area affected by the newly discovered portions of the phantom obstacle. The 'boxed states' do not entirely surround the obstacle, because only part of the obstacle is newly discovered. States whose direction arrows previously pointed to the undiscovered part of the obstacle have had their cost_to_goal fields set to UNCOSTED.

Although the present example resulted the sensing of the entire 'phantom obstacle', it is often necessary to only sense part of the obstacle before an optimal path is found that does not lead into the obstacle.

FIG. 32 shows the stabilized configuration space of FIG. 31 after the states on the heap have been budded.

In FIG. 33, the path has been marked on the configuration space of FIG. 32. The robot can now follow the prescribed path from [72,36] to [108,0], [144,324], [180,288], [180, 252], [180,216], and finally to the goal [180,180] without further difficulties.

This technique works equally well with other metrics, in higher resolutions and dimensions, and with different numbers of neighbors.

B. Fine configuration space.

A finer resolution (64 by 64) example with 16 neighbors, i.e., sixteen possible direction arrows for each state, using 'distance minimization of the end-effector' criterion as the variable metric follows.

FIG. 34a shows a task space in which a two-link robot follows a path determined by a criterion which seeks straight line motion of the end effector.

FIG. 34b shows the configuration space which corresponds to FIG. 34a. The states in this configuration space are only indicated by their direction arrows, because the resolution is too fine to indicate cost to goal values or to allow squares to be marked around the states. The configuration space of FIG. 34b shows the space variant metric which results from the criterion of seeking straight line motion of the end effector.

FIG. 35a shows the task space of FIG. 34a, with a newly added obstacle 3501. The newly added obstacle 3501 blocks the previously planned path.

FIG. 35b shows the configuration space of FIG. 34b, with the newly introduced obstacle 3502 shown in a non-discretized form.

FIG. 36 shows the configuration space of FIG. 35b, but with the newly added obstacle discretized. Those states whose direction arrows previously pointed to the obstacle 3601 have now had their cost_to_goal fields set to UNCOSTED. UNCOSTED is indicated in FIG. 36 by the states which are now white. These states now appear to be white because, in addition to being UNCOSTED, they have no direction arrows. The newly added obstacle 3601 has affected two regions. One affected region 3602 is adjacent to the portion of the obstacle 3601 which would strike the forearm of the robot. A second affected region 3603 is adjacent to the portion of the obstacle 3601 which would strike the protruding elbow end of the forearm link. The perimeter includes those points adjacent to the white (cleared and UNCOSTED) area 3602, 3603, as well as the region in front of the obstacle. The perimeter region is not 'boxed' because the graphical congestion in the fine resolution example prohibits it. Nevertheless the perimeter states are on the heap.

FIG. 37 shows the completed configuration space, corresponding to FIG. 36. In order to get from FIG. 36 to FIG. 37, the perimeter states of FIG. 36, i.e. those on the heap, were budded. The new path that is prescribed, taking the new obstacle into account, is shown at 3701.

FIG. 38 shows the configuration space of FIG. 37 with the obstacle in a position which appears moved away from the goal. The discretized area 3801 is where the obstacle moved from, and the polygonal shape 3802 is the non-discretized region describing approximately where the obstacle has moved to.

FIG. 39 shows the configuration space of FIG. 38 after the method of FIGS. 1-7 has been applied. As in FIG. 36, the area affected by the movement of the obstacle is now white. The perimeter of the white area is on the heap, although the resolution of the figure is too fine to show the perimeter area as boxed. It can be seen that not very much of the configuration space has to be recalculated in this case.

FIG. 40b shows the configuration space of FIG. 39 after the perimeter states have been budded. The resulting path is shown at 4001.

FIG. 40a shows the task space corresponding to the configuration space of FIG. 40b.

FIG. 41a shows a task space in which there are no obstacles, but a number of goals, e.g. 4101, have been added.

FIG. 41b shows a configuration space in which cost waves have been propagated from a single goal, using the metric induced by the criterion of moving the end-effector in a straight line. As in FIG. 41a, no obstacles are appear. Goal states corresponding to the newly added goals of FIG. 41a have been superimposed on the configuration space of FIG. 41b resulting in nine newly added goal states. e.g. 4102.

In applying the method of FIGS. 1-7 to the space of FIG. 41b, the newly added goals must be added to the heap. However no 'clear influence' step needs to be applied. It is only necessary to bud the new heap.

FIG. 42b shows the result of budding the goal states which were added to the heap at the time of FIG. 41b. In addition, a path is shown from a given starting state to the appropriate goal.

FIG. 42a shows the task space corresponding to the configuration space of FIG. 42b.

FIG. 43 shows the configuration space of FIG. 42b where the goal state 4301, which is roughly in the center, is removed, and the other nine goal states are unchanged.

FIG. 44 shows the result of 'clearing the influence' 120 of the removed goal state. As before, the area from which influence has been cleared is indicated in white, signifying that the direction arrows have been cleared and the cost_to_goal fields have been set to UNCOSTED. Again, the states on the perimeter of the white area are on the heap.

FIG. 45 shows the stable configuration space resulting from budding the perimeter states which were on the heap at the time of FIG. 44.

FIG. 46 is a flow chart which summarizes the above-described approach to dealing with unsensed or partially sensed changes in conditions.

In box 4601 the method determines a next state in a precalculated path, by following direction_arrow values from a current states.

In box 4602 the method sends a setpoint to a motion controller for the robot, based on the next state.

At box 4603 a test is performed to determine whether a sensor associated with the motion to the next state has detected new information. If no new information is detected, control returns to box 4601.

If new information is detected there are two options. If the new information is not an absolute obstacle to movement, control may optionally return via the dotted line 4604 to box 4601. The dotted line 4604 represents a situation in which movement is chosen over calculation of a new optimum path. The dotted line 4604 is chosen, in other words, when movement is more important than strict optimality.

While the dotted line 4604 is taken, a processor could be incorporating new information into a configuration space while motion continues. Such parallel processing could be useful when the new information does not immediately affect the motion on the precalculated path. For instance, if the method is applied to control of emergency vehicles, an emergency vehicle might report a traffic blockage in a lane of opposing traffic. Such a report need not affect the progress of the emergency vehicle which reports the blockage. In this case of the emergency vehicle, the vision of the driver is the proximity sensor.

If the dotted line 4604 is not taken, and new information is sensed, control passes to box 4605. In box 4605, the new information is incorporated into configuration space. At 4606, differential budding occurs, for instance using boxes 110-140 of FIG. 1.

After 4606, control returns to box 4601.

Appendix A also shows code for dealing with phantom changes in conditions.

APPENDIX A

© North American Philips Corporation 1988
All rights reserved.

```
/* printout of file: black.icon */
/****************************/

/* Format_version=1, Width=64, Height=64, Depth=1, Valid_bits_per_item=16
 */
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF,
    0xFFFF,0xFFFF,0xFFFF,0xFFFF,0xFFFF,0xFFFF,0xFFFF,0xFFFF
```

```
/* printout of file: goal.icon */
/***************************/

/* Format_version=1, Width=64, Height=64, Depth=1, Valid_bits_per_item=16
 */
        0x0000,0x03FF,0xFF80,0x0000,0x0000,0x1FFF,0xFFF0,0x0000,
        0x0000,0x7FFF,0xFFFC,0x0000,0x0001,0xFFFF,0xFFFF,0x0000,
        0x0003,0xFFC0,0x07FF,0x8000,0x000F,0xFE00,0x00FF,0xE000,
        0x001F,0xF000,0x001F,0xF000,0x003F,0xC000,0x0007,0xF800,
        0x007F,0x8000,0x0003,0xFC00,0x00FE,0x001F,0xF000,0xFE00,
        0x01FC,0x01FF,0xFF00,0x7F00,0x03F8,0x07FF,0xFFC0,0x3F80,
        0x07F0,0x1FE0,0x0FF0,0x1FC0,0x07E0,0x3F00,0x01F8,0x0FC0,
        0x0FC0,0x7C00,0x007C,0x07E0,0x1F81,0xF800,0x003F,0x03F0,
        0x1F83,0xE00F,0xE00F,0x83F0,0x3F03,0xC07F,0xFC07,0x81F8,
        0x3E07,0x81FF,0xFF03,0xC0F8,0x7E0F,0x03F8,0x1F81,0xE0FC,
        0x7C1F,0x07C0,0x07C1,0xF07C,0x7C1E,0x0F80,0x01E0,0xF07C,
        0xFC3C,0x1F00,0x00F0,0x787E,0xF83C,0x3E03,0xE078,0x783E,
        0xF878,0x3C0F,0xF838,0x3C3E,0xF878,0x781F,0xFC3C,0x3C3E,
        0xF078,0x783F,0xFE1C,0x3C1F,0xF070,0x787E,0x3F1C,0x1C1F,
        0xF0F0,0xF078,0x0F0E,0x1E1F,0xF0F0,0xF0F8,0x0F8E,0x1E1F,
        0xF0F0,0xF0F1,0xC78E,0x1E1F,0xF0F0,0xF0F1,0xC78E,0x1E1F,
        0xF0F0,0xF0F1,0xC78E,0x1E1F,0xF0F0,0xF0F8,0x0F8E,0x1E1F,
        0xF0F0,0xF078,0x0F0E,0x1E1F,0xF0F0,0x787E,0x3F1C,0x1E1F,
        0xF0F8,0x783F,0xFE1C,0x3E1F,0xF878,0x781F,0xFC3C,0x3C3E,
        0xF878,0x3C0F,0xF838,0x3C3E,0xF87C,0x3E03,0xE078,0x7C3E,
        0xFC7C,0x1F00,0x00F0,0x7C7E,0x7C3E,0x0F80,0x01E0,0xF87C,
        0x7C3F,0x07C0,0x07C1,0xF87C,0x7E1F,0x03F8,0x1F81,0xF0FC,
        0x3E1F,0x81FF,0xFF03,0xF0F8,0x3F0F,0xC07F,0xFC07,0xE1F8,
        0x1F87,0xE00F,0xE00F,0xC3F0,0x1F83,0xF800,0x003F,0x83F0,
        0x0FC3,0xFC00,0x007F,0x87E0,0x07E1,0xFF00,0x01FF,0x0FC0,
        0x07F0,0x7FE0,0x0FFC,0x1FC0,0x03F8,0x3FFF,0xFFF8,0x3F80,
        0x01FC,0x1FFF,0xFFF0,0x7F00,0x00FE,0x07FF,0xFFC0,0xFE00,
        0x007F,0x81FF,0xFF03,0xFC00,0x003F,0xC01F,0xF007,0xF800,
        0x001F,0xF000,0x001F,0xF000,0x000F,0xFE00,0x00FF,0xE000,
        0x0003,0xFFC0,0x07FF,0x8000,0x0001,0xFFFF,0xFFFF,0x0000,
        0x0000,0x7FFF,0xFFFC,0x0000,0x0000,0x1FFF,0xFFF0,0x0000,
        0x0000,0x03FF,0xFF80,0x0000,0x0000,0x003F,0xF800,0x0000
```

```
/* printout of file:  gray25.icon */
/*****************************/

/* Format_version=1, Width=64, Height=64, Depth=1, Valid_bits_per_item=16
 */
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111,
        0x8888,0x8888,0x8888,0x8888,0x2222,0x2222,0x2222,0x2222,
        0x4444,0x4444,0x4444,0x4444,0x1111,0x1111,0x1111,0x1111
```

```
/* printout of file:  gray50.icon */
/**************************/

/* Format_version=1, Width=64, Height=64, Depth=1, Valid_bits_per_item=16
 */
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555,
        0xAAAA,0xAAAA,0xAAAA,0xAAAA,0x5555,0x5555,0x5555,0x5555
```

```
/* printout of file:  gray75.icon */
/*************************/

/* Format_version=1, Width=64, Height=64, Depth=1, Valid_bits_per_item=16
 */
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE,
        0x7777,0x7777,0x7777,0x7777,0xDDDD,0xDDDD,0xDDDD,0xDDDD,
        0xBBBB,0xBBBB,0xBBBB,0xBBBB,0xEEEE,0xEEEE,0xEEEE,0xEEEE
```

```
/* printout of file: heap.icon */
/****************************/

/* Format_version=1, Width=64, Height=64, Depth=1, Valid_bits_per_item=16
*/
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x003F,0xFFFF,0xFFFF,0xE000,
    0x003F,0xFFFF,0xFFFF,0xE000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x0030,0x0000,0x0000,0x6000,
    0x0030,0x0000,0x0000,0x6000,0x003F,0xFFFF,0xFFFF,0xE000,
    0x003F,0xFFFF,0xFFFF,0xE000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000
```

```
/* printout of file:  path.icon */
/****************************/

/* Format_version=1, Width=64, Height=64, Depth=1, Valid_bits_per_item=16
*/
        0x0000,0x0000,0x0000,0x0000,0x0000,0x0000,0x0000,0x0000,
        0x0000,0x0000,0x0000,0x0000,0x0000,0x0000,0x0000,0x0000,
        0x0FFF,0xFFFF,0xFFFF,0xFFF0,0x0800,0x0000,0x0000,0x0010,
        0x0800,0x0000,0x0000,0x0010,0x0800,0x0000,0x0000,0x0010,
        0x0800,0x0000,0x0000,0x0010,0x0800,0x0000,0x0000,0x0010,
        0x0800,0x0000,0x0000,0x0010,0x0800,0x0000,0x0000,0x0010,
        0x080F,0xFFFF,0xFFFF,0xF010,0x0808,0x0000,0x0000,0x1010,
        0x0808,0x0000,0x0000,0x1010,0x0808,0x0000,0x0000,0x1010,
        0x0808,0x0000,0x0000,0x1010,0x0808,0x0000,0x0000,0x1010,
        0x0808,0x0000,0x0000,0x1010,0x0808,0x0000,0x0000,0x1010,
        0x0808,0x0FFF,0xFFF0,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0800,0x0010,0x1010,
        0x0808,0x0800,0x0010,0x1010,0x0808,0x0FFF,0xFFF0,0x1010,
        0x0808,0x0000,0x0000,0x1010,0x0808,0x0000,0x0000,0x1010,
        0x0808,0x0000,0x0000,0x1010,0x0808,0x0000,0x0000,0x1010,
        0x0808,0x0000,0x0000,0x1010,0x080F,0xFFFF,0xFFFF,0xF010,
        0x0800,0x0000,0x0000,0x0010,0x0800,0x0000,0x0000,0x0010,
        0x0800,0x0000,0x0000,0x0010,0x0800,0x0000,0x0000,0x0010,
        0x0800,0x0000,0x0000,0x0010,0x0FFF,0xFFFF,0xFFFF,0xFFF0,
        0x0000,0x0000,0x0000,0x0000,0x0000,0x0000,0x0000,0x0000,
        0x0000,0x0000,0x0000,0x0000,0x0000,0x0000,0x0000,0x0000
```

```
/* printout of file:  white.icon */
/****************************/

/* Format_version=1, Width=64, Height=64, Depth=1, Valid_bits_per_item=16
 */
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000,
	0x0000,0x0000,0x0000,0x0000,0x0000,0x0000,0x0000,0x0000
```

```
/* printout of file:  arrows.externs.h */
/*****************************/

/* definition of direction_arrows */
/* used by bud.c and by path.c */ extern VECTTYPE opposing[DIRECTION_COUNT];
        /* lookup table of arrow opposing */

/* directions are (dx,dy) */
/* directions must be in pairs s.t. even & (even+1) */
/* represent opposing vectors */ extern DIR_NODE direction[DIRECTION_COUNT];
```

```
/* printout of file: arrows.globals.h */
/****************************/

/* definition of direction_arrows */
/* used by bud.c and by path.c */

VECTTYPE opposing[DIRECTION_COUNT];      /* lookup table of arrow opposing */

/* directions are (dx,dy) */
/* directions must be in pairs s.t. even & (even+1) */
/* represent opposing vectors */ ifdef HAS_KNIGHT_MOVES
DIR_NODE direction[DIRECTION_COUNT] = {
        1,0,     /* 0- right */
        -1,0,    /* 1- left */
        0,1,     /* 2- up */
        0,-1,    /* 3- down */
        1,1,     /* 4- rt, up */
        -1,-1,   /* 5- lt, dn */
        -1,1,    /* 6- lt, up */
        1,-1,    /* 7- rt, dn */
        2,1,-2,-1,
        1,2,-1,-2,
        -1,2,1,-2,
        -2,1,2,-1
};
#else
/* standard 8 directions */
/* horizontal, vertical & diagonals */
DIR_NODE direction[DIRECTION_COUNT] = {
        1,0,     /* 0- right */
        -1,0,    /* 1- left */
        0,1,     /* 2- up */
        0,-1,    /* 3- down */
        1,1,     /* 4- rt, up */
        -1,-1,   /* 5- lt, dn */
        -1,1,    /* 6- lt, up */
        1,-1};   /* 7- rt, dn */
#endif
```

```c
/* printout of file: defines.h */
/*****************************/ include <math.h>

/*****************************************************************/
/* #define HAS_KNIGHT_MOVES **************************************/
/* remove comment above for 16 neighbor version & recompile all */
/*****************************************************************/ typedef short INDEXTYPE;

/*#define HAS_KNIGHT_MOVES*/ ifdef HAS_KNIGHT_MOVES
define DIRECTION_COUNT 16
#else
#define DIRECTION_COUNT 8
endif /*#define FLOATWORLD*/
ifdef FLOATWORLD
typedef float COSTTYPE;
#else
typedef int COSTTYPE;
endif define COUPLING 1              /* 1 if coupling to wyatt arm */
define UINT16   unsigned short
#define INT16    short
/*****************************************************************/
/*      defines.h
/*      history:
/*              created 198609xx Leo Dorst
/*              mod     19861113 Leo + Karen
/*****************************************************************/
#define NUMBER         234 /* arbitrary constant for bresenham */
#define LIST           235 /* arbitrary constant for bresenham */
#define COLOR_MAP_SIZE 4   /* current belief is = # bitplanes used */
#define CENTIMETER     4   /* number of pixels per centimeter */
#define NUMOBS         5   /* since obstacles are saved in the bitplanes
                              of the array con, the number of obstacles
                              should not exceed sizeof(type of con) */
#define NUMPHOBS 5

/*
#define XSIZE    64
#define YSIZE    64
*/
#define XSIZE    10
define YSIZE    10 define HIRES    1         /* 1 if you want hires screen options, 0 otherwise */
```

```
define CMARGIN 20 define CSTEP           0       /* this includes 1 pixel cell boundary */
define CELL_SIZE       (512/XSIZE)
#define CXSIZE          (2*CMARGIN+XSIZE*(CSTEP+CELL_SIZE)+CSTEP)
#define CYSIZE          (2*CMARGIN+YSIZE*(CSTEP+CELL_SIZE)+CSTEP)
#define PNT_OFFSET      ( CMARGIN + CSTEP + 1 )
#define MAXDIM 16       /* maximum dimension for basic pattern */
#define MAXSIZE         (MAXDIM*MAXDIM/16)
#define WHITEP   0
#define GRAY25   1
#define GRAY50   2
#define GRAY75   3
#define BLACKP   4
#define PATCH_COUNT 5
#define POINTERPATCH    BLACKP  /* patch plotted when pointing to con space */
#define PATHPATCH       BLACKP  /* patch plotted on path in config space */
#define MOVEPATCH       BLACKP  /* patch plotted when moving in con space */
/* #define ICON_SIZE    (CELL_SIZE*CELL_SIZE/sizeof(UINT16)) */
#define ICON_SIZE       16
#define SMICON_SIZE     1
#define OBST_ICON       0
#define GOAL_ICON       1
#define HEAP_ICON       2
#define START_ICON      3
#define SMOBST_ICON     4
#define SMGOAL_ICON     5
#define SMSTART_ICON    6
define ICON_COUNT      7 define GOAL_ICON_SIZE  64 ifdef FLOATWORLD
define INFINITY        9e6
/*(MAXFLOAT/2.) /* code for infinite values */ define UNCOSTED        8e6
/*(INFINITY * .9999999) /* code for undetermined values */
#else
#define INFINITY 999999
#define UNCOSTED 888888
endif define NOCONSTRAINT    0               /* code for absence of constraints */
define GOAL            1               /* code for goal points */
#define NOGOAL          0               /* code for goal points */
#define UNITSTEPX       5               /* unit step size */
#define UNITSTEPY       5               /* unit step size */
#define DIAGONAL        7               /* diagonal step size */
#define XTS             UNITSTEPX
#define YTS             UNITSTEPY
#define DIA             DIAGONAL
```

```c
#define OBSTACLE        -1              /* obstacle pointer */
#define IP              0               /* initial pointer */
#define LENGTH1         (25*CENTIMETER)
#define LENGTH2F        (26*CENTIMETER)
#define LENGTH2R        (13*CENTIMETER)
#define PI              3.14159
#define PI2             (PI*2.0)
#define ANGLE1RES       ((2.0*PI)/(float)(XSIZE))
#define ANGLE2RES       ((2.0*PI)/(float)(YSIZE))
#define ANGLE1PIX       ((float)(XSIZE*CELL_SIZE)/32768.0)
#define ANGLE2PIX       ((float)(YSIZE*CELL_SIZE)/32768.0)
#define NOBLOCK 0                       /* no blocking present */
#define BLOCK   1                       /* block present */
#define CARTMARGIN      0
#define CARTWIDTH       (128*CENTIMETER)
#define CARTHEIGHT      (128*CENTIMETER)
#define XBASE           ((CARTWIDTH-2*CARTMARGIN)/2 + CARTMARGIN)
#define YBASE           ((CARTWIDTH-2*CARTMARGIN)/2 + CARTMARGIN)
#define FRAME0_XOFFSET  20
#define FRAME0_YOFFSET  110
#define BLOCK_BUTTON    0
#define START_BUTTON    0
#define GOAL_BUTTON     3
#define DGOAL_BUTTON    1
#define POINTER_BUTTON  2
#define STATE_CONSTRAINT_BUTTON 3
#define MOVEMODE        0
#define PATHMODE        1
#define NOARM           2
#define STICK_ARM       0
#define BODY_ARM        1
#define FLOW    0
#define NOFLOW  1
#define DOT     0       /* cell data types */
#define SQUEL   1
#define XWALL   2
#define YWALL   4
#define PIX_COLOR(color)        ((color)<<5)
#define BLACK   1
#define WHITE   0
#define MAXCOM  10      /* maximum number of commands in string */
#define MAXPATH (XSIZE+YSIZE) /* maximum path length */
#ifdef MAKINGSINCOS
#include "/usr/local/interc/include/rt.h"
#endif
#include <stdio.h>
include <math.h>
#include <errno.h>
#include <pixrect/pixrect_hs.h>
#include <sunwindow/window_hs.h>
#include <suntool/tool_struct.h>
#include <suntool/window.h>
#include <suntool/frame.h>
```

```c
#include <suntool/canvas.h>
#include <suntool/panel.h>
typedef char FLAGTYPE;
typedef struct position ( INT16 x, y; )          SCREEN_POS, GRID_POS;
typedef struct cell     ( INT16 x, y, xsize, ysize, type, color;)      CELL;
typedef struct element  ( INT16 i, j, type, value; )         ELEMENT;
typedef struct cartcell      ( INT16 x, y, xsize, ysize, color;) CARTCELL;
typedef struct cartelement   ( INT16 i, j, value; )              CARTELEMENT;
typedef struct robot_arm (INT16 end1_x,end1_y,end2f_x,end2f_y,end2r_x,end2r_y;
                          double angle1,angle2;) ARM;
typedef char            LOGICAL;
typedef char            COLOR;
typedef UINT16          PIXEL;
typedef struct canvas_handlers (
        void (*reader)();
        void (*feedback)();
) CANVAS_HANDLERS;

typedef struct positionlist (
        GRID_POS **list;
        INT16 current,
        number;
) POSITIONLIST;

#ifdef ONBOARD
#define POOLSIZE 300000
#else
#define POOLSIZE 200
endif define BADALLOC      -1              /* returned value if alloc is NG */
define DONTSEND       0
#define SEND           1
define PATHLENGTH    300 define INPUT          0
define PROPAGATE      1
#define PREPARE        2
#define GRADIENT       3

/* arm shape parameters */ define W1      ( 3.75*CENTIMETER)    /* width arm 1 */
define L11     (-3.75*CENTIMETER)    /* elbow arm 1 */
#define L12     (27.25*CENTIMETER)    /* front arm 1 */
#define L1J     ( 25.0*CENTIMETER)    /* arm 1: distance to joint */
#define W2      ( 1.0*CENTIMETER)     /* width arm 2 */
#define L21     (-13.0*CENTIMETER)    /* elbow arm 2 */
define L22     ( 26.0*CENTIMETER)    /* front arm 2 */ define MAX_GOAL_NUMBER 30
define MAX_PATH_NUMBER (5*(XSIZE+YSIZE))
```

```
#define YES 1
define NO 0 define KILLGOALS 0
define KEEPGOALS 1 define MOTION 0
define DISTANCE 1
#define EFFORT 2

/*      @(#)cms_rgb.h 1.2 86/10/08 SMI   */

/*
 * Copyright (c) 1983 by Sun Microsystems, Inc.
 */

/*
 * Definition of the colormap segment CMS_RGB,
 * the collection of rgb (red-green-blue) binary combinations.
 */ define CMS_RGB         "rgb"
define CMS_RGBSIZE     8
define NUMCOLORBITS    3 define WHITEC          0
define REDC            1
#define YELLOWC         2
#define GREENC          3
#define CYANC           4
#define BLUEC           5
#define MAGENTAC        6
define BLACKC          7 define cms_rgbsetup(r,g,b)     (r)[WHITEC] = 255;       (g)[WHITEC] = 255;      (b)[WH typedef unsigned VECTTYPE ;/* bit string of direction flags */ define PUT_IN_HEAP 0x1
define REMOVE_FROM_HEAP (~PUT_IN_HEAP)

#define PUT_IN_PERIM 0x2
#define REMOVE_FROM_PERIM (~PUT_IN_PERIM)

typedef struct csnode {
        COSTTYPE cost_to_goal;
        VECTTYPE vector;        /* 16 possible vectors */
        FLAGTYPE flags;
} CSNODE;

typedef struct heapnode {
```

```c
        INDEXTYPE x;
        INDEXTYPE y;
} HEAPNODE;

typedef unsigned int BOTHINDICIES;    /* length of x&y together */ typedef struct xynode {
        INDEXTYPE x;      /* could be a char !! */
        INDEXTYPE y;
} XYNODE;

typedef struct polnode {
        int x;            /* must be int !! */
        int y;
} POLNODE;

typedef struct dir_node {
        INDEXTYPE dx;     /* could be a char !! */
        INDEXTYPE dy;
} DIR_NODE;

#define FACCURACY (1e-2)

#ifdef FLOATWORLD
#define ACCURACY FACCURACY
#else
#define ACCURACY 0
endif define MAXHEAP 10000
define NUMVERTICES 12 /* maximum number of vertices in a polygon */ typedef COSTTYPE (*PFF)();

define DRAWOBS 0
#define ADDOBS 1
#define REMOBS -1
#define HALFWAY 2
#define ADDPHOBS 3
#define REMPHOBS -3

/* for path.c */
#define NOPROBLEM 0
define STUCK 1 define STANDARD      1
define PHANTOM       2
#define MAXPERIM 10000
#define GOAL_START ((int)((GOAL_ICON_SIZE-CELL_SIZE)/2))
#define GOAL_CELL_SIZE 16
/* pixels */
#define TASK_GOAL_START ((int)((GOAL_ICON_SIZE-GOAL_CELL_SIZE)/2))
```

```
/* TASK_GOAL should be a fixed size ie 64/4 = 16 */
#define INC (CELL_SIZE + CSTEP)
```

```
/* printout of file: externs.h */
/******************************/

/**************************************************************/
/*      externs.h
/*      history:
/*              created 198609xx LEo Dorst
/*              mod     19861113 Karen Trovato
/**************************************************************/ extern CELL         null_cell;
extern ELEMENT      null_element;
extern GRID_POS     null_position; /* also for SCREEN_POS */
extern CARTCELL     null_cartcell;
extern CARTELEMENT  null_cartelement;
extern ARM          null_arm;

/**************************************************************/
/*      canvas.c       */
/**************************************************************/ extern void     (*reader)();

extern          init_canvases();
extern void     nullproc();
extern          canvas1_event_proc();
extern          canvas2_event_proc();
extern          message_event_proc();

extern void     basereader();
extern void     tracker();
extern void     reset_handlers();
extern void     point_feedback1();
extern void     point_read1();
extern void     change2_proc();
extern void     change1_proc();
extern void     flow_proc();
extern void     mode_proc();
extern void     redraw_proc();
extern void     speed_proc();
extern void     camera_proc();
extern void     robot_proc();
extern void     demo_proc();
extern void     gain_proc();
extern void     metric_proc();

extern CANVAS_HANDLERS base;
extern CANVAS_HANDLERS canvas1_hand;
extern CANVAS_HANDLERS canvas2_hand;

extern CANVAS_HANDLERS *current;
extern CANVAS_HANDLERS *last_touched;
```

```
extern erase_arms();
extern LOGICAL  special_point();
/***************************************************************/
/*      print.c */
/***************************************************************/
extern print_pnt();
extern print_car();
extern print_con();
/***************************************************************/
/*      show.c  */
/***************************************************************/
extern show_goa();
extern show_con();
extern show_car();
extern show_pnt();
extern show_ima();
extern show_start_point();
extern show_goal_point();
extern plot_patch();
extern plot_patch();
extern plot_icon();
extern paint_element2();
extern plot_canvas2();
extern plot_canvas1();
extern clear_canvas1();
extern clear_canvas2();
extern show_arm();
extern plot_path_element();
extern grid_paint2();
extern grid_paint1();
extern ELEMENT *element_of_point1();
extern CARTELEMENT *element_of_point2();
extern CARTCELL * element_to_cell2();
extern CELL * element_to_cell();
extern element_show();
/***************************************************************/
/*      cdt.c   */
/***************************************************************/
extern init_cdt();
extern new_cdt();
extern int Bx();
extern int By();
/***************************************************************/
/*      path.c  */
/***************************************************************/
find_and_draw_shortest_path();
/***************************************************************/
/*      trafo_data.c    */
/***************************************************************/
extern short roundx();
extern short roundy();
extern short periodic_x();
extern short periodic_y();
```

```
extern set_arm();
extern print_arm();
extern init_arm();
extern borderline();
/*****************************************************************/
/*      icons   */
/*****************************************************************/
/* memory pixrects for cursors            */
/*****************************************************************/
extern  short cursor_array[16];
extern struct pixrect cursor_pr;
extern struct cursor   main_cursor;

/*****************************************************************/
/* memory pixrects in white, grey and black patterns.        */
/*****************************************************************/ extern  unsigned short   white_data[];
extern  unsigned short   gray25_data[];
extern  unsigned short   gray50_data[];
extern  unsigned short   gray75_data[] ;
extern  unsigned short   black_data[];
extern struct pixrect white_patch;
extern struct pixrect gray25_patch;
extern struct pixrect gray50_patch;
extern struct pixrect gray75_patch;
extern struct pixrect black_patch;
extern struct pixrect *patch_prs[PATCH_COUNT];
extern struct pixrect standardobs;
extern struct pixrect phantomobs;
extern unsigned short obstacle_data[32*32/16];

extern PIXEL constraint_image [XSIZE] [YSIZE];
                    /* interm config  constraint image */
extern PIXEL pnt [XSIZE] [YSIZE];        /* pointer image */
extern int path[2*PATHLENGTH];

/*****************************************************************/
/*      icons   */
/*****************************************************************/ extern struct pixrect heap_icon;
extern struct pixrect goal_icon;
extern struct pixrect obst_icon;
extern struct pixrect start_icon;
extern struct pixrect smgoal_icon;
extern struct pixrect smobst_icon;
extern struct pixrect smstart_icon;
extern  unsigned short   goal_data[];
extern  unsigned short   obst_data[ICON_SIZE];
extern  unsigned short   start_data[ICON_SIZE];
extern  unsigned short   smgoal_data[SMICON_SIZE];
extern  unsigned short   smobst_data[SMICON_SIZE];
```

```c
extern  unsigned short   smstart_data[SMICON_SIZE];
extern  struct pixrect *icon_prs[ICON_COUNT];

/***************************************************************/
/*      arrows */
/*      in order of XP,XN,YP,YN,LU,LD,RU,RD */
/***************************************************************/ extern struct pixrect xp_arrow;
extern struct pixrect xn_arrow;
extern struct pixrect yp_arrow;
extern struct pixrect yn_arrow;
extern struct pixrect lu_arrow;
extern struct pixrect ld_arrow;
extern struct pixrect ru_arrow;
extern struct pixrect rd_arrow;
extern  unsigned short   xp_data[ICON_SIZE];
extern  unsigned short   xn_data[ICON_SIZE];
extern  unsigned short   yp_data[ICON_SIZE];
extern  unsigned short   yn_data[ICON_SIZE];
extern  unsigned short   lu_data[ICON_SIZE];
extern  unsigned short   ld_data[ICON_SIZE];
extern  unsigned short   ru_data[ICON_SIZE];
extern  unsigned short   rd_data[ICON_SIZE];
extern struct pixrect *arrow_prs[DIRECTION_COUNT];

/***************************************************************/
/* basic point definitions */
/***************************************************************/ extern short    istart,jstart;          /* start point */
extern short    igoal,jgoal;
extern short    ilast,jlast;
extern LOGICAL  new_feedback;
/***************************************************************/
/* arm definition */
/***************************************************************/
extern ARM      *arm;

/***************************************************************/
/* configuration space definitions */
/***************************************************************/
extern PIXEL goa [XSIZE] [YSIZE];               /* goal image */
extern PIXEL pnt [XSIZE] [YSIZE];               /* pointer image */
extern unsigned int ima [XSIZE] [YSIZE];        /* result image */ extern  int x_increment[DIRECTION_COUNT];
extern  int y_increment[DIRECTION_COUNT];

/***************************************************************/
/* canvas treatment: cell dimensions */
/***************************************************************/
```

```
extern Frame            frame0;
extern Frame            message_frame;
extern Canvas           canvas1;
extern Pixwin           *canvas1_pw;
extern struct pixrect   *canvas1_pr;

extern Canvas           canvas2;
extern Pixwin           *canvas2_pw;
extern struct pixrect   *canvas2_pr;

extern Panel            panel;
extern Panel            panel2;
extern Panel            message_panel;
extern Panel_item       goal_button;
extern Panel_item       start_button;
extern Panel_item       change1_item;
extern Panel_item       change2_item;
extern Panel_item       mode_item;
extern Panel_item       flow_item;
extern Panel_item       redraw_item;
extern Panel_item       speed_item;
extern Panel_item       metric_item;
extern Panel_item       gain_item;
extern Panel_item       camera_item;
extern Panel_item       robot_item;
extern Panel_item       message;
extern Panel_item       message_item;
extern Panel_item       prog_item1;
extern Panel_item       prog_item2;
extern Panel_item       demo_item;

extern short    change2;
extern short    change1;
extern short    mode;
extern short    redraw;
extern short    flow;
extern short    speed;
extern short    camera;
extern short    robot;
extern short    gain;
extern COSTTYPE (*metric_fcn)();        /* ptr to any of the metric fcns */ extern u_char rmap[COLOR_MAP_SIZE], gmap[COLOR_MAP_SIZE], bmap[COLOR_MAP_SIZE];

extern short present_obstacle;
extern SCREEN_POS ph_obs_pos[NUMOBS];
extern SCREEN_POS ph_obs_pos_old[NUMOBS];
extern SCREEN_POS obs_pos[NUMOBS];
extern SCREEN_POS obs_pos_old[NUMOBS];
extern int rad8;
extern int angleobs;
extern int obs_ang1, obs_ang2, obs_ll_plus, obs_ll_minus;
extern short oldevent_x, oldevent_y;
```

```
extern int obs_ang1,obs_ang2;    /* results of 12f/rinterp_obs appear here */
extern int nobs,il;              /* useful values for debug */
extern int obs_11_plus,obs_11_minus; /* result of 11_interp_obs appears here*/
extern int rad8,angleobs;        /* radius scaled up by 8 */
extern int link2_front[14][2][13]; /* obstacle point descriptors (link2 front) */
extern int del_12f[14][2][13];   /* pt 0 absolute, and d01,d02 relat positions */
extern int link2_rear[10][2][13]; /* obstacle point descriptors (link2 rear) */
extern int del_12r[10][2][13];   /* pt 0 absolute, and d01,d02 relat positions */
extern int link1_obs[16];        /* link1 obstacle data +/1 dtheta bound */
extern unsigned int bitmask[32]; /* bit masks for obstacle codes */ extern short pathlength;

extern short lookupx[256][256];
extern short lookupy[256][256];
extern LOGICAL regeneration_needed;
extern short i_shown_arm, j_shown_arm;
extern LOGICAL arm_shown;
extern LOGICAL feedback;

extern GRID_POS task_goal[MAX_GOAL_NUMBER];
extern short   num_goals;
extern LOGICAL path_drawn;
extern CSNODE (*configspace)[YSIZE];
extern PIXEL (*con) [YSIZE];     /* configuration constraint image */
extern PIXEL ph_con (XSIZE][YSIZE];   /* configuration constraint image */
extern bud();
extern init_goal();

extern int firstime;
extern un_bud();                 /* in bud.c */
extern un_look();                /* in bud.c */
extern remove_goal();            /* in bud.c */
extern delete_from_min_heap();
extern coordinates_of();         /* in bud.c */
extern double celltoangle_x();   /* in trafo_data.c */
extern double celltoangle_y();   /* in trafo_data.c */
extern unsigned char red[CMS_RGBSIZE];
extern unsigned char green[CMS_RGBSIZE];
extern unsigned char blue[CMS_RGBSIZE];
extern unsigned char red1[CMS_RGBSIZE];
extern unsigned char green1[CMS_RGBSIZE];
extern unsigned char blue1[CMS_RGBSIZE];

extern DIR_NODE direction[DIRECTION_COUNT];
extern COSTTYPE metric_value(); /* in metric.c */
extern float dl1_task_straight[XSIZE];
extern float dli_task_straight[XSIZE];
extern float di2_task_straight[XSIZE];
extern float d12_task_straight[XSIZE];
extern COSTTYPE effort(); /* in metric.c */
extern COSTTYPE task_straight();       /* in metric.c */
```

```
extern COSTTYPE config_straight();     /* in metric.c */ extern int newcon;
extern int perim;

extern HEAPNODE heap[MAXHEAP+1];       /* heap uses locations 1-> MAXHEAP */
                      /* location 0 isn't used to hasten indexing */ extern XYNODE remobs[MAXHEAP];  /* keep newly freed constraints here */
extern XYNODE addobs[MAXHEAP];  /* keep newly added constraints here */ extern XYNODE newgoals[MAX_GOAL_NUMBER];/* keep the newly added goals here */
extern XYNODE remgoals[MAX_GOAL_NUMBER];/* keep the newly added goals here */ extern XYNODE goal[MAX_GOAL_NUMBER]; /* cumulative goals kept here */
extern goalcounter;

extern int nfcounter, newgoalcounter, remgoalcounter;
                         /* indicies into above structures */ extern check_new_obs_and_rmd_goals();   /* in bud.c */ extern check_free_obs_and_new_goals();  /* in bud.c */ extern clear_influence(); /* in bud.c */
extern budinit();         /* in bud.c */ extern int addobscounter;
extern int remobscounter;

extern XYNODE bloblist [MAXHEAP];
extern int numbloblist;

extern int obstacle;

extern GRID_POS path_array[MAX_PATH_NUMBER];
extern int pathcounter;
extern int perim_index;
extern XYNODE perimeter[MAXPERIM+1];

extern struct pixfont *smallfont;
extern dump_screen();
extern show_heap(),
extern show_perim();
```

```
/* printout of file: globals.h */
/*********************/

/***********************************************************/
/*       globals.h
/*       history:
/*               created 198609xx Leo Dorst
/*               mod     19861113 Karen Trovato
/***********************************************************/
/***********************************************************/
/* type definitions */
/***********************************************************/

/***********************************************/

CELL          null_cell       = {0,0,0,0,0,0};
ELEMENT       null_element    = {0,0,0,0};
GRID_POS      null_position   = {0,0};           /* also for SCREEN_POS */
CARTCELL      null_cartcell   = {0,0,0,0,0};
CARTELEMENT   null_cartelement = {0,0,0};
ARM           null_arm        = {0,0,0,0,0.0,0.0,0.0};

/***********************************************************/
/* pertaining to color - kit */
/***********************************************************/
static u_char rmap[COLOR_MAP_SIZE],
              gmap[COLOR_MAP_SIZE],
              bmap[COLOR_MAP_SIZE];
              /* r[x],g[x],b[x] is assigned a color for each bit plane */
/***********************************************************/
/* memory pixrects for cursors                    */
/***********************************************************/
static short cursor_array[16] = {
       0x8000,0xC000,0xE000,0xF000,0xF800,0xFC00,0xFE00,0xF000,
       0xD800,0x9800,0x0C00,0x0C00,0x0600,0x0600,0x0300,0x0300
};
mpr_static (cursor_pr,16,16,1,cursor_array);
struct cursor   main_cursor = { 0,0,PIX_SRC^PIX_DST,&cursor_pr };
/***********************************************************/
/* memory pixrects in white, grey and black patterns.       */
/***********************************************************/ static unsigned short   white_data[] = {
include "white.icon"
};
mpr_static(white_patch, MAXDIM, MAXDIM, 1, white_data);

static unsigned short   gray25_data[] = {
#include "gray25.icon"
};
```

```
mpr_static(gray25_patch, MAXDIM, MAXDIM, 1, gray25_data);

static unsigned short   gray50_data[] = {
#include "gray50.icon"
};

mpr_static(gray50_patch, MAXDIM, MAXDIM, 1, gray50_data);

static unsigned short   gray75_data[] = {
#include "gray75.icon"
};
mpr_static(gray75_patch, MAXDIM, MAXDIM, 1, gray75_data);

static unsigned short   black_data[] = {
#include "black.icon"
};

mpr_static(black_patch, MAXDIM, MAXDIM, 1, black_data);

struct pixrect *patch_prs[PATCH_COUNT] =
              { &white_patch, &gray25_patch,&gray50_patch,
                &gray75_patch, &black_patch};

/**************************************************************/
/*      icons   */
/**************************************************************/ static unsigned short   goal_data[] = {
include "goal.icon"
};

mpr_static (goal_icon,GOAL_ICON_SIZE,GOAL_ICON_SIZE,1,goal_data);

static unsigned short   obst_data[ICON_SIZE] = {
        0x0000,0x7FFE,0x7FFE,0x783E,0x7C7E,0x6EF6,0x67E6,0x63C6,
        0x63C6,0x67E6,0x6E76,0x7C3E,0x781E,0x7FFE,0x7FFE,0x0000 };
mpr_static (obst_icon,CELL_SIZE,CELL_SIZE,1,obst_data);

static unsigned short   start_data[ICON_SIZE] = {
        0xF99F,0xF3CF,0xE7E3,0xC003,0x8001,0x27E4,0x67E6,0xE667,
        0xE667,0x67E6,0x27E4,0x8001,0xC003,0xC7E3,0xF3CF,0xF99F };
mpr_static (star_icon,CELL_SIZE,CELL_SIZE,1,start_data);

static unsigned short heap_data[]={
#include "heap.icon"
};
mpr_static (heap_icon,CELL_SIZE,CELL_SIZE,1,heap_data);

static unsigned short   smgoal_data[SMICON_SIZE] = { 0x6FF6 };
/* 0x7EFF, 0xC3DB, 0xDBC3, 0xFF7E ); */
mpr_static (smgoal_icon,CELL_SIZE,CELL_SIZE,1,smgoal_data);
```

```
static unsigned short  smobst_data[SMICON_SIZE] = ( 0x9669 );
/* 0xC3E7, 0x7E3C, 0x3C7E, 0xE7C3 ); */
mpr_static (smobst_icon,CELL_SIZE,CELL_SIZE,1,smobst_data);

static unsigned short  smstart_data[SMICON_SIZE] = ( 0xF99F );
/* 0xFFFF, 0xC3C3, 0xC3C3, 0xFFFF ); */
mpr_static (smstar_icon,CELL_SIZE,CELL_SIZE,1,smstart_data);

struct pixrect *icon_prs[ICON_COUNT] =
               { &obst_icon,&goal_icon,&heap_icon,&star_icon,
                 &smobst_icon, &smgoal_icon, &smstar_icon};

/****************************************************************/
/*      icon of standardobstacle        */
/****************************************************************/
static unsigned short  obstacle_data[32*32/16] = {
        0x01F0,0x0000,0x0FFE,0x0000,0x1FFF,0x0000,0x3FFF,0x8000,
        0x7FFF,0xC000,0x7FFF,0xC000,0x7FFF,0xC000,0x7FFF,0xC000,
        0xFFFF,0xE000,0xFFFF,0xE000,0xFFFF,0xE000,0xFFFF,0xE000,
        0xFFFF,0xE000,0x7FFF,0xC000,0x7FFF,0xC000,0x7FFF,0xC000,
        0x3FFF,0x8000,0x1FFF,0x0000,0x0FFE,0x0000,0x01F0,0x0000,
        0x0000,0x0000,0x0000,0x0000,0x0000,0x0000,0x0000,0x0000,
        0x0000,0x0000,0x0000,0x0000,0x0000,0x0000,0x0000,0x0000,
        0x0000,0x0000,0x0000,0x0000,0x0000,0x0000,0x0000,0x0000
};
static unsigned short  ph_obstacle_data[32*32/16] = {
        0x01F0,0x0000,0x0E0E,0x0000,0x1001,0x0000,0x2000,0x8000,
        0x4000,0x4000,0x4000,0x4000,0x4000,0x4000,0x4000,0x4000,
        0x8000,0x2000,0x8000,0x2000,0x8000,0x2000,0x8000,0x2000,
        0x8000,0x2000,0x4000,0x4000,0x4000,0x4000,0x4000,0x4000,
        0x2000,0x8000,0x1001,0x0000,0x0E0E,0x0000,0x01F0,0x0000,
        0x0000,0x0000,0x0000,0x0000,0x0000,0x0000,0x0000,0x0000,
        0x0000,0x0000,0x0000,0x0000,0x0000,0x0000,0x0000,0x0000,
        0x0000,0x0000,0x0000,0x0000,0x0000,0x0000,0x0000,0x0000
};
mpr_static (standardobs,32,32,1,obstacle_data);
mpr_static (phantomobs,32,32,1,ph_obstacle_data);
/****************************************************************/
/* basic array definitions */
/****************************************************************/ short   istart,jstart;             /* start point */
short   igoal,jgoal;
short   ilast,jlast;
LOGICAL new_feedback;
PIXEL   constraint_image [XSIZE] [YSIZE];       /* constraint image */
int     path[2*PATHLENGTH];
PIXEL   ph_con[XSIZE][YSIZE];

/****************************************************************/
/* codes for constants in arrays */
/****************************************************************/
```

```
/****************************************************************/
/* arm definition */
/****************************************************************/
ARM     *arm;

/****************************************************************/
/* canvas treatment: cell dimensions */
/****************************************************************/

Frame           frame0;
Frame           message_frame;
Canvas          canvas1;
Pixwin          *canvas1_pw;
struct pixrect  *canvas1_pr;
Canvas          canvas2;
Pixwin          *canvas2_pw;
struct pixrect  *canvas2_pr;
Panel           panel;
Panel           panel2;
Panel           message_panel;
Panel_item      goal_button;
Panel_item      start_button;
Panel_item      change1_item;
Panel_item      change2_item;
Panel_item      mode_item;
Panel_item      flow_item;
Panel_item      redraw_item;
Panel_item      speed_item;
Panel_item      gain_item;
Panel_item      metric_item;
Panel_item      camera_item;
Panel_item      robot_item;
Panel_item      message_item;
Panel_item      prog_item1;
Panel_item      prog_item2;
Panel_item      demo_item;

short change2;
short change1;
short mode;
short redraw;
short   flow;
short speed;
COSTTYPE (*metric_fcn)();       /* ptr to any of the metric fcns */
short gain;
short camera;
short robot;

/****************************************************************/
short present_obstacle;         /* present obstacle treated */
SCREEN_POS ph_obs_pos[NUMOBS];
SCREEN_POS ph_obs_pos_old[NUMOBS];
```

```
SCREEN_POS obs_pos[NUMOBS];
SCREEN_POS obs_pos_old[NUMOBS];
int rad8;                       /* 8 times radius of obstacle */
int angleobs;                   /* angle of obstacle */
int obs_ang1,obs_ang2,obs_l1_plus,obs_l1_minus;
                                /* return variables of interpolation routines */
short oldevent_x,oldevent_y;
/***********************************************/
/* interpol */
/***********************************************/ int obs_ang1,obs_ang2;      /* results of l2f/rinterp_obs appear here */
    int nobs,il;                /* useful values for debug */
    int obs_l1_plus,obs_l1_minus; /* result of l1_interp_obs appears here*/
    int rad8,angleobs;          /* radius scaled up by 8 */
    int link2_front[14][2][13]; /* obstacle point descriptors (link2 front) */
    int del_l2f[14][2][13];     /* pt 0 absolute, and d01,d02 relat positions */
    int link2_rear[10][2][13];  /* obstacle point descriptors (link2 rear) */
    int del_l2r[10][2][13];     /* pt 0 absolute, and d01,d02 relat positions */
    int link1_obs[16];          /* link1 obstacle data +/1 dtheta bound */
    unsigned int bitmask[32];   /* bit masks for obstacle codes */ short pathlength;

short lookupx[256][256];
short lookupy[256][256];
LOGICAL regeneration_needed;
short i_shown_arm, j_shown_arm;
LOGICAL arm_shown;
LOGICAL feedback;

GRID_POS task_goal[MAX_GOAL_NUMBER];
short  num_goals;
LOGICAL path_drawn;

int firstime;
unsigned char red[CMS_RGBSIZE];
unsigned char green[CMS_RGBSIZE];
unsigned char blue[CMS_RGBSIZE];
unsigned char red1[CMS_RGBSIZE];
unsigned char green1[CMS_RGBSIZE];
unsigned char blue1[CMS_RGBSIZE];

#ifdef HAS_KNIGHT_MOVES
/* in order of XP,XN,YP,YN,LU,LD,RU,RD */
int x_increment[DIRECTION_COUNT] = { 1,-1,0,0,1,-1,-1,1,2,-2,1,-1,-1,1,-2,2};
int y_increment[DIRECTION_COUNT] = { 0,0,1,-1,1,-1,1,-1,1,-1,2,-2,2,-2,1,-1};
#else
int x_increment[DIRECTION_COUNT] = { 1,-1,0,0,1,-1,-1,1};
int y_increment[DIRECTION_COUNT] = { 0,0,1,-1,1,-1,1,-1};
#endif
```

```
XYNODE remobs[MAXHEAP]; /* keep newly freed constraints here */
XYNODE addobs[MAXHEAP]; /* keep the new obstacles (=constraints) here */

XYNODE newgoals[MAX_GOAL_NUMBER];/* keep the newly added goals here */
XYNODE remgoals[MAX_GOAL_NUMBER];/* keep the newly removed goals here */
XYNODE goal[MAX_GOAL_NUMBER];    /* all known goals are in here */ int goalcounter; /* number of pts in goal[].pts to next free */
int nfcounter = 0;       /* newly freed index. pts to next free spot for data*/
int newgoalcounter = 0; /* index for newgoals. pts to next free spot for data*/
int remgoalcounter = 0; /* index for remgoals. pts to next free spot for data*/ int addobscounter = 0; /* number of points in addobs */
int remobscounter = 0; /* number of points in remobs */

XYNODE bloblist[MAXHEAP];
int numbloblist;

int obstacle;

GRID_POS path_array[MAX_PATH_NUMBER];
int pathcounter;

int perim_index;
XYNODE perimeter[MAXPERIM+1];
struct pixfont *smallfont;
```

```c
/* printout of file: borderline.c */
/*****************************/ include "defines.h"
include "externs.h"
/* file borderline.c */ borderline (x1,y1,x2,y2,connectivity)
short   x1,y1,
        x2,y2,
        connectivity;   /* 4 or 8 */
{
        register short
                ind1,ind2,      /* recomputed end points */
                dep1,dep2,
                d_ind,d_dep,
                dx,dy,
                incr1,          /* increment if d < 0   */
                incr2,          /* increment if d >= 0  */
                incr_dep,       /* increment the dependent variable;
                                   either 1 (positive slope) or -1 (neg.) */
                d,      /* determines if the dep var should be increment */
                ind,    /* the current value of the independent variable */
                dep,    /* the current value of the dependent variable   */
                ind_end,/* the stopping point of the independent variable */
                x,y,    /* the x and y value of the pixel */
                xlast,ylast,    /* the x and y last treated */
                pery;
        char            c4,
                        x_is_ind,
                        reverse_start;
        GRID_POS        *punt;

#define abs(x) ((x)>0) ? (x) : -(x)
                xlast = XSIZE;
                ylast = YSIZE;

if ( connectivity == 4) c4 = 1; else c4 =0;

if ((dx = (x2-x1)) < 0) dx = -dx;
                if ((dy = (y2-y1)) < 0) dy = -dy;

if (dy<dx) {
                        x_is_ind = 1; /* x independent variable */
                        ind1 = x1; dep1 = y1;
                        ind2 = x2; dep2 = y2;
                        d_ind = dx; d_dep = dy;
                } else {
                        x_is_ind = 0;
                        ind1 = y1; dep1 = x1;
                        ind2 = y2; dep2 = x2;
                        d_ind = dy; d_dep = dx;
                }
```

```
/*
 * Find which point has the lowest independent variable and use it
 * as the starting point.
 */
if (ind1 > ind2) {
        reverse_start = 1;
    ind = ind2;
    dep = dep2;
    ind_end = ind1;      if (c4) ind_end += d_dep;
    incr_dep = (dep2 > dep1) ? -1 : 1;
} else {
        reverse_start = 0;
    ind = ind1;
    dep = dep1;
    ind_end = ind2;      if (c4) ind_end += d_dep;
    incr_dep = (dep1 > dep2) ? -1 : 1;
}

/* initalisation of actual process parameters */ if (c4) d_ind += d_dep;
d = 2 * d_dep - d_ind;   /* calulate the initial d value */
incr1 = 2 * d_dep;
incr2 = 2 * (d_dep - d_ind);

do {
    /*
     * x and y are assigned depending on whether x is the dependent or
     * independent variable.
     */
    if (x_is_ind) {
        x = ind;
        y = dep;
        if (c4) {        if (reverse_start)    x -= abs(dep-dep2);
                         else                  x -= abs(dep1-dep);
        }
    } else {
        x = dep;
        y = ind;
        if (c4) {        if (reverse_start)    y -= abs(dep-dep2);
                         else                  y -= abs(dep1-dep);
        }
    }

/* insert point treatment routine here */ pery = periodic_y(y);
        if (y != pery) constraint_image[periodic_x(x)][pery] = 2;
        else           constraint_image[periodic_x(x)][pery] = 1;

if (d < 0)
        d += incr1;
    else {
```

```
                    dep += incr_dep;
                    d += incr2;
                }
        } while (ind++ < ind_end);
} clear_constraint_image()
{
        register x,y;

x = XSIZE;
        while (--x>=0) {
                y = YSIZE;
                while (--y>=0) {
                        constraint_image[x][y] = 0;
                }
        }
} fill_contour()
/*
   Fill the contours of the points indicated in the array "constraint_image".
   The output is an array of configuration space pixels,
   XYNODE *bloblist[numbloblist];
*/
{
        short x,y,y11,y12,y21,y22,y31,y32;
        short numobs;

numobs = 0;
        for (x=0; x<XSIZE; x++) {
                for (y=0; y<YSIZE; y++) { if (constraint_image[x][y] != 0) break; }
                if (y == YSIZE) goto next;        /* empty column */
                y11 = y;

for (y=y11; y<YSIZE; y++) { if (constraint_image[x][y] == 0) break; }
                y12 = y;             /* y1 is the y of the first 0 after line */
                if (y12 == YSIZE) {
                        numobs = 1;
                        goto treat_obs;
                }
                for (y=y12; y<YSIZE; y++) { if (constraint_image[x][y] != 0) break; }
                y21 = y;
                if (y21 == YSIZE) {
                        numobs = 1;
                        goto treat_obs;
                }
                for (y=y21; y<YSIZE; y++) {
                        if (constraint_image[x][y] == 0)
                                break;
                }
                y22 = y;
                if (y22 == YSIZE) {
```

```
                    numobs = 2;
                    goto treat_obs;
            }
            for (y=y22; y<YSIZE; y++)
            {
                    if (constraint_image[x][y] != 0) break;
            }
            y31 = y;
            if (y31 == YSIZE) {
                    numobs = 2;
                    goto treat_obs;
            }
            for (y=y31; y<YSIZE; y++) {
                    if (constraint_image[x][y] == 0)
                            break;
            }
            y32 = y;
            if (y32 == YSIZE) {
                    numobs = 3;
                    goto treat_obs;
            }
            printf("OHOOPS! more than 3 lines ? How can that be ?");
            printf(
                    "x=%d,numobs:%d0,x,numobs);
            goto next;
    treat_obs:
            /*
            printf(
                    "x=%d,numobs:%d0,x,numobs);
            printf(
                    "y11,y12,y21,y22,y31,y32,%d,%d,%d,%d,%d,%d,%d0,
                    y11,y12,y21,y22,y31,y32);
                    */
            switch (numobs) {
            case 1:
                    for (y=y11; y<y12; y++) {
                            bloblist[numbloblist].x=x;
                            bloblist[numbloblist++].y=y;
                    }
                    break;
            case 2:
                    if ((y11 == 0) && (y22 == YSIZE)) {
                            if(constraint_image[x][y11] == constraint_image[x][y21]) {
                                    for (y=y11; y<y22; y++) {
                                            bloblist[numbloblist].x=x;
                                            bloblist[numbloblist++].y=y;
                                    }

} else {
                                    for (y=y11; y<y12; y++)
                                    {
                                            bloblist[numbloblist].x=x;
                                            bloblist[numbloblist++].y=y;
```

```
                        }
                        for (y=y21; y<y22; y++)
                        {
                                bloblist[numbloblist].x=x;
                                bloblist[numbloblist++].y=y;
                        }
                }
                } else {
                        if (constraint_image[x][y11] == constraint_image[x][y2
                                for (y=y11; y<y22; y++)
                                {
                                        bloblist[numbloblist].x=x;
                                        bloblist[numbloblist++].y=y;
                                }
                        }
                        else {
                                for (y=0; y<y12; y++)
                                {
                                        bloblist[numbloblist].x=x;
                                        bloblist[numbloblist++].y=y;
                                }
                                for (y=y21; y<YSIZE; y++)
                                {
                                        bloblist[numbloblist].x=x;
                                        bloblist[numbloblist++].y=y;
                                }
                        }
                }
#ifdef COMMENTEDOUT
                if (constraint_image[x][y11] == 2) {
                        for (y=0; y<y12; y++)
                        {
                                bloblist[numbloblist].x=x;
                                bloblist[numbloblist++].y=y;
                        } for (y=y21; y<YSIZE; y++)
                        {
                                bloblist[numbloblist].x=x;
                                bloblist[numbloblist++].y=y;
                        }
                } else if (constraint_image[x][y21] == 2) {
                        for (y=0; y<y12; y++)

{
                                bloblist[numbloblist].x=x;
                                bloblist[numbloblist++].y=y;
                        }
                        for (y=y21; y<YSIZE; y++)
                        {
                                bloblist[numbloblist].x=x;
                                bloblist[numbloblist++].y=y;
                        }
```

```
#endif
                        break;
                case 3:
                    :   if (constraint_image[x][y11] == constraint_image[x][y21]) {
                                for (y=y11; y<y22; y++)
                                {
                                        bloblist[numbloblist].x=x;
                                        bloblist[numbloblist++].y=y;
                                }
                                for (y=y31; y<y32; y++)
                                {
                                        bloblist[numbloblist].x=x;
                                        bloblist[numbloblist++].y=y;
                                }
                        } else {
                                for (y=y11; y<y12; y++)
                                {
                                        bloblist[numbloblist].x=x;
                                        bloblist[numbloblist++].y=y;
                                }
                                for (y=y21; y<y32; y++)
                                {
                                        bloblist[numbloblist].x=x;
                                        bloblist[numbloblist++].y=y;
                                }
                        }
                        break;
                }
        next:;
                y = YSIZE;
                while (--y>=0)  constraint_image[x][y] = 0;
        }
} fill_link1_contour(x1,x2,add)
short x1,x2,add;
/*
   Fill the contours of the points indicated in the array "constraint_image".
   The output is an array of configuration space pixels,
   XYNODE *bloblist[numbloblist];
*/
{
        register short per1,per2,x,y;

per1 = periodic_x(x2);
        per2 = periodic_x(x1);

if (per1 <= per2) {     /* only one strip */
                for (x=per1; x<= per2; x++) {
                        for (y=0; y<YSIZE; y++)
                        {
                                bloblist[numbloblist].x=x;
                                bloblist[numbloblist++].y=y;
```

```
                    }
            }
    } else {           /* two strips left and right */
            for (x=0; x<= per2; x++) {
                    for (y=0; y<YSIZE; y++) {
                            bloblist[numbloblist].x=x;
                            bloblist[numbloblist++].y=y;
                    }
            }
            for (x=per1; x< XSIZE; x++) {
                    for (y=0; y<YSIZE; y++) {
                            bloblist[numbloblist].x=x;
                            bloblist[numbloblist++].y=y;
                    }
            }
    }
} fill_polygon (polygon,nv)
/* fill a polygon consisiting of <nv> vertices.
   result is a list of points within the polygon,
   bloblist[numbloblist]
*/
POLNODE *polygon;
int nv;
{
register int i,j;

for (i=0; i<nv; i++) {
                borderline (
                        roundx(polygon[(i)%nv].x),
                        roundy(polygon[(i)%nv].y),
                        roundx(polygon[(i+1)%nv].x),
                        roundy(polygon[(i+1)%nv].y),4);
        }
        fill_contour();
} draw_polygon(polygon,nv)
POLNODE polygon[NUMVERTICES];
int nv;
{
        int i;
        for (i=0; i<nv; i++) {
                draw_vector(
                        anglepix_x(polygon[(i)%nv].x),
                        anglepix_y(polygon[(i)%nv].y),
                        anglepix_x(polygon[(i+1)%nv].x),
                        anglepix_y(polygon[(i+1)%nv].y),
                        PIX_SRC^PIX_DST,BLACKC);
        }
}
```

```
treat_polygon(polygon,nv,add)
POLNODE polygon[NUMVERTICES];
int add, nv;
/*
Treating a polygon consists of:
- Determine all points internal to the polygon. The result is a list of points
  given in XYNODE bloblist[numbloblist]
- If add=1, then:
  add the points to the constraints
  send the points to the 'object handler' to be reset in configuration space
  If add = -1 then:
  remove the points from the constraints
  send the points to the 'wake finder'
*/
{
        int i;

if (add == DRAWOBS) {
                draw_polygon (polygon,nv);
        } else {
                fill_polygon (polygon, nv);

switch (add) {
                case ADDOBS:
                        for (i=0; i<numbloblist; i++) {
                                con[bloblist[i].x][bloblist[i].y]++;
                        }
                        for (i=0; i<numbloblist; i++) {
                                addobs[addobscounter].x = bloblist[i].x;
                                addobs[addobscounter++].y = bloblist[i].y;
                        }
                        break;
                case REMOBS:
                        for (i=0; i<numbloblist; i++) {
                                con[bloblist[i].x][bloblist[i].y]--;
                        }
                        for (i=0; i<numbloblist; i++) {
                                remobs[remobscounter].x = bloblist[i].x;
                                remobs[remobscounter++].y = bloblist[i].y;
                        }
                        break;
                case ADDPHOBS:
                        for (i=0; i<numbloblist; i++) {
                                ph_con[bloblist[i].x][bloblist[i].y]++;
                        }
                        break;
                case REMPHOBS:
                        for (i=0; i<numbloblist; i++) {
                                ph_con[bloblist[i].x][bloblist[i].y]--;
                        }
                        break;
                default:
                        printf("Illegal value of 'add' in treat_polygon.0);
```

```c
/* printout of file:  bud.c */
/***************************/ include <stdio.h>
include <math.h>
#include "defines.h"
include "externs.h"
#define fullcontour
#include "arrows.externs.h"
#ifdef FLOATWORLD
#define MULT 1
#else
#define MULT 1000
endif define DIMENSIONS_OF_CSPACE 2 int rihtest;

FLAGTYPE *local_vector;

extern COSTTYPE (*metric_fcn)();        /* ptr to any of the metric fcns */ extern int remobscounter;
extern int addobscounter;

extern XYNODE remobs[MAXHEAP];   /* keep newly freed constraints here */
extern XYNODE addobs[MAXHEAP];   /* keep newly added constraints here */ extern XYNODE newgoals[MAX_GOAL_NUMBER];/* keep the newly added goals here */
extern XYNODE remgoals[MAX_GOAL_NUMBER];/* keep the newly added goals here */ extern int newgoalcounter, remgoalcounter;
                            /* indicies into above structures */ float dl1_task_straight[XSIZE];
float dli_task_straight[XSIZE];
float dl2_task_straight[XSIZE];
float dl2_task_straight[XSIZE];

HEAPNODE heap[MAXHEAP+1];      /* heap uses locations 1-> MAXHEAP */
                    /* location 0 isn't used to hasten indexing */

CSNODE (*configspace)[YSIZE];
PIXEL (*con)  [YSIZE];   /* configuration constraint image */ static BOTHINDICIES *fastaccess = (BOTHINDICIES *)heap;
                            /* ptr to x&y of heap */
static int bottom_of_heap;

static int budcounter;
```

```
remove_goal(gx,gy)
int gx,gy;
{
        configspace[gx][gy].cost_to_goal = UNCOSTED;
        configspace[gx][gy].vector = (unsigned)0;
                        /* goal doesn't point anywhere */
        printf("removing goal from configspace[%d][%d]0,gx,gy);
#ifdef UNBUDDING
        un_bud(gx,gy);/* the first seed */
#endif
        printf("done UN-budding0);
} budinit()
{
        int x,y;

bottom_of_heap = 1; /* next free spot in heap */ perim_index = MAXPERIM;

configspace = (CSNODE (*)[YSIZE]) malloc(XSIZE*YSIZE*sizeof(CSNODE));
        con = (PIXEL (*)[YSIZE]) malloc(XSIZE*YSIZE*sizeof(PIXEL));

/* XXX ALLOCATE CONFIGSPACE HERE ? */
        /* XXX ALLOCATE HEAP HERE ? */

/* this next loop should get optimized */
        for(x=0;x<XSIZE;x++)
                for(y=0;y<YSIZE;y++)
                {
                        if(configspace[x][y].cost_to_goal !=  INFINITY)
                        {
                                configspace[x][y].cost_to_goal=UNCOSTED;
                                configspace[x][y].vector=(unsigned)0;
                        }
                }
        x=0;
        while(x < DIRECTION_COUNT)
        {
                opposing[x]= 01 << (x+1);
                opposing[x+1] = 01 << x;
                x += 2;
        }
} show_heap_in_cyan()
{
        int k,i,j,x,y;
        COSTTYPE cost;

printf("Showing Heap. Heap elements in Boxes0);
```

```
        for (k=1;k<bottom_of_heap;k++)
        {
                i = heap[k].x;
                j = heap[k].y;
                x = CMARGIN + CSTEP + 1 + (CELL_SIZE+CSTEP)*i;
                y = CMARGIN + CSTEP + 1 + (CELL_SIZE+CSTEP)*j;
                pw_replrop(canvas1_pw, x,y, CELL_SIZE,CELL_SIZE,
                    (PIX_SRC^PIX_DST)|PIX_COLOR(BLACKC),
                    icon_prs[HEAP_ICON], GOAL_START,GOAL_START);
                /*
                pw_replrop(canvas1_pw, x,y, CELL_SIZE,CELL_SIZE,
                    (PIX_SRC^PIX_DST)|PIX_COLOR(CYANC),
                    icon_prs[HEAP_ICON], GOAL_START,GOAL_START);
                */
        }
        show_costs();

printf("hit cr to continue->");
        getchar();
} show_heap(infostring,colored_in)
char *infostring;
{
        int i;
        COSTTYPE cost;

printf("Showing Heap with: %s0,infostring);

for (i=1;i<bottom_of_heap;i++)
        {
                cost=configspace[heap[i].x][heap[i].y].cost_to_goal;

if(cost == UNCOSTED)
                        printf("heap[%d], [x,y], cost: [%d,%d], UNCOSTED0,
                                i,heap[i].x, heap[i].y);
                else if(cost == INFINITY)
                        printf("heap[%d], [x,y], cost: [%d,%d],INFINITY0,
                                i,heap[i].x, heap[i].y);
                else
                        printf("heap[%d], [x,y], cost: [%d,%d]=%f0,
                                i,heap[i].x, heap[i].y, cost);
        }
} add_to_min_heap(localx,localy)
short localx, localy;
/* add the config space indicies to the heap */
/* this heap code keeps the lowest valued node at the top */
/* NOTE: for speed- perhaps should mark if node is in heap. (use sign bit?)*/
{
        COSTTYPE new_child_cost;
```

42

```
        int child,parent;      /* indices into heap */
        short parentx, parenty;

if((child = bottom_of_heap) >= MAXHEAP)
                printf("PANIC: hit bottom of heap.%d.0,bottom_of_heap);

local_vector= (FLAGTYPE *)
                (&(configspace[(int)localx][(int)localy].flags));
        if(PUT_IN_HEAP & (*local_vector))
        /* node in heap already */
        {
                rihtest++;
                return;
        } else
                (*local_vector) |= PUT_IN_HEAP;
                /* signal that node in heap */ new_child_cost = configspace[(int)localx][(int)localy].cost_to_goal;
                        /* node cost we're putting in*/ while((parent = (child>>1)) /* parent = child/2 */
          && (configspace[heap[parent].x][heap[parent].y].cost_to_goal >
                        new_child_cost))
        {
                /* swap child up swapping parent down*/
                /***********************************/
                *(fastaccess + child) = *(fastaccess +parent);
                child = parent;
        }
        heap[child].x = localx;/* put the child into the open node */
        heap[child].y = localy;/* put the child into the open node */ bottom_of_heap++;
} int delete_from_min_heap(xcoord,ycoord)
int *xcoord, *ycoord;
/* returns TRUE (1) if successful, FALSE (0) else */
{
        /* return the lowest value node (at heap[1]) and reheap */ register int parent,rchild,lchild;      /* indicies into heap */
        register int tmpx, tmpy;
                /* temporary indicies for configspace */
        register HEAPNODE *nodeptr;

register HEAPNODE *picked_node;
        register int heap_height, i;
        register COSTTYPE picked_node_cost;
        register float f_heap_height;
        register double doublenodes;
        register COSTTYPE leftchild_val, rightchild_val;
```

```c
        if(bottom_of_heap == 1) /* there are no items in heap */
                return(FALSE);

/* bottom of heap WAS the first free spot in heap */
        bottom_of_heap--;
        /* NOW bottom is pointing to last full spot in heap */

*xcoord = (int)(heap[1].x); *ycoord = (int)(heap[1].y);

configspace[(int)*xcoord][(int)*ycoord].flags &= REMOVE_FROM_HEAP;
        /* signal that node not in heap */ if(bottom_of_heap == 1) /* theres one item in heap */
                return(TRUE);   /* don't bother re-heaping */
        /* otherwise, pull off the node at the bottom most edge */
        picked_node = &heap[bottom_of_heap];

picked_node_cost =
          configspace[(int)(picked_node->x)][(int)(picked_node->y)].cost_to_goal;

parent=1;

doublenodes = bottom_of_heap;
        f_heap_height = (float)(logb(doublenodes));
        heap_height = (int)(f_heap_height);
#ifdef DEBUG
        printf("f heap=%f, heap-height=%d0,f_heap_height,heap_height);
#endif
        /* heap_height will tell us the max # of checks to freely make */ for(i=1;i<heap_height;i++)
        {
                /* keep swapping down with the smaller of the 2 children */
                /* until can't swap or at bottom edge of heap */ lchild= parent << 1;    /* parent*2 */
                rchild= lchild + 1;     /* parent*2 + 1 */ nodeptr = &(heap[lchild]);
                leftchild_val =
                        configspace[nodeptr->x][nodeptr->y].cost_to_goal;

nodeptr = &(heap[rchild]);
                rightchild_val =
                        configspace[nodeptr->x][nodeptr->y].cost_to_goal;

if(rightchild_val < leftchild_val)
                {
                        if(rightchild_val < picked_node_cost)
                        {
                                /* swap up right child */
                                *(fastaccess + parent) = *(fastaccess +rchild);
```

```c
                                        parent=rchild;
                        }
                        else
                        {       /* found picked node a home in heap */
                                heap[parent]= (*picked_node);
                                return(TRUE);
                        }
                }
                else
                {
                        if(leftchild_val < picked_node_cost)
                        {
                                /* swap up left child */
                                *(fastaccess + parent) = *(fastaccess +lchild);
                                parent=lchild;
                        }
                        else
                        {
                                heap[parent]= (*picked_node);
                                return(YES);
                        }
                }

}
        /* if we got here, then we're at the bottom edge of the heap */
        /* have to deal with 'missing children' */ lchild= parent << 1;    /* parent*2 */
        rchild= lchild + 1;     /* parent*2 + 1 */
#ifdef DEBUG
        printf("BOTTOM FRINGE: bottom_of_heap=%d,lchild=%d,rchild=%d0,
                bottom_of_heap,lchild,rchild);
        printf("leftchild value=%d, rightchild value= %d0,
                leftchild_val,rightchild_val);
endif if(bottom_of_heap > rchild)     /* both children exist */
        {
                nodeptr = &(heap[lchild]);
                leftchild_val = configspace[nodeptr->x][nodeptr->y].cost_to_goal;

nodeptr = &(heap[rchild]);
                rightchild_val = configspace[nodeptr->x][nodeptr->y].cost_to_goal;

if(rightchild_val < leftchild_val)
                {
                        if(rightchild_val < picked_node_cost)
                        {
                                /* swap up right child */
                                *(fastaccess + parent) = *(fastaccess +rchild);

heap[rchild]= (*picked_node);
                                return(TRUE);
```

```
                                )
                                else
                                {
                                        heap[parent]= (*picked_node);
                                        return(TRUE);
                                }
                        }
                        else
                        {
                                if(leftchild_val < picked_node_cost)
                                {
                                        /* swap up left child */
                                        *(fastaccess + parent) = *(fastaccess +lchild);

heap[lchild]= (*picked_node);

return(TRUE);
                                }
                                else
                                {
                                        heap[parent]= (*picked_node);
                                        return(TRUE);
                                }
                        }
                }
                else if(bottom_of_heap <= lchild)         /* no children exist */
                {
                        heap[parent]= (*picked_node);
#ifdef DEBUG
                        printf("no children!0);
#endif
                        return(TRUE);

}
                else                                    /* only left child exists */
                {
                        nodeptr = &(heap[lchild]);
                        leftchild_val = configspace[nodeptr->x][nodeptr->y].cost_to_goal;

if(leftchild_val < picked_node_cost)
                        {
                                /* swap up left child */
                                *(fastaccess + parent) = *(fastaccess +lchild);
                                heap[lchild]= (*picked_node);
                                return(TRUE);
                        }
                        else
                        {
                                heap[parent]= (*picked_node);
                                return(TRUE);
                        }
                }
```

```
} look(xcoord,ycoord,dir)
int xcoord, ycoord;
int dir;
{
        int newx, newy;
        COSTTYPE transition_cost;
        VECTTYPE newvector;
        COSTTYPE cost_to_newnode;
        register CSNODE *new_csptr;      /* pt to the new node */
        COSTTYPE c;

/*points_to(xcoord,ycoord,dir,&newx,&newy);*/
        /* going for speed here. cut out the routine call */
        newx = (XSIZE + xcoord + direction[dir].dx) % XSIZE;
        newy = (YSIZE + ycoord + direction[dir].dy) % YSIZE;

if(con[newx][newy] != NOCONSTRAINT)
                return;

/* else, trying to go to an uncostrained state */ transition_cost = (*metric_fcn)(dir,newx,newy);

cost_to_newnode = transition_cost +
                configspace[xcoord][ycoord].cost_to_goal;

newvector = *(opposing+dir);

new_csptr = &(configspace[newx][newy]);

c=cost_to_newnode-new_csptr->cost_to_goal;
#ifdef FLOATWORLD
        if(( c) < -ACCURACY )
#else
        if(c<0)
#endif
        {
                /* this is best path, overwrite cost & vector*/
                new_csptr->cost_to_goal = cost_to_newnode;
                new_csptr->vector = newvector;

add_to_min_heap((short)newx,(short)newy);
        }
ifdef FLOATWORLD
        else if( c > ACCURACY)
#else
        else if(c==0)
#endif
        {
                /* add our vector to the existing vectors */
```

```
                    /*if(con[newx][newy] == NOCONSTRAINT)*/
                    new_csptr->vector |= newvector;
        }
} show_cdt()
{
        int x,y;

for(x=0;x<XSIZE;x++)
        {
                for(y=0;y<YSIZE;y++)
                {
                        printf("[%ld,%ld]=(%f,%4x) ",x,y,
                        configspace[x][y].cost_to_goal,
                        configspace[x][y].vector);
                }
                putchar('0');
        }
} bud(sx,sy)      /* bud out till this start is stable */
int sx,sy;
{
        VECTTYPE lookvector;    /* vector of directions to look in */
        int indexx, indexy;
        int i;  /* direction in the ordinal sense eg. 1,2,3,4,5 */
#ifdef DEBUG
        printf("entering bud0);
#endif
        rihtest = 0;
        budcounter=0;

/* the first seed */
        /*init();         set up goal in config space and heap */
#ifdef UNBUDDING
        firstime = YES; /* always budding in full from scratch */
#endif
        while(delete_from_min_heap(&indexx,&indexy))
                                        /* is legal- ie non zero */
        {
                /*plot_canvas1();*/
/*      bud the whole space if next stopping criterion isn't in */
#ifdef STOPPINGCOND
                if(address->cost_to_goal > starts_address->cost_to_goal)
                /* we're done */
                {
                        break;
                }
endif
```

```
#ifdef UNBUDDING
                if(firstime)
                {
#endif
                /* look where we didn't come from*/
                lookvector= -(configspace[indexx][indexy].vector);
                for (i=0;i<DIRECTION_COUNT; i++)
                {
                        if(lookvector & (01 << i))
                                look(indexx,indexy,i);   /* 2^i is direction */
                }
#ifdef UNBUDDING
                }
                else    /* we can't assume that we can just bud out */
                {
                        for (i=0;i<ARROW_COUNT; i++)
                        look(indexx,indexy,i);   /* 2^i is direction */
                }
endif
#ifdef NOTHISPEED
                budcounter++;
#endif
        }
#ifdef NOTHISPEED
        printf("budded out %d times0,budcounter);
#endif
} show_perim(infostring)
char *infostring;
{
        int k;

printf("Dumping Perimeter to show: %s0,infostring);
        for(k=MAXPERIM;k>perim_index;k--) {
                printf("perim[%d]=(x,y):  [%d,%d]0,k,
                        perimeter[k].x, perimeter[k].y);
        }
} clear_influence() /* clear the influence */
{
        int bh;
        int x,y;
        int newx, newy;
        int dir;
        unsigned lookbackvector;
        int counter;
        float percent;
        CSNODE *xy_node_ptr, *newxy_node_ptr;
        int uncostflag;
        COSTTYPE cost;
        int bag[DIRECTION_COUNT][DIMENSIONS_OF_CSPACE];
```

```
int bagcounter;

counter=bh=0;
printf("entered clear influence0);

while(delete_from_min_heap(&x,&y))
{
        xy_node_ptr = &(configspace[x][y]);
        uncostflag= NO;
        bagcounter=0;
        for (dir=0;dir<DIRECTION_COUNT;dir++)
        {
                newx = (XSIZE + x + direction[dir].dx) % XSIZE;
                newy = (YSIZE + y + direction[dir].dy) % YSIZE;
                newxy_node_ptr = &(configspace[newx][newy]);
                cost=newxy_node_ptr->cost_to_goal;
                if((cost == UNCOSTED) || (cost == INFINITY)) {
                        if (xy_node_ptr->vector & (01 << dir))
                        /* we're looking at pointed to neighbor */
                                uncostflag=YES;
                }
                else
                {
                        bag[bagcounter][0]=newx;
                        bag[bagcounter++][1]=newy;
                        /*add_to_min_heap(newx,newy);*/
                        /*
                        printf("added %d,%d to bag0,
                                newx,newy);
                        */
                }
        }
        if (!uncostflag)
        /* i.e. if uncostflag == NO */
        /*none of my pointed to neighbors are uncosted */
        {
                if(!(xy_node_ptr->flags & PUT_IN_PERIM))
                {
                        /* perimeter */
                        perimeter[perim_index].x = x;
                        perimeter[perim_index--].y = y;
                        xy_node_ptr->flags |= PUT_IN_PERIM;
                }
        }
        else
        /* i.e. if uncostflag == YES */
        {
                /* clear this state */
                xy_node_ptr->cost_to_goal =UNCOSTED;
                xy_node_ptr->vector =IP;
                /* empty all states that are */
                /* in the bag into the heap */
                while(bagcounter > 0)
```

```
                    {
                            bagcounter--;
                            add_to_min_heap(bag[bagcounter][0],
                                    bag[bagcounter][1]);
                    }
            }
    }

/* now set up the perimeter in the heap */ while(perim_index < MAXPERIM)
    {
            perim_index++;
            if(configspace[perimeter[perim_index].x]
            [perimeter[perim_index].y].cost_to_goal <
            UNCOSTED)
            add_to_min_heap(perimeter[perim_index].x,
                    perimeter[perim_index].y);

configspace[perimeter[perim_index].x]
                            [perimeter[perim_index].y].flags
                            &= REMOVE_FROM_PERIM;
    }
} check_new_obs_and_rmd_goals() /* the neighbors that are surrounding */
            /* the newly added obstacles are */
            /* added to the 'unbudding' heap. */
{
    int x,y;
    int newx, newy;
    int dir;
    unsigned lookbackvector;
    CSNODE *xy_node_ptr, *newxy_node_ptr;
    int i;

i=addobscounter;
    while(i)        /* set up configuration space */
    {
            x=addobs[--i].x;
            y=addobs[i].y;
            configspace[x][y].vector=0;
            configspace[x][y].cost_to_goal = INFINITY;
    }

/* now add the removed goals */
    /* remgoalcounter points to next unfilled index */
    while(remgoalcounter)  /* there are some removed goals */
    {
            remgoalcounter--;
    configspace[remgoals[remgoalcounter].x][remgoals[remgoalcounter].y].cost_to_goal=UNC
```

```
                addobs[addobscounter].x= remgoals[remgoalcounter].x;
                addobs[addobscounter++].y=
                                remgoals[remgoalcounter].y;
        }
        while(addobscounter) /* there's more constraints */
        {
                x=addobs[--addobscounter].x;
                y=addobs[addobscounter].y;

xy_node_ptr = &(configspace[x][y]);

/* look in all directions */
                for (dir=0;dir<DIRECTION_COUNT;dir++)
                {
                        /* find indicies of neighbor in direction dir */
                        newx = (XSIZE + x + direction[dir].dx) % XSIZE;
                        newy = (YSIZE + y + direction[dir].dy) % YSIZE;

newxy_node_ptr = &(configspace[newx][newy]);

/* put the full contour of the obstacle into the */
                        /* heap */
                        lookbackvector = *(opposing+dir);
                        /* next test gives downstream contour */
                        /* these nodes and their children will be cleared */
                        if(newxy_node_ptr->vector & lookbackvector)
                        /* looking back */
                                add_to_min_heap(newx,newy);
                        else if((newxy_node_ptr->cost_to_goal) != INFINITY)
                        {
                                /* a front contour to an obstacle */
                                perimeter[perim_index].x = newx;
                                perimeter[perim_index--].y = newy;
                        }
                }
        }
} check_free_obs_and_new_goals()
                /* the neighbors that are 'looking back at' */
                /* the freed added obstacles are */
                /* added to the 'unbudding' heap. */
{
        int x,y;
        int newx, newy;
        int dir;
        unsigned lookbackvector;
        CSNODE *xy_node_ptr, *newxy_node_ptr;
        int i,j;

/* set up configuration space */
```

```
        i=remobscounter;
        while(i)
        {
                x=remobs[--i].x;
                y=remobs[i].y;
                configspace[x][y].vector=0;
                configspace[x][y].cost_to_goal = UNCOSTED;
        } while(remobscounter) /* more newly freed obstacles */
        {
                x=remobs[--remobscounter].x;
                y=remobs[remobscounter].y;

xy_node_ptr = &(configspace[x][y]);
                /* look in all directions */
                /* for neighbors with 'genuine' costs */
                /* (not UNCOSTED or INFINITE) */ for (dir=0;dir<DIRECTION_COUNT;dir++)
                {
                        /*points_to(x,y,dir,&newx,&newy);*/
                        /* next 2 lines speedier than above routine call */
                        newx = (XSIZE + x + direction[dir].dx) % XSIZE;
                        newy = (YSIZE + y + direction[dir].dy) % YSIZE;

newxy_node_ptr = &(configspace[newx][newy]);
                        if(newxy_node_ptr->cost_to_goal < UNCOSTED)
                                add_to_min_heap(newx,newy);
                }
        }
        /* now add the new goals */
        while(newgoalcounter)
        {
                newgoalcounter--;
                x=newgoals[newgoalcounter].x;
                y=newgoals[newgoalcounter].y;
                add_to_min_heap(x,y);
                printf("adding goal at %d,%d0,x,y);
                configspace[x][y].vector = IP;
                configspace[x][y].cost_to_goal = 0;
        }
} clear_vectors_and_costs(should_keep_goals)
int should_keep_goals;
{
register CSNODE *csptr;
int x,y;
        for(x=0;x<XSIZE;x++)
                for(y=0;y<YSIZE;y++)
                {
                        csptr= &(configspace[x][y]);
```

```
                        /* don't touch goals, or obstacles */
                        if(csptr->cost_to_goal == 0)/* goal */
                        {
                                if(should_keep_goals == KILLGOALS)
                                  csptr->cost_to_goal=
                                        UNCOSTED;
                                else /* add this goal */
                                {
                                printf("adding goal from clear_vectors0);
/* new */               add_to_goals(x,y);
                                /* kit show_goal_point(x,y,PIX_SRC);*/
                                add_goal_in_task_space(x,y);
        /* old                     add_to_min_heap(x,y);*/
                                }
                                csptr->vector=0;
                        }
                        else if(con[x][y] == NOCONSTRAINT)
                        {
                                csptr->cost_to_goal= UNCOSTED;
                                csptr->vector=0;
                        }
                        else if(con[x][y])/* is an obstacle, ensure blocking */
                        {
                                csptr->cost_to_goal= INFINITY;
                                csptr->vector=0;
                        }
                }
        }
}

COSTTYPE effort(direction,x,y)
        /* metric for dynamics under constant energy for wyatt arm*/
int direction, x, y;
{
#define RELMASS 5.
        switch(direction) {
        case 0:
        case 1:
                return(RELMASS);
        case 2:
        case 3:
                return(1.);
        case 4:
        case 5:
        case 6:
        case 7:
                return((COSTTYPE)(sqrt(1.+RELMASS*RELMASS)));
        case 8:
        case 9:
        case 14:
        case 15:
                return((COSTTYPE)(sqrt(4.*RELMASS*RELMASS+1.)));
        case 10:
```

```
          case 11:
          case 12:
          case 13:
                  return((COSTTYPE)(sqrt(RELMASS*RELMASS+4.)));
          }
}

COSTTYPE task_straight(direction,x,y)
        /* metric for straight movement in task space by wyatt arm*/
int direction, x, y;
{
        if (direction < 4) {
                return(MULT*1.0);
        } else {
                switch(direction) {
                case 4:
                case 5:
                        return((COSTTYPE)dl1_task_straight[abs(x-y)]);
                case 6:
                case 7:
                        return((COSTTYPE)dli_task_straight[abs(x-y)]);
                case 8:
                case 9:
                case 10:
                case 11:
                        return((COSTTYPE)dl2_task_straight[abs(x-y)]);
                case 12:
                case 13:
                case 14:
                case 15:
                        return((COSTTYPE)di2_task_straight[abs(x-y)]);
                }
        }
} ifdef FLOATWORLD
COSTTYPE config_straight(direction,x,y)
        /* metric for straight motion in config space */
short direction; {
        if (direction < 4)
                return (1.);
        else if (direction < 8)
                return (sqrt(2.));
        else return(sqrt(5.));
}
else
COSTTYPE config_straight(direction,x,y)
        /* metric for straight motion in config space */
short direction; {
        if (direction < 4)
                return (5);
        else if (direction < 8)
                return (7);
```

```
        else return(11);
}
endif double celltoangle_x(x)
int x;
{
        return( (double)(x)/(double)(XSIZE)*PI2);
} double celltoangle_y(y)
int y;
{
        return( (double)(y)/(double)(YSIZE)*PI2);
} init_metrics()
{
        int i;

/* init task_straight_metric */
        /* this is in fact only correct if XSIZE == YSIZE */
        /* since onyl then is one allowed to use the same celltoangle */
        if (XSIZE == YSIZE) {
                for (i=0; i<XSIZE; i++) {
                        dl1_task_straight[i] = MULT*
                        ( sqrt(2. + 2. * cos( celltoangle_x(i))));
                        if(dl1_task_straight[i] < FACCURACY)
                                dl1_task_straight[i] = MULT* .01;
                        dli_task_straight[i] = MULT*
                        ( sqrt(2. - 2. * cos( celltoangle_x(i))));
                        if(dli_task_straight[i] < FACCURACY)
                                dli_task_straight[i] = MULT * .01;
                        dl2_task_straight[i]= MULT *
                        ( sqrt(5. + 4. * cos( celltoangle_x(i))));
                        if(dl2_task_straight[i] < FACCURACY)
                                dl2_task_straight[i] = MULT*.01;
                        di2_task_straight[i] = MULT *
                        ( sqrt(5. - 4. * cos( celltoangle_x(i))));
                        if(di2_task_straight[i] < FACCURACY)
                                di2_task_straight[i] = MULT * .01;
                }
        }
}
```

```c
/* printout of file:  canvas.c */
/*****************************/ include "defines.h"
include "externs.h"

#include <suntool/sunview.h>
#include <suntool/panel.h>
include <suntool/canvas.h> static short Data[] = {
include "Phantom.icon"
};

extern main();
extern int g_argc;
extern char **g_argv;

/*
the next two items are the proportions of the width of a cell
that are used to highlight the costs within the path
the white window is the amount of x of the cell that is used for
highlighting, and the red side of the window is the amount of x
used to edge around the window
*/ define WHITE_WINDOW .8
define RED_SIDE_WINDOW ((1-WHITE_WINDOW)/2)

/*****************************************************************
        canvas.c
        canvases declation and initialization
history:
        created 198609xx Leo Dorst
        mod     19861113 Leo + Karen
*****************************************************************/ mpr_static(my_pixrect, 64, 64, 1, Data);

Rect my_rect = {0, 0, 64, 64};

Icon my_icon;

init_canvases()
{
        short i;

my_icon = icon_create(ICON_IMAGE, &my_pixrect,
                ICON_WIDTH,      64,
                ICON_HEIGHT,     64,
                ICON_IMAGE_RECT, &my_rect, 0);

frame0 = window_create(NULL, FRAME,
```

```
                FRAME_ARGC_PTR_ARGV,&g_argc,g_argv,
                FRAME_ICON, my_icon,
                FRAME_LABEL,
"Task Space        -- PATH PLANNING DEMONSTRATION WITH DIFFERENTIAL BUDDING IN AN UNCE
                WIN_X,                  FRAME0_XOFFSET,
                WIN_Y,                  FRAME0_YOFFSET,
                FRAME_SHOW_LABEL,       TRUE,
                0);
#define PANEL_HEIGHT 150
        panel = window_create(frame0,PANEL,
                WIN_X,                  0,
                WIN_Y,                  3,
                WIN_HEIGHT,             PANEL_HEIGHT,
                WIN_WIDTH,              CARTWIDTH,
                WIN_CURSOR,             &main_cursor,
                0);
        canvas1 = window_create(frame0, CANVAS,
                WIN_Y,                  3,
                WIN_RIGHT_OF,           panel,
                WIN_HEIGHT,             CYSIZE,
                WIN_WIDTH,              (CXSIZE+4),
                WIN_EVENT_PROC,         canvas1_event_proc,
                WIN_CONSUME_PICK_EVENTS,WIN_NO_EVENTS,
                                        LOC_WINEXIT,LOC_WINENTER,LOC_DRAG,
                                        MS_LEFT,MS_RIGHT,MS_MIDDLE,
                                        WIN_UP_EVENTS,0,
                WIN_CURSOR,             &main_cursor,
                0);
        canvas2 = window_create(frame0, CANVAS,
                WIN_HEIGHT,             CARTHEIGHT,
                WIN_WIDTH,              CARTWIDTH,
                WIN_X,                  0,
                WIN_BELOW,              panel,
                WIN_EVENT_PROC,         canvas2_event_proc,
                WIN_CONSUME_PICK_EVENTS,WIN_NO_EVENTS,
                                        LOC_WINEXIT,LOC_WINENTER,LOC_DRAG,
                                        MS_LEFT,MS_RIGHT,MS_MIDDLE,
                                        WIN_UP_EVENTS,0,
                WIN_CURSOR,             &main_cursor,
                0);
        message_frame = window_create(frame0,FRAME,
                WIN_X,                  (CARTWIDTH/4),
                WIN_Y,                  (CARTHEIGHT/2),
                WIN_EVENT_PROC,         message_event_proc,
                0);
        message_panel = window_create(message_frame,PANEL,0);
        panel2 = window_create(frame0,PANEL,
                WIN_BELOW,              canvas1,
                WIN_RIGHT_OF,           canvas2,
                WIN_HEIGHT,             (PANEL_HEIGHT+CARTHEIGHT-CYSIZE),
                0);
        prog_item1 = panel_create_item(panel2,PANEL_CHOICE,
                PANEL_LABEL_X,          5,
```

```
        PANEL_LABEL_Y,          ((PANEL_HEIGHT+CARTHEIGHT-CYSIZE)/2-8),
        PANEL_FEEDBACK,         PANEL_INVERTED,
        PANEL_CHOICE_STRINGS,
        "Your_Move ","Propagating Waves ",
        "Preparing_Graphics ","Following Gradient ",0,
        0);
change2_item = panel_create_item(panel,PANEL_CHOICE,
        PANEL_LABEL_X,          10,
        PANEL_LABEL_Y,          4,
        PANEL_LABEL_STRING,     "Path Computation:         ",
        PANEL_FEEDBACK,         PANEL_INVERTED,
        PANEL_CHOICE_STRINGS,   "Now"," ",0,
        PANEL_NOTIFY_PROC,      change2_proc,
        0);
change1_item = panel_create_item(panel,PANEL_CHOICE,
        PANEL_LABEL_X,          10,
        PANEL_LABEL_Y,          24,
        PANEL_LABEL_STRING,     "Configuration Space Mouse: ",
        PANEL_FEEDBACK,         PANEL_INVERTED,
        PANEL_CHOICE_STRINGS,   "Start","Goal",
                /*"Double_Goal,*/"Pointer","Constraint",0,
        PANEL_NOTIFY_PROC,      change1_proc,
        0);
mode_item = panel_create_item(panel,PANEL_CHOICE,
        PANEL_LABEL_X,          10,
        PANEL_LABEL_Y,          44,
        PANEL_LABEL_STRING,     "Arm Display Mode:         ",
        PANEL_FEEDBACK,         PANEL_INVERTED,
        PANEL_CHOICE_STRINGS,   "Moving arm","Arm path",0,
        PANEL_NOTIFY_PROC,      mode_proc,
        0);
speed_item = panel_create_item(panel, PANEL_SLIDER,
        PANEL_LABEL_X,          10,
        PANEL_LABEL_Y,          67,
        PANEL_LABEL_STRING,     "Display Speed            ",
        PANEL_FEEDBACK,         PANEL_INVERTED,
        PANEL_VALUE,            100,
        PANEL_MIN_VALUE,        1,
        PANEL_MAX_VALUE,        100,
        PANEL_SHOW_RANGE,       FALSE,
        PANEL_SHOW_VALUE,       TRUE,
        PANEL_NOTIFY_LEVEL,     PANEL_DONE,
        PANEL_NOTIFY_PROC,      speed_proc,
        0);
message_item = panel_create_item(message_panel,PANEL_MESSAGE,
        PANEL_ITEM_X,           5,
        PANEL_ITEM_Y,           10,
        PANEL_LABEL_STRING,
        "No path to the goal(s) possible !",
        PANEL_NOTIFY_PROC,      message_event_proc,
        0);
flow_item = panel_create_item(panel,PANEL_CHOICE,
        PANEL_LABEL_X,          10,
```

```
                    PANEL_LABEL_Y,          84,
                    PANEL_LABEL_STRING,     "Show Flow Pattern:        ",
                    PANEL_FEEDBACK,         PANEL_INVERTED,
                    PANEL_CHOICE_STRINGS,   "End","All","No",0,
                    PANEL_NOTIFY_PROC,      flow_proc,
                    0);
        metric_item = panel_create_item(panel,PANEL_CHOICE,
                    PANEL_LABEL_X,          10,
                    PANEL_LABEL_Y,          104,
                    PANEL_LABEL_STRING,     "Criterion: Minimum        ",
                    PANEL_FEEDBACK,         PANEL_INVERTED,
                    PANEL_CHOICE_STRINGS,   "Motion","Distance","Effort",0,
                    PANEL_NOTIFY_PROC,      metric_proc,
                    0);
        demo_item = panel_create_item(panel,PANEL_CHOICE,
                    PANEL_LABEL_X,          10,
                    PANEL_LABEL_Y,          124,
                    PANEL_LABEL_STRING,     "Demonstration Pattern:    ",
                    PANEL_FEEDBACK,         PANEL_INVERTED,
                    PANEL_CHOICE_STRINGS,   "Clean","Video"," ",0,
                    PANEL_NOTIFY_PROC,      demo_proc,
                    0);
        canvas1_pw = canvas_pixwin(canvas1);    /* config space */
        canvas2_pw = canvas_pixwin(canvas2);    /* task space */
        window_fit(frame0);
        window_fit(message_panel);
        window_fit(message_frame);
        init_colors();
        set_prog_item(INPUT);
        panel_set_value(change1_item,POINTER_BUTTON);
        panel_set_value(change2_item,1);
        panel_set_value(demo_item,2);
        panel_set_value(mode_item,1);
        mode = PATHMODE;
        change1 = POINTER_BUTTON;
        redraw = BODY_ARM;
        flow = TRUE;
        feedback = FALSE;
        metric_fcn = (PFF) config_straight;
        speed = 100;
        robot = DONTSEND;
        smallfont = pf_open("/usr/lib/fonts/fixedwidthfonts/screen.r.14");
        regeneration_needed = FALSE;
}

/****************************************************************/
/*      canvas handlers          */
/****************************************************************/ void nullproc() { return; } static canvas2_event_proc (win,event)
        Window  win;
```

```
            Event   *event;
    {
            remove_message();
            switch (event_id(event)) {
            case LOC_WINEXIT:
                    reset_handlers();
                    return;
            case MS_LEFT:
            case MS_MIDDLE:
            case MS_RIGHT:
                    if (event_is_down(event)) {
                            remove_cursor2();
                            obs_select(event);
                    }
                    if (event_is_up(event))   {
                            add_cursor2();
                            obs_read(event);
                    }
                    break;
            case LOC_DRAG:
                    obs_feedback(event);
                    break;
            }
    }
    static
    canvas1_event_proc (win,event)
            Window  win;
            Event   *event;
    {
            remove_message();
            switch (event_id(event)) {
            case MS_LEFT:
            case MS_MIDDLE:
            case MS_RIGHT:
                    if (event_is_down(event)) {
                            remove_cursor1();
                            point_select(event);
                    }
                    if (event_is_up(event))   {
                            add_cursor1();
                            point_read1(event);
                    }
                    break;
            case LOC_DRAG:
                    point_feedback1(event);
                    break;
            case LOC_WINEXIT:
                    reset_handlers();
                    break;
            }
    }
```

```
void basereader() {;}
void tracker() {;} void reset_handlers() {; } obs_select(event)
        Event   *event;
{
        register short  i;
        int x,y;

/* scan for obstacle */
        /* take lowest obstacle number satisfying closeness criteria */
        x = event_x(event);
        y = (CARTHEIGHT - event_y(event));

for (i=0; i<NUMOBS; i++) {
                if ( (abs(obs_pos[i].x - x) < 5*CENTIMETER) &&
                     (abs(obs_pos[i].y - y) < 5*CENTIMETER) ) {
                        present_obstacle = i;
                        oldevent_x = obs_pos[i].x;
                        oldevent_y = obs_pos[i].y;
                        obstacle = STANDARD;
                        return;
                }
        }
        for (i=0; i<NUMPHOBS; i++) {
                if ( (abs(ph_obs_pos[i].x - x) < 5*CENTIMETER) &&
                     (abs(ph_obs_pos[i].y - y) < 5*CENTIMETER) ) {
                        present_obstacle = i;
                        oldevent_x = ph_obs_pos[i].x;
                        oldevent_y = ph_obs_pos[i].y;
                        obstacle = PHANTOM;
                        return;
                }
        }
} obs_read(event)
        Event   *event;
{
        /* remove old trafo and add new one */
        if (obstacle == STANDARD) {
                obs_pos[present_obstacle].x = event_x(event);
                obs_pos[present_obstacle].y = (CARTHEIGHT-event_y(event));
        } else {
                ph_obs_pos[present_obstacle].x = event_x(event);
                ph_obs_pos[present_obstacle].y = (CARTHEIGHT-event_y(event));
        }
} obs_change() /* test if obstacle has changed since last time */
{
```

```
        register int i;

for (i=0; i< NUMOBS; i++) {
                if (obs_pos[i].x != obs_pos_old[i].x ||
                    obs_pos[i].y != obs_pos_old[i].y) {
                convert_to_joint_space(obs_pos_old[i].x,obs_pos_old[i].y,REMOBS);
                convert_to_joint_space(obs_pos[i].x, obs_pos[i].y,ADDOBS);
                /* transfer these values into old obstacle positions */
                obs_pos_old[i].x = obs_pos[i].x;
                obs_pos_old[i].y = obs_pos[i].y;
                regeneration_needed = TRUE;
                }
        }
        for (i=0; i< NUMPHOBS; i++) {
                if (ph_obs_pos[i].x != ph_obs_pos_old[i].x ||
                    ph_obs_pos[i].y != ph_obs_pos_old[i].y) {
                convert_to_joint_space(
                        ph_obs_pos_old[i].x,ph_obs_pos_old[i].y,REMPHOBS);
                convert_to_joint_space(
                        ph_obs_pos[i].x, ph_obs_pos[i].y,ADDPHOBS);
                /* transfer these values into old obstacle positions */
                ph_obs_pos_old[i].x = ph_obs_pos[i].x;
                ph_obs_pos_old[i].y = ph_obs_pos[i].y;
                regeneration_needed = TRUE;
                }
        }
} goal_change() /* test if goals have changed since last time */
{
        if (remgoalcounter || newgoalcounter ) {
                regeneration_needed = TRUE;
        }
} check_for_change_in_obs_and_goals()
{
        obs_change();
        goal_change();
        /* XXX ALLOCATE, AND WRITE TO GLOBAL MEMORY FOR BUDDER */
        /* SEND LOCATION(S) THROUGH PIPE TO BUDDER */
} obs_feedback(event)
        Event   *event;
{
        if (obstacle == STANDARD) {
                show_obs_icon(oldevent_x,oldevent_y,(PIX_SRC^PIX_DST)|PIX_COLOR(BLACKC
                convert_to_joint_space(oldevent_x,oldevent_y,DRAWOBS);
                oldevent_x = event_x(event);
                oldevent_y = CARTHEIGHT-event_y(event);
                show_obs_icon(oldevent_x,oldevent_y,(PIX_SRC^PIX_DST)|PIX_COLOR(BLACKC
                convert_to_joint_space(oldevent_x,oldevent_y,DRAWOBS);
```

```
        } else {
                show_ph_obs_icon(oldevent_x,oldevent_y,(PIX_SRC^PIX_DST)|PIX_COLOR(BLA
                convert_to_joint_space(oldevent_x,oldevent_y,DRAWOBS);
                oldevent_x = event_x(event);
                oldevent_y = CARTHEIGHT-event_y(event);
                show_ph_obs_icon(oldevent_x,oldevent_y,(PIX_SRC^PIX_DST)|PIX_COLOR(BLA
                convert_to_joint_space(oldevent_x,oldevent_y,DRAWOBS);
        }
} point_select(event)
        Event   *event;
{
        ELEMENT         *elem,*element_of_point1();
        register short i,j;
        if ( (elem = element_of_point1(event)) == NULL) return;
        ilast = elem->i;
        jlast = elem->j;

plot_canvas2();
        plot_point1(ilast,jlast);
        plot_arm(ilast,jlast,PIX_SRC^PIX_DST);
        feedback = FALSE;

} void point_feedback1(event)
        Event   *event;
{
        ELEMENT         *elem,*element_of_point1();
        register short  i,j;

if (new_feedback) {
                plot_point1(ilast,jlast);
                erase_arms();
                new_feedback = FALSE;
        } else {
                plot_point1(ilast,jlast);
                plot_arm(ilast,jlast,PIX_SRC^PIX_DST,BLACKP);
        }
        if ( (elem = element_of_point1(event)) == NULL) return;
        ilast = elem->i;
        jlast = elem->j;
        plot_point1(ilast,jlast);
        plot_arm(ilast,jlast,PIX_SRC^PIX_DST,BLACKP);
        feedback = TRUE;

} void point_read1(event)
        Event   *event;
{
        ELEMENT         *elem,*element_of_point1();
```

```
register short  i,j;
short old_i_start, old_j_start;

new_feedback = TRUE;

if ( (elem = element_of_point1(event)) == NULL) return;
i = elem->i;
j = elem->j;

switch(change1) {
      case START_BUTTON:
              init_path();
              show_arm(i,j,PIX_SRC,BLACK);
              path_array[0].x = i;
              path_array[0].y = j;
              if (con[i][j] != NOCONSTRAINT ) {
                      show_message();
                      return;
              }
      /*      plot_path_point(i,j);*/
      /*      plot_point1(i,j); */
              check_for_change_in_obs_and_goals();
              if (regeneration_needed) {
                      /*plot_point1(i,j); kit*/
                      exor_old_path();
                      istart = i; jstart = j;
                      regenerate();
                      set_prog_item(GRADIENT);
                      /* superfluous */
                      /*      pathcounter = 0;*/
                      local_path_planning();
              } else {
                      set_prog_item(GRADIENT);
                      exor_old_path();
                      istart = i; jstart = j;
                      /*next line new--  kit */
                      local_path_planning();
              }
              firstime = YES;/* will be NO someday */
              set_prog_item(INPUT);
              reset_handlers();
              break;
      case DGOAL_BUTTON:
              process_goal(i,j);
              exor_old_path();
              plot_canvas2();
              show_arm(istart,jstart,PIX_SRC^PIX_DST,BLACK);
              regeneration_needed = TRUE;
              reset_handlers();
              break;
      case POINTER_BUTTON:
              plot_point1(i,j);
              report_about(i,j);
```

65

```
                        break;
            case STATE_CONSTRAINT_BUTTON:
                check_for_change_in_obs_and_goals();
                if(con[i][j])
                {
                        if(NOCONSTRAINT == (--con[i][j]))
                        {
                                remobs[remobscounter].x=i;
                                remobs[remobscounter++].y=j;
                        }
                }
                else
                {
                        /* new constraint */
                        con[i][j]++;
                        addobs[addobscounter].x = i;
                        addobs[addobscounter++].y = j;
                }
                plot_point1(i,j);
                exor_old_path();
                init_path();
                regenerate();
                set_prog_item(GRADIENT);
                local_path_planning();
                set_prog_item(INPUT);
                reset_handlers();
                break;
        }
} process_goal(i,j)
int i,j;
{
        int numknown;

if ((numknown=goal_known(i,j)) != goalcounter) {
                plot_patch(i,j,PIX_SRC,WHITEP);
                remove_from_goals(i,j,numknown);
                remove_goal_in_task_space(i,j);
        } else {
                add_to_goals(i,j);
                show_goal_point(i,j,PIX_SRC);
                add_goal_in_task_space(i,j);
        }
        /* mirror image goal */
        /* the following in fact only if XSIZE == YSIZE. Sorry */
        if (i != j) {
                show_arm(j,i,PIX_SRC,BLACKP);
                if ((numknown=goal_known(j,i)) != goalcounter) {
                        remove_from_goals(j,i,numknown);
                        plot_patch(j,i,PIX_SRC,WHITEP);
                } else {
```

```c
                        add_to_goals(j,i);
                        show_goal_point(j,i,PIX_SRC);
                }
        }
} int goal_known(i,j)    /* test if a goal at this location was known */
                        /* return goal number if known */
                        /* return next free (goalcounter) if unknown */
int i,j;
{
        register int k;

for (k=0; k<goalcounter; k++) {
                if (goal[k].x == i && goal[k].y == j) return(k);
        }
        return(goalcounter);
} add_to_goals(i,j)
int i,j;
{
        register int k;

/* put goal in addgoal array */
        newgoals[newgoalcounter].x = i;
        newgoals[newgoalcounter++].y = j;

/* put goal in goal array */
        goal[goalcounter].x = i;
        goal[goalcounter++].y = j;

/* check if this goal was just removed, if so remove from remgoals */
        for (k=0; k<remgoalcounter; k++) {
                if (remgoals[k].x == i && remgoals[k].y == j) {
                        /* substitute last element for this one */
                        remgoals[k].x = remgoals[--remgoalcounter].x;
                        remgoals[k].y = remgoals[remgoalcounter].y;
                }
        } if (newgoalcounter == MAX_GOAL_NUMBER ||
                goalcounter == MAX_GOAL_NUMBER)
                        printf("No more goals can be added!0);
} remove_from_goals(i,j,number)
int i,j;
{
        register int k;

/* put goal in remgoal-array */
        remgoals[remgoalcounter].x = i;
```

```
        remgoals[remgoalcounter++].y = j;

/* place last goal in new empty position in goal -array */
        goal[number].x = goal[--goalcounter].x;
        goal[number].y = goal[goalcounter].y;

/* check if this goal is just new, if so remove from newgoals */
        for (k=0; k<newgoalcounter; k++) {
                if (newgoals[k].x == i && newgoals[k].y == j) {
                        /* substitute last element for this one */
                        newgoals[k].x = newgoals[--newgoalcounter].x;
                        newgoals[k].y = newgoals[newgoalcounter].y;
                        return; /* don't add to added goals */
                }
        }
        if (remgoalcounter == MAX_GOAL_NUMBER)
                        printf("No more goals can be removed!0);
} report_about(i,j)
int i,j;
{
#ifdef FLOATWORLD
        printf("pt[%d,%d], cost=%f, vect=%x(x)0,i,j,
        configspace[i][j].cost_to_goal,
        configspace[i][j].vector);
#else
        printf("pt[%d,%d], cost=%d, vect=%x(x)0,i,j,
        configspace[i][j].cost_to_goal,
        configspace[i][j].vector);
#endif
} exor_old_path()
{
        short save_mode;

if (!path_drawn) return;
        save_mode = mode;
        mode = NOARM;
        plot_path_point(istart,jstart);
        find_and_draw_shortest_path();
        mode = save_mode;
        path_drawn = FALSE;
        /**/
} plot_background(i,j)
short i,j;
{
        /* plot the white area behind the number */
        register ii,jj;
```

```
        if((XSIZE > 10) || (YSIZE > 10)) return;
        /*
        ii=CMARGIN+ CELL_SIZE/5 +INC*i+4;
        jj = j*INC + (CMARGIN + CELL_SIZE/2 ) +1;
        */
        jj=CMARGIN+ CELL_SIZE/5 +INC*j+4;
        ii = i*INC + (CMARGIN + CELL_SIZE* RED_SIDE_WINDOW) +1;

/*
        ii = CMARGIN + i*(CELL_SIZE + CSTEP) +1;
        jj = CMARGIN + j*(CELL_SIZE + CSTEP) +1;
        */
        pw_replrop(canvas1_pw,ii,jj,
                (int) (CELL_SIZE * WHITE_WINDOW),
                CELL_SIZE>>2,
                (PIX_DST^PIX_SRC)|PIX_COLOR(REDC),patch_prs[BLACKP],
                GOAL_START, GOAL_START);
} plot_path_point(i,j)
short i,j;
{
        if(configspace[i][j].cost_to_goal != 0)
        {
                plot_background(i,j);
                plot_patch(i,j,
                (PIX_SRC^PIX_DST)|PIX_COLOR(REDC),BLACKP);
        }
        /*
        plot_patch(i,j,(PIX_SRC|PIX_DST)|PIX_COLOR(REDC),BLACKP);
        */
} void change2_proc(choice_item,value,event)
Panel_item      choice_item;
int             value;
Event           *event;
{
        change2 = value;

erase_arms();
        show_arm(istart,jstart,PIX_SRC,BLACK);
        check_for_change_in_obs_and_goals();
        if (regeneration_needed) {
                init_path();
                regenerate();
                set_prog_item(GRADIENT);
                /* show_arm(istart,jstart,PIX_SRC^PIX_DST,WHITE); */
                show_arm(istart,jstart,PIX_SRC^PIX_DST,BLACK);
                find_and_draw_shortest_path();
        } else {
                set_prog_item(GRADIENT);
```

```
                exor_old_path();
                /* show_arm(istart,jstart,PIX_SRC^PIX_DST,WHITE); */
                show_arm(istart,jstart,PIX_SRC^PIX_DST,BLACK);
                local_path_planning();
        }
        set_prog_item(INPUT);
        panel_set_value(change2_item,1);
} void change1_proc(choice_item,value,event)
Panel_item    choice_item;
int           value;
Event         *event;
{
        change1=value; /* value is any of START, DGOAL, POINTER or
                STATE CONSTRAINT buttons */
        panel_set_value(change2_item,1);
} void flow_proc(mode_item,value,event)
Panel_item    mode_item;
int           value;
Event         *event;
{
        switch (value) {
        case 0:
                flow = TRUE;
                break;
        case 1:
                flow = HALFWAY;
                break;
        case 2:
                flow = FALSE;
                break;
        }
        check_for_change_in_obs_and_goals();
        if (regeneration_needed) {
                init_path();
                regenerate();
        }
        set_prog_item(PREPARE);
/*
        plot_path_point(istart,jstart);
*/
        plot_canvas1();
        set_prog_item(GRADIENT);
        local_path_planning();
        set_prog_item(INPUT);
} void mode_proc(mode_item,value,event)
Panel_item    mode_item;
int           value;
```

```
Event           *event;
{
        switch (value) {
        case 0:
                mode = MOVEMODE;
                break;
        case 1:
                mode = PATHMODE;
                break;
        }
        if (regeneration_needed)  {
                init_path();
                regenerate();
                set_prog_item(GRADIENT);
        } else {
                set_prog_item(GRADIENT);
                exor_old_path();
                local_path_planning();
        }
        set_prog_item(INPUT);
} void redraw_proc(redraw_item,value,event)
Panel_item      redraw_item;
int             value;
Event           *event;
{
        switch (value) {
        case 0:
                redraw = STICK_ARM;
                break;
        case 1:
                redraw = BODY_ARM;
                break;
        } if (regeneration_needed)  {
                init_path();
                regenerate();
                set_prog_item(GRADIENT);
        } else {
                set_prog_item(GRADIENT);
                exor_old_path();
        }
        local_path_planning();
        set_prog_item(INPUT);
} void speed_proc(speed_item,value,event)
Panel_item      speed_item;
int             value;
```

```
Event         *event;
{      speed = value;   } void metric_proc(metric_item,value,event)
Panel_item    metric_item;
int           value;
Event         *event;
{
        /* XXX PIPE */
        switch(value) {
        case MOTION:
                metric_fcn = (PFF)config_straight;
                break;
        case DISTANCE:
                metric_fcn = (PFF)task_straight;
                break;
        case EFFORT:
                metric_fcn = (PFF)effort;
                break;
        }
        regeneration_needed = TRUE;
        clear_vectors_and_costs(KEEPGOALS);
        init_path();
        regenerate();
        set_prog_item(GRADIENT);
        local_path_planning();
        set_prog_item(INPUT);
} void demo_proc(demo_item,value,event)
Panel_item    demo_item;
int           value;
Event         *event;
{
        short i;

set_prog_item(INPUT);
        switch (value) {
        case 0: /* Clear */
                clear_vectors_and_costs(KILLGOALS); /* set up budder */
                init_goals_in_task_space();/*kit Jan 19 */
                init_ph_con();
                init_con();
                init_obs();
                init_goal(XSIZE/2,YSIZE/2);
                init_sta();
                break;
        case 1: /* Video Pattern */
                clear_vectors_and_costs(KILLGOALS); /* set up budder */
                init_ph_con();
                init_con();
                init_video_obs();
                init_goal(0,0);
```

```
                    istart = 0; jstart = YSIZE/2;
                    break;
            }
        set_prog_item(PREPARE);
        init_path();
        plot_canvas2(); plot_canvas1();
        show_arm(istart,jstart,PIX_SRC,BLACK);
        regenerate();
        set_prog_item(GRADIENT);
        local_path_planning();
        set_prog_item(INPUT);
        panel_set_value(demo_item,2);
} regenerate()    /* Regenerate landscapes */
{
        char tstring[20];
        set_prog_item(PROPAGATE);
        check_new_obs_and_rmd_goals();
                /* add perimeter of new obs & removed_goals */
                /* to the unbudding heap */
        clear_influence(); /* leaves perimeter in heap */
        /*kit
        show_heap("Perimeter of Cleared Influence");
        */
        /* intermediate display: strange for metric change */
        if (flow == HALFWAY) {
                set_prog_item(PREPARE);
                show_arm(istart,jstart,PIX_SRC,BLACK);
                plot_canvas1();
                /*
                printf("Hit any char to continue:");
                getchar();
                */
                set_prog_item(PROPAGATE);
        }
        plot_canvas1();
#ifdef printmode
        printf("dump screen?(y/n) ->");
        scanf("%s",tstring);
        if(tstring[0] == 'y')
                dump_screen("After the influence is removed");
#endif
        check_free_obs_and_new_goals();
        /* clear_vectors_and_costs(KEEPGOALS); */
        if(flow == HALFWAY)
                show_heap_in_cyan();
        /*show_heap("Perimeter, Removed Obs, Added Goals");*/
        bud(istart,jstart);
        set_prog_item(PREPARE);
        show_arm(istart,jstart,PIX_SRC,BLACK);
        plot_canvas2(); plot_canvas1();
        regeneration_needed = FALSE;
```

```
} show_message()
{
        window_set(message_frame,WIN_SHOW,TRUE,0);
} remove_message()
{
        window_set(message_frame,WIN_SHOW,FALSE,0);
        pw_batch_on(canvas1_pw);
        pw_batch_off(canvas1_pw);
} message_event_proc(win,event)
Window          win;
Event           *event;
{
        switch (event_id(event)) {
        case MS_LEFT:
        case MS_MIDDLE:
        case MS_RIGHT:
                remove_message();
        }
} plot_point1(i,j)        /* exor point in configuration space, dependent on modes */
short i,j;
{
        int op;
#ifdef asdfa
        op = (PIX_SRC^PIX_DST)|PIX_COLOR(REDC);
        if (flow) {
                plot_patch(i,j,op,BLACKP);
                if ((change1 == DGOAL_BUTTON) && (i != j))
                        plot_patch(j,i,op,BLACKP);
        } else {
                plot_patch(i,j,op,POINTERPATCH);
                if ((change1 == DGOAL_BUTTON) && (i != j))
                        plot_patch(j,i,op,POINTERPATCH);
        }
else
        plot_path_point(i,j);
#endif
} plot_arm(i,j,op,color)
short i,j,op,color;
{
        show_arm(i,j,op,color);
        if ((change1 == DGOAL_BUTTON) && (i != j)) show_arm(j,i,op,color);
}
```

```
set_prog_item(number)
short number;
{
        switch (number) {
        case INPUT:
                panel_set_value(prog_item1,0);
                break;
        case PROPAGATE:
                panel_set_value(prog_item1,1);
                break;
        case PREPARE:
                panel_set_value(prog_item1,2);
                break;
        case GRADIENT:
                panel_set_value(prog_item1,3);
                break;
        }
} remove_goal_in_task_space(i,j)
short i,j;
{
        int k;
        short gx,gy;
        double angle1,angle2;
        double cos1,sin1,cos2,sin2;

angle1 = -i*ANGLE1RES; /* wyatt coordinates */
        angle2 = -j*ANGLE2RES; /* wyatt coordinates */
        cos1 = cos(angle1);
        sin1 = sin(angle1);
        cos2 = cos(angle2);
        sin2 = sin(angle2);
        gx = XBASE+(short)(L1J*cos1) + (short)( (L22-W2)*cos2+.5);
        gy = YBASE+(short)(L1J*sin1) + (short)( (L22-W2)*sin2+.5);

for (k=0; k<num_goals; k++) {
                if (task_goal[k].x == gx && task_goal[k].y == gy) {
                        num_goals -= 1;
                        task_goal[k].x = task_goal[num_goals].x;
                        task_goal[k].y = task_goal[num_goals].y;
                        break;
                }
        }
        pw_rop(canvas2_pw,
                gx-(CELL_SIZE/2),gy-(CELL_SIZE/2),CELL_SIZE,CELL_SIZE,
                PIX_SRC^PIX_DST,icon_prs[GOAL_ICON],
                GOAL_START,GOAL_START);

} add_goal_in_task_space(i,j)
short i,j;
```

```
{
        int k;
        int g;
        short gx,gy;
        double angle1,angle2;
        double cos1,sin1,cos2,sin2;

if (num_goals == MAX_GOAL_NUMBER-1) {
                printf(" No more goals can be added; %d is the maximum0,
                MAX_GOAL_NUMBER);
        } angle1 = -i*ANGLE1RES;  /* wyatt coordinates */
        angle2 = -j*ANGLE2RES;  /* wyatt coordinates */
        cos1 = cos(angle1);
        sin1 = sin(angle1);
        cos2 = cos(angle2);
        sin2 = sin(angle2);
        gx = XBASE+(short)(L1J*cos1) + (short)( (L22-W2)*cos2 + .5);
        gy = YBASE+(short)(L1J*sin1) + (short)( (L22-W2)*sin2 + .5);

task_goal[num_goals].x = gx;
        task_goal[num_goals].y = gy;
        num_goals += 1;

pw_batch_on(canvas2_pw);
        g= (GOAL_START);
        pw_write(canvas2_pw,
                gx-(CELL_SIZE/2),gy-(CELL_SIZE/2),CELL_SIZE/2,CELL_SIZE/2,
                ((PIX_SRC^PIX_DST)|PIX_COLOR(GREENC)),icon_prs[GOAL_ICON],
                g,g);
        pw_batch_off(canvas2_pw);
} remove_cursor1()
{
        Cursor cursor;
        cursor = window_get(canvas1,WIN_CURSOR);
        cursor_set (cursor,CURSOR_OP,PIX_DST,0);
        window_set(canvas1,WIN_CURSOR,cursor,0);
} add_cursor1()
{
        Cursor cursor;
        cursor = window_get(canvas1,WIN_CURSOR);
        cursor_set (cursor,CURSOR_OP,PIX_DST^PIX_SRC,0);
        window_set(canvas1,WIN_CURSOR,cursor,0);
} remove_cursor2()
{
```

```
        Cursor cursor;
        cursor = window_get(canvas2,WIN_CURSOR);
        cursor_set (cursor,CURSOR_OP,PIX_DST,0);
        window_set(canvas2,WIN_CURSOR,cursor,0);
} add_cursor2()
{
        Cursor cursor;
        cursor = window_get(canvas2,WIN_CURSOR);
        cursor_set (cursor,CURSOR_OP,PIX_DST^PIX_SRC,0);
        window_set(canvas2,WIN_CURSOR,cursor,0);
} local_path_planning()
{
        while (find_and_draw_shortest_path() == STUCK)
                regenerate();
} dump_screen(infostring)
char *infostring;
{
        printf("Dumping screen showing: %s0,infostring);
        system("/usr/local/bin/scdump");
        system("sleep 20");
}
```

```c
/* printout of file: demo.c */
/***************************/ include "defines.h"
include "externs.h"
#include "globals.h"
#include "arrows.globals.h"
/************************************************
        armdemo2.c
        history :
                created 19860912      Leo  Dorst
                modified 19861113     Leo + Karen
************************************************/
int g_argc;
char **g_argv;

main(argc,argv)
int argc;
char *argv[];
{
        /* export these values to canvas */
        g_argc = argc;
        g_argv = argv;

printf("00);
        budinit();
printf("10);
        init_metrics();
printf("20);
        clear_constraint_image();
printf("30);
        init_canvases();
printf("40);
        prepare_trafo_data();
printf("50);
        init_sta();
printf("60);
        init_path();
printf("70);
        init_goal(XSIZE/2,YSIZE/2);
printf("80);
        init_con();
        init_ph_con();
printf("90);
        regenerate();
printf("110);
        plot_canvas2();
printf("120);
        plot_canvas1();
printf("130);
        window_set(canvas2_pw,WIN_SHOW,TRUE,0);
printf("140);
        window_set(canvas1_pw,WIN_SHOW,TRUE,0);
```

```
printf("150);
        find_and_draw_shortest_path();
printf("160);
        set_prog_item(INPUT);
        window_main_loop(frame0);
printf("170);
}
```

```
/* printout of file: init.c */
/*******************************/ include "defines.h"
include "externs.h"
#include "arrows.externs.h"
/************************************************************************
        init.c
        initialisation routines
        history
                created 198609xx Leo Dorst
                mod     19861113 Leo Dorst
************************************************************************/
init_sta()      /* initialize start point */
{
        istart = XSIZE/5; jstart = YSIZE/5;
        path_array[0].x = istart;
        path_array[0].y = jstart;
} init_goals_in_task_space()
{
        num_goals = 0;
} init_goal(i,j)
short i,j;
{
        goalcounter = 0;
        add_to_goals(i,j);
        add_goal_in_task_space(i,j);
} init_obs()      /* place the obstcles in line on the top of the screen */
{
        register short i;

for (i=0; i<NUMPHOBS; i++) {
                ph_obs_pos_old[i].x = 0;
                ph_obs_pos_old[i].y = 0;
                ph_obs_pos[i].x = 15;
                ph_obs_pos[i].y = 15 + 24*i;
        }
        for (i=0; i<NUMOBS; i++) {
                obs_pos_old[i].x = 0;
                obs_pos_old[i].y = 0;
                obs_pos[i].x = 15;
                obs_pos[i].y = 15+24*(i+NUMPHOBS);
        }
        obs_change();
} init_video_obs() /* place the obstcles in CRE-video setup*/
```

```
{
        register short i;

for (i=0; i<NUMOBS; i++) {
                obs_pos_old[i].x = 0;
                obs_pos_old[i].y = 0;
        }
        obs_pos[NUMOBS-1].x = 152;
        obs_pos[NUMOBS-1].y = 343;
        obs_pos[NUMOBS-2].x = 132;
        obs_pos[NUMOBS-2].y = 228;
        obs_pos[NUMOBS-3].x = 215;
        obs_pos[NUMOBS-3].y = 138;
        obs_pos[NUMOBS-4].x = 354;
        obs_pos[NUMOBS-4].y = 173;
        obs_pos[NUMOBS-5].x = 361;
        obs_pos[NUMOBS-5].y = 315;
        obs_change();
} init_ph_con()   /* initializes array con[][] */
{
        register short i,j;

for (i=0; i<XSIZE; i++)
                for (j=0; j<YSIZE; j++)
                        ph_con[i][j] = NOCONSTRAINT;
} init_path()   /* initializes array path_array[][] */
{
        register short i,j;

pathcounter = 1;  /* yuck! */
} init_con()   /* initializes array con[][] */
{
        register short i,j;

for (i=0; i<XSIZE; i++)
                for (j=0; j<YSIZE; j++)
                        con[i][j] = NOCONSTRAINT;
} init_pnt()   /* initializes array pnt[][] */
{
        register short i,j;

for (i=0; i<XSIZE; i++)
                for (j=0; j<YSIZE; j++)
                        configspace[i][j].vector = IP;   /* initial pointer */
}
```

```
init_colors()
{
/*
        cms_rgbsetup(red1,green1,blue1);
        pw_setcmsname(canvas2_pw,"rgb2");
        pw_putcolormap(canvas2_pw,0,CMS_RGBSIZE,red1,green1,blue1);
*/
        cms_rgbsetup(red,green,blue);
        pw_setcmsname(canvas1_pw,"rgb1");
        pw_putcolormap(canvas1_pw,0,CMS_RGBSIZE,red,green,blue);
}
```

```
/* printout of file: interpol.c */
/*****************************/

/* subrs to define obstacles and perform obstacle interpolation */
/* uses table look-ups and integer arithmetic */
#include "defines.h"
include "externs.h"
#include <stdio.h>

/* wrap-around constant for encoders */
#define WRAP 32768
#define BIT1ON 0x01;    /* useful mask */

/* fnc to define obstacle data */
/***********************************************************/ def_obstacles()
{
 int k,i,j;

/* define a set of obstacle codes, 0 through 30 */
        bitmask[0]=BIT1ON;
        for (i=0;i<NUMOBS;i++) bitmask[i+1]=bitmask[i]<<1;

/*  define an obstacle boundary */
/* first index--> obstacle radius, nrad */
/* second index--> theta1 (=0), theta2 (=1); third index = point# */
/* obstacle number 0  --> radius= 8 cm - min allowed radius */
/* obstacle number 12 --> radius = 54 cm - max reach of link2 */

/* obstacle radius = 8cm */
link2_front[0][0][0]= -4800;
link2_front[0][0][1]= -9800;
link2_front[0][0][2]= -9800;
link2_front[0][0][3]= -9000;
link2_front[0][0][4]= -4800;
link2_front[0][0][5]= -4800;
link2_front[0][1][0]= 11300;
link2_front[0][1][1]= 6000;
link2_front[0][1][2]= 5000;
link2_front[0][1][3]= 5000;
link2_front[0][1][4]= 8800;
link2_front[0][1][5]= -11300;

/* obstacle radius = 10cm */
link2_front[1][0][0]= -3300;
link2_front[1][0][1]= -9300;
link2_front[1][0][2]= -9300;
link2_front[1][0][3]= -8300;
link2_front[1][0][4]= -3600;
link2_front[1][0][5]= -3600;
link2_front[1][1][0]= 12500;
link2_front[1][1][1]= 6000;
```

```
link2_front[1][1][2]= 5000;
link2_front[1][1][3]= 5000;
link2_front[1][1][4]= 9500;
link2_front[1][1][5]= -12500;

/* obstacle radius = 14 cm */
link2_front[2][0][0]= -2400;
link2_front[2][0][1]= -8000;
link2_front[2][0][2]= -8000;
link2_front[2][0][3]= -7000;
link2_front[2][0][4]= -2400;
link2_front[2][0][5]= -2400;
link2_front[2][1][0]= 13000;
link2_front[2][1][1]= 6000;
link2_front[2][1][2]= 5300;
link2_front[2][1][3]= 5300;
link2_front[2][1][4]= 9500;
link2_front[2][1][5]= -13000;

/* obstacle radius = 18cm */
link2_front[3][0][0]= -1800;
link2_front[3][0][1]= -7500;
link2_front[3][0][2]= -7500;
link2_front[3][0][3]= -6500;
link2_front[3][0][4]= -1800;
link2_front[3][0][5]= -1800;
link2_front[3][1][0]= 13000;
link2_front[3][1][1]= 6000;
link2_front[3][1][2]= 5100;
link2_front[3][1][3]= 5100;
link2_front[3][1][4]= 8600;
link2_front[3][1][5]= -13000;

/* obstacle radius = 22cm */
link2_front[4][0][0]= -1400;
link2_front[4][0][1]= -6800;
link2_front[4][0][2]= -6800;
link2_front[4][0][3]= -6000;
link2_front[4][0][4]= -1400;
link2_front[4][0][5]= -1400;
link2_front[4][1][0]= 12300;
link2_front[4][1][1]= 5800;
link2_front[4][1][2]= 4800;
link2_front[4][1][3]= 4800;
link2_front[4][1][4]= 7000;
link2_front[4][1][5]= -12300;

/* obstacle radius = 26cm */
link2_front[5][0][0]= -1300;
link2_front[5][0][1]= -6200;
link2_front[5][0][2]= -6200;
link2_front[5][0][3]= -3000;
link2_front[5][0][4]= -1300;
```

```
link2_front[5][0][5]= -1300;
link2_front[5][1][0]= 9900;
link2_front[5][1][1]= 5600;
link2_front[5][1][2]= 4300;
link2_front[5][1][3]= 5000;
link2_front[5][1][4]= 3600;
link2_front[5][1][5]= -9900;

/* obstacle radius = 30cm */
link2_front[6][0][0]= -2300;
link2_front[6][0][1]= -5600;
link2_front[6][0][2]= -5600;
link2_front[6][0][3]= -3000;
link2_front[6][0][4]= -1300;
link2_front[6][0][5]= 400;
link2_front[6][1][0]= 6700;
link2_front[6][1][1]= 5700;
link2_front[6][1][2]= 4000;
link2_front[6][1][3]= 4000;
link2_front[6][1][4]= 2000;
link2_front[6][1][5]= -6700;

/* obstacle radius = 34cm */
link2_front[7][0][0]= -2300;
link2_front[7][0][1]= -5100;
link2_front[7][0][2]= -5100;
link2_front[7][0][3]= -2800;
link2_front[7][0][4]= -1800;
link2_front[7][0][5]= 1000;
link2_front[7][1][0]= 5400;
link2_front[7][1][1]= 5000;
link2_front[7][1][2]= 3600;
link2_front[7][1][3]= 3100;
link2_front[7][1][4]= 2200;
link2_front[7][1][5]= -4500;

/* obstacle radius = 38cm */
link2_front[8][0][0]= -2600;
link2_front[8][0][1]= -4400;
link2_front[8][0][2]= -4400;
link2_front[8][0][3]= -2300;
link2_front[8][0][4]= -1400;
link2_front[8][0][5]= 700;
link2_front[8][1][0]= 4600;
link2_front[8][1][1]= 4600;
link2_front[8][1][2]= 3200;
link2_front[8][1][3]= 2200;
link2_front[8][1][4]= 1000;
link2_front[8][1][5]= -3000;

/* obstacle radius = 42cm */
link2_front[9][0][0]= -2800;
link2_front[9][0][1]= -3800;
```

```
link2_front[9][0][2]= -3800;
link2_front[9][0][3]= -2000;
link2_front[9][0][4]= -1000;
link2_front[9][0][5]= 800;
link2_front[9][1][0]= 3900;
link2_front[9][1][1]= 3800;
link2_front[9][1][2]= 2700;
link2_front[9][1][3]= 1300;
link2_front[9][1][4]= 200;
link2_front[9][1][5]= -2400;

/* obstacle radius = 46cm */
link2_front[10][0][0]= -2300;
link2_front[10][0][1]= -3000;
link2_front[10][0][2]= -3000;
link2_front[10][0][3]= -1500;
link2_front[10][0][4]= -900;
link2_front[10][0][5]= 1100;
link2_front[10][1][0]= 3000;
link2_front[10][1][1]= 3000;
link2_front[10][1][2]= 2000;
link2_front[10][1][3]= 700;
link2_front[10][1][4]= 0;
link2_front[10][1][5]= -2300;

/* obstacle radius = 50cm */
link2_front[11][0][0]= -1500;
link2_front[11][0][1]= -2200;
link2_front[11][0][2]= -2200;
link2_front[11][0][3]= -1900;
link2_front[11][0][4]= -800;
link2_front[11][0][5]= 700;
link2_front[11][1][0]= 2100;
link2_front[11][1][1]= 2100;
link2_front[11][1][2]= 1700;
link2_front[11][1][3]= 1000;
link2_front[11][1][4]= 0;
link2_front[11][1][5]= -1700;

/* obstacle radius = 52cm */
link2_front[12][0][0]= -1000;
link2_front[12][0][1]= -1400;
link2_front[12][0][2]= -1400;
link2_front[12][0][3]= -900;
link2_front[12][0][4]= -700;
link2_front[12][0][5]= 200;
link2_front[12][1][0]= 1400;
link2_front[12][1][1]= 1400;
link2_front[12][1][2]= 1000;
link2_front[12][1][3]= 200;
link2_front[12][1][4]= 0;
link2_front[12][1][5]= -800;
```

```
/* obstacle radius = 54cm */
link2_front[13][0][0]= -500;
link2_front[13][0][1]= -700;
link2_front[13][0][2]= -700;
link2_front[13][0][3]= -500;
link2_front[13][0][4]= 0;
link2_front[13][0][5]= 200;
link2_front[13][1][0]= 700;
link2_front[13][1][1]= 700;
link2_front[13][1][2]= 300;
link2_front[13][1][3]= 0;
link2_front[13][1][4]= -500;
link2_front[13][1][5]= -700;

/* use odd-symmetry to fill in rest of matrices */
for (k=0;k<14;k++) {
        for (i=0;i<2;i++) {
                for (j=0;j<7;j++) {
                        link2_front[k][i][j+6]= -link2_front[k][i][j];
                }
        }
}

/* stuff "del" tables with d01, d02 */
for (k=0;k<14;k++) {
        for (i=0;i<2;i++) {
                del_l2f[k][i][0]=link2_front[k][i][0];
                for (j=0;j<12;j++)
                        del_l2f[k][i][j+1]= link2_front[k][i][j+1]-link2_front[k][i][j];
        }
}

/* done with defining link-2, front obstacle boundaries; */
/* also need to define link-2 rear and link 1 obstacle boundaries */

/* obstacle radius = 12cm + epsilon */
link2_rear[0][0][0]= -2800;
link2_rear[0][0][1]= -3000;
link2_rear[0][0][2]= -3000;
link2_rear[0][0][3]= -2900;
link2_rear[0][0][4]= -2800;
link2_rear[0][0][5]= -2800;
link2_rear[0][1][0]= 12200   +16384;
link2_rear[0][1][1]= 11800   +16384;
link2_rear[0][1][2]= 10800   +16384;
link2_rear[0][1][3]= 10700   +16384;
link2_rear[0][1][4]= 10600   +16384;
link2_rear[0][1][5]= -12200  +16384;

/* obstacle radius = 14cm */
link2_rear[1][0][0]= -2500;
link2_rear[1][0][1]= -3400;
link2_rear[1][0][2]= -3400;
```

```
link2_rear[1][0][3]= -3000;
link2_rear[1][0][4]= -2500;
link2_rear[1][0][5]= -2500;
link2_rear[1][1][0]= 12800 +16384;
link2_rear[1][1][1]= 11000 +16384;
link2_rear[1][1][2]= 9500  +16384;
link2_rear[1][1][3]= 9500  +16384;
link2_rear[1][1][4]= 10000 +16384;
link2_rear[1][1][5]= -12800 +16384;

/* obstacle radius = 18cm */
link2_rear[2][0][0]= -1800;
link2_rear[2][0][1]= -3600;
link2_rear[2][0][2]= -3600;
link2_rear[2][0][3]= -2800;
link2_rear[2][0][4]= -1800;
link2_rear[2][0][5]= -1800;
link2_rear[2][1][0]= 12800 +16384;
link2_rear[2][1][1]= 9800  +16384;
link2_rear[2][1][2]= 7900  +16384;
link2_rear[2][1][3]= 7900  +16384;
link2_rear[2][1][4]= 9000  +16384;
link2_rear[2][1][5]= -12800 +16384;

/* obstacle radius = 22cm */
link2_rear[3][0][0]= -1600;
link2_rear[3][0][1]= -3500;
link2_rear[3][0][2]= -3500;
link2_rear[3][0][3]= -2500;
link2_rear[3][0][4]= -1600;
link2_rear[3][0][5]= -1600;
link2_rear[3][1][0]= 12800 +16384;
link2_rear[3][1][1]= 8500  +16384;
link2_rear[3][1][2]= 6300  +16384;
link2_rear[3][1][3]= 6300  +16384;
link2_rear[3][1][4]= 6100  +16384;
link2_rear[3][1][5]= -12800 +16384;

/* obstacle radius = 26cm */
link2_rear[4][0][0]= -1300;
link2_rear[4][0][1]= -3300;
link2_rear[4][0][2]= -3300;
link2_rear[4][0][3]= -2300;
link2_rear[4][0][4]= -1300;
link2_rear[4][0][5]= -1300;
link2_rear[4][1][0]= 10000 +16384;
link2_rear[4][1][1]= 7700  +16384;
link2_rear[4][1][2]= 5000  +16384;
link2_rear[4][1][3]= 4700  +16384;
link2_rear[4][1][4]= 3300  +16384;
link2_rear[4][1][5]= -10000 +16384;

/* obstacle radius = 30cm */
```

```
link2_rear[5][0][0]= -1600;
link2_rear[5][0][1]= -2800;
link2_rear[5][0][2]= -2800;
link2_rear[5][0][3]= -2000;
link2_rear[5][0][4]= -1000;
link2_rear[5][0][5]= 500;
link2_rear[5][1][0]= 7000  +16384;
link2_rear[5][1][1]= 6300  +16384;
link2_rear[5][1][2]= 4200  +16384;
link2_rear[5][1][3]= 3000  +16384;
link2_rear[5][1][4]= 0     +16384;
link2_rear[5][1][5]= -7000 +16384;

/* obstacle radius =   34cm */
link2_rear[6][0][0]= -1800;
link2_rear[6][0][1]= -2300;
link2_rear[6][0][2]= -2300;
link2_rear[6][0][3]= -1800;
link2_rear[6][0][4]= -1000;
link2_rear[6][0][5]= 0;
link2_rear[6][1][0]= 5000  +16384;
link2_rear[6][1][1]= 4800  +16384;
link2_rear[6][1][2]= 3100  +16384;
link2_rear[6][1][3]= 1800  +16384;
link2_rear[6][1][4]= 500   +16384;
link2_rear[6][1][5]= -3200 +16384;

/* obstacle radius =   38cm */
link2_rear[7][0][0]= -900;
link2_rear[7][0][1]= -1500;
link2_rear[7][0][2]= -1500;
link2_rear[7][0][3]= -1000;
link2_rear[7][0][4]= -300;
link2_rear[7][0][5]= 200;
link2_rear[7][1][0]= 3200  +16384;
link2_rear[7][1][1]= 3200  +16384;
link2_rear[7][1][2]= 1600  +16384;
link2_rear[7][1][3]= 400   +16384;
link2_rear[7][1][4]= -1000 +16384;
link2_rear[7][1][5]= -2000 +16384;

/* obstacle radius =   40cm */
link2_rear[8][0][0]= -300;
link2_rear[8][0][1]= -800;
link2_rear[8][0][2]= -800;
link2_rear[8][0][3]= -600;
link2_rear[8][0][4]= -300;
link2_rear[8][0][5]= 0;
link2_rear[8][1][0]= 1800  +16384;
link2_rear[8][1][1]= 1800  +16384;
link2_rear[8][1][2]= 600   +16384;
link2_rear[8][1][3]= 0     +16384;
link2_rear[8][1][4]= -600  +16384;
```

```c
link2_rear[8][1][5]= -1100 +16384;

/* obstacle radius = 40.5cm - epsilon */
link2_rear[9][0][0]= -300;
link2_rear[9][0][1]= -700;
link2_rear[9][0][2]= -700;
link2_rear[9][0][3]= -400;
link2_rear[9][0][4]= -200;
link2_rear[9][0][5]= 0;
link2_rear[9][1][0]= 1400 +16384;
link2_rear[9][1][1]= 1400 +16384;
link2_rear[9][1][2]= 300 +16384;
link2_rear[9][1][3]= -200 +16384;
link2_rear[9][1][4]= -600 +16384;
link2_rear[9][1][5]= -1100 +16384;

/* use odd-symmetry to fill in rest of matrices */
for (k=0;k<10;k++) {
        for (j=0;j<7;j++) {
                link2_rear[k][0][j+6]= -link2_rear[k][0][j];
                link2_rear[k][1][j+6]= -(link2_rear[k][1][j]-16384)+16384;
        }
}

/**** stuff "del" tables with d01, d02 */
for (k=0;k<10;k++) {
        for (i=0;i<2;i++) {
                del_12r[k][i][0]=link2_rear[k][i][0];
                for (j=0;j<12;j++)
                        del_12r[k][i][j+1]=
                                link2_rear[k][i][j+1]-link2_rear[k][i][j];
        }
}

/* definitions for link1: radial interpolation done in */
/* "l1_interp_obs()" */
link1_obs[15]=1100;
link1_obs[14]=1180;
link1_obs[13]=1300;
link1_obs[12]=1330;
link1_obs[11]=1400;
link1_obs[10]=1560;
link1_obs[9]=1800;
link1_obs[8]=1930;
link1_obs[7]=2450;
link1_obs[6]=2570;
link1_obs[5]=3600;
link1_obs[4]=4800;
link1_obs[3]=11070;

return;
}
```

```
        link2_rear[8][1][5]= -1100 +16384;

/* obstacle radius = 40.5cm - epsilon */
        link2_rear[9][0][0]= -300;
        link2_rear[9][0][1]= -700;
        link2_rear[9][0][2]= -700;
        link2_rear[9][0][3]= -400;
        link2_rear[9][0][4]= -200;
        link2_rear[9][0][5]= 0;
        link2_rear[9][1][0]= 1400  +16384;
        link2_rear[9][1][1]= 1400  +16384;
        link2_rear[9][1][2]= 300   +16384;
        link2_rear[9][1][3]= -200  +16384;
        link2_rear[9][1][4]= -600  +16384;
        link2_rear[9][1][5]= -1100 +16384;

/* use odd-symmetry to fill in rest of matrices */
for (k=0;k<10;k++) {
        for (j=0;j<7;j++) {
                link2_rear[k][0][j+6]= -link2_rear[k][0][j];
                link2_rear[k][1][j+6]= -(link2_rear[k][1][j]-16384)+16384;
        }
}

/**** stuff "del" tables with d01, d02 */
for (k=0;k<10;k++) {
        for (i=0;i<2;i++) {
                del_12r[k][i][0]=link2_rear[k][i][0];
                for (j=0;j<12;j++)
                        del_12r[k][i][j+1]=
                                link2_rear[k][i][j+1]-link2_rear[k][i][j];
        }
}

/* definitions for link1: radial interpolation done in */
/* "l1_interp_obs()" */
link1_obs[15]=-1100;
link1_obs[14]=-1180;
link1_obs[13]=-1300;
link1_obs[12]=-1330;
link1_obs[11]=-1400;
link1_obs[10]=-1560;
link1_obs[9]=-1800;
link1_obs[8]=-1930;
link1_obs[7]=-2450;
link1_obs[6]=-2570;
link1_obs[5]=-3600;
link1_obs[4]=-4800;
link1_obs[3]=-11070;

return;
}
```

```
/* end def_obstacles */

/* link2, front */
/* function to interpolate boundary points of obstacles */
/* accepts lookup table indices and numbered corner pt;
   returns interpolated corner pt as obs_ang1 and obs_ang2
   in encoder units */
/* if obs too close to shoulder, returns -1 */
/* if obs beyond link2 reach, returns 0 */
/* if valid obs within link2 reach, returns 1*/ int l2f_interp_obs(icorner)
int icorner;
{
 int ncase;

/*look-up radius is 8* cm */ /* use radius to determine case number */
ncase= rad8>>4;
switch(ncase) {
        /* here if radius greater than reach */
  default:  return(0);
        /* first 4 cases if obs within 8cm of shoulder--> too close */
  case 0: case 1: case 2: case 3: return(0);
  case 4:               /* between 8 and 10 cm */
        nobs=0;
        /* integer interpolation factor is 32x float ratio */
        i1= (rad8-64)<<1;
        goto interp;
  case 5: case 6:       /* between 10 and 14 cm */
        nobs=1;
        i1= (rad8-80);
        goto interp;
  case 7: case 8:       /* between 14 and 18 cm */
        nobs=2;
        i1= (rad8-112);
        goto interp;
  case 9: case 10:      /* between 18 and 22 cm */
        nobs=3;
        i1= (rad8-144);
        goto interp;
  case 11: case 12:     /* between 22 and 26 cm */
        nobs=4;
        i1= (rad8-176);
        goto interp;
  case 13: case 14:     /* between 26 and 30 cm */
        nobs=5;
        i1= (rad8-208);
        goto interp;
  case 15: case 16:     /* between 30 and 34 cm */
        nobs=6;
        i1= (rad8-240);
        goto interp;
  case 17: case 18:     /* between 34 and 38 cm */
```

```
            nobs=7;
            i1= (rad8-272);
            goto interp;
    case 19: case 20:        /* between 38 and 42 cm */
            nobs=8;
            i1= (rad8-304);
            goto interp;
    case 21: case 22:        /* between 42 and 46 cm */
            nobs=9;
            i1= (rad8-336);
            goto interp;
    case 23: case 24:        /* between 46 and 50 cm */
            nobs=10;
            i1= (rad8-368);
            goto interp;
    case 25:                 /* between 50 and 52 cm */
            nobs=11;
            i1= (rad8-400);
            goto interp;
    case 26:                 /* between 52 and 54 cm */
            nobs=12;
            i1= (rad8-416);
            goto interp;
    /* done with cases; do interpolation */
    }

/* have assigned integer iterpolation factor, i1 */
    /* want to interpolate point "icorner" */ interp:
            if((icorner<0)||(icorner>12)) return(0);
            obs_ang1= del_12f[nobs][0][icorner]+
                    ((i1*(del_12f[nobs+1][0][icorner]-del_12f[nobs][0][icorner]))
                    >>5);
            obs_ang2 = del_12f[nobs][1][icorner]+
                    ((i1*(del_12f[nobs+1][1][icorner]-del_12f[nobs][1][icorner]))
                    >>5);

/* done w/ corner pt interpolation; return 1 to signal all O.K. */
        return(1);
}

/***************************************************************/
/* link2, rear*/
/* function to interpolate boundary points of obstacles */
/* accepts lookup table indices and numbered corner pt;
    returns interpolated corner pt as obs_ang1 and obs_ang2
    in encoder units */
/* if obs out of reach of link2 rear, returns 0 */
/* if valid obs within link2 rear reach, returns 1*/ int l2r_interp_obs(icorner)
int icorner;
```

```
{
 int ncase;

/*look-up radius, rad8, is 8* cm */
 /* use radius to determine case number */
 ncase= rad8>>4;
 switch(ncase)
 {
    /* here if obs out of reach */
   default:  return(0);
 /* between 12 and 14 cm */
  case 6:
        nobs=0;
        /* integer interpolation factor is 32x float ratio */
        il= (rad8-96)<<1;
        goto interp;
 /* between 14 and 18 cm */
  case 7: case 8:
        nobs=1;
        il= (rad8-112);
        goto interp;
 /* between 18 and 22 cm */
  case 9: case 10:
        nobs=2;
        il= (rad8-144);
        goto interp;
 /* between 22 and 26 cm */
  case 11: case 12:
        nobs=3;
        il= (rad8-176);
        goto interp;
 /* between 26 and 30 cm */
  case 13: case 14:
        nobs=4;
        il= (rad8-208);
        goto interp;
 /* between 30 and 34 cm */
  case 15: case 16:
        nobs=5;
        il= (rad8-240);
        goto interp;
 /* between 34 and 38 cm */
  case 17: case 18:
        nobs=6;
        il= (rad8-272);
        goto interp;
 /* between 38 and 40 cm */
  case 19:
        nobs=7;
        il= (rad8-304)<<1;
        goto interp;
 /* between 40 and 42 cm */
  case 20:
```

```
        /* check if r>40.5 ---> out of reach */
        if (rad8>324) return(0);
        else { nobs=8;
                i1= (rad8-320)<<3;
                goto interp;}
  /* end of cases */
  }

/* have assigned integer iterpolation factor, i1 */
  /* want to interpolate point "icorner" */
interp:
    if((icorner<0)||(icorner>12)) return(0);
    obs_ang1= del_12r[nobs][0][icorner]+
        ((i1*(del_12r[nobs+1][0][icorner]-del_12r[nobs][0][icorner]))>>5);
    obs_ang2 = del_12r[nobs][1][icorner]+
        ((i1*(del_12r[nobs+1][1][icorner]-del_12r[nobs][1][icorner]))>>5);

/* done w/ corner pt interpolation; return 1 to signal all O.K. */
    return(1);
}

/**************************************************************/
/* function to interpolate link1 obstacles */
/* accepts lookup table indices and returns interpolated
   obs_l1_plus and obs_l1_minus (in encoder units) for
   link1 cw rot, ccw rot, respectively */ int l1_interp_obs()
{
 int index;
 int interp_factor;
 int ivar;

/*look-up radius, rad8, is 8* cm */

/* check if out of elbow reach; if out of reach, return 0 */
        if(rad8>242) return(0);

/* check if too close to shoulder */
        if(rad8<8*CENTIMETER) {
                /* within reach of rear of link1; stall at +/-180 deg */
                /* don't include angleobs offset */
                obs_l1_plus=( -8192+WRAP)%WRAP;
                obs_l1_minus=(8192+WRAP)%WRAP;
                return(1);
        }
/* here if obstacle between 7.8cm and 31cm */
/* compute obstacle index number from radius */
/* 29cm is 14th index */
        index= (rad8-8)>>4;
        ivar = (index<<4) +8;
        interp_factor=rad8-ivar;
```

```
/* interpolation factor is 16 times larger than float value */
    ivar= ((link1_obs[index+1]-link1_obs[index])*interp_factor)>>4;
    ivar+= link1_obs[index];
    obs_l1_plus= ( -ivar+WRAP)%WRAP;
    obs_l1_minus= ivar;

return(1);
}
```

```c
/* printout of file: path.c */
/****************************/ include "defines.h"
include "externs.h"

short ip,jp,ipp,jpp,pointer,num;
/*****************************************************************
        path.c
        path following
                created 198609xx Leo Dorst
                mod     19861114 Leo Dorst
*****************************************************************/ int Bx(x)
INT16 x;
{
        if (x < 0) x += XSIZE;
        if (x >= XSIZE) x -= XSIZE;
        return(x);
} int By(y)
INT16 y;
{
        if (y < 0) y += YSIZE;
        if (y >= YSIZE) y -= YSIZE;
        return(y);
} int find_and_draw_shortest_path()
/* return STUCK if path is blocked by phantom */
/* else plot path and return NOPROBLEM */
{
        erase_arms();
        num=0;
        ip = istart;
        ipp = istart;
        jp = jstart;
        jpp = jstart;

/* this is really patchwork... */
        /*
        switch (mode) {
        case MOVEMODE:
                plot_path_point(ip,jp);
                show_arm(istart,jstart,PIX_SRC^PIX_DST,BLACK);
                break;
        case PATHMODE:
                show_arm(istart,jstart,PIX_SRC^PIX_DST,BLACK);
                break;
        case NOARM:
                break;
```

```
        }
        if(mode != MOVEMODE)
        {
                plot_path_point(ip,jp);
        }
*/ if (((pointer - configspace[ip][jp].vector) == OBSTACLE)
                && (mode != NOARM)) {
                show_message();
                return;
        } if ( (pointer == IP) && (mode != NOARM) ) {
                show_message();
                switch(mode) {
                case MOVEMODE:
                case PATHMODE:
                        arm_shown = TRUE;
                        i_shown_arm = ip;
                        j_shown_arm = jp;
                        break;
                default:
                        arm_shown = FALSE;
                }
                return;
        }
        if (mode != NOARM) delay(10);
        while ((pointer - configspace[ip][jp].vector) != IP ) {
                if (take_step() == STUCK) return(STUCK);
        } show_goal_point(ip,jp,PIX_SRC|PIX_DST);

if (mode == MOVEMODE) {
                arm_shown = TRUE;
                i_shown_arm = ip;
                j_shown_arm = jp;
        } else {
                arm_shown = FALSE;
        }
        if (robot == SEND) {
                store_path_point();
                pathlength = num;
        }
        if (mode != NOARM) path_drawn = TRUE; else path_drawn = FALSE;
        return (NOPROBLEM);
} int take_step()
{
        short k;
        short iinc,jinc;
```

```
        int ipnew, jpnew;

for(k=DIRECTION_COUNT-1; k>=0; k--) {
                if (pointer & ( 0x1 << k)) {
                        ipnew = (short)Bx(ip+x_increment[k]);
                        jpnew = (short)By(jp+y_increment[k]);
                        if (ph_con[ipnew][jpnew] == NOCONSTRAINT) {
                                ip = ipnew;
                                jp = jpnew;
                                do_step();
                                return(NOPROBLEM);
                        }
                        else
                        {
                        /* check all constrained arrows for obstacles,
                                in sequence */
                                check_all_neighbors();
                                istart = ip;
                                jstart = jp;
                                return(STUCK);
                        }
                }
        }
} check_all_neighbors()
{
        short k;
        short ipnew,jpnew;

for(k=DIRECTION_COUNT-1; k>=0; k--) {
                ipnew = (short)Bx(ip+x_increment[k]);
                jpnew = (short)By(jp+y_increment[k]);
                if (ph_con[ipnew][jpnew] != NOCONSTRAINT) {
                        con[ipnew][jpnew]++;
                        addobs[addobscounter].x = ipnew;
                        addobs[addobscounter++].y = jpnew;
                }
        }
} delay(times)
short times;
{
        int i,j;
        i = speed;
        while (i++ < 100) for (j=0; j<(times*500); j++);
} store_path_point()
{
        if (num > PATHLENGTH) {
                printf("path longer than can be stored0);
```

```
                return;
        }
        path[2*num  ] = cellangle_x(ip);
        path[2*num+1] = cellangle_y(jp);
} do_step()
{
        int op;
        op = (PIX_SRC^PIX_DST)|PIX_COLOR(REDC);
        switch(mode) {
        case MOVEMODE:
           if (speed != 100) delay(1);
           show_arm(ipp,jpp,PIX_SRC^PIX_DST,BLACK); /* erase previous */
           ipp = ip;
           jpp = jp;
           show_arm(ipp,jpp,PIX_SRC^PIX_DST,BLACK);
           plot_path_point(ip,jp);
           add_to_path(ip,jp);
           break;
        case PATHMODE:
           if (speed != 100) delay(1);
           plot_path_point(ip,jp);
           add_to_path(ip,jp);
           show_arm(ip,jp,PIX_SRC,BLACK);
           break;
        case NOARM:
           plot_path_point(ip,jp);
           break;
        }
} add_to_path(i,j)
int i,j;
{
        if (pathcounter == MAX_PATH_NUMBER)
                printf("No more points can be added to path0);
        path_array[pathcounter].x = ip;
        path_array[pathcounter++].y = jp;
} take_step_new() /* taking into account double steps */
{
        short k;
        int iinc,jinc,aiinc,ajinc;

iinc =0;
        jinc =0;
        for(k=0; k<DIRECTION_COUNT; k++) {
                if (pointer & ( 0x1 << k)) {
                        iinc += x_increment[k];
                        jinc += y_increment[k];
                }
```

```
        }
        ip = (short)Bx(ip+iinc);
        jp = (short)By(jp+jinc);
/*
        if (iinc < 0) aiinc = -iinc; else aiinc = iinc;
        if (jinc < 0) ajinc = -jinc; else ajinc = jinc;
        if ( !(aiinc == 2 && ajinc == 1) && !(aiinc == 1 && ajinc == 2) ) {
                for(k=0; k<DIRECTION_COUNT; k++) {
                        if (pointer & ( 0x1 << k)) {
                                ip = (short)Bx(ip+x_increment[k]);
                                jp = (short)By(jp+y_increment[k]);
                                do_step();
                                goto step_taken;
                        }
                }
                step_taken:;
        } else {
                if (aiinc == 2) {
                        ip = (short)Bx(ip+(aiinc/iinc));
                        jp = (short)By(jp+jinc);
                        do_step();
                        ip = (short)Bx(ip+(aiinc/iinc));
                        do_step();
                } else {
                        ip = (short)Bx(ip+iinc);
                        jp = (short)By(jp+(ajinc/jinc));
                        do_step();
                        jp = (short)By(jp+(ajinc/jinc));
                        do_step();
                }
        }
*/
}
```

```c
/* printout of file: print.c */
/***************************/ include "defines.h"
include "externs.h"
/**********************************************************************/
/*      print.c                                                       */
/*      print arrays                                                  */
/*              created 198609xx Leo Dorst                            */
/*              mod     19861114 Leo Dorst                            */
/**********************************************************************/
print_pnt()     /* show the pnt array */
/* not valid anymore because of multivalued pointers */
{
        register short i,j;
        PIXEL co;

printf("0nt0);
        for ( i=0; i<XSIZE; i++) {
                for ( j=0; j<YSIZE; j++) {
                        printf("%0.4x ",configspace[i][j].vector);
                }
                printf("0);
        }
} print_con()     /* show the con array */
{
        register short i,j;
        float co;

printf("0on0);
        printf("  ");
        for ( i=0; i<XSIZE; i++)
                printf("%5d",i);
        printf("0);
        for(i=0;i<40;i++)
                printf("--");
        printf("0);

for ( j=0; j<YSIZE; j++) {
                printf("%2d ",j);
                for ( i=0; i<XSIZE; i++) {
                        co=configspace[i][j].cost_to_goal;
                        if ((int)co == (int)UNCOSTED) printf("  U  ");
                        else if ((int)co == (int)INFINITY) printf(" INF ");
                        else printf("%5.1f",co);
                }
                printf("0);
        }
} print_obs()
```

101

```
{
        int i;

for (i=0; i<NUMOBS; i++) {
                printf("obs_pos[%d] = (%d,%d) => (%f,%f)0,
                i,(obs_pos[i].x),(obs_pos[i].y));
        }
}
```

```
/* printout of file: show.c */
/************************/ include "defines.h"
include "externs.h"
/*#define NOARROWS*/
/***************************************************************/
/*      show.c          */
/*      sunshow arrays  */
/*              created 198609xx Leo Dorst */
/*              mod     19861114 Leo Dorst */
/***************************************************************/ show_goal()     /* show goal points */
{
        register int i;

for (i=0; i<goalcounter; i++) {
                pw_rop(canvas1_pw,
                PNT_OFFSET+INC*goal[i].x,PNT_OFFSET+INC*goal[i].y,
                CELL_SIZE,CELL_SIZE,
                (PIX_DST|PIX_SRC|PIX_COLOR(GREENC)),
                icon_prs[GOAL_ICON],
                GOAL_START, GOAL_START);
        }
} show_goal_point(i,j,op)
short i,j;
int op;
{
register ii,jj;
int fop;
        ii = CMARGIN + i*(CELL_SIZE + CSTEP) +1;
        jj = CMARGIN + j*(CELL_SIZE + CSTEP) +1;
        fop = op|PIX_COLOR(GREENC);
        pw_rop(canvas1_pw,ii,jj,CELL_SIZE-2,CELL_SIZE-2,
                fop,icon_prs[GOAL_ICON],GOAL_START,GOAL_START);
} show_start_point(op)
int op;
{
        plot_icon(istart,jstart,op,START_ICON);
} show_ph_con()   /* show con array on sun */
{
        register short  i,j,k;
        register int    x,y;

y = CMARGIN + CSTEP + 1 - INC;
        for ( j=0; j<YSIZE; j++) {
```

```
                y += INC;
                x = CMARGIN + CSTEP + 1 - INC;
                for ( i=0; i<XSIZE; i++) {
                        x += INC;
                        if (ph_con[i][j] != NOCONSTRAINT) {
                                pw_replrop(canvas1_pw,
                                        x,y, CELL_SIZE,CELL_SIZE,
                                                PIX_SRC | PIX_COLOR(BLACKC),
                                        patch_prs[GRAY25],
                                        GOAL_START,GOAL_START);
                        }
                }
        }
} show_path()     /* show path array on sun */
{
        register short  i,j,k;
        register int    x,y;

for (k=0;k<pathcounter;k++) {
                i = path_array[k].x;
                j = path_array[k].y;
                x = CMARGIN + CSTEP + 1 + (CELL_SIZE+CSTEP)*i;
                y = CMARGIN + CSTEP + 1 + (CELL_SIZE+CSTEP)*j;
                /*
                pw_rop(canvas1_pw, x,y, CELL_SIZE,CELL_SIZE,
                        (PIX_SRC)|PIX_COLOR(REDC),
                        patch_prs[BLACKP],
                        GOAL_START,GOAL_START);
                */
                if(configspace[i][j].cost_to_goal != 0)
                /* don't put red where the goal is */
                /*printf(" were showing bad path pt at %d,%d0,i,j);*/
                plot_path_point(i,j);
                /*
                this is the bad code
                pw_replrop(canvas1_pw, x,y, CELL_SIZE,CELL_SIZE,
                        (PIX_SRC^PIX_DST)|PIX_COLOR(REDC),
                        patch_prs[BLACKP],
                        GOAL_START,GOAL_START);
                */
                if (mode == PATHMODE)
                        show_arm(i,j,PIX_SRC,BLACKC);
                else
                        show_end_point(i,j);

}
} show_con()      /* show con array on sun */
{
        register short  i,j,k;
```

```
        register int    x,y;

y = CMARGIN + CSTEP + 1 - INC;
        for ( j=0; j<YSIZE; j++) {
                y += INC;
                x = CMARGIN + CSTEP + 1 - INC;
                for ( i=0; i<XSIZE; i++) {
                        x += INC;
                        if (con[i][j] != NOCONSTRAINT) {
                                pw_replrop(canvas1_pw, x,y, CELL_SIZE,CELL_SIZE,
                                        PIX_SRC | PIX_COLOR(BLACKC),
                                        patch_prs[BLACKP],
                                GOAL_START,GOAL_START);
                                /*
                                plot_patch(x,y,PIX_SRC|PIX_COLOR(BLACKC),BLACKP);
                                */
                        }
                }
        }
} show_obs()
{
        register short i,x,y;
        short j;
        for (i=0;i<NUMOBS;i++) {
                show_obs_icon(obs_pos[i].x,obs_pos[i].y,
                        PIX_SRC|PIX_COLOR(BLACKC));
        }
        for (i=0;i<NUMPHOBS;i++) {
                show_ph_obs_icon(ph_obs_pos[i].x,ph_obs_pos[i].y,
                        PIX_SRC|PIX_COLOR(BLACKC));
        }
} show_obs_icon(x,y,op)
short x,y;
int op;
{
        /* this is the round black obstacle that is in task space */
        pw_rop(canvas2_pw, x-10,(CARTHEIGHT-y)-10,20,20, op,&standardobs,0,0);
} show_ph_obs_icon(x,y,op)
short x,y;
int op;
{
        /* this is the round black rimmed white */
        /* obstacle that is in task space */
        pw_rop(canvas2_pw, x-10,(CARTHEIGHT-y)-10,20,20, op,&phantomobs,0,0);
} show_pnt()      /* show pnt array on sun */
```

```
{
        register short  i,j,k;
        register short  x,y,pointer;
        ELEMENT         *in_el;
        CELL            *in_cell;

for ( i=0; i<XSIZE; i++) {
                for ( j=0; j<YSIZE; j++) {
                        switch (pointer = configspace[i][j].vector) {
                        case OBSTACLE:
                                plot_patch(i,j,PIX_SRC|PIX_COLOR(BLACKC),BLACKP);
                                break;
                        case IP:        /* unmodified, so GOAL or unreachable */
                                break;
                        default:
                                for (k=0; k<DIRECTION_COUNT; k++)
                                    if (pointer & ( 0x1 << k))
                                        plot_arrow(i,j,
                                           PIX_SRC|PIX_DST,k);
                                break;
                        }
                }
        }
} plot_patch(i,j,op,type) /* plot icon of type at i,j using operation op */
short i,j,type;
int op;
{
        register ii,jj;
        ii = CMARGIN + i*(CELL_SIZE + CSTEP) +1;
        jj = CMARGIN + j*(CELL_SIZE + CSTEP) +1;
        pw_replrop(canvas1_pw,ii,jj,CELL_SIZE,CELL_SIZE,op,
        patch_prs[type],
                GOAL_START, GOAL_START);
} plot_arrow(i,j,op,type)
short i,j,type;
int op;
{
/*
#define GAP 3
*/
#define GAP (CELL_SIZE/4)
        /* type is the direction number */
        /* it is < DIRECTION_COUNT */
#ifndef NOARROWS
        register ii,jj;
        register ix,iy, sign_x, sign_y;
        register mxy;
```

```c
            ii = i*(CELL_SIZE +CSTEP) + (CMARGIN + CELL_SIZE/2 ) +1;
            jj = j*(CELL_SIZE +CSTEP) + (CMARGIN + CELL_SIZE/2 ) +1;

if ((ix = x_increment[type]) == 0 )
                    sign_x = 0;
            else if (ix < 0)
                    sign_x = -1;
            else
                    sign_x = 1;
            if ((iy = y_increment[type]) == 0 )
                    sign_y = 0;
            else if (iy < 0)
                    sign_y = -1;
            else
                    sign_y = 1;
            mxy = max (abs(ix).abs(iy));

if (sign_x == 0 || sign_y == 0)
            {       /* horiz/vertical arrows */
#ifdef BLUE_ARROWS
                    pw_vector(canvas1_pw,
                            ii+ix*(CELL_SIZE-GAP)/2,
                            jj+iy*(CELL_SIZE-GAP)/2,
                            ii + ix * (CELL_SIZE-GAP),
                            jj + iy * (CELL_SIZE-GAP),
                            op, BLUEC);
#else
                    pw_vector(canvas1_pw,
                            ii+ix*(CELL_SIZE-GAP)/2,
                            jj+iy*(CELL_SIZE-GAP)/2,
                            ii + ix * (CELL_SIZE-GAP),
                            jj + iy * (CELL_SIZE-GAP),
                            op, REDC);
#endif
#ifdef BLUE_ARROWS
                    pw_vector(canvas1_pw,
                            ii + ix*(CELL_SIZE-GAP-1)- sign_y,
                            jj + iy*(CELL_SIZE-GAP-1)+ sign_x,
                            ii + ix*(CELL_SIZE-GAP-1)+ sign_y,
                            jj + iy*(CELL_SIZE-GAP-1)- sign_x,
                            op, BLUEC);
#else
                    pw_vector(canvas1_pw,
                            ii + ix*(CELL_SIZE-GAP-1)- sign_y,
                            jj + iy*(CELL_SIZE-GAP-1)+ sign_x,
                            ii + ix*(CELL_SIZE-GAP-1)+ sign_y,
                            jj + iy*(CELL_SIZE-GAP-1)- sign_x,
                            op, REDC);
#endif
            }
            else if (mxy == 1) { /* diagonal steps */
#ifdef BLUE_ARROWS
                    pw_vector(canvas1_pw,
```

```
                              ii+ix*(CELL_SIZE-GAP)/2,
                              jj+iy*(CELL_SIZE-GAP)/2,
                              ii + ix * (CELL_SIZE-GAP),
                              jj + iy * (CELL_SIZE-GAP),
                              op, BLUEC);
#else
                    pw_vector(canvas1_pw,
                              ii+ix*(CELL_SIZE-GAP)/2,
                              jj+iy*(CELL_SIZE-GAP)/2,
                              ii + ix * (CELL_SIZE-GAP),
                              jj + iy * (CELL_SIZE-GAP),
                              op, REDC);
#endif
#ifdef BLUE_ARROWS
                    pw_vector(canvas1_pw,
                              ii + ix*(CELL_SIZE-GAP),
                              jj + iy*(CELL_SIZE-GAP-1),
                              ii + ix*(CELL_SIZE-GAP-1),
                              jj + iy*(CELL_SIZE-GAP),
                              op, BLUEC);
#else
                    pw_vector(canvas1_pw,
                              ii + ix*(CELL_SIZE-GAP),
                              jj + iy*(CELL_SIZE-GAP-1),
                              ii + ix*(CELL_SIZE-GAP-1),
                              jj + iy*(CELL_SIZE-GAP),
                              op, REDC);
#endif
        } else {         /* knight's moves */
#ifdef BLUE_ARROWS
                    pw_vector(canvas1_pw,
                              ii+ix*(CELL_SIZE-GAP)/2,
                              jj+iy*(CELL_SIZE-GAP)/2,
                              ii + ix * (CELL_SIZE-GAP),
                              jj + iy * (CELL_SIZE-GAP),
                              op, BLUEC);
#else
                    pw_vector(canvas1_pw,
                              ii+ix*(CELL_SIZE-GAP)/2,
                              jj+iy*(CELL_SIZE-GAP)/2,
                              ii + ix * (CELL_SIZE-GAP),
                              jj + iy * (CELL_SIZE-GAP),
                              op, REDC);
#endif
#ifdef BLUE_ARROWS
                    pw_vector(canvas1_pw,
                              ii + ix*(CELL_SIZE-GAP),
                              jj + iy*(CELL_SIZE-GAP-1),
                              ii + ix*(CELL_SIZE-GAP-1),
                              jj + iy*(CELL_SIZE-GAP),
                              op, BLUEC);
#else
                    pw_vector(canvas1_pw,
```

```
                                ii + ix*(CELL_SIZE-GAP),
                                jj + iy*(CELL_SIZE-GAP-1),
                                ii + ix*(CELL_SIZE-GAP-1),
                                jj + iy*(CELL_SIZE-GAP),
                                op, REDC);
#endif
        )
/*
#ifdef BLUE_ARROWS
        pw_vector(canvas1_pw,
                ii+x_increment[type]*GAP,
                jj+y_increment[type]*GAP,
                ii+x_increment[type]*CELL_SIZE,
                jj+y_increment[type]*CELL_SIZE,
                        op, BLUEC);
#else
        pw_vector(canvas1_pw,
                ii+x_increment[type]*GAP,
                jj+y_increment[type]*GAP,
                ii+x_increment[type]*CELL_SIZE,
                jj+y_increment[type]*CELL_SIZE,
                        op, REDC);
#endif
*/
#endif
} plot_icon(i,j,op,type) /* plot icon of type at i,j using operation op */
short i,j,type;
int op;
{
        register ii,jj;
        ii = CMARGIN + i*(CELL_SIZE + CSTEP) +1;
        jj = CMARGIN + j*(CELL_SIZE + CSTEP) +1;
        /*
        op = PIX_SRC|PIX_COLOR(GREENC);
        */
                pw_rop(canvas1_pw,ii,jj,CELL_SIZE,CELL_SIZE,
                op,icon_prs[type],
                GOAL_START, GOAL_START);
} border_draw1()
{
        pw_vector(canvas1_pw,
                CMARGIN,CMARGIN,CXSIZE-CMARGIN,CMARGIN,PIX_SRC |
                PIX_COLOR(BLACKC),1);
        pw_vector(canvas1_pw,
                CMARGIN,CMARGIN,CMARGIN,CYSIZE-CMARGIN,PIX_SRC |
                PIX_COLOR(BLACKC),1);
        pw_vector(canvas1_pw,
                CXSIZE-CMARGIN+1,CMARGIN,CXSIZE-CMARGIN+1,CYSIZE-CMARGIN+1,
                PIX_SRC | PIX_COLOR(BLACKC),1);
```

```
		pw_vector(canvasl_pw,
			CMARGIN,CYSIZE-CMARGIN+1,CXSIZE-CMARGIN+1,CYSIZE-CMARGIN+1,
			PIX_SRC | PIX_COLOR(BLACKC),1);
} show_labels()
{
	char vertical_text[20];
	char short_text[2];
	int i;

pw_text(canvasl_pw,190,CYSIZE-5,
		PIX_SRC|PIX_DST,NULL,"Angle of Shoulder  -->");

strcpy(vertical_text,"Angle of Elbow ||v");
	for(i=0;i<20;i++)
	{
		if(vertical_text[i]==' ')
			break;
		else
		{
			short_text[0]=vertical_text[i];
			short_text[1]=' ';
		}
		pw_text(canvasl_pw,CYSIZE-11,190+14*i,
		PIX_SRC|PIX_DST,NULL,short_text);
	}
} show_costs()
/* show all the cost_to_goals of the configspace */
{
	register i,j,ii,jj;
	register COSTTYPE cost;
	register char lstr[20];
	register char rstr[20];

if((XSIZE > 10) || (YSIZE > 10)) return;

/* if costs won't fit, don't bother */
	show_labels();

/* now make the numbers on the x/y borders */
	for(i=0;i<XSIZE;i++)
	{
			sprintf(lstr,"%-3d",i*(360/XSIZE));
			sprintf(rstr,"%3d",i*(360/XSIZE));
			ii= CMARGIN+INC*i+ INC/20;
			/* now for the x direction label */
			pw_text(canvasl_pw,
			ii-2,CELL_SIZE/3,
			(PIX_SRC^PIX_DST),
/*			(PIX_SRC^PIX_DST)|PIX_COLOR(REDC),*/
```

110

```
                            smallfont,rstr);
                    /* now for the y direction label */
                    pw_text(canvas1_pw,
                        0,ii+CELL_SIZE/3+3,
                        (PIX_SRC^PIX_DST),
/*                           (PIX_SRC^PIX_DST)|PIX_COLOR(REDC),*/
                        smallfont,lstr);
            } for(i=0;i<XSIZE;i++)
        {
                for(j=0;j<YSIZE;j++)
                { ii=CMARGIN+ CELL_SIZE/5 +INC*i-3;
                        jj = j*INC + (CMARGIN + CELL_SIZE/2 );

/* get string representation of cost */
                        cost=configspace[i][j].cost_to_goal;
                        if(cost == INFINITY)
                                strcpy(lstr," I ");
                        else if(cost == UNCOSTED)
                                strcpy(lstr," U ");
                        else
#ifdef FLOATWORLD
                                sprintf(lstr,"%4.2f",
#else                           configspace[i][j].cost_to_goal);

sprintf(lstr,"%4d",
#endif                          configspace[i][j].cost_to_goal);

pw_text(canvas1_pw,
                        ii,jj,PIX_SRC|PIX_DST,smallfont,lstr);
                }
        }
} plot_canvas2()
{
        pw_batch_on(canvas2_pw);
        init_colors();
        clear_canvas2();
        show_obs();
        plot_goals_in_task_space();
        pw_batch_off(canvas2_pw);
} plot_canvas1()
{
        pw_batch_on(canvas1_pw);
        init_colors();
        clear_canvas1();
        border_draw1();
```

```
        grid_paint1();
        show_ph_con(); show_con(); /* should be in this order */
        if (flow) show_pnt();
        show_goal();
        show_path();
        show_costs();
        pw_batch_off(canvas1_pw);
} clear_canvas1()
{
        pw_rop(canvas1_pw,0,0,CXSIZE,CYSIZE,PIX_COLOR(WHITEC),NULL,0,0);
}
clear_canvas2()
{
        /* kit Jan 19, 88
        pw_rop(canvas2_pw,0,0,CXSIZE,CYSIZE,PIX_COLOR(WHITEC),NULL,0,0);
        */
        pw_rop(canvas2_pw,0,0,CARTWIDTH,CARTHEIGHT,PIX_COLOR(WHITEC),
        NULL,0,0);
} show_arm(i,j,op,color)
short   i,j,color;
int op;
{
        double angle1,angle2;
        double cos1,sin1,cos2,sin2;
        short   l10_x,l10_y,l11_x,l11_y,l12_x,l12_y,l13_x,l13_y;
        short   l20_x,l20_y,l21_x,l21_y,l22_x,l22_y,l23_x,l23_y;
        short   l24_x,l24_y,l25_x,l25_y;
        short   end1_x,end1_y,end2f_x,end2f_y,end2r_x,end2r_y;
        short   end2_x,end2_y;
        short gx,gy;
        int fop;
        fop = (op | PIX_COLOR(color));

angle1 = -i*ANGLE1RES; /* wyatt coordinates */
        angle2 = -j*ANGLE2RES; /* wyatt coordinates */ switch (redraw) {
        case STICK_ARM:
                end1_x = XBASE+(short)((double)(LENGTH1)*cos(angle1)+0.5);
                end1_y = YBASE+(short)((double)(LENGTH1)*sin(angle1)+0.5);
                end2f_x = end1_x + (short)((double)(LENGTH2F)*cos(angle2)+0.5);
                end2f_y = end1_y + (short)((double)(LENGTH2F)*sin(angle2)+0.5);
                end2r_x = end1_x - (short)((double)(LENGTH2R)*cos(angle2)+0.5);
                end2r_y = end1_y - (short)((double)(LENGTH2R)*sin(angle2)+0.5);
                pw_batch_on(canvas2_pw);
                pw_vector(canvas2_pw, XBASE,YBASE,end1_x,end1_y, fop,BLACKC);
                pw_vector(canvas2_pw, end2f_x,end2f_y,end2r_x,end2r_y,fop,BLACKC);
                pw_batch_off(canvas2_pw);
                break;
```

```
        case BODY_ARM:
                cos1 = cos(angle1);
                sin1 = sin(angle1);
                cos2 = cos(angle2);
                sin2 = sin(angle2);
                110_x = XBASE + (short)( L11*cos1 - W1*sin1+0.5);
                110_y = YBASE + (short)( L11*sin1 + W1*cos1+0.5);
                111_x = XBASE + (short)( L11*cos1 + W1*sin1+0.5);
                111_y = YBASE + (short)( L11*sin1 - W1*cos1+0.5);
                112_x = XBASE + (short)( L12*cos1 + W1*sin1+0.5);
                112_y = YBASE + (short)( L12*sin1 - W1*cos1+0.5);
                113_x = XBASE + (short)( L12*cos1 - W1*sin1+0.5);
                113_y = YBASE + (short)( L12*sin1 + W1*cos1+0.5);

/* joint 2 */
                end1_x = XBASE+(short)(L1J*cos1+0.5);
                end1_y = YBASE+(short)(L1J*sin1+0.5);
                120_x = end1_x + (short)( L21*cos2 - W2*sin2+0.5);
                120_y = end1_y + (short)( L21*sin2 + W2*cos2+0.5);
                121_x = end1_x + (short)( L21*cos2 + W2*sin2+0.5);
                121_y = end1_y + (short)( L21*sin2 - W2*cos2+0.5);
                122_x = end1_x + (short)( L22*cos2 + W2*sin2+0.5);
                122_y = end1_y + (short)( L22*sin2 - W2*cos2+0.5);
                123_x = end1_x + (short)( L22*cos2 - W2*sin2+0.5);
                123_y = end1_y + (short)( L22*sin2 + W2*cos2+0.5);
                124_x = end1_x + (short)( (L22-2*W2)*cos2 + W2*sin2+0.5);
                124_y = end1_y + (short)( (L22-2*W2)*sin2 - W2*cos2+0.5);
                125_x = end1_x + (short)( (L22-2*W2)*cos2 - W2*sin2+0.5);
                125_y = end1_y + (short)( (L22-2*W2)*sin2 + W2*cos2+0.5);
                end2_x = end1_x + (short)( (L22-W2)*cos2 + .5);
                end2_y = end1_y + (short)( (L22-W2)*sin2 + .5);

pw_batch_on(canvas2_pw);
                pw_vector(canvas2_pw, 110_x,110_y,111_x,111_y,fop,BLACKC);
                pw_vector(canvas2_pw, 111_x,111_y,112_x,112_y,fop,BLACKC);
                pw_vector(canvas2_pw, 112_x,112_y,113_x,113_y,fop,BLACKC);
                pw_vector(canvas2_pw, 113_x,113_y,110_x,110_y,fop,BLACKC);
                pw_vector(canvas2_pw, 120_x,120_y,121_x,121_y,fop,BLACKC);
                pw_vector(canvas2_pw, 121_x,121_y,122_x,122_y,fop,BLACKC);
                pw_vector(canvas2_pw, 122_x,122_y,123_x,123_y,fop,BLACKC);
                pw_vector(canvas2_pw, 123_x,123_y,120_x,120_y,fop,BLACKC);
                pw_vector(canvas2_pw, 124_x,124_y,125_x,125_y,fop,BLACKC);
                pw_vector(canvas2_pw, end1_x,end1_y,end1_x,end1_y,fop,BLACKC);
                pw_vector(canvas2_pw, end2_x,end2_y,end2_x,end2_y,(PIX_SRC|PIX_COLOR(R
                pw_batch_off(canvas2_pw);
        }
} show_end_point(i,j)
int i,j;
{
        double angle1,angle2;
        double cos1,sin1,cos2,sin2;
```

```
        short   end1_x,end1_y;
        short   end2_x,end2_y;

angle1 = -i*ANGLE1RES; /* wyatt coordinates */
        angle2 = -j*ANGLE2RES; /* wyatt coordinates */
        cos1 = cos(angle1);
        sin1 = sin(angle1);
        cos2 = cos(angle2);
        sin2 = sin(angle2);
        end1_x = XBASE+(short)(L1J*cos1+0.5);
        end1_y = YBASE+(short)(L1J*sin1+0.5);
        end2_x = end1_x + (short)( (L22-W2)*cos2 + .5);
        end2_y = end1_y + (short)( (L22-W2)*sin2 + .5);
        pw_vector(canvas2_pw, end2_x,end2_y,end2_x,end2_y,
                (PIX_SRC|PIX_COLOR(REDC)),BLACKC);
} plot_goals_in_task_space()
{
        short k;

for (k=0; k<num_goals;k++) {
                /*
                pw_rop(canvas2_pw,
                task_goal[k].x-(CELL_SIZE/2),task_goal[k].y-(CELL_SIZE/2),
                CELL_SIZE,CELL_SIZE,
                ((PIX_SRC^PIX_DST)|PIX_COLOR(GREENC)),icon_prs[GOAL_ICON],
                GOAL_START, GOAL_START);
                */
                pw_rop(canvas2_pw,
                task_goal[k].x-(GOAL_CELL_SIZE/2),
                task_goal[k].y-(GOAL_CELL_SIZE/2),
                GOAL_CELL_SIZE,GOAL_CELL_SIZE,
                (PIX_SRC|PIX_COLOR(GREENC)),icon_prs[GOAL_ICON],
                TASK_GOAL_START, TASK_GOAL_START);
        }
} plot_path_element(i,j,k)
short i,j,k;
{
/*
        plot_arrow(i,j,PIX_SRC|PIX_DST,k);
*/
        plot_patch(i,j,PIX_SRC|PIX_DST,PATHPATCH);
}

/****************************************************************
        canvas1 painting routines
****************************************************************/ grid_paint1()
```

```
{
        register short   i, xbeg, ybeg, xend, yend, x ,y;

xbeg = CMARGIN;
        ybeg = CMARGIN;
        xend = CXSIZE-CMARGIN;
        yend = CYSIZE-CMARGIN;

x = xbeg;
        for (i=0; i < (2*XSIZE+2); i++) {
                pw_vector(canvas1_pw, x, ybeg, x, yend, PIX_SRC, 1);
                if ((i % 2))
                        x += CELL_SIZE;
                else
                        x += CSTEP;
        } y = ybeg;
        for (i=0; i < (2*YSIZE+3); i++) {
                pw_vector(canvas1_pw, xbeg, y, xend, y, PIX_SRC, 1);
                if ((i % 2))
                        y += CELL_SIZE;
                else
                        y += CSTEP;
        }
}

/***********************************************************************
        canvas cell coordinate routines
***********************************************************************/
ELEMENT *element_of_point1(event)
        Event   *event;
{
        ELEMENT         *result;
        LOGICAL         largex, largey;
        short   x,y;

result = &null_element;
        x = event_x(event);
        y = event_y(event);
        if (x < CMARGIN+1)  {
                x = CXSIZE-CMARGIN-CSTEP-(CMARGIN-CSTEP-x);
                window_set(canvas1,WIN_MOUSE_XY,x,y,0);
                result->i = (x - CMARGIN)/(CSTEP+CELL_SIZE);
                result->j = (y - CMARGIN)/(CSTEP+CELL_SIZE);
                return (result);
        }
        if (y < CMARGIN+1)  {
                y = CYSIZE-CMARGIN-CSTEP-(CMARGIN-CSTEP-y);
                window_set(canvas1,WIN_MOUSE_XY,x,y,0);
                result->i = (x - CMARGIN)/(CSTEP+CELL_SIZE);
                result->j = (y - CMARGIN)/(CSTEP+CELL_SIZE);
                return (result);
```

```
        }
        if (x >= (CXSIZE-CMARGIN-CSTEP) ) {
                x = CMARGIN +CSTEP+(x-CXSIZE+CMARGIN+CSTEP);
                window_set(canvas1,WIN_MOUSE_XY,x,y,0);
                result->i = (x - CMARGIN)/(CSTEP+CELL_SIZE);
                result->j = (y - CMARGIN)/(CSTEP+CELL_SIZE);
                return (result);
        }
        if (y >= (CYSIZE-CMARGIN-CSTEP) ) {
                y = CMARGIN +CSTEP+(y-CYSIZE+CMARGIN+CSTEP);
                window_set(canvas1,WIN_MOUSE_XY,x,y,0);
                result->i = (x - CMARGIN)/(CSTEP+CELL_SIZE);
                result->j = (y - CMARGIN)/(CSTEP+CELL_SIZE);
                return (result);
        }
        result->i = (x - CMARGIN)/(CSTEP+CELL_SIZE);
        result->j = (y - CMARGIN)/(CSTEP+CELL_SIZE);
        return (result);
} erase_arms() /* at the moment redraw complete canvas2 */
{
        pw_batch_on(canvas2_pw);
        clear_canvas2();
        show_obs();
        plot_goals_in_task_space();
        pw_batch_off(canvas2_pw);
}
```

```
/* printout of file: trafo_data.c */
/***************************/ include "defines.h"
include "externs.h"
/*
        joint space obstacle treatment
        after an original by wyatt newman
        leo 19870406
*/ prepare_trafo_data()
{
        register short i;

def_obstacles();
        init_obs();
}

/* add = +1: add obstacle */
/* add =  0: just show polygon */
/* add = -1: sub obstacle */ convert_to_joint_space(xx,yy,add)
short add;
short xx,yy; /* coordinates of obstacle.*/
{
        register short j,k;
        float x,y;
        POLNODE polygon[NUMVERTICES];

x = (float)(xx-XBASE);
        y = (float)(yy-YBASE);

numbloblist = 0; /* start new blob */ rad8     = (int)((8/CENTIMETER)*sqrt(y*y + x*x));
        angleobs= ( (int)(32768.0/(2*PI)*atan2(y,x)+32768)) % 32768;

if (12f_interp_obs(0)) {        /* discretize obstacle, if present */
                /* angle shift not yet done */
                polygon[0].x = (int) obs_ang1 + (int) angleobs;
                polygon[0].y = (int) obs_ang2 + (int) angleobs ;
                for(k=1;k<NUMVERTICES;k++) {
                        12f_interp_obs(k);
                        polygon[k].x = polygon[k-1].x + (int) obs_ang1;
                        polygon[k].y = polygon[k-1].y + (int) obs_ang2;
                }
                treat_polygon(polygon,NUMVERTICES,add);
        } if(12r_interp_obs(0)) {         /* discretize obstacle, if present */
```

```
                /* angle shift not yet done */
                polygon[0].x = (int) obs_ang1 + (int) angleobs;
                polygon[0].y = (int) obs_ang2 + (int) angleobs ;
                for(k=1;k<NUMVERTICES;k++) {
                        l2r_interp_obs(k);
                        polygon[k].x = polygon[k-1].x + (int) obs_ang1;
                        polygon[k].y = polygon[k-1].y + (int) obs_ang2;
                }
                treat_polygon(polygon,NUMVERTICES,add);
        } if(l1_interp_obs()) {           /* discretize obstacle, if present */
                polygon[0].x = (int) obs_l1_plus + (int) angleobs - 32768;
                polygon[0].y = 0;
                polygon[1].x = polygon[0].x;
                polygon[1].y = 32767-32767/YSIZE;
                polygon[2].x = (int) obs_l1_minus + (int) angleobs;
                polygon[2].y = 32767-32767/XSIZE;
                polygon[3].x = polygon[2].x;
                polygon[3].y = 0;
                treat_polygon(polygon,4,add);
        }
} init_arm()
{
        double angle1,angle2;
        angle1 = (double)(ANGLE1RES*XSIZE/2);
        angle2 = (double)(ANGLE2RES*YSIZE/2);
        set_arm(angle1,angle2);
} set_arm(angle1,angle2)
        double angle1,angle2;
{
        arm = &null_arm;
        arm->angle1 = angle1;
        arm->angle2 = angle2;
} short roundx(x) /* conversion from screen to discrete config space */
int x;
{
        return (( (short)(x*ANGLE1PIX+CELL_SIZE/2+XSIZE*CELL_SIZE) / CELL_SIZE)-XSIZE)
} short roundy(y) /* conversion from screen to discrete config space */
int y;
{
        return (( (short)(y*ANGLE2PIX+CELL_SIZE/2+YSIZE*CELL_SIZE) / CELL_SIZE)-YSIZE)
}
```

```
short periodic_x(x)
short x;
{
        if (x < 0)  return(XSIZE+x);
        if (x >= XSIZE ) return(x-XSIZE);
        return(x);
} short periodic_y(y)
short y;
{
        if (y < 0)  return(YSIZE+y);
        if (y >= YSIZE ) return(y-YSIZE);
        return(y);
} int anglepix_x(x)       /* conversion from angle to screen coordinates */
int x;
{
        return ((int)(x*ANGLE1PIX)+CELL_SIZE/2+CMARGIN);
} int anglepix_y(y)       /* conversion from angle to screen coordinates */
int y;
{
        return ((int)(y*ANGLE2PIX)+CELL_SIZE/2+CMARGIN);
} int cellangle_x(x)
int x;
{
        return ( (int) ( (((float)x)*32768.0) / ((float)XSIZE) ) );
} int cellangle_y(y)
int y;
{
        return ( (int) ( (((float)y)*32768.0) / ((float)YSIZE) ) );
} float obspixworld_x(x) /* conversion from pixels to world coordinates */
int x;
{
        return( (float)(x-XBASE)/(float)CENTIMETER );
} float obspixworld_y(y) /* conversion from pixels to world coordinates */
int y;
{
        return( (float)(y-YBASE)/(float)CENTIMETER );
} int obsworldpix_x(x) /* conversion from world to pixels */
```

```
short x;
{
        return ((int) ( ((float)x)*((float)CENTIMETER)) + XBASE);
} int obsworldpix_y(y) /* conversion from world to pixels */
short y;
{
        return ((int) ( ((float)y)*((float)CENTIMETER)) + YBASE);
} draw_vector(x1,y1,x2,y2,op,color)
        /* draw vector in periodic config space */
        /* it is assumed that only one boundary is traversed by the line */
short x1,y1,x2,y2,op,color;
{
        int fop;
        short leftx1,rightx1,normalx1;
        short leftx2,rightx2,normalx2;
        short lefty1,righty1,normaly1;
        short lefty2,righty2,normaly2;
        short crossx,crossy;

leftx1 = rightx1 = normalx1 = FALSE;
        if (x1 < CMARGIN)                       leftx1  = TRUE;
        else if (x1 > (CXSIZE-CMARGIN)) rightx1 = TRUE;
        else                                    normalx1= TRUE;

leftx2 = rightx2 = normalx2 = FALSE;
        if (x2 < CMARGIN)                       leftx2  = TRUE;
        else if (x2 > (CXSIZE-CMARGIN)) rightx2 = TRUE;
        else                                    normalx2= TRUE;

lefty1 = righty1 = normaly1 = FALSE;
        if (y1 < CMARGIN)                       lefty1  = TRUE;
        else if (y1 > (CXSIZE-CMARGIN)) righty1 = TRUE;
        else                                    normaly1= TRUE;

lefty2 = righty2 = normaly2 = FALSE;
        if (y2 < CMARGIN)                       lefty2  = TRUE;
        else if (y2 > (CXSIZE-CMARGIN)) righty2 = TRUE;
        else                                    normaly2= TRUE;

fop = op | PIX_COLOR(color);
        /*
        fop = (PIX_SRC^PIX_DST) | PIX_COLOR(BLACKC);
        */
#define JUMPX (CXSIZE-2*CMARGIN)
#define JUMPY (CYSIZE-2*CMARGIN)
#define RIGHTX (CXSIZE-CMARGIN)
#define RIGHTY (CYSIZE-CMARGIN)
        if (normalx1 && normalx2 && normaly1 && normaly2)
                pw_vector(canvas1_pw,x1,y1,x2,y2,fop,1);
```

```
else /* all-to-one-side cases */
    if (leftx1 && leftx2 && normaly1 && normaly2)    /* left side */
        pw_vector(canvas1_pw,x1+JUMPX,y1,x2+JUMPX,y2,fop,1);
    else if (normalx1 && normalx2 && lefty1 && lefty2)    /* upper side */
        pw_vector(canvas1_pw,x1,y1+JUMPY,x2,y2+JUMPY,fop,1);
    else if (rightx1 && rightx2 && normaly1 && normaly2)    /* right side */
        pw_vector(canvas1_pw,x1-JUMPX,y1,x2-JUMPX,y2,fop,1);
    else if (normalx1 && normalx2 && righty1 && righty2)    /* lower side */
        pw_vector(canvas1_pw,x1,y1-JUMPY,x2,y2-JUMPY,fop,1);
    else /* corner cases */
    if (leftx1 && leftx2 && lefty1 && lefty2)    /* upper left */
        pw_vector(canvas1_pw,x1+JUMPX,y1+JUMPY,x2+JUMPX,y2+JUMPY,fop,1);
    else if (leftx1 && leftx2 && righty1 && righty2)    /* lower left */
        pw_vector(canvas1_pw,x1+JUMPX,y1-JUMPY,x2+JUMPX,y2-JUMPY,fop,1);
    else if (rightx1 && rightx2 && righty1 && righty2)    /* lower right */
        pw_vector(canvas1_pw,x1-JUMPX,y1-JUMPY,x2-JUMPX,y2-JUMPY,fop,1);
    else if (rightx1 && rightx2 && lefty1 && lefty2)    /* upper right */
        pw_vector(canvas1_pw,x1-JUMPX,y1+JUMPY,x2-JUMPX,y2+JUMPY,fop,1);
    else /* border crossing cases */
    if (leftx1 && normalx2 && normaly1 && normaly2) {    /* left border */
        crossy = y2 - (short)( ((float)(x2-CMARGIN)*(y2-y1)) / (float)(x2-x1)
        pw_vector(canvas1_pw,x1+JUMPX,y1,RIGHTX,crossy,fop,1);
        pw_vector(canvas1_pw,CMARGIN,crossy,x2,y2,fop,1);
    }
    else if (normalx1 && leftx2 && normaly1 && normaly2) {    /* left border */
        crossy = y1 - (short)( ((float)(x1-CMARGIN)*(y1-y2)) / (float)(x1-x2)
        pw_vector(canvas1_pw,x2+JUMPX,y2,RIGHTX,crossy,fop,1);
        pw_vector(canvas1_pw,CMARGIN,crossy,x1,y1,fop,1);
    }
    else if (rightx1 && normalx2 && normaly1 && normaly2) {    /* right border */
        crossy = y2 - (short)( ((float)(x2-RIGHTX)*(y2-y1)) / (float)(x2-x1) )
        pw_vector(canvas1_pw,x1-JUMPX,y1,CMARGIN,crossy,fop,1);
        pw_vector(canvas1_pw,RIGHTX,crossy,x2,y2,fop,1);
    }
    else if (normalx1 && rightx2 && normaly1 && normaly2) {    /* right border */
        crossy = y1 - (short)( ((float)(x1-RIGHTX)*(y1-y2)) / (float)(x1-x2) )
        pw_vector(canvas1_pw,x2-JUMPX,y2,CMARGIN,crossy,fop,1);
        pw_vector(canvas1_pw,RIGHTX,crossy,x1,y1,fop,1);
    }
    else if (lefty1 && normaly2 && normalx1 && normalx2) {    /* upper border */
        crossx = x2 - (short)( ((float)(y2-CMARGIN)*(x2-x1)) / (float)(y2-y1)
        pw_vector(canvas1_pw,x1,y1+JUMPY,crossx,RIGHTY,fop,1);
        pw_vector(canvas1_pw,crossx,CMARGIN,x2,y2,fop,1);
    }
    else if (normaly1 && lefty2 && normalx1 && normalx2) {    /* upper border */
        crossx = x1 - (short)( ((float)(y1-CMARGIN)*(x1-x2)) / (float)(y1-y2)
        pw_vector(canvas1_pw,x2,y2+JUMPY,crossx,RIGHTY,fop,1);
        pw_vector(canvas1_pw,crossx,CMARGIN,x1,y1,fop,1);
    }
    else if (righty1 && normaly2 && normalx1 && normalx2) {    /* lower border */
        crossx = x2 - (short)( ((float)(y2-RIGHTY)*(x2-x1)) / (float)(y2-y1) )
        pw_vector(canvas1_pw,x1,y1-JUMPY,crossx,CMARGIN,fop,1);
        pw_vector(canvas1_pw,crossx,RIGHTY,x2,y2,fop,1);
```

```
        }
    else if (normaly1 && righty2 && normalx1 && normalx2) { /* lower border */
        crossx = x1 - (short)( ((float)(y1-RIGHTX)*(x1-x2)) / (float)(y1-y2) )
        pw_vector(canvas1_pw,x2,y2-JUMPX,crossx,CMARGIN,fop,1);
        pw_vector(canvas1_pw,crossx,RIGHTY,x1,y1,fop,1);
    }

}
```

We claim:

1. Computer apparatus for creating animation comprising
memory means for storing a configuration space data structure representing an object and its environment;
means for receiving signals indicating a change in the environment;
means for identifying a perimeter of a region in the configuration space data structure;
means for propagating cost waves in the configuration space data structure from the perimeter in order to create an updated configuration space data structure; and
means for displaying motion of the object based on the updated configuration space data structure.

2. The apparatus of claim 1 wherein the configuration space data structure is an array of states, which array has a dimension for each degree of freedom of the object, each state being a data structure corresponding to a pose of the object.

3. The apparatus of claim 2 wherein each state comprises a field for storing a cost to goal value and a field for storing a direction arrows value.

4. The apparatus of claim 3 wherein the means for propagating cost waves comprises
means for exploring all neighbors of an affected state;
means for improving neighbors of that affected state by storing appropriate signals in the respective cost to goal and direction arrows fields;
means for adding improved neighbors to a storage data structure; and
means for causing iteration until all states in the storage data structure.

5. The apparatus of claim 3 wherein the means for displaying
includes means for following direction arrows values from a current state to a goal state to produce a sequence of states along an optimal path to the goal state; and
displays a sequence of poses of the object corresponding to the sequence of states.

6. The apparatus of claim 3 wherein the means for identifying comprises
means for locating a back edge of a new obstacle;
means for storing a perimeter list of states surrounding states in the affected region, the affected region being those states for which the direction arrows indicate a path through the new obstacle; and
means for clearing cost to goal and direction arrows values from the affected region; and
wherein the means for propagating propagates from the states on the perimeter list.

7. The apparatus of claim 6 wherein the means for identifying further comprises
means for second locating a front edge of the obstacle; and
means for including the front edge in the parameter list.

8. The apparatus of claim 6 wherein the perimeter list is a sifting heap data structure.

9. The apparatus of claim 1 further comprising
means for treating a portion of the change of conditions as the change of conditions, which portion is actually encountered by the object; and
means for iterating for each newly encountered portion, until all of the change of conditions is encountered.

10. The apparatus of claim 1 wherein the change of conditions is addition of an obstacle.

11. The apparatus of claim 1 wherein the change of conditions is addition of a goal.

12. The apparatus of claim 1 wherein the change of conditions is removal of an obstacle.

13. The apparatus of claim 12 wherein the means for propagating clears cost values from the states corresponding to the removed obstacle and propagates from a set of neighbor states of the removed obstacle.

14. The apparatus of claim 1 wherein the change of conditions is removal of a goal.

15. The apparatus of claim 3 wherein the means for identifying stores at least one state corresponding to an added goal in a sifting heap data structure and the means for propagating propagates from that at least one state.

16. The apparatus of claim 3
wherein the storage data structure is a heap;
further comprising;
means for checking any added obstacles and any removed goals;
means for clearing the influence of added obstacles and removed goals; and
means for second checking removed obstacles and added goals;
wherein the means for identifying stores
a perimeter list in the heap in response to the added obstacle removed goals; and
neighbor states of the added obstacles and removed goals; and
wherein the means for propagating propagates from all the states on the heap.

17. Computer software, embodied in a computer-readable medium, for creating animation comprising
means for causing storage of a configuration space data structure representing an object and its environment;
means for causing reception of signals indicating a change in the environment;
means for causing identification of a perimeter of a region in the configuration space data structure;
means for causing propagation of cost waves in the configuration space data structure from the perimeter in order to create an updated configuration space data structure; and
means for causing display of motion of the object based on the updated configuration space data structure.

18. The software of claim 17 wherein the configuration space data structure is an array of states, which array has a dimension for each degree of freedom of the object, each state being a data structure corresponding to a pose of the object.

19. The software of claim 18 wherein each state comprises a field for storing a cost to goal value and a field for storing a direction arrows value.

20. The software of claim 17 wherein the means for propagating cost waves comprises
means for causing exploration of all neighbors of an affected state;
means for causing improvement of neighbors of that affected state by storing appropriate signals in the respective cost to goal and direction arrows fields;
means for causing addition of improved neighbors to a storage data structure; and
means for causing iteration until all states in the storage data structure.

21. The software of claim 19 wherein the means for causing display
- includes means for causing following of direction arrows values from a current state to a goal state to produce a sequence of states along an optimal path to the goal state; and
- displays a sequence of poses of the object corresponding to the sequence of states.

22. The software of claim 19 wherein the means for identifying comprises
- means for causing location of a back edge of a new obstacle;
- means for causing storage of a perimeter list of states surrounding states in the affected region, the affected region being those states for which the direction arrows indicate a path through the new obstacle; and
- means for causing clearing of cost to goal and direction arrows values from the affected region; and
wherein the means for causing propagation, causes propagation from the states on the perimeter list.

23. The software of claim 22 wherein the means for identifying further comprises
- means for causing second location of a front edge of the obstacle; and
- means for causing inclusion of the front edge in the parameter list.

24. The software of claim 22 wherein the perimeter list is a sifting heap data structure.

25. The software of claim 17 further comprising
- means for causing treatment of a portion of the change of conditions as the change of conditions, which portion is actually encountered by the object; and
- means for causing iteration for each newly encountered portion, until all of the change of conditions is encountered.

26. The software of claim 17 wherein the change of conditions is addition of an obstacle.

27. The software of claim 17 wherein the change of conditions is addition of a goal.

28. The software of claim 17 wherein the change of conditions is removal of an obstacle.

29. The software of claim 28 wherein the means for causing propagation causes clearance of cost values from the states corresponding to the removed obstacle and propagates from a set of neighbor states of the removed obstacle.

30. The software of claim 17 wherein the change of conditions is removal of a goal.

31. The software of claim 19 wherein the means for identifying stores at least one state corresponding to an added goal in a sifting heap data structure and the means for propagating propagates from that at least one state.

32. The software of claim 19
wherein the storage data structure is a heap;
further comprising;
- means for checking any added obstacles and any removed goals;
- means for clearing the influence of added obstacles and removed goals; and
- means for second checking removed obstacles and added goals;
wherein the means for identifying stores
- a perimeter list in the heap in response to the added obstacle removed goals; and
- neighbor states of the added obstacles and removed goals; and
wherein the means for propagating propagates from all the states on the heap.

* * * * *